US008771924B2

(12) United States Patent
Oohashi

(10) Patent No.: US 8,771,924 B2
(45) Date of Patent: Jul. 8, 2014

(54) POLYMERIZABLE COMPOSITION, LITHOGRAPHIC PRINTING PLATE PRECURSOR AND LITHOGRAPHIC PRINTING METHOD

(75) Inventor: Hidekazu Oohashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 37 days.

(21) Appl. No.: 11/964,125

(22) Filed: Dec. 26, 2007

(65) Prior Publication Data

US 2008/0199804 A1 Aug. 21, 2008

(30) Foreign Application Priority Data

Dec. 26, 2006 (JP) ................................ P2006-350047
Dec. 26, 2006 (JP) ................................ P2006-350048

(51) Int. Cl.
*G03F 7/033* (2006.01)
*B41N 1/08* (2006.01)
*B41C 1/10* (2006.01)

(52) U.S. Cl.
CPC .............. *G03F 7/033* (2013.01); *B41C 1/1008* (2013.01); *B41N 1/08* (2013.01)
USPC ......... 430/281.1; 430/302; 101/465; 101/467

(58) Field of Classification Search
CPC .......... G03F 7/033; B41C 1/1008; B41N 1/08
USPC ............. 430/270.1, 302, 281.1; 101/465, 467
See application file for complete search history.

(56) References Cited

U.S. PATENT DOCUMENTS

| | | | | |
|---|---|---|---|---|
| 2,850,445 | A | 9/1958 | Oster | |
| 4,708,925 | A | 11/1987 | Newman | |
| 6,051,361 | A * | 4/2000 | Hattori et al. | 430/270.1 |
| 6,805,052 | B2 * | 10/2004 | Aert et al. | 101/467 |
| 6,916,855 | B2 * | 7/2005 | Jansen et al. | 522/167 |
| 7,316,884 | B2 * | 1/2008 | Ansai et al. | 430/270.1 |
| 7,410,746 | B2 * | 8/2008 | Sakayori | 430/270.1 |
| 8,211,613 | B2 * | 7/2012 | Sakayori | 430/270.1 |
| 2004/0248031 | A1 * | 12/2004 | Ansai et al. | 430/270.1 |
| 2004/0260050 | A1 | 12/2004 | Munnelly et al. | |
| 2006/0210918 | A1 | 9/2006 | Kuroki | |
| 2008/0026324 | A1 | 1/2008 | Aoshima et al. | |

FOREIGN PATENT DOCUMENTS

| | | | |
|---|---|---|---|
| EP | 0 530 957 | A1 | 3/1993 |
| EP | 0 903 225 | A2 | 3/1999 |
| EP | 0 770 494 | B1 | 5/2000 |
| GB | 2008784 | A | 6/1979 |
| JP | 44-20189 | B | 8/1969 |
| JP | 6-105353 | A | 4/1994 |
| JP | 8-276558 | A | 10/1996 |
| JP | 10207056 | A2 * | 8/1998 |
| JP | 11-95433 | A | 4/1999 |
| JP | 2938397 | B2 | 6/1999 |
| JP | 2000-112121 | A | 4/2000 |
| JP | 2000-211262 | A | 8/2000 |
| JP | 2001-277740 | A | 10/2001 |
| JP | 2001-290271 | A | 10/2001 |
| JP | 2001-337454 | A | 12/2001 |
| JP | 2002-12607 | A | 1/2002 |
| JP | 2002-29162 | A | 1/2002 |
| JP | 2002-46361 | A | 2/2002 |
| JP | 2002-107927 | A | 4/2002 |
| JP | 2002-137562 | A | 5/2002 |
| JP | 2002-326470 | A | 11/2002 |
| JP | 2003-005357 | A | 1/2003 |
| JP | 2003 107751 | A | 4/2003 |
| JP | 2004-117533 | A1 | 4/2004 |
| JP | 2004 163853 | A | 6/2004 |
| JP | 2004-317652 | A | 11/2004 |
| JP | 2005-049640 | A | 2/2005 |
| JP | 2005-271338 | A | 10/2005 |
| JP | 2005 292734 | A | 10/2005 |
| JP | 2005-300817 | A | 10/2005 |
| JP | 2006-106700 | A | 4/2006 |
| JP | 2006 142552 | A | 6/2006 |
| JP | 2006-145901 | A | 6/2006 |
| JP | 2006-256132 | A | 9/2006 |
| JP | 2008 52264 | A | 3/2008 |

OTHER PUBLICATIONS

Partial European Search Report dated Dec. 17, 2008.
Extended European Search Report dated Jun. 26, 2009.
Office Action dated Jul. 19, 2011 on Japanese Application No. 2006-350047.
Office Action dated Apr. 10, 2012 on Japanese Application No. 2006-350047.
Partial English-language translation of Japanese Patent Publication No. 2003-005357.
Partial English-language translation of Japanese Patent Publication No. 2000-112121.
Partial English-language translation of Japanese Patent Publication No. 2004-317652.
Office Action dated Oct. 23, 2012 in Japanese Patent Application No. 2007-334588.

* cited by examiner

*Primary Examiner* — John Chu
(74) *Attorney, Agent, or Firm* — Sughrue Mion, PLLC

(57) ABSTRACT

A polymerizable composition contains a binder polymer containing a functional group having a dipole moment of 3.8 debye or more and being represented by the formula (1), (2), (3), (4) or (5) as defined herein, a radical polymerizable compound and a radical polymerization initiator.

15 Claims, 1 Drawing Sheet

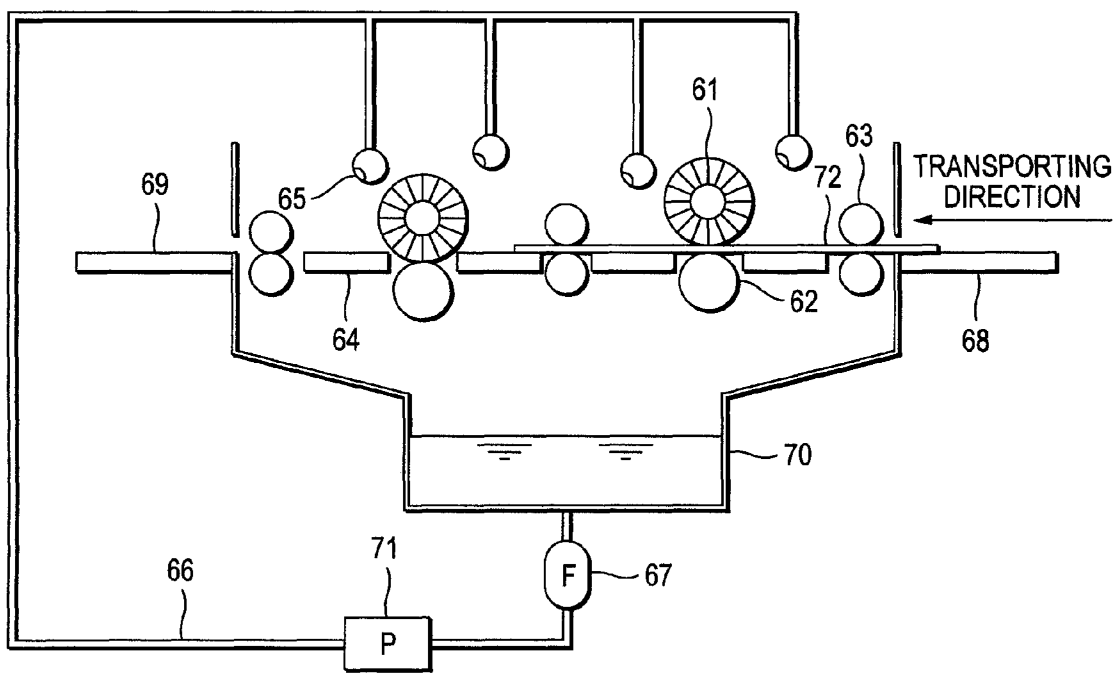
61
63
TRANSPORTING
DIRECTION
72
69
65
64
62
68
70
71
66
P
F
67

POLYMERIZABLE COMPOSITION, LITHOGRAPHIC PRINTING PLATE PRECURSOR AND LITHOGRAPHIC PRINTING METHOD

FIELD OF THE INVENTION

The present invention relates to a polymerizable composition capable of utilizing for image forming materials, for example, three-dimensional photo-modeling, holography, lithographic printing plate precursors, color proof, photoresists or color filters, and photo-curable resin materials, for example, ink, paint and adhesives. Also, it relates to a lithographic printing plate precursor that is capable of being subjected to a so-called direct plate-making, in which the plate-making is directly conducted based on digital signals, for example, from a computer using various kinds of lasers, particularly, to a lithographic printing plate precursor of a simple processing type which does not need alkali development, and a lithographic printing method using the lithographic printing plate precursor.

BACKGROUND OF THE INVENTION

A solid laser, semiconductor laser and gas laser having a large output and a small size, which radiate an ultraviolet ray, visible light or infrared ray having a wavelength of 300 to 1,200 nm, have become easily available, and these lasers are very useful for recording light sources used in the direct plate-making based on digital signals, for example, from a computer. Various investigations on recording materials sensitive to such laser beams have been made. Typical examples thereof include first recording materials capable of being recorded with a infrared laser having a wavelength of not less than 760 nm, for example, positive-working recording materials as described in U.S. Pat. No. 4,708,925 and acid catalyst crosslinking type negative-working recording materials described in JP-A-8-276558 (the term “JP-A” as used herein means an “unexamined published Japanese patent application”), and secondly recording materials responsive to an ultraviolet ray or visible light laser having a wavelength of from 300 to 700 nm, for example, radical polymerization type negative-working recording materials as described in U.S. Pat. No. 2,850,445 and JP-B-44-20189 (the term “JP-B” as used herein means an “examined Japanese patent publication”). Although these materials have image-forming sensitivity sufficient for practical use, further improvement in sensitivity has been requested in order to extend the life of exposure light source or increase a number of printing plates produced per hour (improvement in productivity).

Ordinarily, a binder is added to a photosensitive layer used in the image-forming material and the binder has a function for increasing image strength, heat resistance of the layer or the like. For instance, it is described that in the case of using a binder containing a maleimido group in its side chain, the heat resistance of the cured layer obtained is increased due to excellent thermal stability of the maleimido group (see JP-A-2001-337454). It is described that in the case of using a polymer containing an ethylenically unsaturated bond in its side chain, photosensitive compositions capable of providing a cured layer having high strength are obtained because the binder is involved in the polymerization to form a layer having higher crosslink density (see JP-A-6-105353). It is described that in the case of using a binder containing a cyclic ether group and an ethylenically unsaturated bond in its side chain due to high hydrophilicity of the cyclic ether group, image-forming materials capable of providing a cured layer having a preferable developing property with an aqueous solution and high strength are obtained (see JP-A-2002-12607). It is described that in the case of using a binder obtained by copolymerization of a monomer wherein a methyl group in the methacryl group is substituted with a hetero atom, since compatibility with a radical polymerizable compound is improved, an amount of the radical polymerizable compound can be increased thereby obtaining photopolymerizable compositions having good preservation stability and providing a layer having high film strength (see JP-A-2002-107927). It is described that in the case of using a binder containing as an alkali-hydrolyzable group, a lactone group or an acid anhydride group in its side chain, since the developing property is increased by hydrolysis of the lactone ring, photopolymerizable compositions capable of forming a cured layer with high sensitivity and high resolution are obtained (see JP-A-2004-317652). In the lactone group or acid anhydride group described as the alkali-hydrolyzable group in JP-A-2004-317652, a few functional groups having a dipole moment of 3.8 debye or more are involved. However, these groups incidentally have the dipole moment of 3.8 debye or more and the technical concept relating to the functional group having a dipole moment of 3.8 debye or more is neither disclosed nor suggested in JP-A-2004-317652. It is described that in the case of using a polymer including a phenyl group substituted with a vinyl group in its side chain, since the phenyl groups substituted with a vinyl group are present as an aligned state in the layer, the polymerization reaction is apt to progress so that photosensitive compositions having high sensitivity and being free from latent image fading can be obtained, although the reason for this is not clear (see JP-A-2001-290271). It is described that in the case of using a binder containing a multipoint hydrogen bond-forming group, because of the presence of crosslink due to the hydrogen bond in addition to crosslink due to the radical polymerization, polymerizable compositions capable of providing a layer having high sensitivity and high strength are obtained (see JP-A-2005-300817). In the amido group described as the multipoint hydrogen bond-forming group in JP-A-2005-300817, a few functional groups having a dipole moment of 3.8 debye or more are involved. However, these groups incidentally have the dipole moment of 3.8 debye or more and the technical concept relating to the functional group having a dipole moment of 3.8 debye or more is neither disclosed nor suggested in JP-A-2005-300817. Moreover, in any of the patent documents there is no description as to the increase in radical polymerization reactivity of the radical polymerizable compound by means of these binders and the resulting improvements in both sensitivity and printing durability.

On the other hand, with respect to short wavelength light of not more than 300 nm or electron beam, radical polymerizable compositions are especially important for photoresist materials. In recent years, in integrated circuits, the degree of integration is more and more increased and in the production of a semiconductor substrate of VLSI or the like, fabrication of super-fine patterns composed of line width of finer than half micron has been required. In order to fulfill such requirements, the wavelength of light source used in an exposure apparatus in photolithography is more and more shortened and the use of a far ultraviolet ray or an excimer laser (for example, XeCl, KrF or ArF) has been investigated. Further, the formation of super-fine patterns by an electron beam has been investigated. Particularly, the electron beam is regarded as a promising light source for next-generation pattern forming technique.

In the photoresist materials, also, further increase in sensitivity has been requested in order to increase the productivity.

Further, with respect to hitherto known PS plates, a step of removing the non-image area by dissolution (development processing) is indispensable and a post-processing step, for example, washing the printing plate after the development processing with water, treatment of the printing plate after the development processing with a rinse solution containing a surfactant or treatment of the printing plate after the development processing with an oil-desensitizing solution containing gum arabic or a starch derivative, is also necessary. The point that such additional wet treatments are indispensable is a large subject of investigation in hitherto known PS plates. Even when the first half (image-forming process) of plate-making process is simplified by the above-described digital processing, the effects due to the simplification is still insufficient as long as the last half (development processing) is the troublesome wet treatment.

Particularly, the consideration for global environment has become a great concern throughout the field of industry in recent years. In view of the consideration for global environment, a treatment with a developer closer to a neutral range and a small amount of waste liquid are subjects of further investigations. Further, it is desirable that the wet type post-processing is simplified or changed to a dry processing.

From this viewpoint, as one method for eliminating the processing step, a method referred to as on-machine development wherein an exposed printing plate precursor is mounted on a cylinder of a printing machine and the non-image area of the printing plate precursor is removed by supplying dampening water and ink while rotating the cylinder is known. Specifically, according to the method, the printing plate precursor is exposed and mounted on a printing machine as it is to complete development processing in a conventional process of printing.

A lithographic printing plate precursor suitable for the on-machine development is required to have an image-forming layer soluble in dampening water or an ink solvent and a bright room handling property suitable for development on a printing machine placed in a bright room.

However, it is substantially impossible for hitherto known PS plates to fulfill such requirements.

In order to fulfill such requirements, a lithographic printing plate precursor having provided on a hydrophilic support an image-forming layer in which fine particles of thermoplastic hydrophobic polymer are dispersed in a hydrophilic binder polymer is proposed (see, for example, Japanese Patent 2,938,397). In the plate-making, the lithographic printing plate precursor is exposed to an infrared laser to agglomerate (fuse) the fine particles of thermoplastic hydrophobic polymer by heat generated by light-to-heat conversion thereby forming an image, and mounted on a cylinder of a printing machine to carry out on-machine development by supplying at least any one of dampening water and ink. Since the lithographic printing plate precursor has the sensitive zone in an infrared region, it has also the handling property in a bright room.

However, the image formed by the agglomeration (fusion) of the fine particles of thermoplastic hydrophobic polymer is insufficient in strength and has a problem of printing durability as a printing plate.

Lithographic printing plate precursors including microcapsules containing a polymerizable compound incorporated therein in stead of the thermoplastic fine particles are also proposed (see, for example, JP-A-2000-211262, JP-A-2001-277740, JP-A-2002-29162, JP-A-2002-46361, JP-A-2002-137562 and JP-A-2002-326470). In the lithographic printing plate precursors according to such a proposal, it is advantageous that the polymer image formed by a reaction of the polymerizable compound is excellent in the strength in comparison with the image formed by the fusion of the fine particles.

Also, since the polymerizable compound has high reactivity, many proposals of isolation of the polymerizable compound using microcapsules have been made. Further, it has been proposed to use a thermally degradable polymer in a shell of the microcapsule.

However, in the hitherto known lithographic printing plate precursors described in Japanese Patent 2,938,397, JP-A-2000-211262, JP-A-2001-277740, JP-A-2002-29162, JP-A-2002-46361, JP-A-2002-137562 and JP-A-2002-326470, the image formed by laser exposure is insufficient in the sensitivity and printing durability and further improvements are requested. Specifically, in such a lithographic printing plate precursor of a simple processing type, a photosensitive layer having high hydrophilicity is used in order to make development with an aqueous solution having pH of 10 or less or dampening water (ordinarily nearly neutral) on a printing machine and as a result, the image area is apt to be destroyed. Even when the binders as described in JP-A-2001-337454, JP-A-6-105353, JP-A-2002-12607, JP-A-2002-107927, JP-A-2004-317652, JP-A-2001-290271 and JP-A-2005-300817 are used in such lithographic printing plate precursors, lithographic printing plate precursors satisfying the simple processing aptitude, sensitivity and printing durability can not be obtained.

SUMMARY OF THE INVENTION

Therefore, an object of the present invention is to provide a radical polymerizable composition having sensitivity higher than those of hitherto known radical polymerizable compositions. Another object of the invention is to provide a lithographic printing plate precursor capable of being subjected to a direct plate-making based on digital data, for example, from a computer by image-recording using a solid laser or semiconductor laser radiating an ultraviolet ray, visible light or infrared ray, particularly, a lithographic printing plate precursor of a simple processing type having high sensitivity and high printing durability capable of being developed with an aqueous solution having pH of 10 or less or on a printing machine, and a lithographic printing method using the lithographic printing plate precursor.

As a result of the intensive investigations, it has been found that the above-described objects can be achieved by using a radical polymerizable composition comprising a binder polymer containing a functional group having a dipole moment of 3.8 debye or more, a radical polymerizable compound and a radical polymerization initiator, or a lithographic printing plate precursor comprising a support having thereon a photosensitive layer comprising a binder polymer which contains a functional group having a dipole moment of 3.8 debye or more and has an acid value of 0.3 meq/g or less, a radical polymerizable compound and a radical polymerization initiator, and a lithographic printing method using the lithographic printing plate precursor.

Specifically, the present invention includes the following items.

(1) A polymerizable composition comprising a binder polymer containing a functional group having a dipole moment of 3.8 debye or more and being represented by formula (1), (2), (3), (4) or (5) shown below, a radical polymerizable compound and a radical polymerization initiator:

(1)

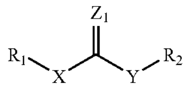

(2)

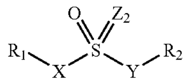

(3)

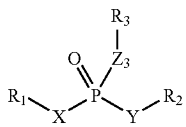

(4)

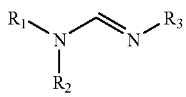

(5)

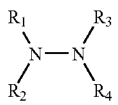

In formulae (1) to (5), X and Y each represents —$C(R_5)(R_6)$—, —$C(R_5)$=, —O—, —S—, —$N(R_5)$— or —N=, $Z_1$ represents O or S, $Z_2$ represents O or a lone pair, $Z_3$ represents —$C(R_5)(R_6)$—, —$C(R_5)$=, —O—, —S—, —$N(R_5)$— or —N=, $R_1$ to $R_6$ each represents a substituent comprising at least one atom selected from hydrogen, carbon, oxygen, nitrogen, sulfur, phosphorus, halogen and silicon or appropriate two of $R_1$ to $R_6$ may be combined with each other to form a ring, provided that at least one of $R_1$ to $R_6$ represents a divalent connecting group comprising at least one atom selected from hydrogen, carbon, oxygen, nitrogen, sulfur, phosphorus, halogen and silicon and connecting to a skeleton of the binder polymer, and provided that in formula (1), (i) when X is —O— and $Z_1$, is O, $R_1$, Y and $R_2$ are not combined with each other to form —$CH_2$)n- (wherein n is 3 or 4) or —C(=O)—$(CH_2)_2$—, (ii) when X is —N= and $Z_1$ is O, $R_1$, Y and $R_2$ are not combined with each other to form =CH—NH—CH=CH—, and (iii) X is —$N(R_5)$— and $Z_1$, is O, $R_1$, Y and $R_2$ are not combined with each other to form —CH=CH—CH=CH—.

(2) The polymerizable composition as described in (1), wherein the binder polymer includes more than 20% by mole of a repeating unit containing the functional group having a dipole moment of 3.8 debye or more.

(3) The polymerizable composition as described in (1) or (2) which further comprises a sensitizing dye having absorption in a wavelength of 300 to 1,200 nm.

(4) An image-forming material comprising a support having thereon a layer comprising the polymerizable composition as described in any one of (1) to (3).

(5) A lithographic printing plate precursor comprising a support of a hydrophilic surface having thereon a photosensitive layer comprising the polymerizable composition as described in any one of (1) to (3).

(6) The lithographic printing plate precursor as described in (5) which has a protective layer on the photosensitive layer.

(7) A lithographic printing plate precursor comprising a support having thereon a photosensitive layer comprising a binder polymer which contains a functional group having a dipole moment of 3.8 debye or more and has an acid value of 0.3 meq/g or less, a radical polymerizable compound and a radical polymerization initiator.

(8) The lithographic printing plate precursor as described in (7), wherein the functional group having a dipole moment of 3.8 debye or more is a frictional group represented by formula (1), (2), (3), (4) or (5) shown below:

(1)

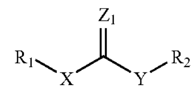

(2)

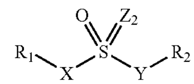

(3)

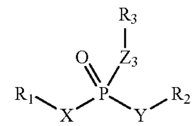

(4)

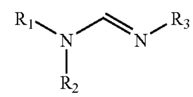

(5)

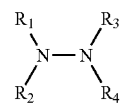

In formulae (1) to (5), X and Y each represents —$C(R_5)(R_6)$—, —$C(R_5)$=, —O—, —S—, —$N(R_5)$—or —N=, $Z_1$ represents O or S, $Z_2$ represents O or a lone pair, $Z_3$ represents —$C(R_5)(R_6)$—, —$C(R_5)$=, —O—, —S—, —$N(R_5)$— or —N=, and $R_1$ to $R_6$ each represents a substituent comprising at least one atom selected from hydrogen, carbon, oxygen, nitrogen, sulfur, phosphorus, halogen and silicon or appropriate two of $R_1$ to $R_6$ may be combined with each other to form a ring, provided that at least one of $R_1$ to $R_6$ represents a divalent connecting group comprising at least one atom selected from hydrogen, carbon, oxygen, nitrogen, sulfur, phosphorus, halogen and silicon and connecting to a skeleton of the binder polymer.

(9) The lithographic printing plate precursor as described in (7) or (8), wherein the binder polymer includes more than 20% by mole of a repeating unit containing the functional group having a dipole moment of 3.8 debye or more.

(10) The lithographic printing plate precursor as described in any one of (7) to (9), wherein the photosensitive layer further comprises a sensitizing dye having absorption in a wavelength of 300 to 1,200 nm.

(11) The lithographic printing plate precursor as described in any one of (7) to (10) which has a protective layer on the photosensitive layer.

(12) The lithographic printing plate precursor as described in any one of (7) to (11) which is capable of being developed with an aqueous solution having pH of 10 or less.

(13) The lithographic printing plate precursor as described in any one of (7) to (11) which is capable of performing printing by mounting on a printing machine after image exposure without carrying out any processing.

(14) A lithographic printing method comprising (i) mounting the lithographic printing plate precursor as described in (13) on a printing machine, exposing it imagewise with a laser or (ii) exposing the lithographic printing plate precursor as described in (13) imagewise with a laser and mounting the exposed lithographic printing plate precursor on a printing machine, then supplying printing ink and dampening water on the exposed lithographic printing plate precursor to remove an unexposed area of the photosensitive layer and printing.

According to the present invention, a polymerizable composition having high sensitivity can be obtained. Also, a polymerizable composition having high sensitivity capable of utilizing for image forming materials, for example, three-dimensional photo-modeling holography, lithographic printing plate precursors, color proofs, photoresists or color filters, and photo-curable resin materials, for example, ink, paint and adhesives can be obtained. Further, a lithographic printing plate precursor that is capable of being subjected to a so-called direct plate-making, in which the plate-making is directly conducted based on digital signals, for example, from a computer using various kinds of lasers, particularly, a lithographic printing plate precursor of a simple processing type which does not need development with an aqueous alkali solution, and a lithographic printing method using the lithographic printing plate precursor are obtained.

BRIEF DESCRIPTION OF THE DRAWINGS

FIG. 1 is an illustration for showing a structure of an automatic development processor.

DESCRIPTION OF REFERENCE NUMERALS AND SIGNS

61: Rotating brush roller
62: Backing roller
63: Transport roller
64: Transport guide plate
65: Spray pipe
66: Pipe line
67: Filter
68: Plate supply table
69: Plate discharge table
70: Developer tank
71: Circulating pump
72: Plate

DETAILED DESCRIPTION OF THE INVENTION

The invention will be described in more detail below.

At the beginning, the binder polymer containing a functional group having a dipole moment of 3.8 debye or more for use in the polymerizable composition according to the invention is described in detail below.

[Binder Polymer Containing a Functional Group Having a Dipole Moment of 3.8 Debye or More]

The binder polymer containing a functional group having a dipole moment of 3.8 debye or more for use in the polymerizable composition according to the invention is a binder polymer including a functional group having a dipole moment of 3.8 debye or more in any position of the main chain and side chain thereof. The dipole moment as used herein is described below.

As the dipole moment used in the invention, a value determined by the method shown below using a molecular orbital method is adopted. Although the dipole moment is calculated by solving the Hartree-Fock-Roothaan equation: FC=SCN (wherein F represents Hartree-Fock matrix, C represents AO coefficient matrix, S represents overlap integration, and E represents energy eigenvalue diagonal matrix), "MOPAC" which is a calculation program of semiempirical molecular orbital method is used in the invention. The "MOPAC": is a method for considerably decreasing the calculation amount by neglecting differential overlap in two-electron integration and using experimental values of atoms or certain typical molecules as parameters (for example, AMI parameter) in place of the integral calculations and it is a calculation method well known in the industrial field. The details thereof are described in *Jikken Kagakukoza 5th edition* 12 *Keisan Kagaku*, pages 48 to 59, compiled by The Chemical Society of Japan, Maruzen Co., Ltd. The dipole moment used in the invention can be determined with reference to these descriptions.

In the invention, although any binder polymer including a functional group having a dipole moment of 3.8 debye or more can be preferably used it is more preferable to use a binder polymer including a functional group having a larger dipole moment. Specifically, a binder polymer including a functional group having a dipole moment of 4.5 debye or more is more preferable and a binder polymer including a functional group having a dipole moment of 5.0 debye or more is particularly preferable.

The upper limit of the dipole moment of the functional group according to the invention is preferably 10 or less, more preferably 8.5 or less, still more preferably 7.0 or less.

In the determination of the dipole moment of the functional group according to the invention, a dipole moment of a compound formed by substituting a bond of a functional group, for example, a hydroxy group, a carboxylic acid group, an ester group or an ether group, or a functional group formed by combination of these groups, which connects to a binder polymer with a hydrogen atom is determined and the value obtained is indicated as a dipole moment of the functional group. A molecular weight of the compound used for the determination of dipole moment is preferably from 50 to 300, more preferably from 60 to 280, still more preferably from 70 to 250.

As the functional group having a dipole moment of 3.8 debye or more for use in the binder polymer of the polymerizable composition according to the invention, functional groups represented by formulae (1) to (5) shown below are preferable.

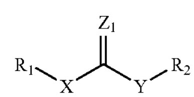
(1)

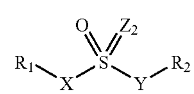
(2)

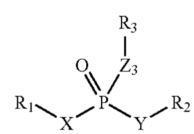
(3)

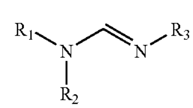
(4)

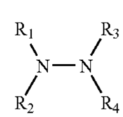
(5)

In formulae (1) to (5), X and Y each represents —C($R_5$)($R_6$)—, —C($R_5$)═, —O—, —S—, —N($R_5$)— or —N═, $Z_1$ represents O or S, $Z_2$ represents O or a lone pair, $Z_3$ represents —C($R_5$)($R_6$)—, —C($R_5$)═, —O—, —S—, —N($R_5$)— or —N═, $R_1$ to $R_6$ each represents a substituent comprising at least one atom selected from hydrogen, carbon, oxygen, nitrogen, sulfur, phosphorus, halogen and silicon or appropriate two of $R_1$ to $R_6$ may be combined with each other to form a ring, provided that at least one of $R_1$ to $R_6$ represents a divalent connecting group comprising at least one atom selected from hydrogen, carbon, oxygen, nitrogen, sulfur, phosphorus, halogen and silicon and connecting to a skeleton of the binder polymer, and provided that in formula (1), (i) when X is —O— and $Z_1$ is O, $R_1$, Y and $R_2$ are not combined with each other to form —$CH_2)_n$— (wherein n is 3 or 4) or —C(═O)—($CH_2$)$_2$—, (ii) when X is —N═ and $Z_1$ is O, $R_1$, Y and $R_2$ are not combined with each other to form ═CH—NH—CH═CH—, and (iii) X is —N($R_5$)— and $Z_1$ is O, $R_1$, Y and $R_2$ are not combined with each other to form —CH═CH—CH═CH—.

The substituent comprising at least one atom selected from hydrogen, carbon, oxygen, nitrogen, sulfur, phosphorus, halogen and silicon represented by any one of $R_1$ to $R_6$ includes monovalent or divalent substituents formed from —H, —F, —Cl, —Br, —I, >C<, ═C<, ≡C—, —O—, O═, —N<, —N═, ≡N, —S—, S═, >S<, ≡S≡, —P<, ≡P<, >Si<, ═Si<, ≡Si— and combinations thereof. Examples of the monovalent substituent include a hydrogen atom, an alkyl group [for example, a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group, a 2-norbornyl group, a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-methoxyphenyl)carbamoylethyl group, an N-methyl-N-sulfophenyl)carbamoylmethyl group, a sulfobutyl group, a sulfonatobutyl group, a sulfamoylbutyl group, an N-ethylsulfamoylmethyl group, an N,N-dipropyl-sulfamoylpropyl group, an N-tolylsulfamoylpropyl group, an N-methyl-N-phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, a 2-methylpropenylmethyl group a 2-methylpropenylmethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group or a 3-butynyl group), an aryl group [for example, a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a nitrophenyl group, a cyanophenyl group, a sulfophenyl group, a sulfonatophenyl group, a phosphonophenyl group or a phosphonatophenyl group], a heteroaryl group [for example, a group derived from a heteroaryl ring, for example, thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthylidine, quinazoline, cinnoline, pteridine, carbazole, carboline, phenanthrine, acridine, perimidine, phenanthroline, phthalazine, phenarsazine, phenoxazine, furazane or phenoxazine], an alkenyl group [for example, a vinyl group, a 1-propenyl group, a 1-butenyl group, a cinnamyl group or a 2-chloro-1-ethenyl group], an alkynyl group [for example, an ethynyl group, a 1-propynyl group, a 1-butynyl group or a trimethylsilylethynyl group], a halogen atom [for example, —F, —Br, —Cl or —I], a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diaryl-carbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and its conjugated base group (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—$PO_3H_2$) and its conjugated base group (hereinafter referred to as a "phosphonato group", a dialkylphosphono group (—$PO_3$(alkyl)$_2$), a diarylphosphono group (—$PO_3$(aryl)$_2$), an alkylarylphosphono group (—$PO_3$(alkyl)(aryl)), a monoalkylphosphono group (—$PO_3$H(alkyl)) and its conjugated base group (hereinafter referred to as an "alkylphosphonato group"), a monoarylphosphono group (—$PO_3$H(aryl)) and its conjugated base group (hereinafter referred to as an "arylphosphonato group"), a phosphonooxy group (—$OPO_3H_2$) and its conjugated base group (hereinafter referred to as a "phosphonatooxy group"), a dialkylphosphonooxy group (—$OPO_3$(alkyl)$_2$), a diarylphosphonooxy group (—$OPO_3$(aryl)$_2$), an alkylarylphosphonooxy group (—$OPO_3$(alkyl)(aryl)), a monoalkylphosphonooxy group (—$OPO_3$H(alkyl)) and its conjugated base group (hereinafter referred to as an "alkylphosphonatooxy group"), a monoarylphosphonooxy group (—$OPO_3$H(aryl)) and its conjugated base group (hereinafter referred to as an "arylphosphonatooxy group"), a cyano group and a nitro group. Among the above-described groups, a hydrogen atom, an alkyl group, an aryl group, an alkenyl group, an alkynyl group, a halogen atom, an alkoxy group and an acyl group are preferable.

Examples of the divalent substituent include —$CX_1X_2$—, —CO—, —$NX_1$—, —O—, —S—, —$PX_1$—, —$SiX_1X_2$—, —$CX_1$=N—, —$SO_2$—, —CS—, —SO—, —$CX_1$=$CX_2$—, —C≡C—, —$POX_1$— (wherein $X_1$ and $X_2$ each represents the monovalent substituent described above) and substituents formed by combination of these groups. In case of the divalent substituent the functional group includes a cyclic structure. The divalent substituent forming a 4-membered to 8-membered ring is preferable. The cyclic structure may be saturated or unsaturated and may further have a condensed ring.

For instance, a functional group represented by formula (1) wherein X is —C($R_5$)($R_6$)— (wherein $R_5$ represents a hydrogen atom, and $R_6$, represents a connecting site to a binder polymer), $Z_1$, is O, Y is —C($R_5$)= (wherein $R_5$ and $R_1$ come together to represent —($CH_2$)$_3$—), and $R_2$ is O is a 2,3-dioxo-1-cyclohexyl group.

Of the functional groups, functional groups including a cyclic structure are preferable. Functional groups represented by formula (1) wherein X is —O—, —S— or —N($R_5$)—, Y is —O—, —S— or —N($R_5$)— and $Z_1$ is O or S, and including a cyclic structure, functional groups represented by formula (2) wherein X is —O—, —S— or —N($R_5$)—, Y is —O—, —S— or —N($R_5$)— and $Z_2$ is O or a lone pair, and including a cyclic structure, and functional groups represented by formula (3) wherein X is —O— or —C($R_5$)($R_6$)—, Y is —O— or —C($R_5$)($R_6$)— and $Z_3$ is —O— or —C($R_5$)($R_6$)—, and including a cyclic structure are more preferable.

Functional groups represented by formula (1) wherein (X, Y, $Z_1$) is (—O—, —O—, O), (—O—, —N($R_5$)—, O), (—O—, —C($R_5$)($R_6$)—, O), (—N($R_5$)—, —N($R_5$)—, O) or (—S—, —N($R_5$)—, O), and including a cyclic structure, functional groups represented by formula (2) wherein (X, Y, $Z_2$) is (—O—, —O—, O), (—O—, —N($R_5$)—, O), (—O—, —C($R_5$)($R_6$)—, O), (—N($R_5$)—, —N($R_5$)—, O), and including a cyclic structure, and functional groups represented by formula (3) wherein (X, Y, $Z_3$) is (—O—, —O—, O), (—O—, —O—, —C($R_5$)($R_6$)—), and including a cyclic structure are still more preferable.

Specific examples of the compound forming the functional group for use in the binder polymer of the polymerizable composition according to the invention are set forth below, but the invention should not be construed as being limited thereto. In the following three Tables, the chemical formulae are the specific examples of the compound forming the functional group, and the numerical values at the right sides of the formulae are dipole moments.

| 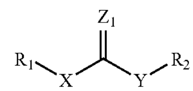 | (1) |
| --- | --- |
| 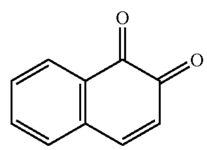 [SMILES: O=C1C=Cc2ccccc2C1=O] | 5.4 |
| 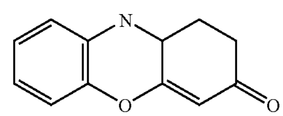 [SMILES: O=C1C=C2Oc3ccccc3NC2CC1] | 4.5 |
| 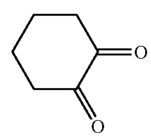 | 4.7 |
| 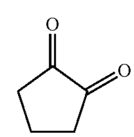 | 4.4 |
| 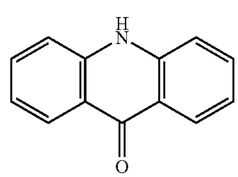 [SMILES: O=c1c2ccccc2[nH]c2ccccc12] | 4.2 |
| 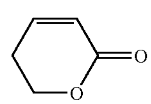 | 5.3 |
| 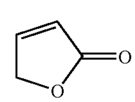 | 4.7 |
| 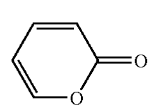 | 4.4 |
| 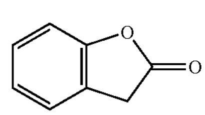 | 4.1 |

-continued
| 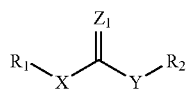 | (1) |
|---|---|
| 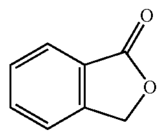 | 5.1 |
| 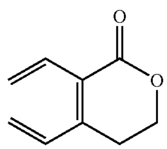 | 5.1 |
| 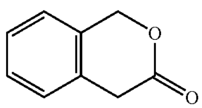 [SMILES: O=C1Cc2ccccc2CO1] | 4.8 |
| 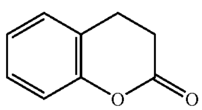 [SMILES: O=C1CCc2ccccc2O1] | 4.2 |
| 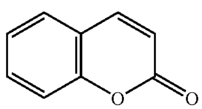 [SMILES: O=c1ccc2ccccc2o1] | 4.8 |
| 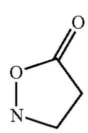 | 4.5 |
| 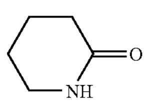 | 4.0 |
| 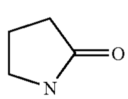 | 3.8 |
| 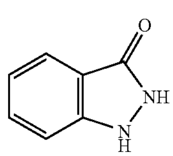 | 4.3 |
| 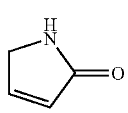 | 4.2 |
| 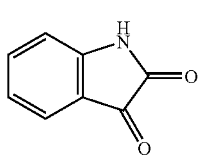 [SMILES: O=C1Nc2ccccc2C1=O] | 5.1 |
| 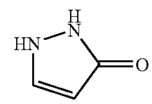 | 5.6 |
| 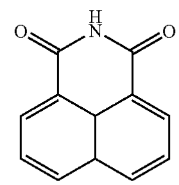 [SMILES: O=C1NC(=O)C2=CC=CC3C=CC=C1C23] | 5.1 |
| 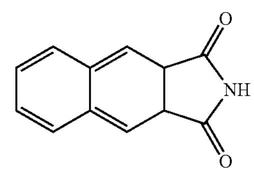 [SMILES: O=C1NC(=O)C2C=c3ccccc3=CC12] | 4.2 |
| 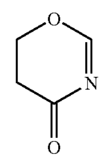 | 4.2 |
| 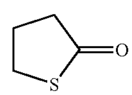 | 3.9 |
| 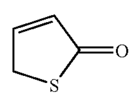 | 4.2 |
| 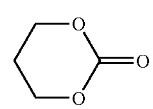 | 5.9 |
| 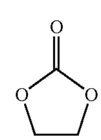 | 5.1 |
| 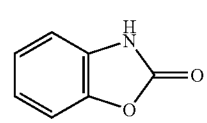 | 4.5 |
| 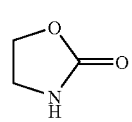 | 5.1 |
| 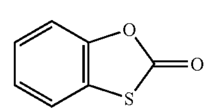 | 4.3 |

-continued
| | |
|---|---|
| 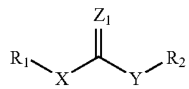 | (1) |
| 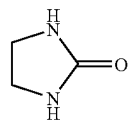 | 4.3 |
| 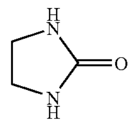 | 5.8 |
| 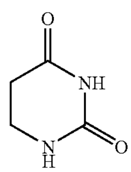 | 4.2 |
| 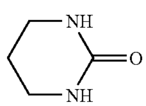 | 4.5 |
| 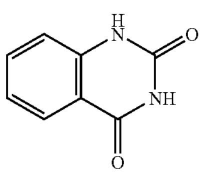 [SMILES: O=c1[nH]c(=O)c2ccccc2[nH]1] | 4.2 |
| 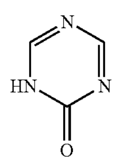 | 4.2 |
| 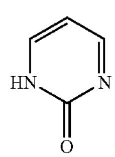 | 5.5 |
| 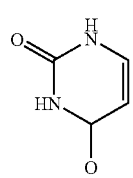 | 4.3 |
| 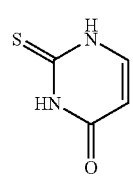 | 4.6 |
-continued
| | |
|---|---|
| 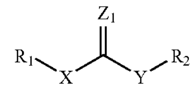 | (1) |
| 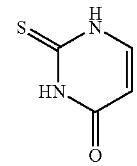 | 4.7 |
| 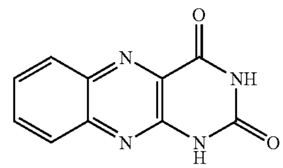 [SMILES: O=c1[nH]c(=O)c2nc3ccccc3nc2[nH]1] | 4.1 |
| 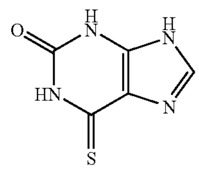 | 7.0 |
| 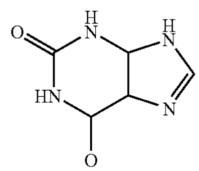 [SMILES: O=C1NC(O)C2N=CNC2N1] | 6.6 |
| 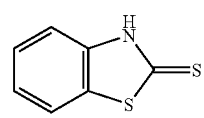 | 4.6 |
| 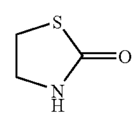 | 4.7 |
| 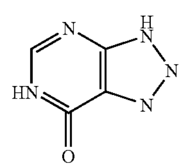 | 5.7 |
| 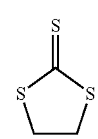 | 4.0 |
| 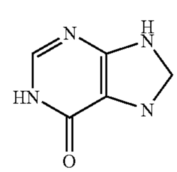 | 4.9 |

-continued
| (1) | |
|---|---|
| 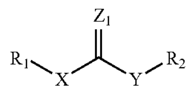 | |
| 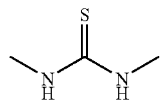 | 5.3 |
| 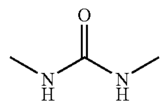 | 3.9 |
| 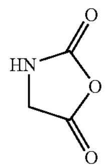 | 5.2 |
| 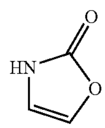 | 4.8 |
| (2) | |
|---|---|
| 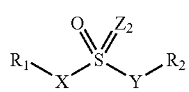 | |
| 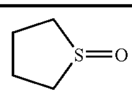 | 3.9 |
| 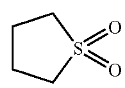 | 4.3 |
| 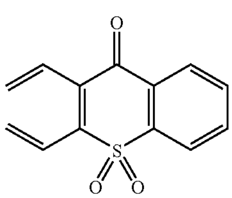 [SMILES: C=CC1=C(C=C)S(=O)(=O)c2ccccc2C1=O] | 4.1 |
| 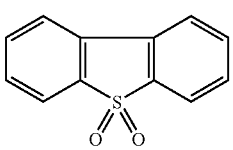 | 5.4 |
| 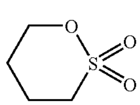 | 4.7 |
| 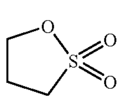 | 4.9 |
-continued
| (2) | |
|---|---|
| 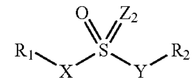 | |
| 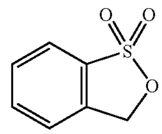 [SMILES: O=S1(=O)OCc2ccccc21] | 6.2 |
| 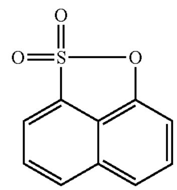 [SMILES: O=S1(=O)Oc2cccc3cccc1c23] | 5.8 |
| 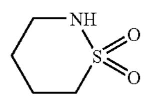 | 4.9 |
| 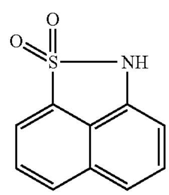 | 4.7 |
| 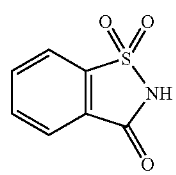 [SMILES: O=C1NS(=O)(=O)c2ccccc21] | 4.1 |
| 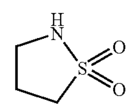 | 4.7 |
| 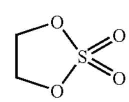 | 4.0 |
| 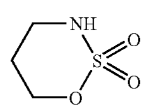 | 5.5 |
| 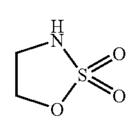 | 5.4 |
| 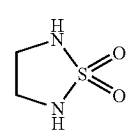 | 5.1 |
| 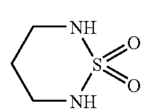 | 5.5 |

-continued
| | |
|---|---|
| 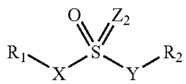 | (2) |
| 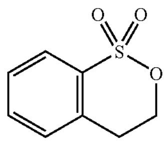 [SMILES: O=S1(=O)OCCc2ccccc21] | 6.3 |
| 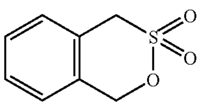 [SMILES: O=S1(=O)Cc2ccccc2CO1] | 5.3 |
| 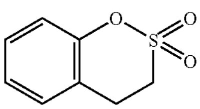 [SMILES: O=S1(=O)CCc2ccccc2O1] | 4.6 |
| 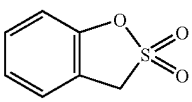 [SMILES: O=S1(=O)Cc2ccccc2O1] | 4.4 |
| 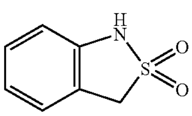 [SMILES: O=S1(=O)Cc2ccccc2N1] | 4.1 |
| 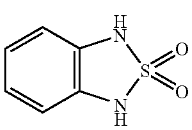 [SMILES: O=S1(=O)Nc2ccccc2N1] | 3.9 |
| 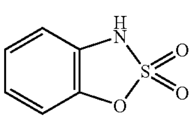 | 4.7 |
| 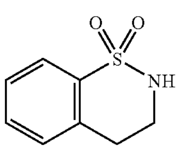 [SMILES: O=S1(=O)NCCc2ccccc21] | 5.4 |
| 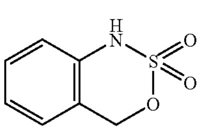 | 5.6 |
| 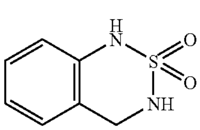 [SMILES: O=S1(=O)NCc2ccccc2N1] | 4.8 |
| 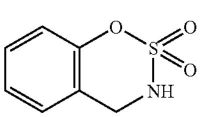 [SMILES: O=S1(=O)NCc2ccccc2O1] | 5.1 |
-continued
| | |
|---|---|
| 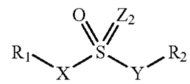 | (2) |
| 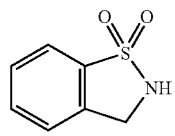 [SMILES: O=S1(=O)NCc2ccccc21] | 5.3 |
| 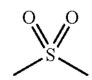 | 4.1 |
| 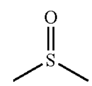 | 3.9 |
| 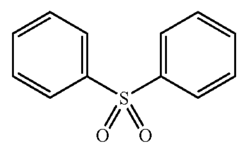 [SMILES: O=S(=O)(c1ccccc1)c1ccccc1] | 4.7 |
| 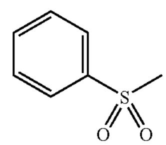 | 4.9 |
| 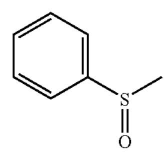 | 3.9 |
| | |
|---|---|
| 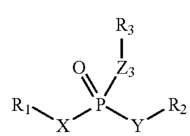 | (3) |
| 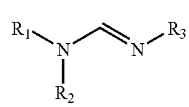 | (4) |
| 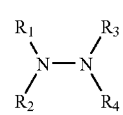 | (5) |
| 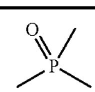 | 5.0 |
| 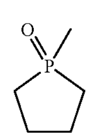 | 4.9 |

-continued

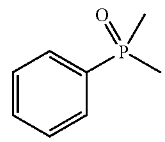
5.2

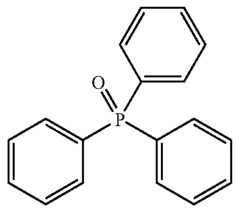 [SMILES: O=P(c1ccccc1)(c1ccccc1)c1ccccc1]
5.3

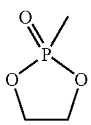
4.7

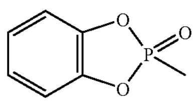
4.7

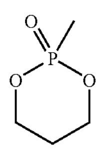
6.9

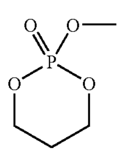
5.2

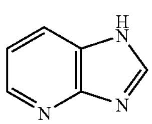
5.3

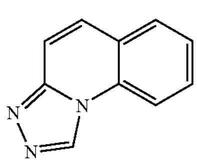 [SMILES: c1ccc2c(c1)ccc1nncn12]
5.9

-continued

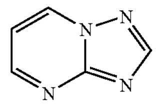
4.1

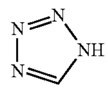
5.1

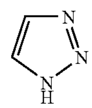
4.1

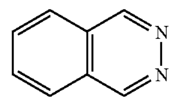
4.6

The binder polymer used in the polymerizable composition according to the invention is a polymer compound including a functional group having a dipole moment of 3.8 debye or more. The polymer compound is preferably a polymer compound selected from an acrylic resin, a methacrylic resin, a styrene resin, a vinyl acetal resin, a urethane resin, a urea resin, an amide resin, an ester resin, a carbonate resin and an epoxy resin, and more preferably an acryl resin or a urethane resin. The binder polymer used in the polymerizable composition according to the invention can be produced by polymerization of a polymerization component including a functional group having a dipole moment of 3.8 debye or more.

Specific examples of the polymerization component including a functional group having a dipole moment of 3.8 debye or more for use in the binder polymer of the polymerizable composition according to the invention are set forth below as a repeating unit, but the invention should not be construed as being limited thereto. In the specific examples below, U-1 to U-135 are repeating units preferable for forming an acrylic resin, methacrylic resin, styrene resin or the like and V-1 to V-45 are repeating units preferable for forming a urethane resin, urea resin, amide resin, ester resin, carbonate resin or the like.

U-1

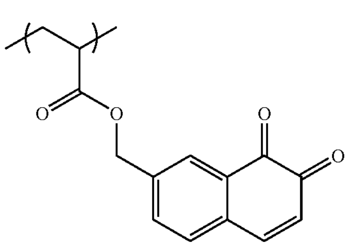

U-2

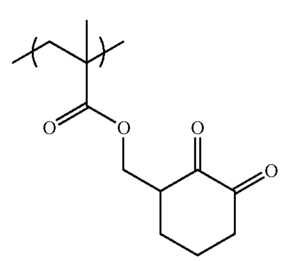

-continued
U-3
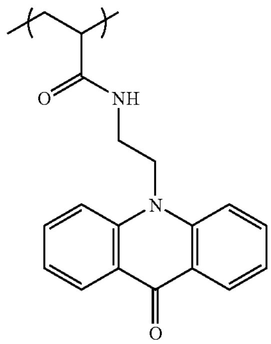
U-4
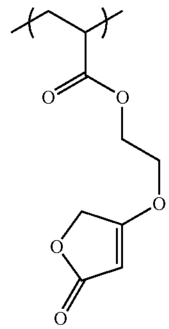
U-5
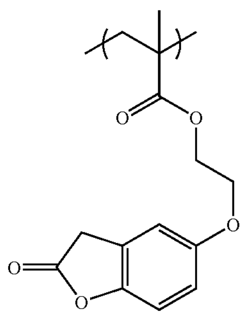
U-6
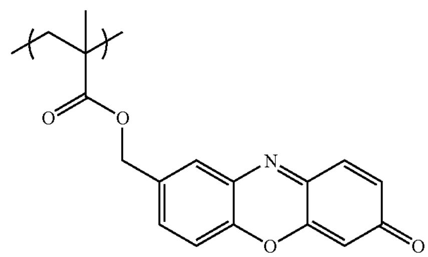
U-7
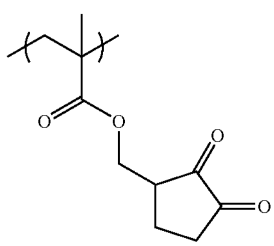
U-8
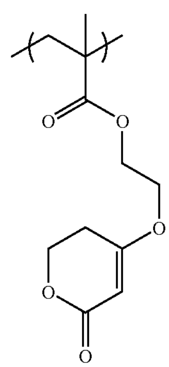
U-9
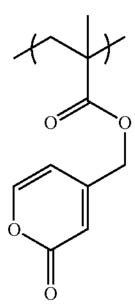
U-10
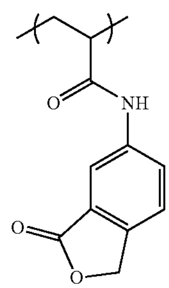
U-11
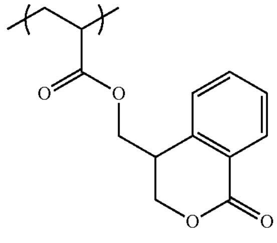
U-12
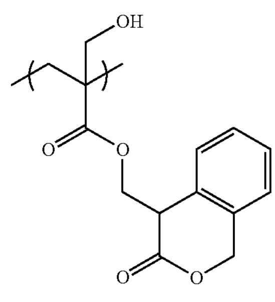

-continued
U-13
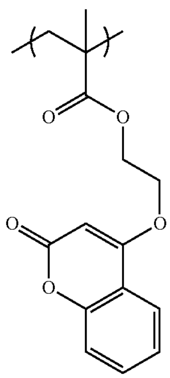
U-14
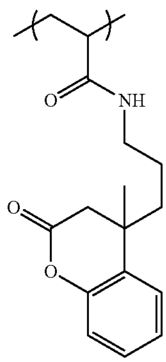
U-15
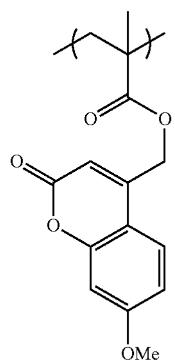
U-16
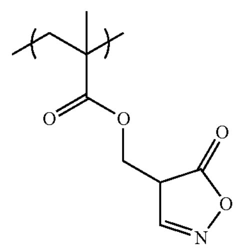
U-17
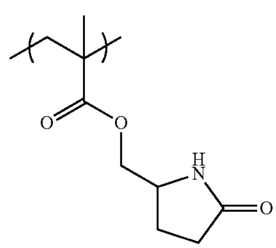
U-18
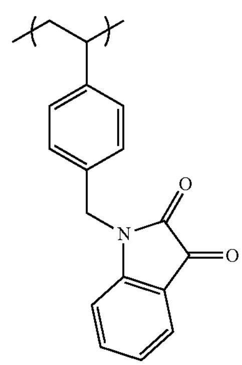
U-19
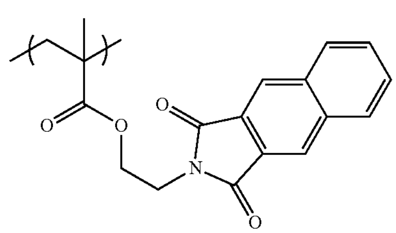
U-20
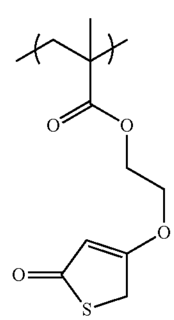

-continued
U-21
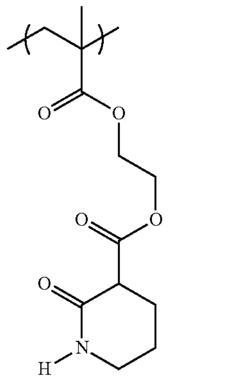
U-22
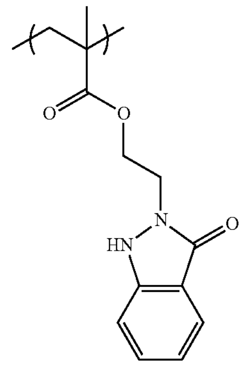
U-23
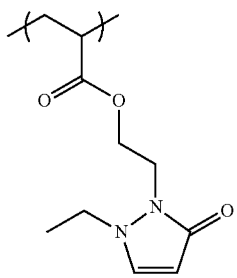
U-24
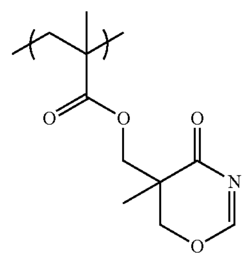
U-25
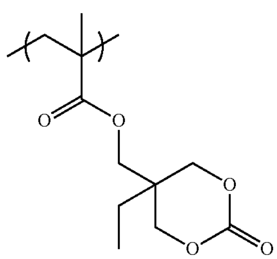
U-26
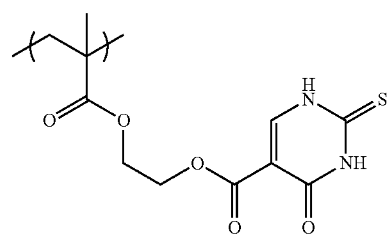
U-27
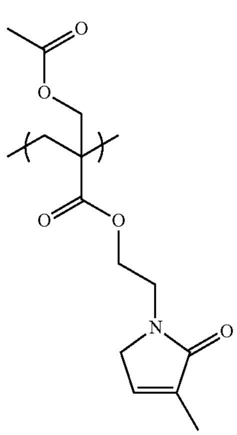
U-28
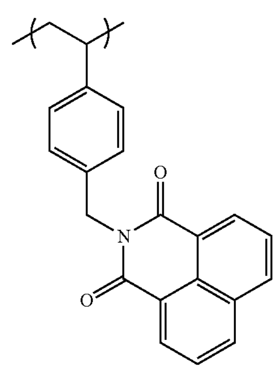

-continued
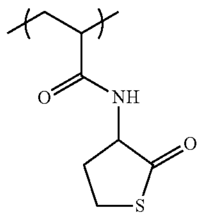
U-29
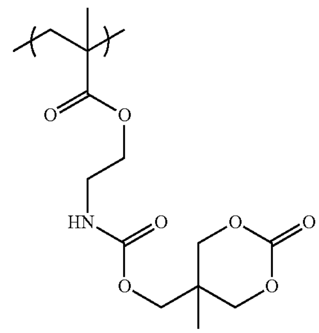
U-30
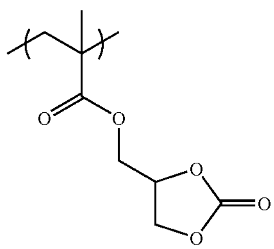
U-31
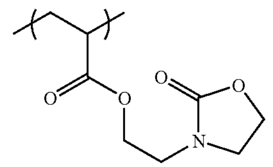
U-32
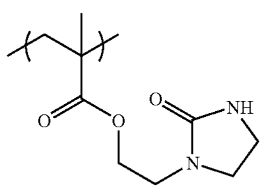
U-33
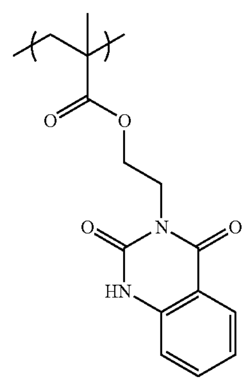
U-34
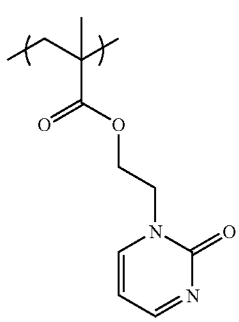
U-35
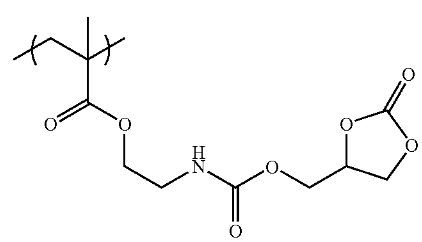
U-36
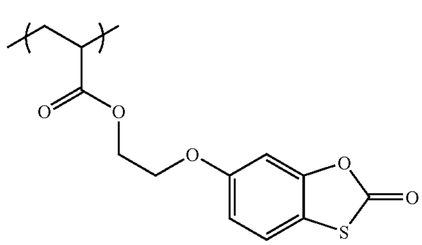
U-37
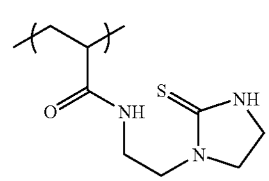
U-38

-continued
U-39
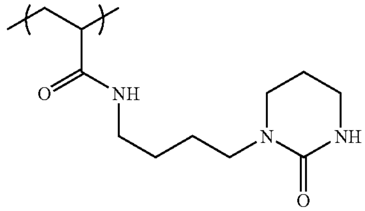
U-40
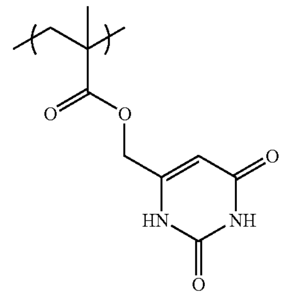
U-41
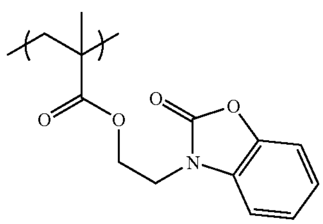
U-42
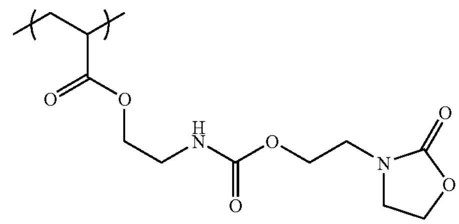
U-43
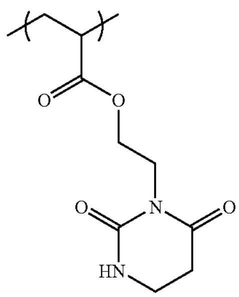
U-44
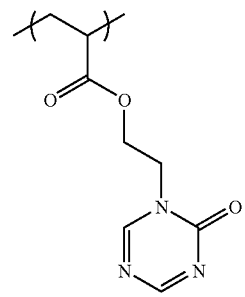
U-45
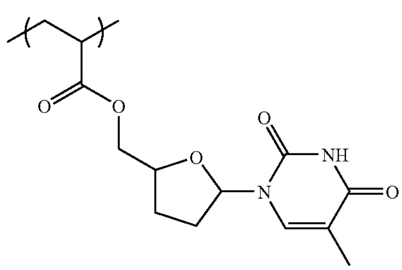
U-46
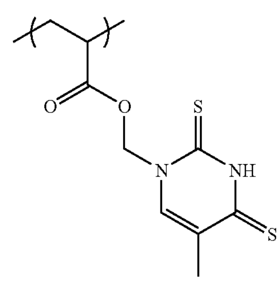
U-47
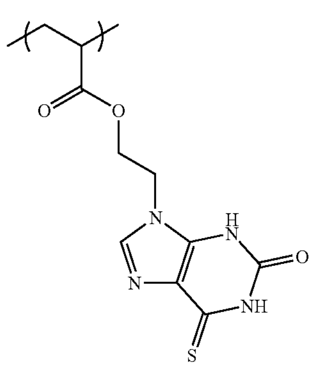
U-48
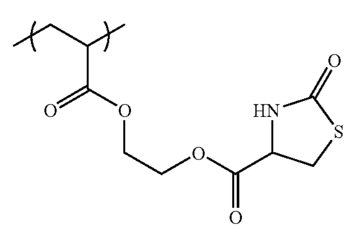

-continued
U-49
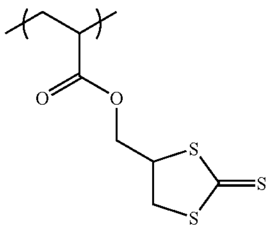
U-50
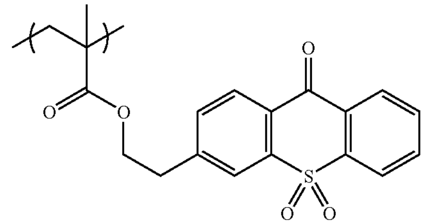
U-51
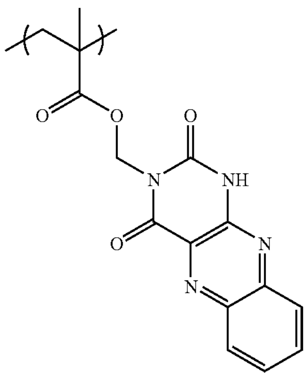
U-52
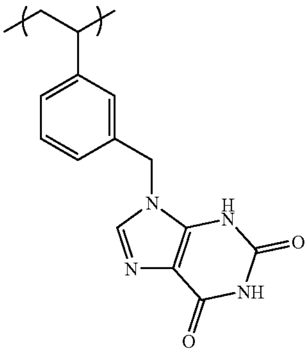
U-53
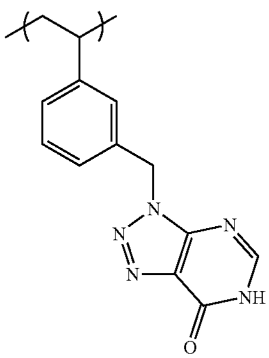
U-54
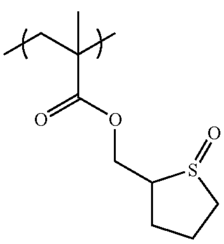
U-55
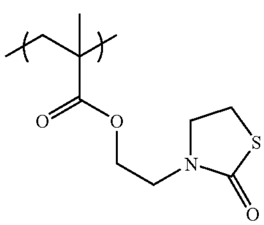
U-56
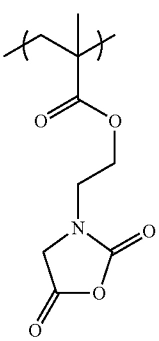

-continued
U-57
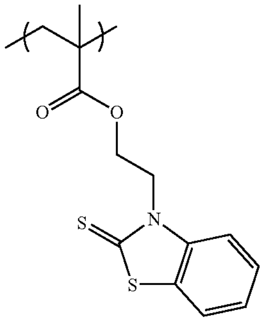
U-58
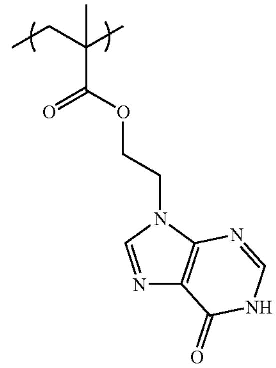
U-59
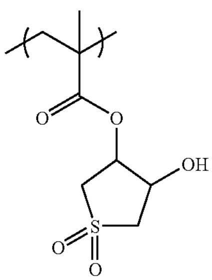
U-60
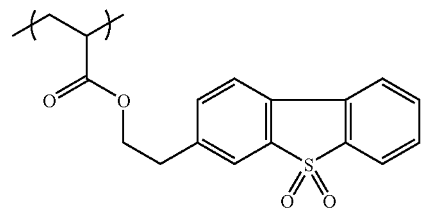
U-61
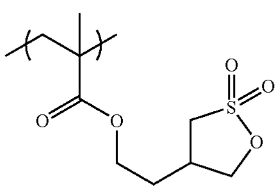
U-62
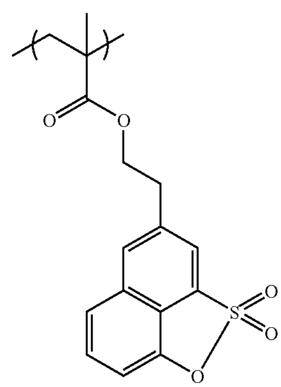
U-63
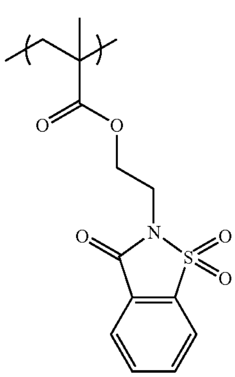
U-64
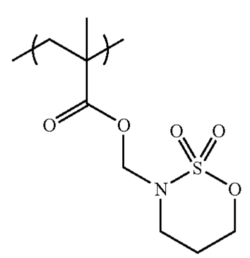

-continued
U-65
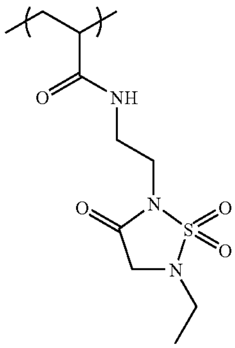
U-66
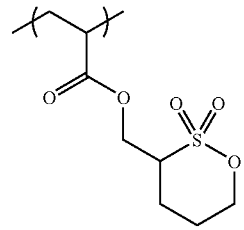
U-67
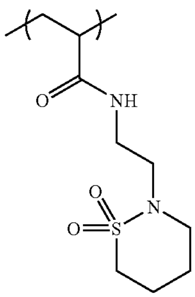
U-68
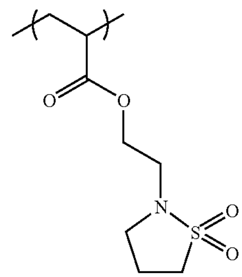
U-69
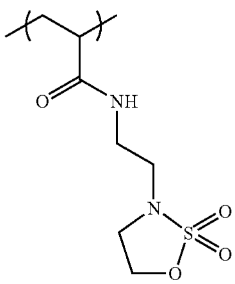
U-70
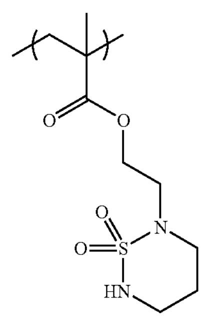
U-71
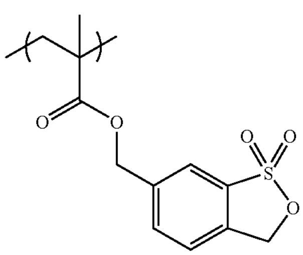
U-72
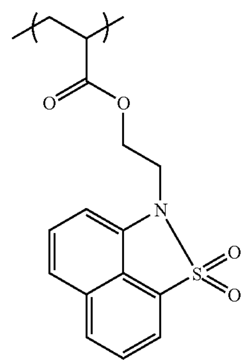
U-73
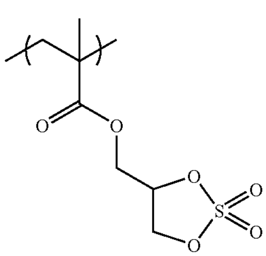
U-74
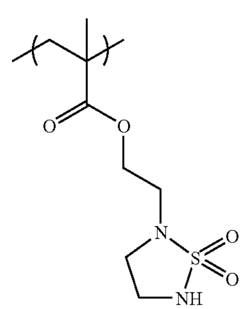

-continued
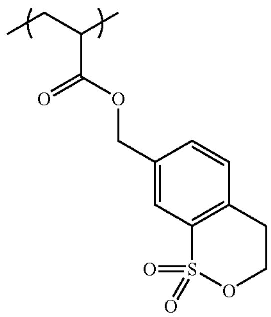
U-75
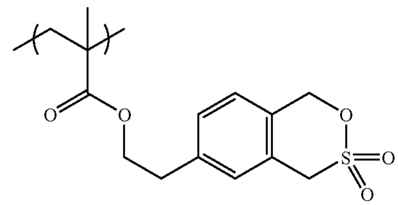
U-76
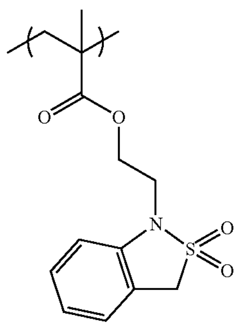
U-77
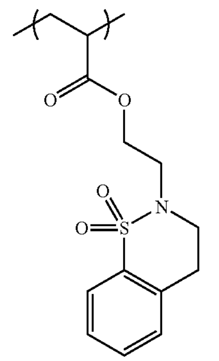
U-78
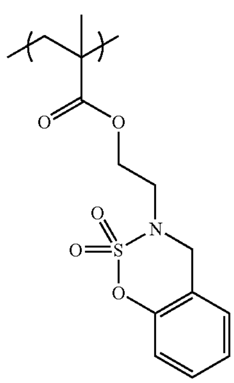
U-79
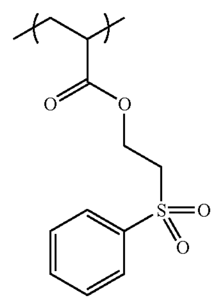
U-80
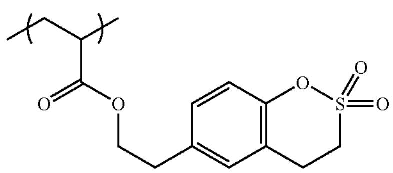
U-81
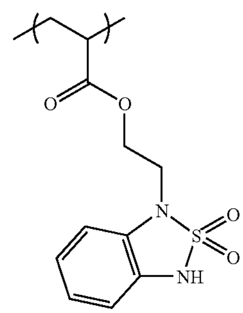
U-82

-continued
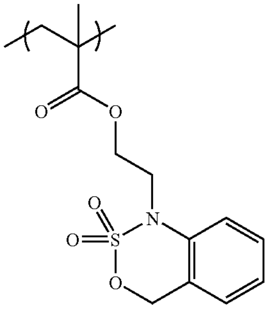
U-83
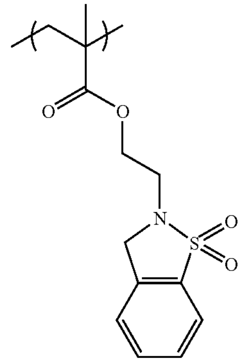
U-84
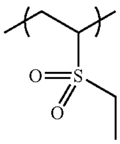
U-85
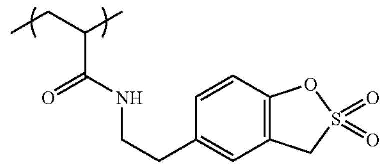
U-86
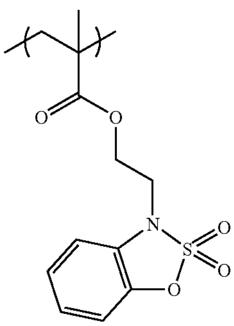
U-87
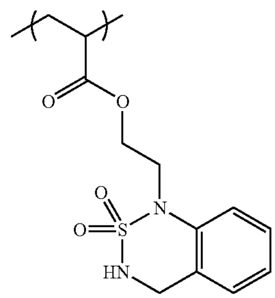
U-88
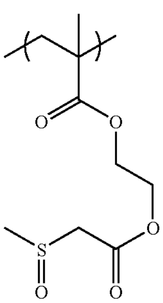
U-89
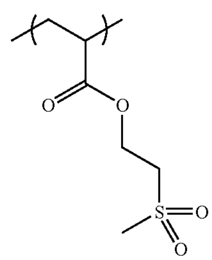
U-90
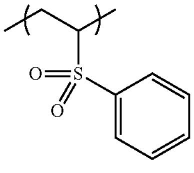
U-91
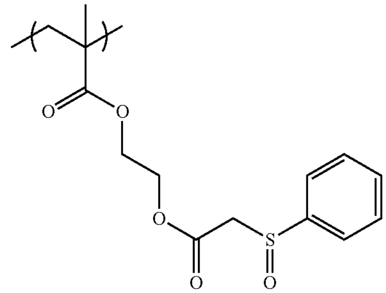
U-92

-continued
U-93
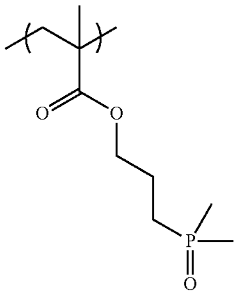
U-94
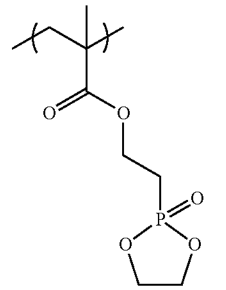
U-95
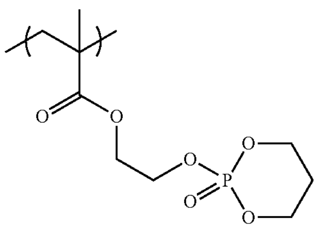
U-96
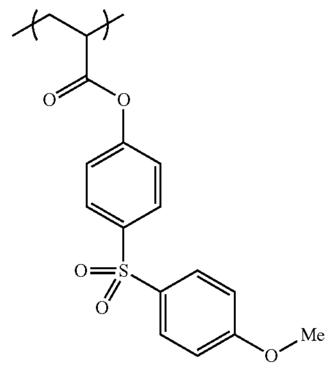
U-97
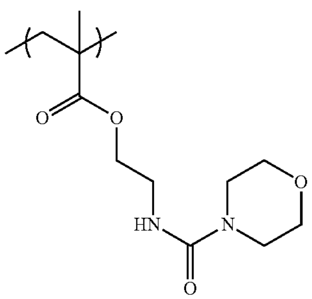
U-98
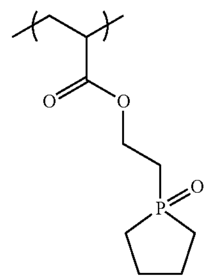
U-99
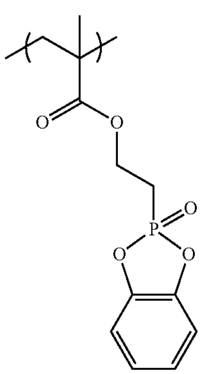
U-100
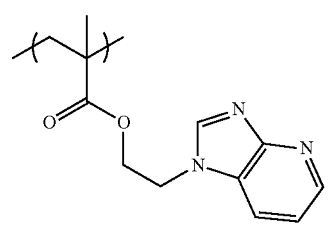
U-101
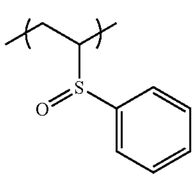
U-102
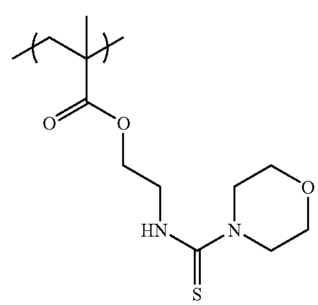

-continued
U-103
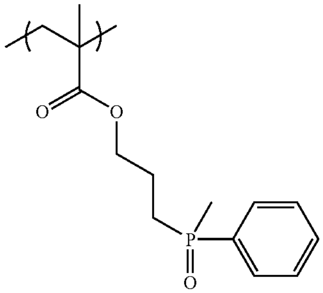
U-104
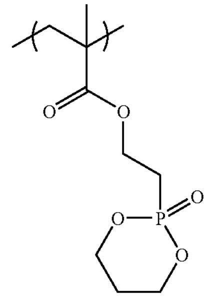
U-105
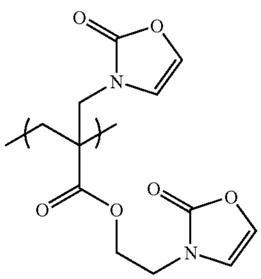
U-106
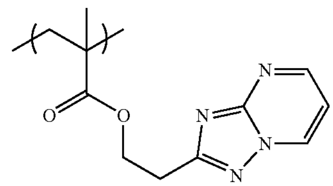
U-107
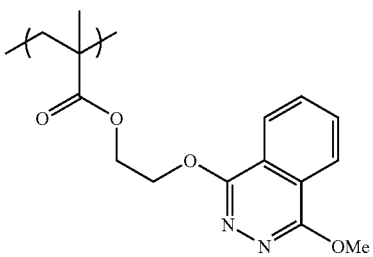
U-108
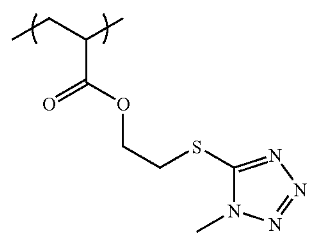
U-109
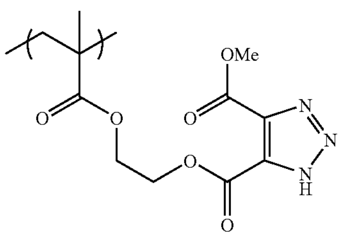
U-110
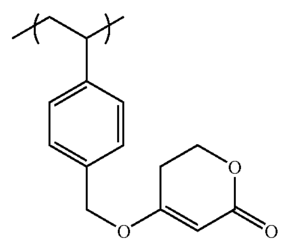
U-111
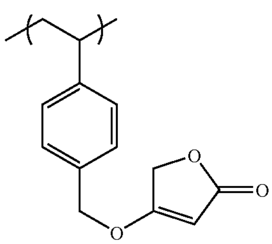
U-112
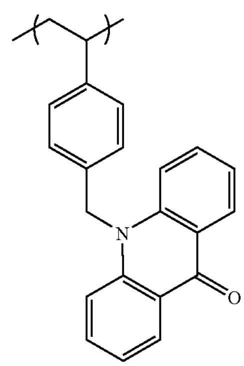
U-113
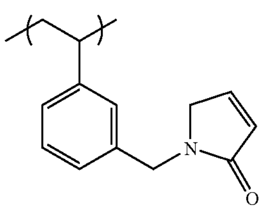
U-114
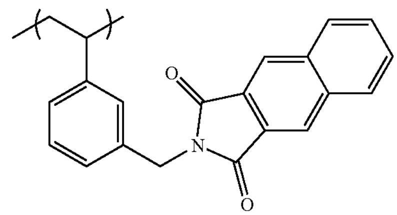

-continued
U-115
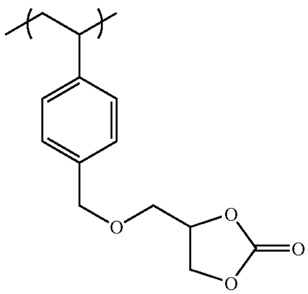
U-116
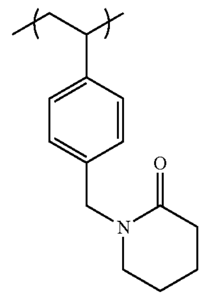
U-117
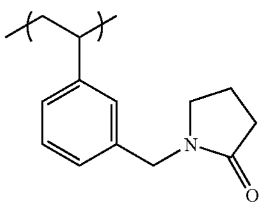
U-118
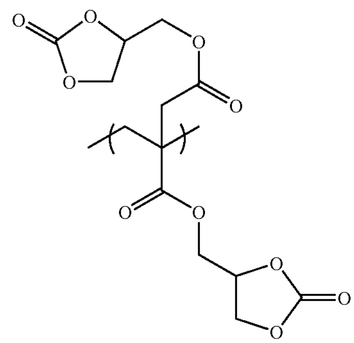
U-119
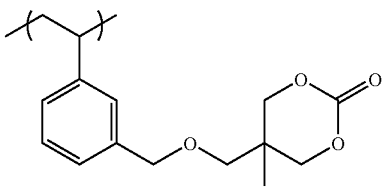
U-120
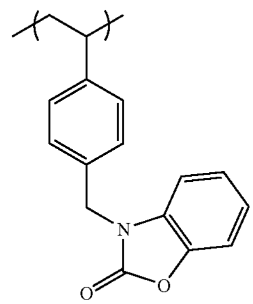
U-121
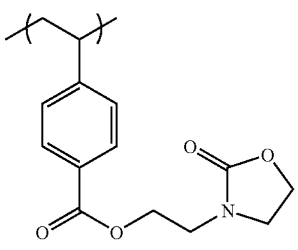
U-122
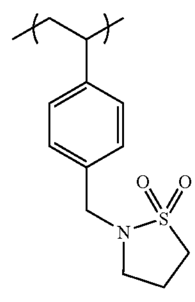
U-123
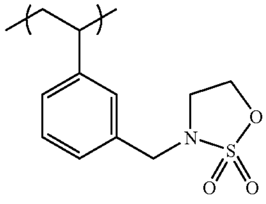
U-124
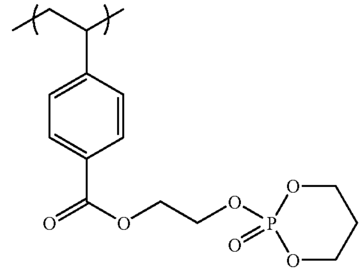

-continued
U-125
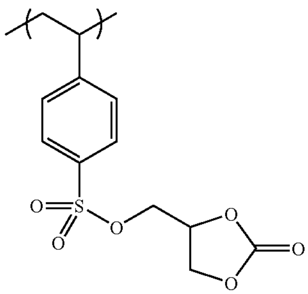
U-126
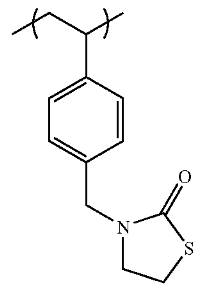
U-127
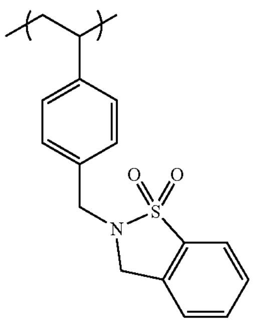
U-128
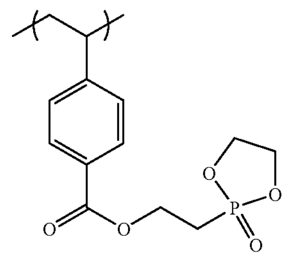
U-129
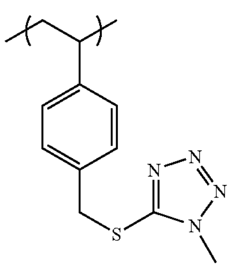
U-130
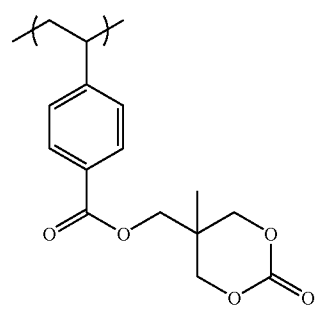
U-131
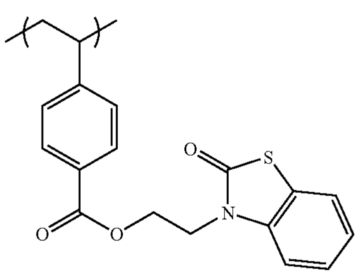
U-132
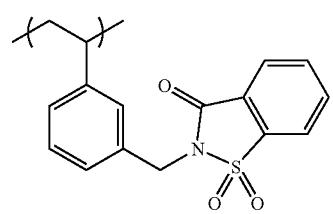
U-133
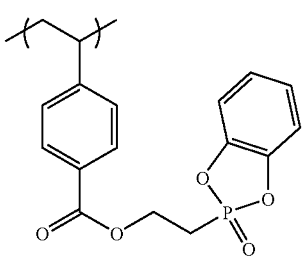
U-134
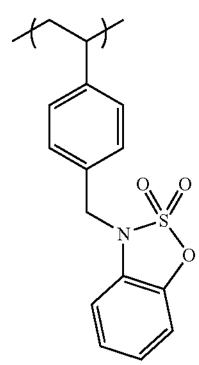

-continued
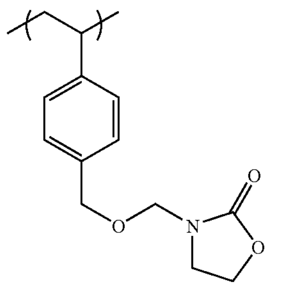
U-135
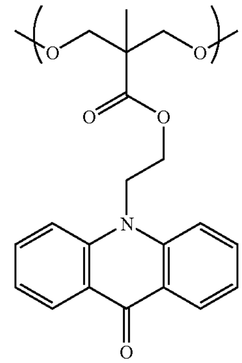
V-1
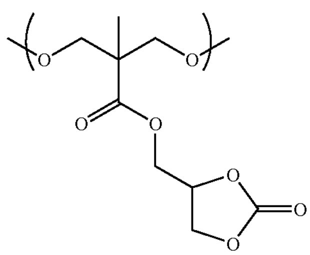
V-2
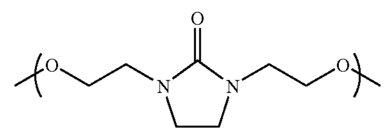
V-3
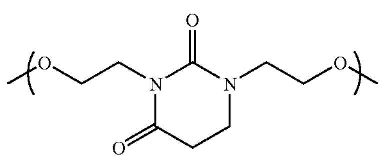
V-4
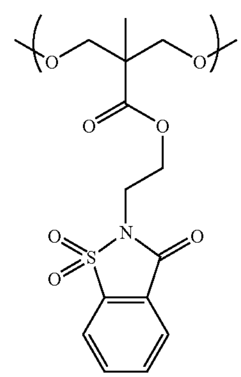
V-5
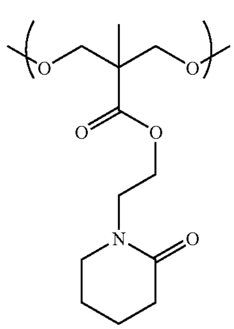
V-6
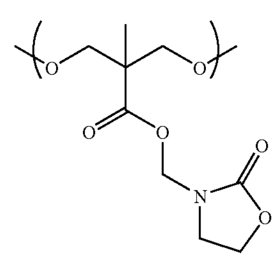
V-7
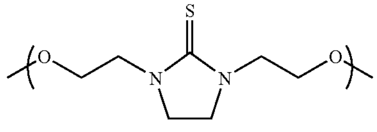
V-8
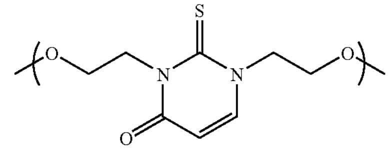
V-9

-continued
V-10
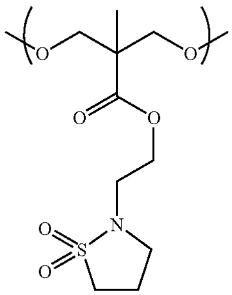
V-11
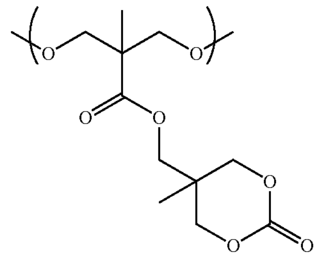
V-12
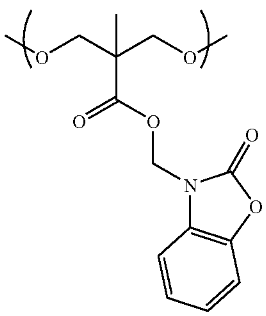
V-13
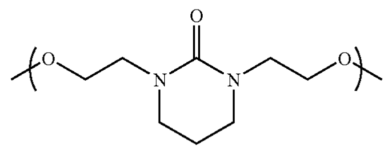
V-14
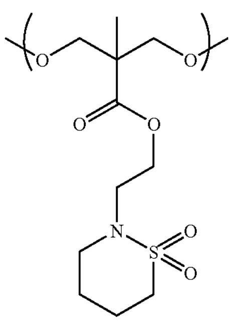
V-15
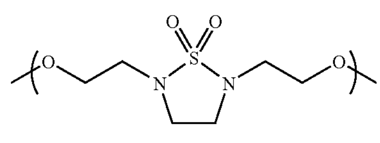
V-16
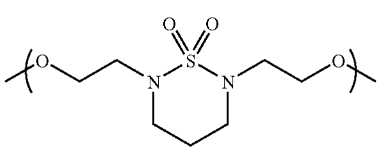
V-17
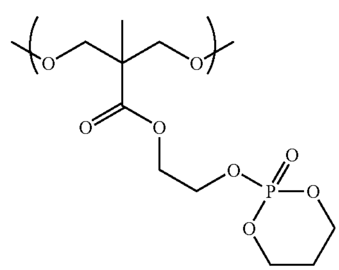
V-18
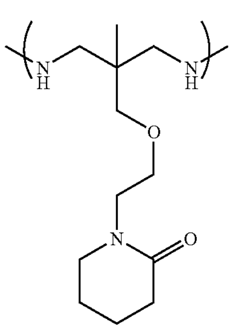
V-19
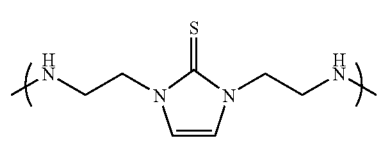

-continued
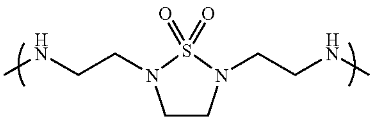
V-20
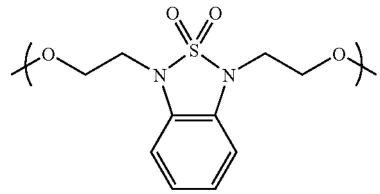
V-21
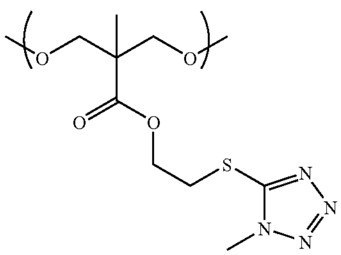
V-22
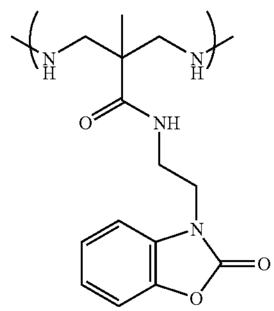
V-23
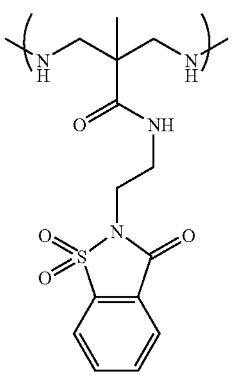
V-24
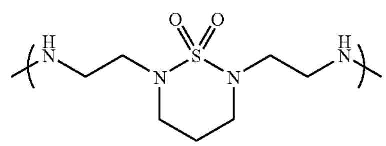
V-25
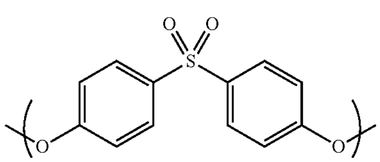
V-26
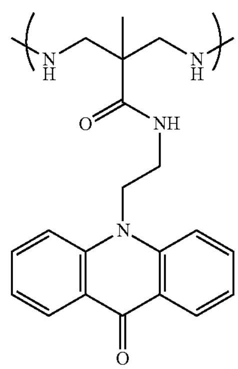
V-27
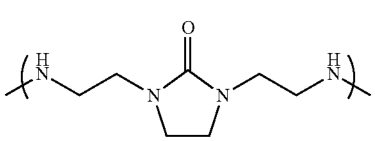
V-28
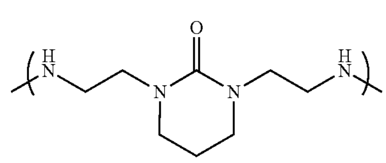
V-29

-continued
V-30
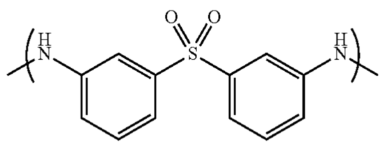
V-31
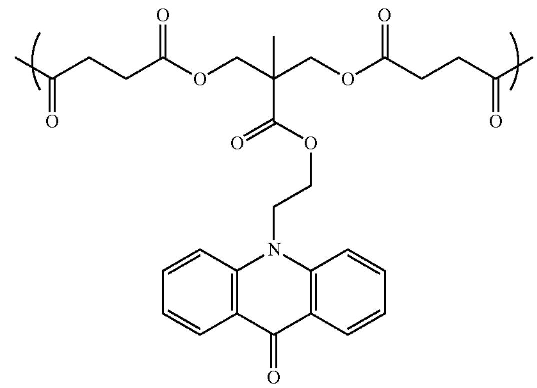
V-32
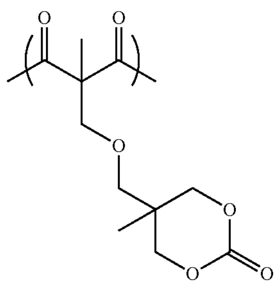
V-33
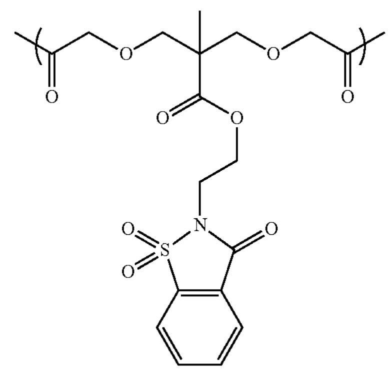
V-34
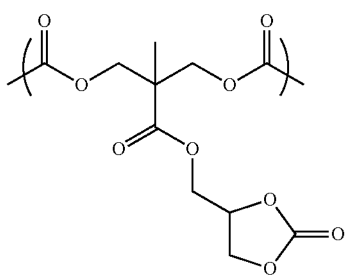
V-35
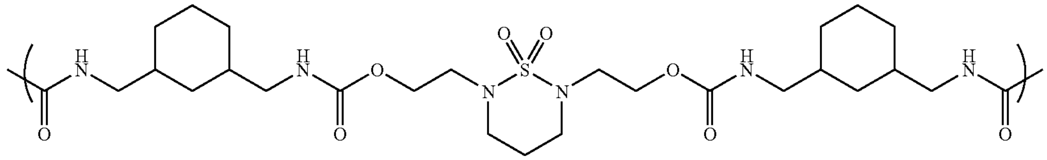
V-36
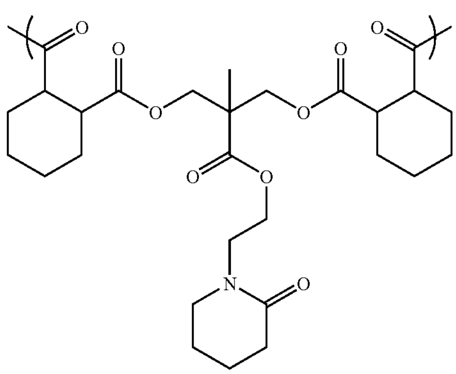
V-37
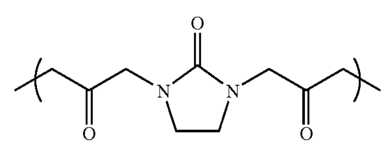

-continued
V-38
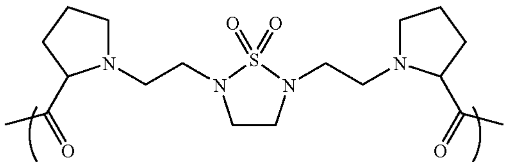
V-39
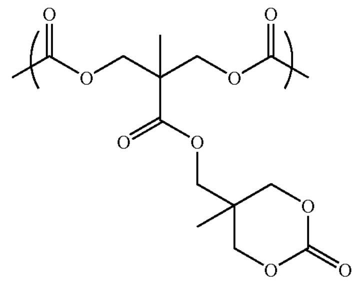
V-40
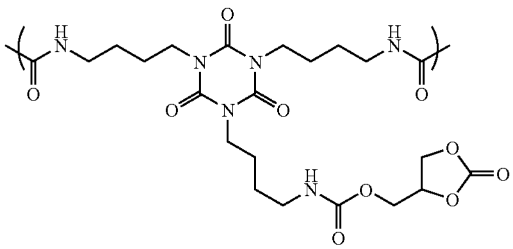
V-41
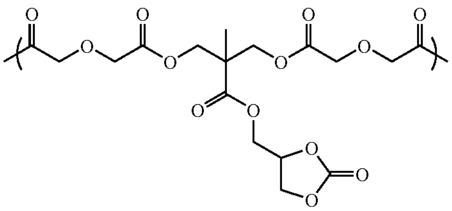
V-42
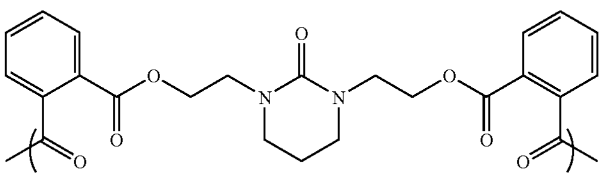
V-43
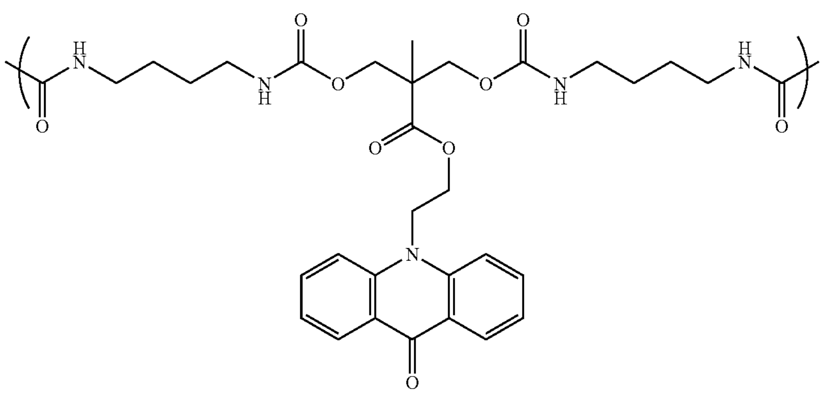
V-44
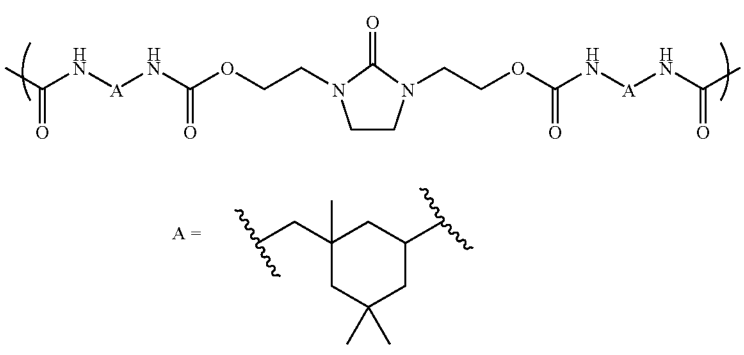

-continued

V-45

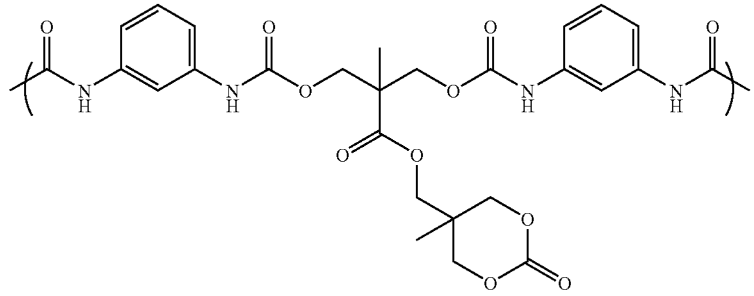

The polymerization components may be used individually or in combination of two or more thereof. The binder polymer used in the polymerizable composition according to the invention may include a polymerization component which does not contain a functional group having a dipole moment of 3.8 debye or more as long as the effects of the invention are not damaged.

Further, the binder polymer used in the polymerizable composition according to the invention may be imparted with a crosslinking property in order to increase the film strength of the image area.

In order to impart the crosslinking property to the binder polymer, a crosslinkable functional group is introduced into the main chain or side chain of the polymer. The crosslinkable functional group may be introduced by copolymerization or may be introduced by a polymer reaction.

The term "crosslinkable functional group" as used herein means a group capable of crosslinking the binder polymer in the process of a radical polymerization reaction which is caused in the photosensitive layer, when the lithographic printing plate precursor is exposed to light. The crosslinkable functional group is not particularly restricted as long as it has such a function and includes, for example, an ethylenically unsaturated bonding group, an amino group or an epoxy group as a functional group capable of conducting an addition polymerization reaction. Also, a functional group capable of forming a radical upon irradiation with light may be used and such a crosslinkable functional group includes, for example, a thiol group, a halogen atom and an onium salt structure. Among them, the ethylenically unsaturated bonding group is preferable, and functional groups represented by formulae (A) to (C) shown below are particularly preferable.

Formula (A):

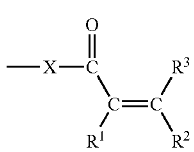

In formula (A), $R^1$ to $R^3$ each independently represents a hydrogen atom or a monovalent organic group. $R^1$ preferably includes, for example, a hydrogen atom or an alkyl group which may have a substituent. Among them, a hydrogen atom or a methyl group is preferable because of high radical reactivity. $R^2$ and $R^3$ each independently preferably includes, for example, a hydrogen atom, a halogen atom, an amino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxyl group, an alkoxycarbonyl group, an alkyl group which may have a substituent or an aryl group which may have a substituent is preferable because of high radical reactivity.

X represents an oxygen atom, a sulfur atom or —N($R^{12}$)—, and $R^{12}$ represents a hydrogen atom or a monovalent organic group. The monovalent organic group represented by $R^{12}$ includes, for example, an alkyl group which may have a substituent. $R^{12}$ is preferably a hydrogen atom, a methyl group, an ethyl group or an isopropyl group because of high radical reactivity.

Examples of the substituent introduced include an alkyl group, an alkenyl group, an alkynyl group, an aryl group, an alkoxy group, an aryloxy group, a halogen atom, an amino group, an alkylamino group, an arylamino group, a carboxyl group, an alkoxycarbonyl group, a sulfo group, a nitro group, a cyano group, an amido group, an alkylsulfonyl group and an arylsulfonyl group.

Formula (B):

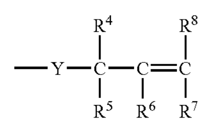

In formula (B), $R^4$ to $R^8$ each independently represents a hydrogen atom or a monovalent organic group. $R^4$ to $R^8$ each independently preferably includes, for example, a hydrogen atom, a halogen atom an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxyl group, an alkoxycarbonyl group, an alkyl group which may have a substituent or an aryl group which may have a substituent is preferable.

Examples of the substituent introduced include those described in Formula (A). Y represents an oxygen atom, a sulfur atom or —N($R^{12}$)—, and $R^{12}$ has the same meaning as $R^{12}$ defined in Formula (A). Preferable examples for $R^{12}$ are also same as those described in Formula (A).

Formula (C):

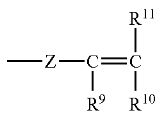

In formula (C), $R^9$ represents a hydrogen atom or a monovalent organic group. The monovalent organic group includes an alkyl group which may have a substituent. Among them, a hydrogen atom or a methyl group is preferable because of high radical reactivity. $R^{10}$ and $R^{11}$ each independently represents, for example, a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. Among them, a hydrogen atom, a carboxyl group, an alkoxycarbonyl group, an alkyl group which may have a substituent or an aryl group which may have a substituent is preferable because of high radical reactivity.

Examples of the substituent introduced include those described in Formula (A). Z represents an oxygen atom, a sulfur atom, —N($R^{13}$)— or a phenylene group which may have a substituent. $R^{13}$ includes an alkyl group which may have a substituent or the like. Among them, a methyl group, an ethyl group or an isopropyl group is preferable because of high radical reactivity.

In the binder polymer having a crosslinking property, for example, a free radical (a polymerization initiating radical or a propagating radical in the process of polymerization of the polymerizable compound) is added to the crosslinkable functional group to cause an addition-polymerization between polymers directly or through a polymerization chain of the polymerizable compound, as a result, crosslinking is formed between polymer molecules to effect curing. Alternatively, an atom (for example, a hydrogen atom on the carbon atom adjacent to the crosslinkable functional group) in the polymer is withdrawn by a free radical to produce a polymer radical and the polymer radicals combine with each other to form crosslinking between polymer molecules to effect curing.

The content of the crosslinkable functional group (content of radical-polymerizable unsaturated double bond determined by iodine titration) in the binder polymer according to the invention is preferably from 0.1 to 10.0 mmol, more preferably from 1.0 to 7.0 mmol, most preferably from 2.0 to 5.5 mmol, per g of the binder polymer.

In view of improvement in the developing property with an aqueous solution, the binder polymer is preferably hydrophilic. On the other hand, in view of increasing the film strength, it is important that the binder polymer has good compatibility with the polymerizable compound contained in the polymerizable composition, that is, the binder polymer is preferably oleophilic. From these standpoints, it is also effective in the invention to introduce a hydrophilic group-containing component and an oleophilic group-containing component in the binder polymer in order to improve the developing property and the film strength. Examples of the hydrophilic group-containing component which can be preferably used include components having a hydrophilic group, for example, a hydroxy group, a carboxylate group, a hydroxyethyl group, an ethyleneoxy group, a hydroxypropyl group, a polyoxyethyl group, a polyoxypropyl group, an amino group, an aminoethyl group, an aminopropyl group, an ammonium group, an amido group or a carboxymethyl group.

Specific examples of the polymerization component which does not contain a functional group having a dipole moment of 3.8 debye or more for use in the binder polymer of the polymerizable composition according to the invention are set forth below, but the invention should not be construed as being limited thereto.

N-1

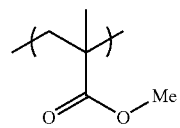

N-2

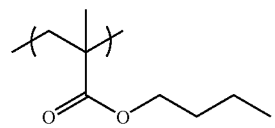

N-3

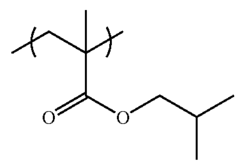

N-4

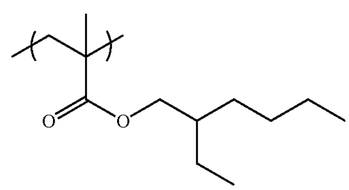

N-5

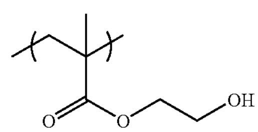

N-6

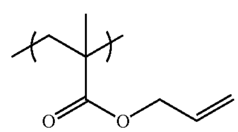

N-7

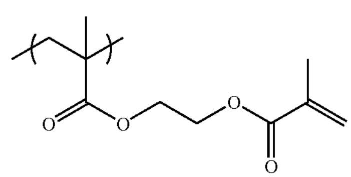

N-8

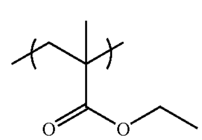

N-9
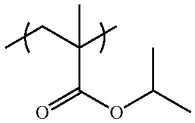
N-10
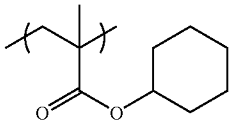
N-11
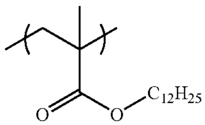
N-12
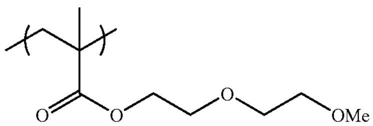
N-13
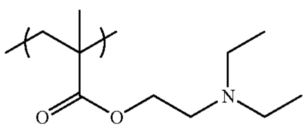
N-14
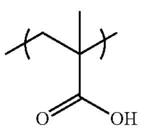
N-15
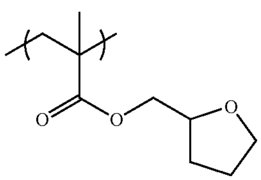
N-16
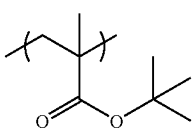
N-17
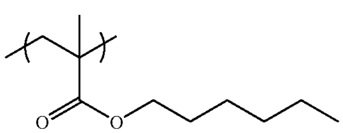
N-18
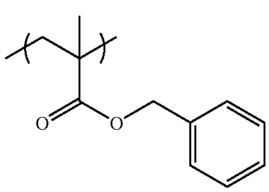
N-19
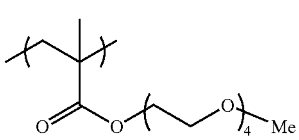
N-20
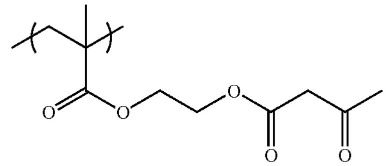
N-21
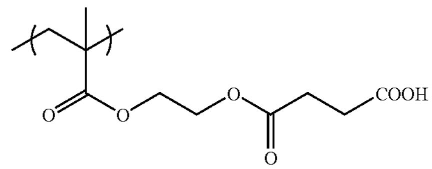
N-22
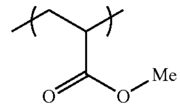
N-23
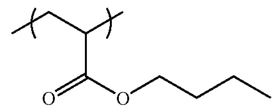
N-24
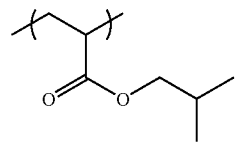
N-25
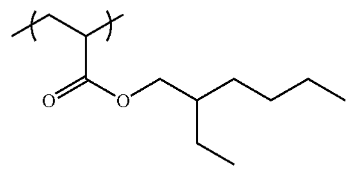
N-26
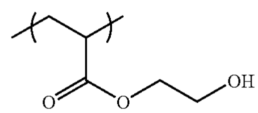
N-27
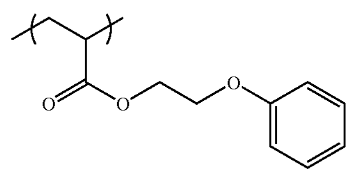
N-28
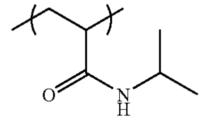
N-29
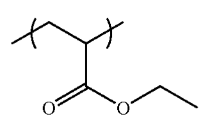
N-30
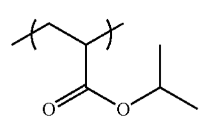

-continued
N-31
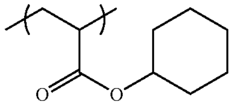
N-32
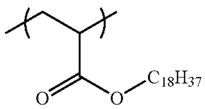
N-33
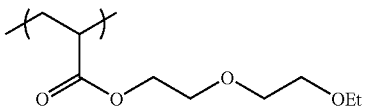
N-34
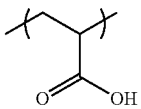
N-35
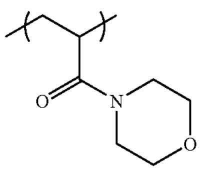
N-36
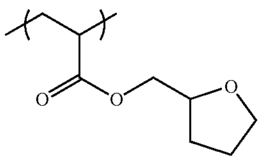
N-37
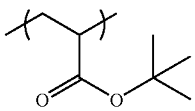
N-38
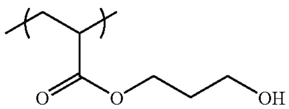
N-39
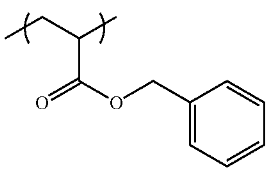
N-40
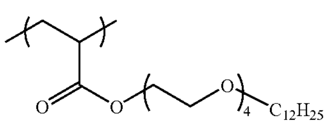
N-41
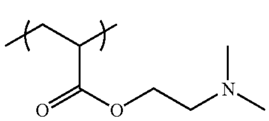
N-42
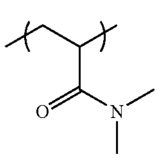
-continued
N-43
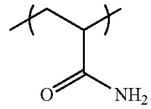
N-44
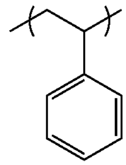
N-45
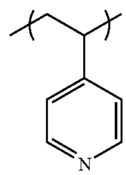
N-46
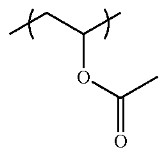
N-47
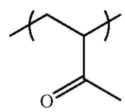
N-48
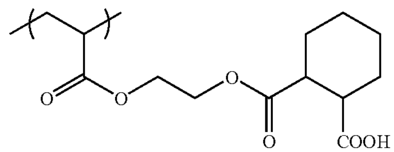
N-49
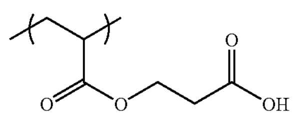
N-50
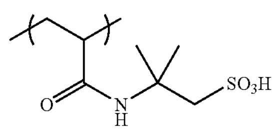
N-51
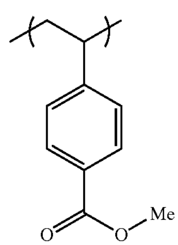

-continued
N-52
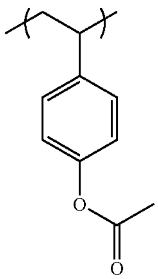
N-53
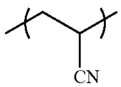
N-54
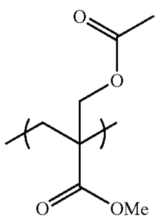
N-55
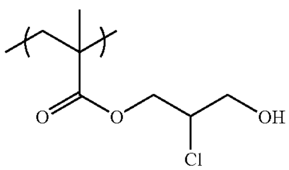
N-56
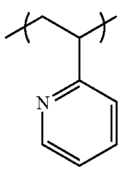
N-57
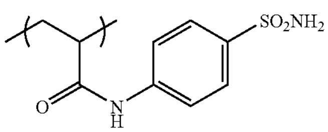
N-58
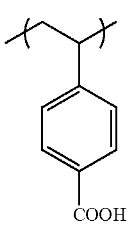
N-59
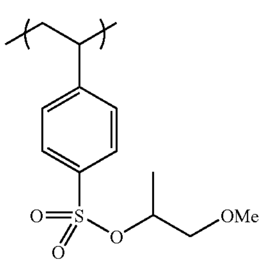
-continued
N-60
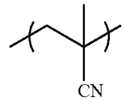
N-61
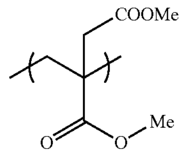
N-62
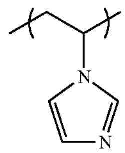
N-63
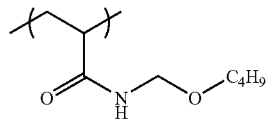
N-64
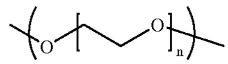
N-65
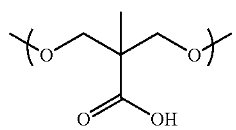
N-66
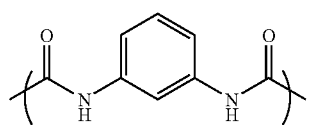
N-67
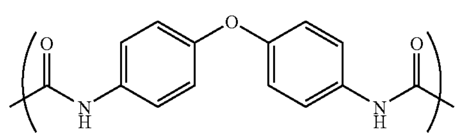
N-68
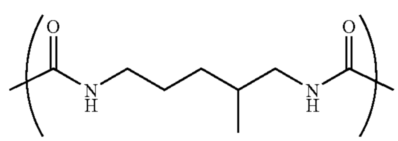
N-69
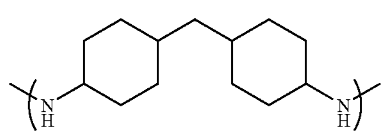
N-70
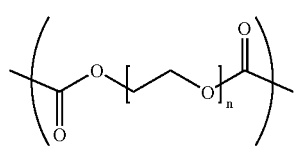
N-71
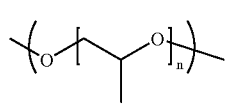

-continued

N-72

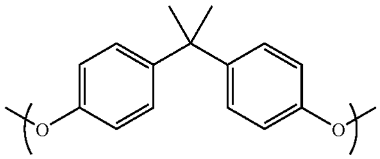

N-73

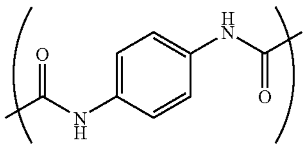

N-74

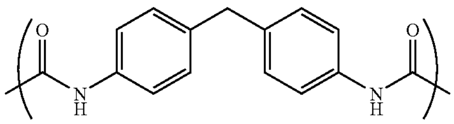

N-75

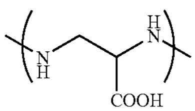

N-76

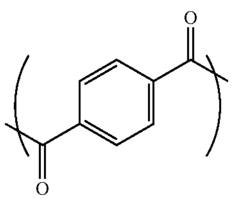

N-77

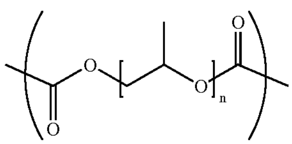

N-78

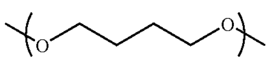

N-79

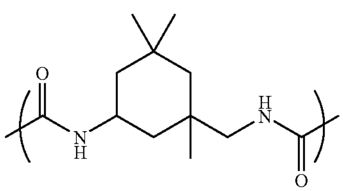

-continued

N-80

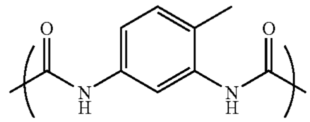

N-81

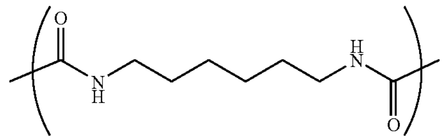

N-82

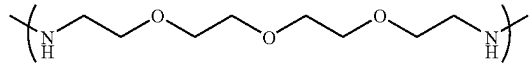

N-83

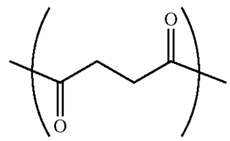

N-84

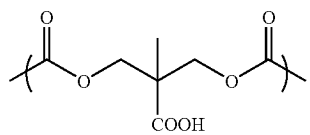

The content of the polymerization component (repeating unit) containing a functional group having a dipole moment of 3.8 debye or more in the binder polymer used in the polymerizable composition according to the invention is preferably more than 20% by mole, more preferably more an 30% by mole. By using more than 20% by mole of the polymerization component, the radical polymerization accelerating effect sufficient for practical use can be obtained.

Specific examples of the binder polymer used in the polymerizable composition according to the invention are set forth below, but the invention should not be construed as being limited thereto.

| Binder | Unit 1 | | Unit 2 | | Unit 3 | |
|---|---|---|---|---|---|---|
| Polymer | No. | Content (%) | No. | Content (%) | No. | Content (%) |
| B-1 | U-1 | 20 | N-14 | 20 | N-1 | 60 |
| B-2 | U-2 | 30 | N-21 | 10 | N-10 | 60 |
| B-3 | U-3 | 40 | N-34 | 20 | N-18 | 40 |
| B-4 | U-4 | 50 | N-48 | 12 | N-1 | 38 |
| B-5 | U-5 | 20 | N-49 | 10 | N-22 | 70 |
| B-6 | U-6 | 20 | N-58 | 20 | N-27 | 60 |
| B-7 | U-7 | 30 | N-14 | 20 | N-28 | 50 |
| B-8 | U-8 | 60 | N-14 | 20 | N-10 | 20 |
| B-9 | U-9 | 30 | N-14 | 20 | N-35 | 50 |
| B-10 | U-10 | 20 | N-21 | 10 | N-44 | 70 |
| B-11 | U-11 | 30 | N-34 | 20 | N-54 | 50 |
| B-12 | U-12 | 30 | N-48 | 12 | N-61 | 58 |
| B-13 | U-13 | 90 | N-49 | 10 | — | — |
| B-14 | U-14 | 80 | N-58 | 20 | — | — |

-continued

| | | | | | | |
|---|---|---|---|---|---|---|
| B-15 | U-15 | 80 | N-14 | 20 | — | — |
| B-16 | U-16 | 40 | N-21 | 10 | U-4 | 50 |
| B-17 | U-17 | 30 | N-34 | 20 | U-8 | 50 |
| B-18 | U-18 | 50 | N-48 | 12 | U-25 | 38 |
| B-19 | U-19 | 90 | N-49 | 10 | — | — |
| B-20 | U-20 | 80 | N-58 | 20 | — | — |
| B-21 | U-21 | 80 | N-14 | 20 | — | — |
| B-22 | U-22 | 40 | N-21 | 10 | N-22 | 50 |
| B-23 | U-23 | 20 | N-34 | 20 | N-27 | 60 |
| B-24 | U-24 | 30 | N-48 | 12 | N-28 | 58 |
| B-25 | U-25 | 90 | N-49 | 10 | — | — |
| B-26 | U-26 | 80 | N-14 | 20 | — | — |
| B-27 | U-27 | 60 | N-21 | 10 | N-22 | 30 |
| B-28 | U-28 | 60 | N-34 | 20 | N-27 | 20 |
| B-29 | U-29 | 30 | N-48 | 12 | U-4 | 58 |
| B-30 | U-30 | 60 | N-21 | 10 | N-18 | 30 |
| B-31 | U-31 | 68 | N-48 | 12 | N-1 | 20 |
| B-32 | U-32 | 90 | N-49 | 10 | — | — |
| B-33 | U-33 | 50 | N-14 | 20 | U-30 | 30 |
| B-34 | U-34 | 40 | N-21 | 10 | N-27 | 50 |
| B-35 | U-35 | 70 | N-34 | 20 | N-28 | 10 |
| B-36 | U-36 | 90 | N-21 | 10 | — | — |
| B-37 | U-37 | 80 | N-14 | 20 | — | — |
| B-38 | U-38 | 50 | N-21 | 10 | N-35 | 40 |
| B-39 | U-39 | 30 | N-34 | 20 | N-44 | 50 |
| B-40 | U-40 | 20 | N-48 | 12 | N-54 | 68 |
| B-41 | U-41 | 90 | N-49 | 10 | — | — |
| B-42 | U-42 | 60 | N-49 | 10 | N-22 | 30 |
| B-43 | U-43 | 80 | N-14 | 20 | — | — |
| B-44 | U-44 | 40 | N-21 | 10 | N-1 | 50 |
| B-45 | U-45 | 30 | N-34 | 20 | N-10 | 50 |
| B-46 | U-46 | 30 | N-48 | 12 | N-18 | 58 |
| B-47 | U-47 | 90 | N-49 | 10 | — | — |
| B-48 | U-48 | 80 | N-58 | 20 | — | — |
| B-49 | U-49 | 80 | N-14 | 20 | — | — |
| B-50 | U-50 | 90 | N-21 | 10 | — | — |
| B-51 | U-51 | 30 | N-34 | 20 | N-35 | 50 |
| B-52 | U-52 | 40 | N-48 | 12 | N-44 | 48 |
| B-53 | U-53 | 40 | N-49 | 10 | N-54 | 50 |
| B-54 | U-54 | 80 | N-58 | 20 | — | — |
| B-55 | U-55 | 70 | N-21 | 10 | N-1 | 20 |
| B-56 | U-56 | 30 | N-48 | 12 | N-22 | 58 |
| B-57 | U-57 | 60 | N-49 | 10 | N-27 | 30 |
| B-58 | U-58 | 50 | N-58 | 20 | N-28 | 30 |
| B-59 | U-59 | 60 | N-49 | 10 | N-27 | 30 |
| B-60 | U-60 | 80 | N-14 | 20 | — | — |
| B-61 | U-61 | 90 | N-21 | 10 | — | — |
| B-62 | U-62 | 80 | N-34 | 20 | — | — |
| B-63 | U-63 | 88 | N-48 | 12 | — | — |
| B-64 | U-64 | 88 | N-48 | 12 | — | — |
| B-65 | U-65 | 50 | N-49 | 10 | N-1 | 40 |
| B-66 | U-66 | 30 | N-58 | 20 | N-10 | 50 |
| B-67 | U-67 | 50 | N-21 | 10 | N-18 | 40 |
| B-68 | U-68 | 80 | N-34 | 20 | — | — |
| B-69 | U-69 | 60 | N-21 | 10 | N-28 | 30 |
| B-70 | U-70 | 80 | N-14 | 20 | — | — |
| B-71 | U-71 | 30 | N-21 | 10 | N-22 | 60 |
| B-72 | U-72 | 60 | N-34 | 20 | N-27 | 20 |
| B-73 | U-73 | 50 | N-48 | 12 | N-28 | 38 |
| B-74 | U-74 | 30 | N-49 | 10 | N-35 | 60 |
| B-75 | U-75 | 30 | N-58 | 20 | N-44 | 50 |
| B-76 | U-76 | 30 | N-14 | 20 | N-54 | 50 |
| B-77 | U-77 | 90 | N-21 | 10 | — | — |
| B-78 | U-78 | 60 | N-34 | 20 | N-1 | 20 |
| B-79 | U-79 | 50 | N-48 | 12 | N-10 | 38 |
| B-80 | U-80 | 60 | N-49 | 10 | N-18 | 30 |
| B-81 | U-81 | 80 | N-58 | 20 | — | — |
| B-82 | U-82 | 80 | N-14 | 20 | — | — |
| B-83 | U-83 | 90 | N-21 | 10 | — | — |
| B-84 | U-84 | 60 | N-34 | 20 | N-1 | 20 |
| B-85 | U-85 | 30 | N-48 | 12 | N-10 | 58 |
| B-86 | U-86 | 30 | N-49 | 10 | N-18 | 60 |
| B-87 | U-87 | 80 | N-58 | 20 | — | — |
| B-88 | U-88 | 80 | N-14 | 20 | — | — |
| B-89 | U-89 | 90 | N-21 | 10 | — | — |
| B-90 | U-90 | 80 | N-34 | 20 | — | — |
| B-91 | U-91 | 50 | N-48 | 12 | N-35 | 38 |
| B-92 | U-92 | 40 | N-49 | 10 | N-44 | 50 |
| B-93 | U-93 | 50 | N-58 | 20 | N-54 | 30 |
| B-94 | U-94 | 80 | N-14 | 20 | — | — |

-continued

| | | | | | | |
|---|---|---|---|---|---|---|
| B-95 | U-95 | 70 | N-49 | 10 | N-1 | 20 |
| B-96 | U-96 | 30 | N-14 | 20 | N-1 | 50 |
| B-97 | U-97 | 30 | N-21 | 10 | N-10 | 60 |
| B-98 | U-98 | 40 | N-34 | 20 | N-18 | 40 |
| B-99 | U-99 | 88 | N-48 | 12 | — | — |
| B-100 | U-100 | 90 | N-49 | 10 | — | — |
| B-101 | U-101 | 80 | N-58 | 20 | — | — |
| B-102 | U-102 | 60 | N-14 | 20 | U-95 | 20 |
| B-103 | U-103 | 50 | N-21 | 10 | N-10 | 40 |
| B-104 | U-104 | 40 | N-34 | 20 | N-18 | 40 |
| B-105 | U-105 | 88 | N-48 | 12 | — | — |
| B-106 | U-106 | 90 | N-49 | 10 | — | — |
| B-107 | U-107 | 30 | N-58 | 20 | N-1 | 50 |
| B-108 | U-108 | 30 | N-14 | 20 | N-10 | 50 |
| B-109 | U-109 | 40 | N-21 | 10 | N-18 | 50 |
| B-110 | U-110 | 80 | N-34 | 20 | — | — |
| B-111 | U-111 | 88 | N-48 | 12 | — | — |
| B-112 | U-112 | 90 | N-49 | 10 | — | — |
| B-113 | U-113 | 50 | N-58 | 20 | N-35 | 30 |
| B-114 | U-114 | 50 | N-14 | 20 | N-44 | 30 |
| B-115 | U-115 | 50 | N-21 | 10 | N-54 | 40 |
| B-116 | U-116 | 50 | N-34 | 20 | N-22 | 30 |
| B-117 | U-117 | 20 | N-48 | 12 | N-27 | 68 |
| B-118 | U-118 | 50 | N-49 | 10 | N-28 | 40 |
| B-119 | U-119 | 80 | N-58 | 20 | — | — |
| B-120 | U-120 | 80 | N-58 | 20 | — | — |
| B-121 | U-121 | 60 | N-58 | 20 | N-44 | 20 |
| B-122 | U-122 | 80 | N-14 | 20 | — | — |
| B-123 | U-123 | 90 | N-21 | 10 | — | — |
| B-124 | U-124 | 80 | N-34 | 20 | — | — |
| B-125 | U-125 | 80 | N-58 | 20 | — | — |
| B-126 | U-126 | 60 | N-21 | 10 | U-121 | 30 |
| B-127 | U-127 | 60 | N-34 | 20 | N-10 | 20 |
| B-128 | U-128 | 40 | N-48 | 12 | U-130 | 48 |
| B-129 | U-129 | 80 | N-58 | 20 | — | — |
| B-130 | U-130 | 80 | N-58 | 20 | — | — |
| B-131 | U-131 | 50 | N-14 | 20 | N-35 | 30 |
| B-132 | U-132 | 50 | N-21 | 10 | U-30 | 40 |
| B-133 | U-133 | 30 | N-34 | 20 | N-54 | 50 |
| B-134 | U-134 | 80 | N-58 | 20 | — | — |
| B-135 | U-135 | 50 | N-58 | 20 | N-44 | 30 |

| Binder | Unit 1 | | Unit 2 | | Unit 3 | | Unit 4 | | Unit 5 | |
|---|---|---|---|---|---|---|---|---|---|---|
| Polymer | No. | Content (%) | No. | Content (%) | No. | Content (%) | No. | Content (%) | No. | Content (%) |
| B-136 | V-43 | 50 | V-1 | 30 | N-65 | 10 | N-71 | 10 | — | — |
| B-137 | V-44 | 50 | V-2 | 38 | N-65 | 12 | — | — | — | — |
| B-138 | V-45 | 50 | V-3 | 40 | N-65 | 10 | — | — | — | — |
| B-139 | V-40 | 50 | V-4 | 20 | N-65 | 15 | N-72 | 15 | — | — |
| B-140 | V-35 | 50 | V-5 | 40 | N-65 | 10 | — | — | — | — |
| B-141 | V-43 | 30 | N-66 | 20 | V-6 | 20 | N-65 | 12 | N-78 | 18 |
| B-142 | V-44 | 20 | N-67 | 30 | V-7 | 30 | N-65 | 13 | N-64 | 7 |
| B-143 | V-45 | 30 | N-68 | 20 | V-8 | 40 | N-65 | 10 | — | — |
| B-144 | V-40 | 20 | N-73 | 30 | V-9 | 30 | N-65 | 13 | N-71 | 7 |
| B-145 | V-35 | 30 | N-74 | 20 | V-10 | 30 | N-65 | 10 | N-72 | 10 |
| B-146 | V-43 | 20 | N-79 | 30 | V-11 | 38 | N-65 | 12 | — | — |
| B-147 | V-44 | 30 | N-80 | 20 | V-12 | 20 | N-65 | 12 | N-78 | 18 |
| B-148 | V-45 | 30 | N-81 | 20 | V-13 | 40 | N-65 | 10 | — | — |
| B-149 | V-40 | 20 | V-43 | 30 | V-14 | 30 | N-65 | 13 | N-64 | 7 |
| B-150 | V-35 | 30 | V-44 | 20 | V-15 | 40 | N-65 | 10 | — | — |
| B-151 | V-40 | 10 | V-45 | 40 | V-16 | 30 | N-65 | 13 | N-71 | 7 |
| B-152 | V-35 | 30 | V-40 | 20 | V-17 | 30 | N-65 | 12 | N-71 | 8 |
| B-153 | V-43 | 10 | V-35 | 40 | V-21 | 30 | N-65 | 15 | N-72 | 5 |
| B-154 | N-74 | 30 | N-81 | 20 | V-22 | 38 | N-65 | 12 | — | — |
| B-155 | N-74 | 30 | N-81 | 20 | V-26 | 30 | N-65 | 13 | N-78 | 7 |
| B-156 | V-31 | 50 | V-2 | 40 | N-65 | 10 | — | — | — | — |
| B-157 | V-32 | 50 | V-3 | 38 | N-65 | 12 | — | — | — | — |
| B-158 | V-33 | 50 | V-5 | 30 | N-65 | 13 | N-71 | 7 | — | — |
| B-159 | V-36 | 30 | N-83 | 20 | V-11 | 38 | N-65 | 12 | — | — |
| B-160 | V-37 | 30 | N-76 | 20 | V-15 | 30 | N-65 | 10 | N-72 | 10 |
| B-161 | V-38 | 30 | V-33 | 20 | V-17 | 26 | N-65 | 13 | N-72 | 11 |
| B-162 | V-41 | 30 | V-36 | 20 | V-2 | 25 | N-65 | 12 | V-11 | 13 |
| B-163 | V-42 | 20 | V-37 | 30 | V-3 | 30 | N-65 | 12 | V-15 | 8 |
| B-164 | V-39 | 30 | N-77 | 20 | V-2 | 40 | N-65 | 10 | — | — |
| B-165 | V-34 | 30 | N-70 | 20 | V-3 | 38 | N-65 | 12 | — | — |
| B-166 | V-39 | 43 | N-84 | 7 | V-5 | 45 | N-65 | 5 | — | — |
| B-167 | V-34 | 50 | V-11 | 13 | N-65 | 13 | V-2 | 24 | — | — |
| B-168 | V-43 | 50 | V-18 | 20 | N-75 | 20 | N-69 | 10 | — | — |
| B-169 | V-44 | 50 | V-19 | 20 | N-75 | 15 | N-82 | 15 | — | — |

-continued

| | | | | | | | | | | |
|---|---|---|---|---|---|---|---|---|---|---|
| B-170 | V-45 | 50 | V-20 | 22 | N-75 | 18 | V-18 | 10 | — | — |
| B-171 | V-40 | 50 | V-23 | 15 | N-75 | 13 | V-19 | 22 | — | — |
| B-172 | V-35 | 50 | V-24 | 35 | N-75 | 15 | — | — | — | — |
| B-173 | V-43 | 25 | N-66 | 25 | V-25 | 35 | N-75 | 15 | — | — |
| B-174 | V-44 | 30 | N-67 | 20 | V-27 | 34 | N-75 | 16 | — | — |
| B-175 | V-45 | 25 | N-68 | 25 | V-28 | 20 | N-75 | 18 | N-69 | 12 |
| B-176 | V-40 | 28 | N-73 | 22 | V-29 | 20 | N-75 | 20 | N-82 | 10 |
| B-177 | V-35 | 26 | N-74 | 24 | V-30 | 34 | N-75 | 16 | — | — |
| B-178 | V-43 | 30 | N-79 | 20 | V-18 | 35 | N-65 | 15 | — | — |
| B-179 | V-44 | 26 | N-80 | 24 | V-19 | 20 | N-65 | 16 | N-69 | 14 |
| B-180 | V-45 | 28 | N-81 | 22 | V-20 | 37 | N-65 | 13 | — | — |
| B-181 | V-40 | 35 | V-43 | 15 | V-23 | 32 | N-75 | 18 | — | — |
| B-182 | V-35 | 22 | V-44 | 28 | V-2 | 20 | N-75 | 17 | N-69 | 13 |
| B-183 | V-40 | 30 | V-45 | 20 | V-3 | 34 | N-75 | 16 | — | — |
| B-184 | V-35 | 31 | V-40 | 19 | V-27 | 36 | N-75 | 14 | — | — |
| B-185 | V-43 | 35 | V-35 | 15 | V-3 | 30 | N-65 | 15 | N-82 | 5 |
| B-186 | N-74 | 30 | N-81 | 20 | V-29 | 10 | N-65 | 12 | V-2 | 28 |
| B-187 | N-74 | 30 | N-81 | 20 | V-30 | 15 | N-65 | 13 | V-3 | 22 |
| B-188 | V-31 | 50 | V-18 | 20 | N-75 | 12 | V-28 | 18 | — | — |
| B-189 | V-32 | 50 | V-19 | 30 | N-65 | 15 | V-29 | 5 | — | — |
| B-190 | V-33 | 50 | V-20 | 35 | N-65 | 15 | — | — | — | — |
| B-191 | V-36 | 26 | N-83 | 24 | V-23 | 38 | N-75 | 12 | — | — |
| B-192 | V-37 | 28 | N-76 | 22 | V-2 | 20 | N-75 | 12 | N-69 | 18 |
| B-193 | V-38 | 28 | V-33 | 22 | V-3 | 35 | N-75 | 15 | — | — |
| B-194 | V-41 | 25 | V-36 | 25 | V-27 | 25 | N-65 | 15 | V-3 | 10 |
| B-195 | V-42 | 26 | V-37 | 24 | V-3 | 26 | N-65 | 15 | N-82 | 6 |
| B-196 | V-39 | 26 | N-77 | 24 | V-24 | 20 | N-75 | 18 | N-82 | 12 |
| B-197 | V-34 | 28 | N-70 | 22 | V-25 | 34 | N-75 | 16 | — | — |
| B-198 | V-39 | 38 | N-84 | 12 | V-2 | 47 | N-75 | 3 | — | — |
| B-199 | V-34 | 50 | V-30 | 30 | N-65 | 17 | V-3 | 3 | — | — |

It is believed that by using the binder polymer including a functional group having a dipole moment of 3.8 debye or more according to the invention, the polarity of the polymerizable composition increases and as a result, since the radical polymerization reaction is stabilized, the polymerization rate increases and the sensitivity is improved.

The binder polymer used in the polymerizable composition according to the invention preferably has a weight average molecular weight of 5,000 or more, more preferably from 10,000 to 300,000, and a number average molecular weight of 1,000 or more, more preferably from 2,000 to 250,000. The polydispersity (weight average molecular weight/number average molecular weight) is preferably from 1.1 to 10.

The binder polymer used in the polymerizable composition according to the invention may be any of a random polymer, a block polymer, a graft polymer or the like, and it is preferably a random polymer.

The binder polymers used in the polymerizable composition according to the invention may be used individually or in combination of two or more thereof. Further, it can be used together with a binder polymer which does not contain a functional group having a dipole moment of 3.8 debye or more as long as the effects of the invention are not damaged.

The content of the binder polymer used in the polymerizable composition according to the invention is from 5 to 90% by weight, preferably from 10 to 70% by weight, more preferably from 10 to 60% by weight, based on the total solid content of the polymerizable composition. In the range described above, the preferable strength of the image area and good image-forming property can be achieved.

Next, the binder polymer which contains a functional group having a dipole moment of 3.8 debye or more and has an acid value of 0.3 meq/g or less for use in the photosensitive layer of a lithographic printing plate precursor according to the invention is described in detail below.

[Binder Polymer which Contains a Functional Group Having a Dipole Moment of 3.8 Debye or More and has an Acid Value of 0.3 meq/g or Less]

The binder polymer which contains a functional group having a dipole moment of 3.8 debye or more and has an acid value of 0.3 meq/g or less for use in the photosensitive layer of a lithographic printing plate precursor according to the invention is preferably a binder polymer including a functional group having a dipole moment of 3.8 debye or more in any position of the main chain and side chain thereof and containing an acid group selected from a carboxylic acid group (—COOH), a sulfonic acid group (—$SO_3$H), a dihydrogenphosphoric acid group (—OPO$(OH)_2$), a monohydrogenphosphonic acid group (—OPO(OH)(OM)), dihydrogenphosphonic acid group (—PO$(OH)_2$), a monohydrogenphosphonic acid group (—PO(OH)(OM)) and a sulfuric acid group (—$OSO_3$H) (wherein M represents a metal cation, for example, $Na^+$, $K^+$ or $Li^+$ or an ammonium ion, for example, tetramethylammonium) in an amount satisfying equation (1) shown below. The dipole moment is described hereinbefore.

$$\text{Acid group in binder polymer (mmol)/Average molecular weight of binder polymer (g)} \leq 0.3 \text{ (mmol/g)} \qquad \text{Equation (1)}$$

In equation (1), average molecular weight of binder polymer=

$$\sum_{n=1}^{Z} (An \times Mn)$$

wherein n represents a number of unit constituting the binder polymer, z represents a sum total of unit constituting the binder polymer, An represents a mole fraction of $n^{th}$ unit in the binder polymer, $$\sum_{n=1}^{z} An = 1,$$

and Mn represents a molecular weight of $n^{th}$ unit.

In the invention, although any binder polymer including a functional group having a dipole moment of 3.8 debye or more and having an acid value of 0.3 meq/g or less can be preferably used, with respect to the dipole moment it is more preferable to use a binder polymer including a functional group having a larger dipole moment. Specifically, a binder polymer including a functional group having a dipole moment of 4.5 debye or more is more preferable and a binder polymer including a functional group having a dipole moment of 5.0 debye or more is particularly preferable.

The upper limit of the dipole moment of the functional group according to the invention is preferably 10 or less, more preferably 8.5 or less, still more preferably 7.0 or less.

In the determination of the dipole moment of the functional group according to the invention, a dipole moment of a compound formed by substituting a bond of a functional group, for example, a hydroxy group, an ester group or an ether group, or a functional group formed by combination of these groups, which connects to a binder polymer with a hydrogen atom is determined and the value obtained is indicated as a dipole moment of the functional group. A molecular weight of the compound used for the determination of dipole moment is preferably from 50 to 300, more preferably from 60 to 280, still more preferably from 70 to 250. As the functional group having a dipole moment of 3.8 debye or more for use in the binder polymer of the photosensitive layer of a lithographic printing plate precursor according to the invention, functional groups represented by formulae (1) to (5) shown below are preferable.

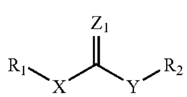

(1)

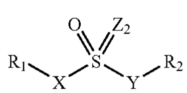

(2)

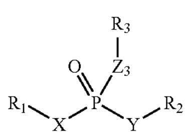

(3)

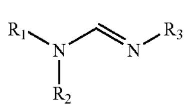

(4)

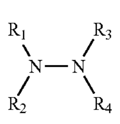

(5)

In formulae (1) to (5), X and Y each represents —C($R_5$)($R_6$)—, —C($R_5$)═, —O—, —S—, —N($R_5$)— or —N═, $Z_1$ represents O or S, $Z_2$ represents O or a lone pair, $Z_3$ represents —C($R_5$)($R_6$)—, —C($R_5$)═, —O—, —S—, —N($R_5$)— or —N═, and $R_1$ to $R_6$ each represents a substituent comprising at least one atom selected from hydrogen, carbon, oxygen, nitrogen, sulfur, phosphorus, halogen and silicon or appropriate two of $R_1$ to $R_6$ may be combined with each other to form a ring, provided that at least one of $R_1$ to $R_6$ represents a divalent connecting group comprising at least one atom selected from hydrogen, carbon, oxygen, nitrogen, sulfur, phosphorus, halogen and silicon and connecting to a skeleton of the binder polymer.

The details of the groups represented by X, Y, $Z_1$, $Z_2$, $Z_3$ and $R_1$ to $R_3$ are same as those described hereinbefore, respectively.

Specific examples of the compound forming the functional group for use in the binder polymer of the photosensitive layer of a lithographic printing plate precursor according to the invention are set forth below, but the invention should not be construed as being limited thereto. In the following three Tables, the chemical formulae are the specific examples of the compound forming the functional group, and the numerical values at the right sides of the formulae are dipole moments.

| 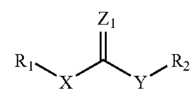 | (1) |
|---|---|
| 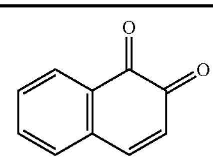 | 5.4 |
| 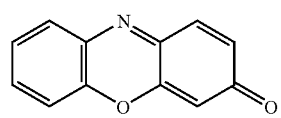 [SMILES: O=c1ccc2nc3ccccc3oc-2c1] | 4.5 |
| 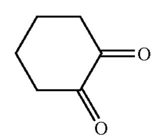 | 4.7 |
| 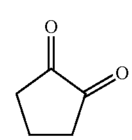 | 4.4 |
| 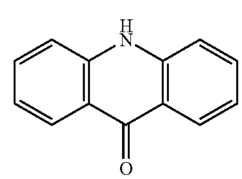 [SMILES: O=c1c2ccccc2[nH]c2ccccc12] | 4.2 |
| 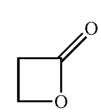 | 4.1 |
| 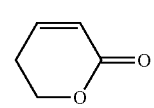 | 5.3 |
| 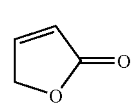 | 4.7 |

-continued
| | |
|---|---|
| 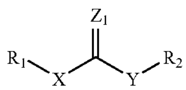 | (1) |
| 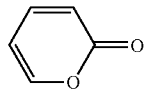 | 4.4 |
| 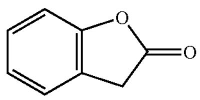 | 4.1 |
| 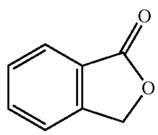 | 5.1 |
| 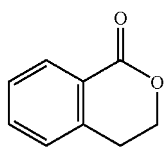 [SMILES: O=C1OCCc2ccccc21] | 5.1 |
| 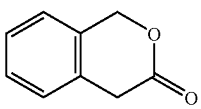 | 4.8 |
| 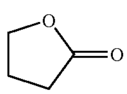 | 4.6 |
| 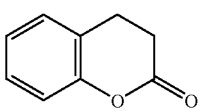 [SMILES: O=C1CCc2ccccc2O1] | 4.2 |
| 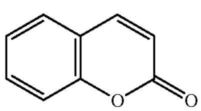 [SMILES: O=c1ccc2ccccc2o1] | 4.8 |
| 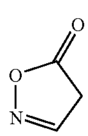 | 4.5 |
| 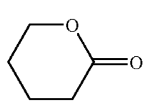 | 4.8 |
| 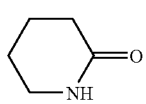 | 4.0 |
| 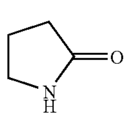 | 3.8 |
-continued
| | |
|---|---|
| 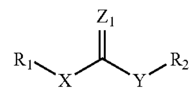 | (1) |
| 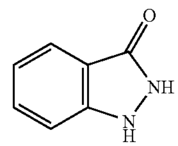 | 4.3 |
| 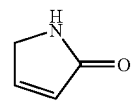 | 4.2 |
| 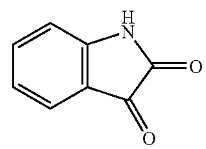 [SMILES: O=C1Nc2ccccc2C1=O] | 5.1 |
| 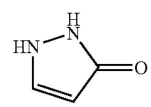 | 5.6 |
| 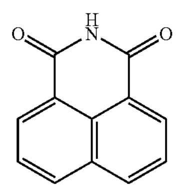 [SMILES: O=C1NC(=O)c2cccc3cccc1c23] | 5.1 |
| 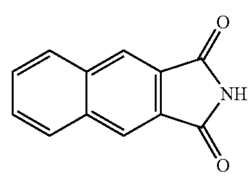 [SMILES: O=C1NC(=O)c2cc3ccccc3cc21] | 4.2 |
| 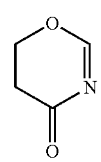 | 4.2 |
| 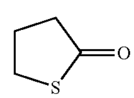 | 3.9 |
| 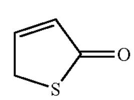 | 4.2 |
| 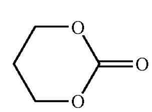 | 5.9 |
| 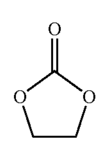 | 5.1 |

-continued
| 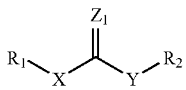 | (1) |
|---|---|
| 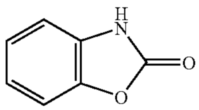 | 4.5 |
| 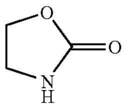 | 5.1 |
| 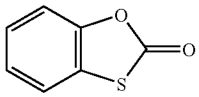 | 4.3 |
| 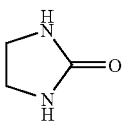 | 4.3 |
| 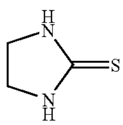 | 5.8 |
| 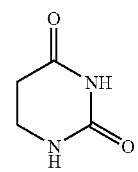 | 4.2 |
| 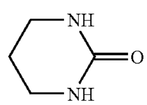 | 4.5 |
| 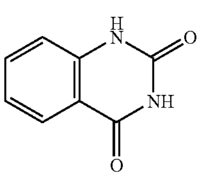 [SMILES: O=c1[nH]c(=O)c2ccccc2[nH]1] | 4.2 |
| 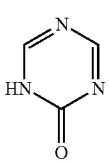 | 4.2 |
| 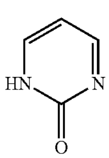 | 5.5 |
-continued
| 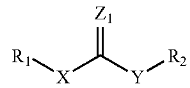 | (1) |
|---|---|
| 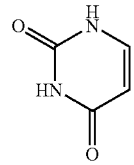 | 4.3 |
| 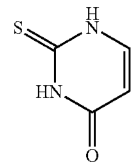 | 4.6 |
| 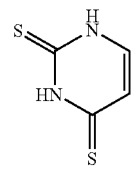 | 4.7 |
| 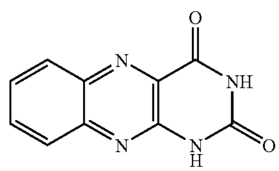 [SMILES: O=c1[nH]c(=O)c2nc3ccccc3nc2[nH]1] | 4.1 |
| 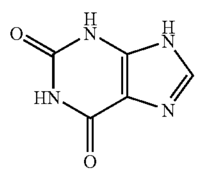 [SMILES: O=c1[nH]c(=O)c2nc[nH]c2[nH]1] | 7.0 |
| 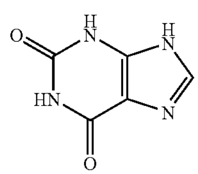 [SMILES: O=c1[nH]c(=O)c2nc[nH]c2[nH]1] | 6.6 |
| 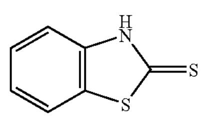 | 4.6 |
| 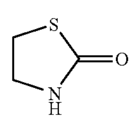 | 4.7 |
| 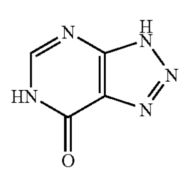 | 5.7 |

-continued
| 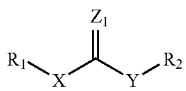 | (1) |
| --- | --- |
| 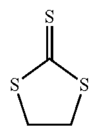 | 4.0 |
| 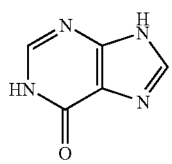 | 4.9 |
| 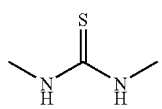 | 5.3 |
| 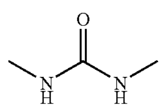 | 3.9 |
| 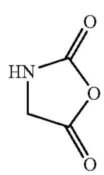 | 5.2 |
| 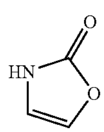 | 4.8 |
| 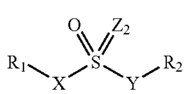 | (2) |
| --- | --- |
| 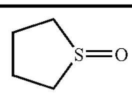 | 3.9 |
| 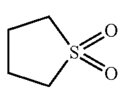 | 4.3 |
| 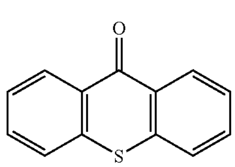 [SMILES: O=c1c2ccccc2sc2ccccc12] | 4.1 |
-continued
| 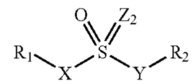 | (2) |
| --- | --- |
| 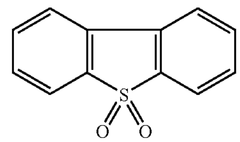 [SMILES: O=S1(=O)c2ccccc2-c2ccccc21] | 5.4 |
| 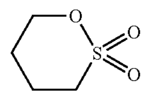 | 4.7 |
| 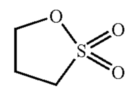 | 4.9 |
| 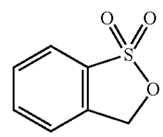 [SMILES: O=S1(=O)OCc2ccccc21] | 6.2 |
| 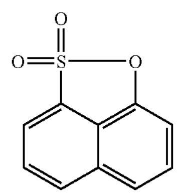 [SMILES: O=S1(=O)Oc2cccc3cccc1c23] | 5.8 |
| 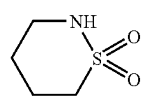 | 4.9 |
| 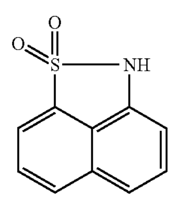 | 4.7 |
| 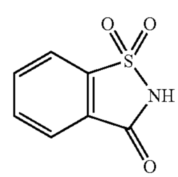 [SMILES: O=C1NS(=O)(=O)c2ccccc21] | 4.1 |
| 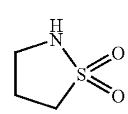 | 4.7 |
| 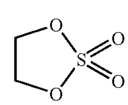 | 4.0 |
| 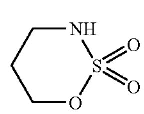 | 5.5 |

-continued
| 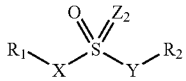 | (2) |
|---|---|
| 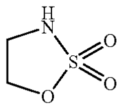 | 5.4 |
| 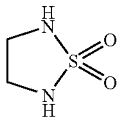 | 5.1 |
| 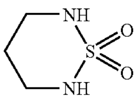 | 5.5 |
| 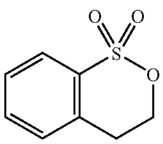 | 6.3 |
| 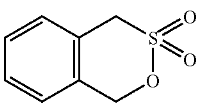 [SMILES: O=S1(=O)Cc2ccccc2CO1] | 5.3 |
| 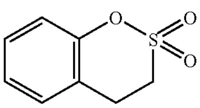 [SMILES: O=S1(=O)CCc2ccccc2O1] | 4.6 |
| 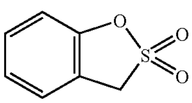 | 4.4 |
| 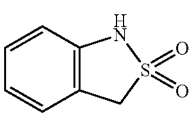 [SMILES: O=S1(=O)Cc2ccccc2N1] | 4.1 |
| 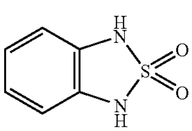 [SMILES: O=S1(=O)Nc2ccccc2N1] | 3.9 |
| 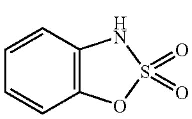 | 4.7 |
| 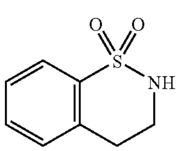 [SMILES: O=S1(=O)NCCc2ccccc21] | 5.4 |
| 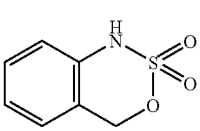 [SMILES: O=S1(=O)Nc2ccccc2CO1] | 5.6 |
-continued
| 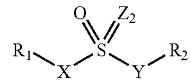 | (2) |
|---|---|
| 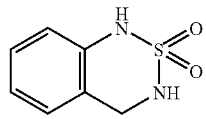 | 4.8 |
| 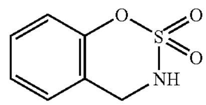 [SMILES: O=S1(=O)NCc2ccccc2O1] | 5.1 |
| 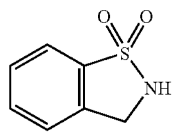 [SMILES: O=S1(=O)NCc2ccccc21] | 5.3 |
| 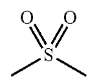 | 4.1 |
| 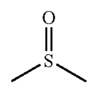 | 3.9 |
| 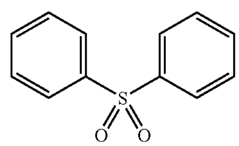 [SMILES: O=S(=O)(c1ccccc1)c1ccccc1] | 4.7 |
| 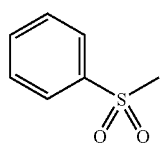 | 4.9 |
| 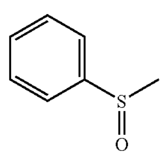 | 3.9 |
(3)
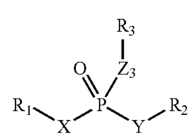
(4)
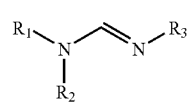
(5)

-continued

| 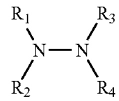 | |
|---|---|
| 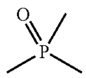 | 5.0 |
| 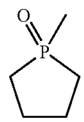 | 4.9 |
| 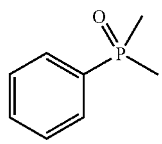 | 5.2 |
| 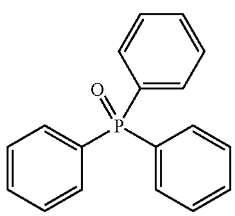 [SMILES: O=P(c1ccccc1)(c1ccccc1)c1ccccc1] | 5.3 |
| 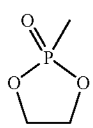 | 4.7 |
| 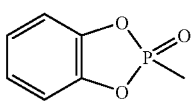 | 4.7 |
| 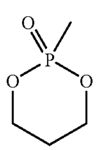 | 6.9 |
| 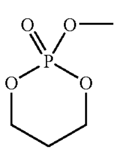 | 5.2 |

-continued

| | |
|---|---|
| 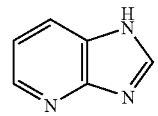 | 5.3 |
| 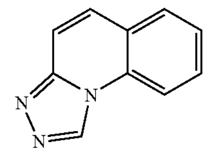 [SMILES: c1ccc2c(c1)ccc1nncn12] | 5.9 |
| 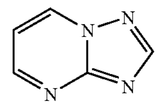 | 4.1 |
| 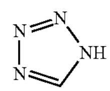 | 5.1 |
| 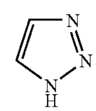 | 4.1 |
| 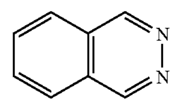 | 4.6 |

The binder polymer used in the photosensitive layer of a lithographic printing plate precursor according to the invention is a polymer compound including a functional group having a dipole moment of 3.8 debye or more and having an acid value of 0.3 meq/g or less. The polymer compound is preferably a polymer compound selected from an acrylic resin, a methacrylic resin, a styrene resin, a vinyl acetal resin, a urethane resin, a urea resin, an amide resin, an ester resin, a carbonate resin and an epoxy resin, and more preferably an acryl resin or a urethane resin. The binder polymer used in the invention can be produced by polymerization of a polymerization component including a functional group having a dipole moment of 3.8 debye or more.

Specific examples of the polymerization component including a functional group having a dipole moment of 3.8 debye or more for use in the binder polymer of the photosensitive layer of a lithographic printing plate precursor according to the invention are set forth below as a repeating unit, but the invention should not be construed as being limited thereto. In the specific examples below, U-1 to U-150 are repeating units preferable for forming an acrylic resin, methacrylic resin, styrene resin or the like and V-1 to V-53 are repeating units preferable for forming a urethane resin, urea resin, amide resin, ester resin, carbonate resin or the like.

U-1

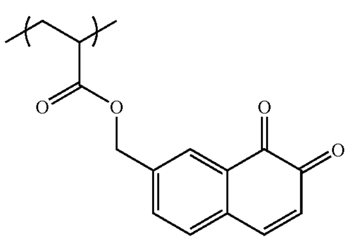

U-2

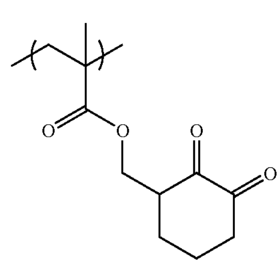

-continued
U-3
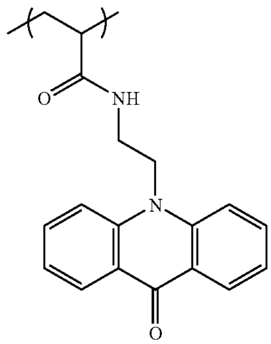
U-4
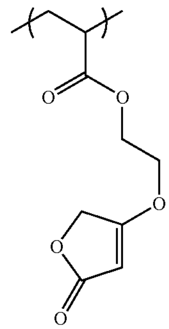
U-5
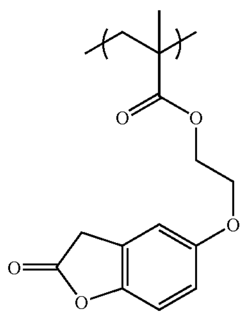
U-6
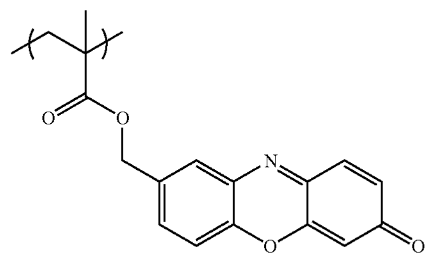
U-7
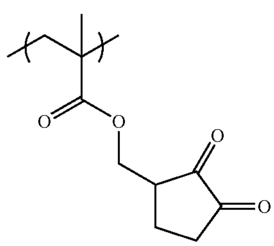
U-8
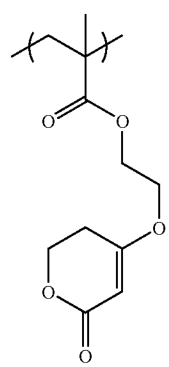
U-9
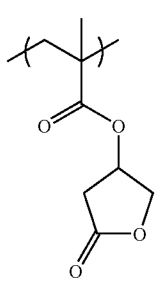
U-10
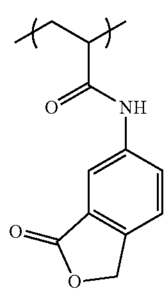
U-11
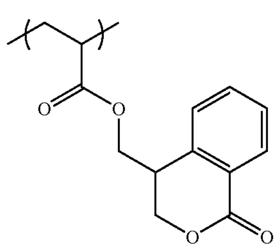
U-12
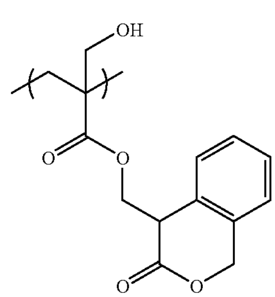

-continued
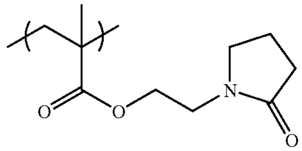
U-13
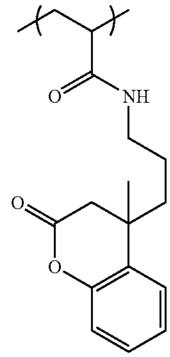
U-14
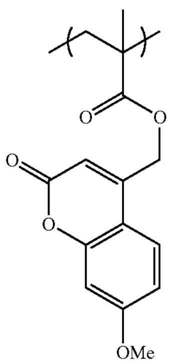
U-15
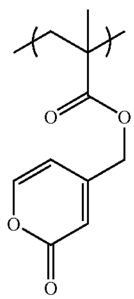
U-16
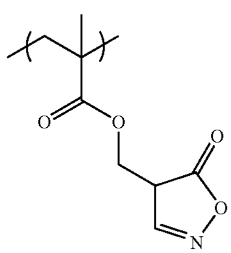
U-17
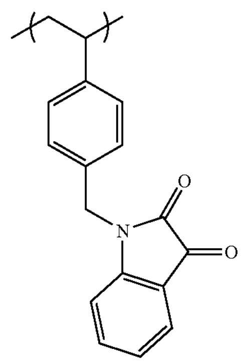
U-18
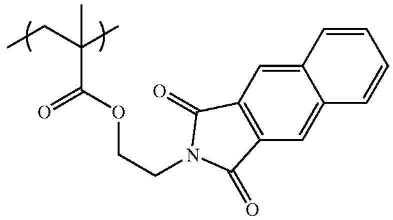
U-19
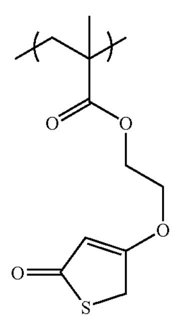
U-20

-continued
U-21
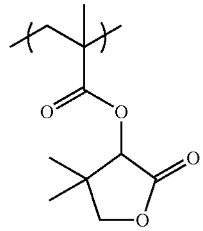
U-22
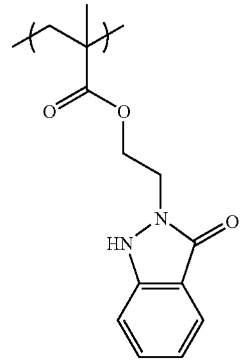
U-23
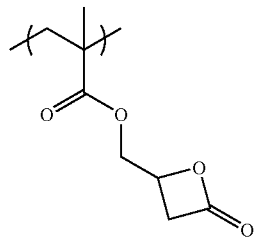
U-24
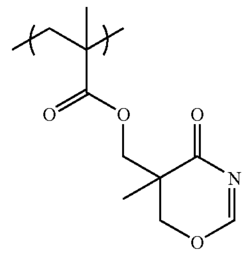
U-25
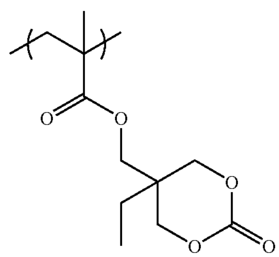
U-26
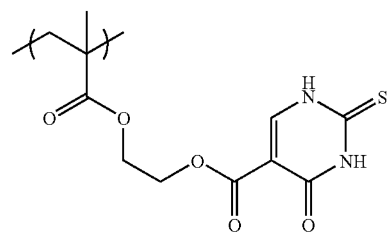
U-27
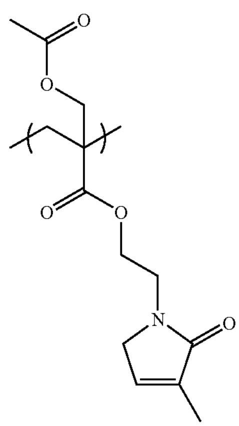
U-28
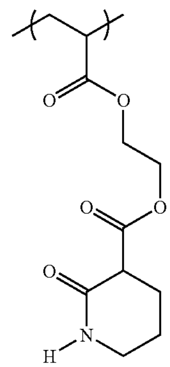
U-29
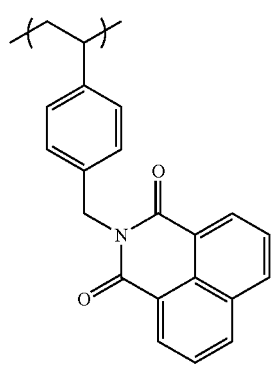
U-30
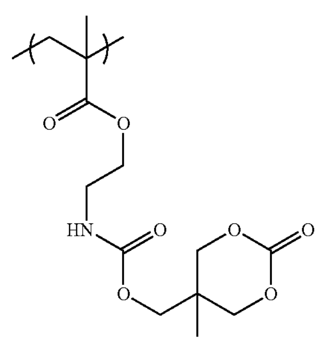

-continued
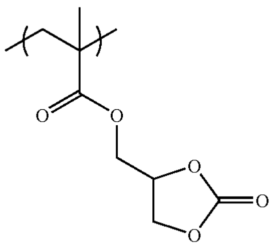
U-31
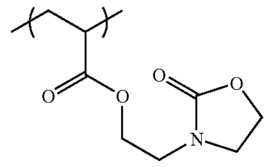
U-32
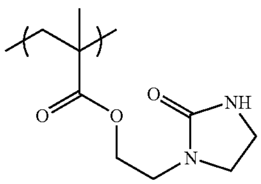
U-33
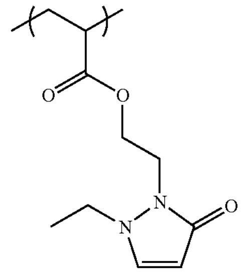
U-34
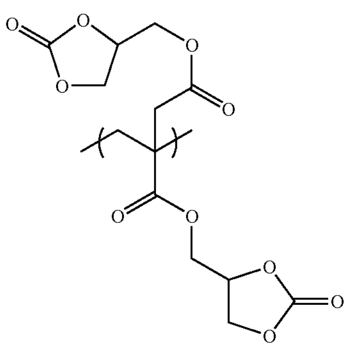
U-35
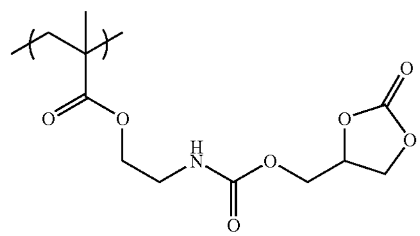
U-36
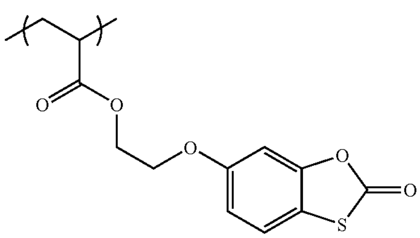
U-37
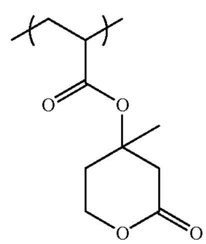
U-38
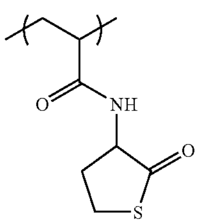
U-39
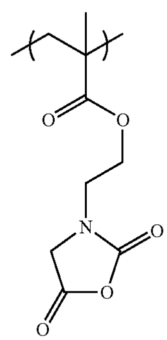
U-40

-continued
U-41
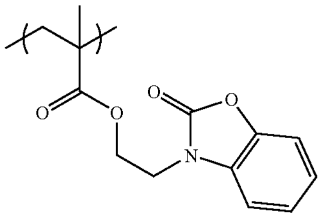
U-42
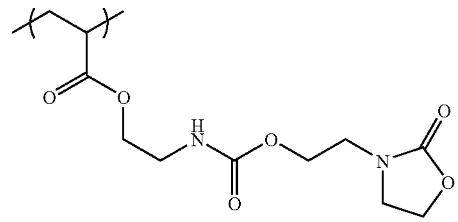
U-43
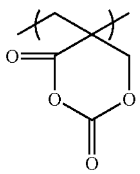
U-44
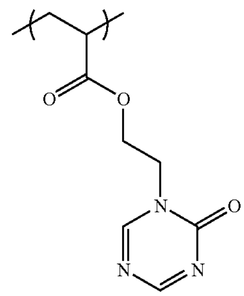
U-45
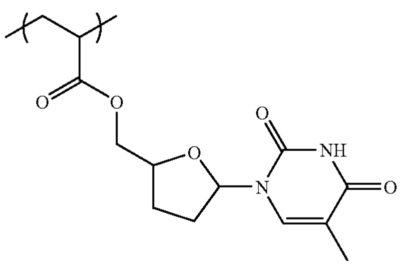
U-46
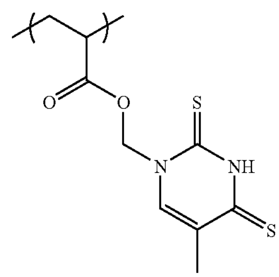
U-47
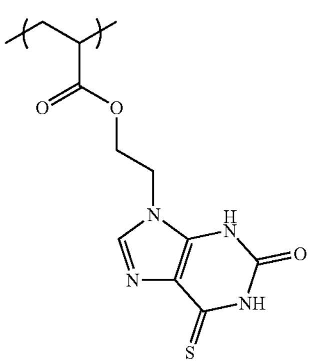
U-48
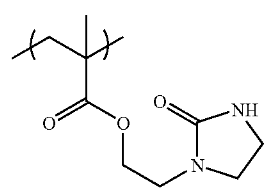
U-49
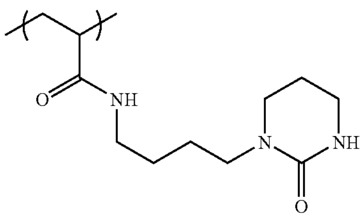
U-50
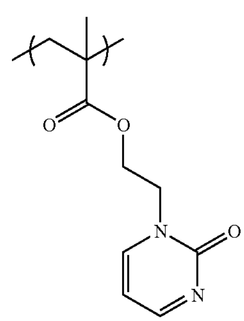

-continued
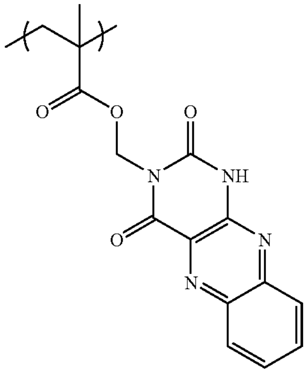
U-51
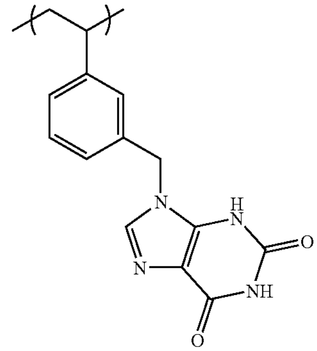
U-52
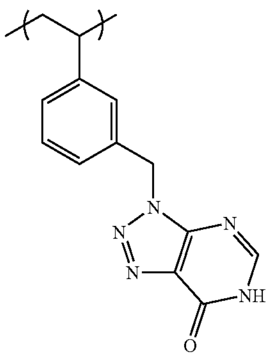
U-53
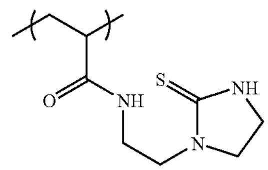
U-54
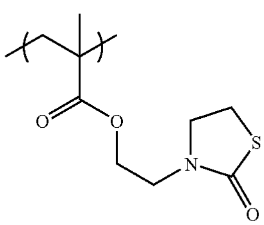
U-55
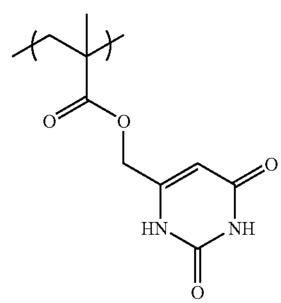
U-56
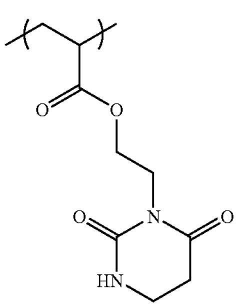
U-57
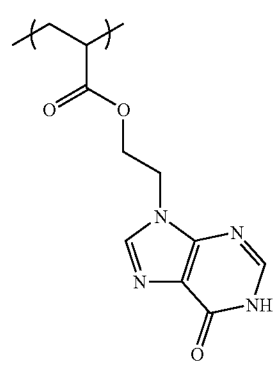
U-58

-continued
U-59
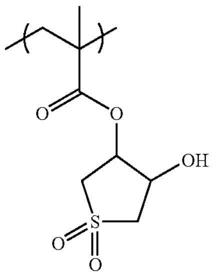
U-60
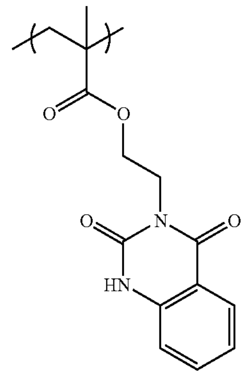
U-61
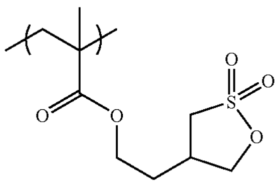
U-62
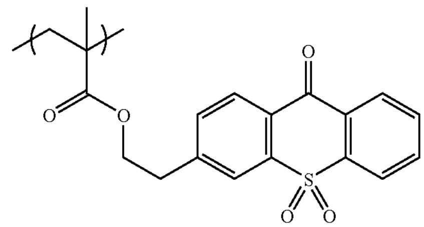
U-63
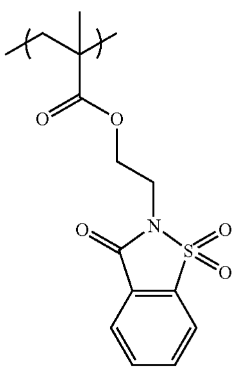
U-64
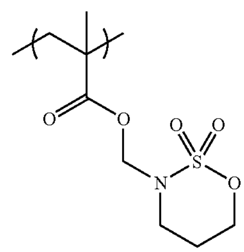
U-65
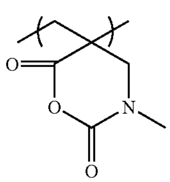
U-66
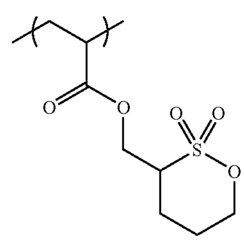
U-67
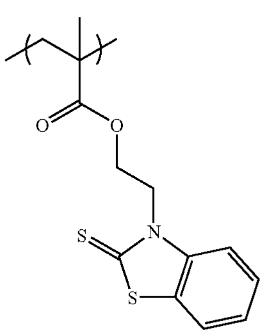
U-68
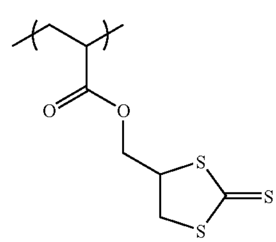

-continued
U-69
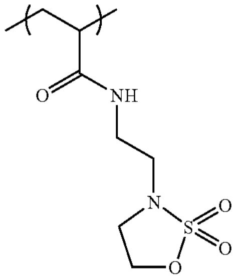
U-70
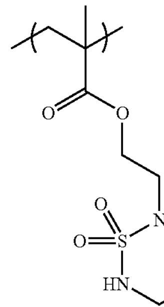
U-71
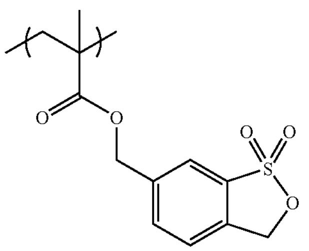
U-72
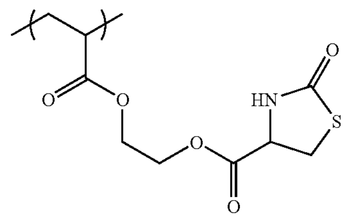
U-73
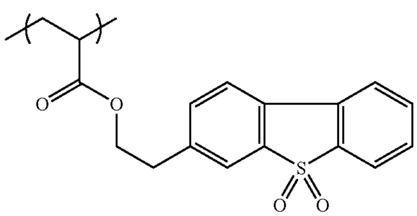
U-74
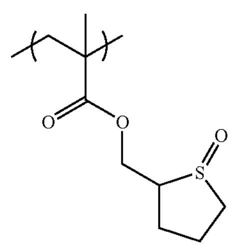
U-75
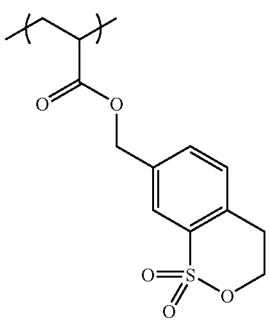
U-76
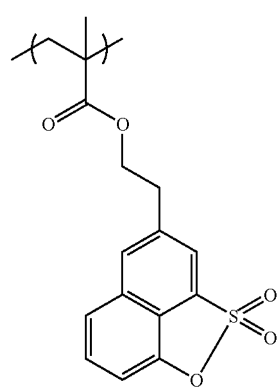
U-77
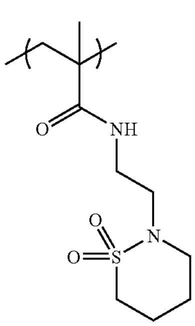
U-78
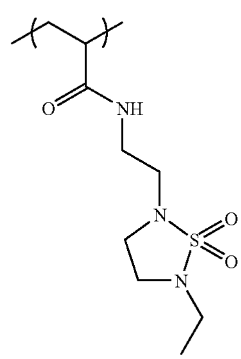

-continued
U-79
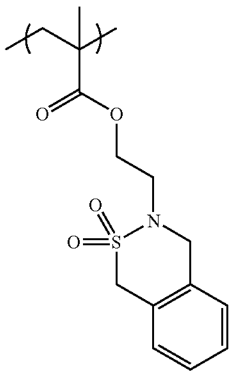
U-80
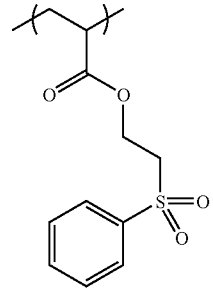
U-81
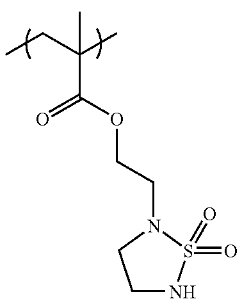
U-82
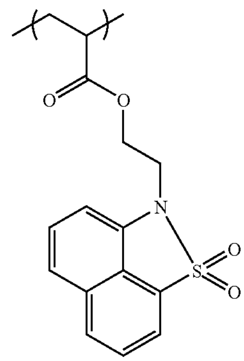
U-83
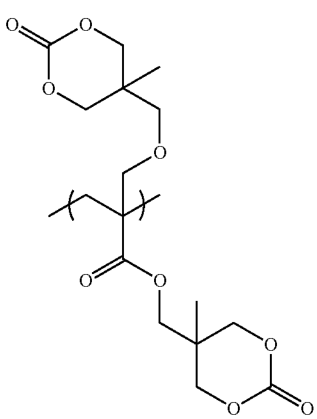
U-84
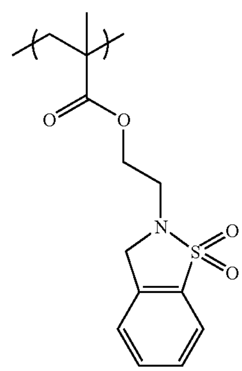
U-85
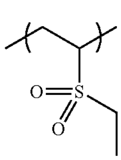
U-86
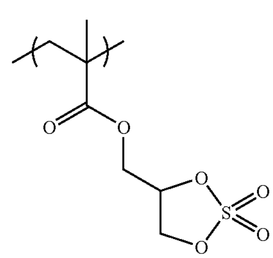

-continued
U-87
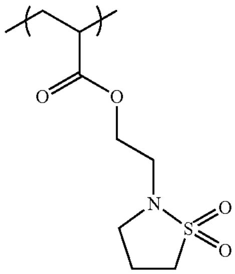
U-88
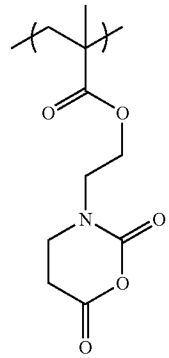
U-89
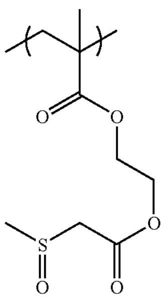
U-90
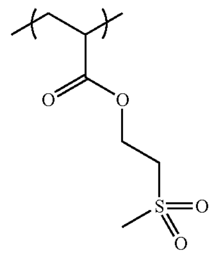
U-91
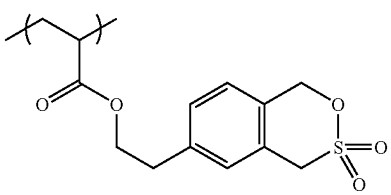
U-92
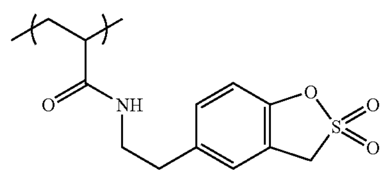
U-93
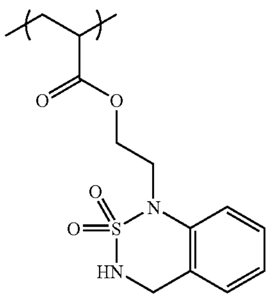
U-94
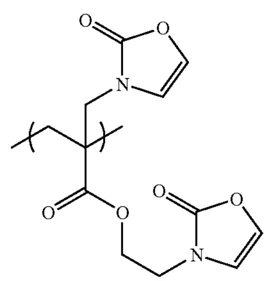
U-95
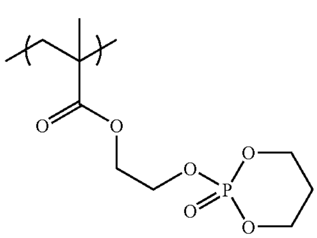
U-96
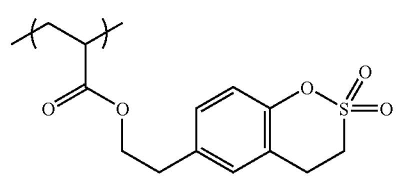

-continued
U-97
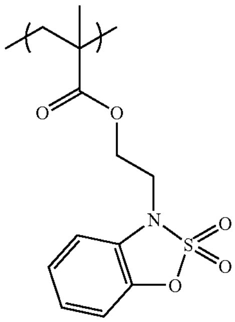
U-98
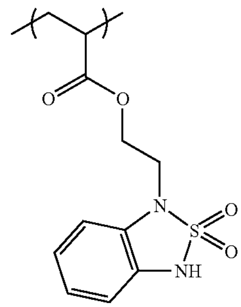
U-99
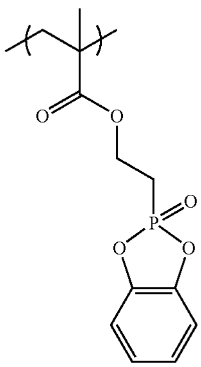
U-100
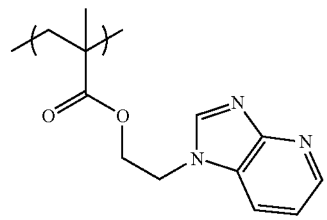
U-101
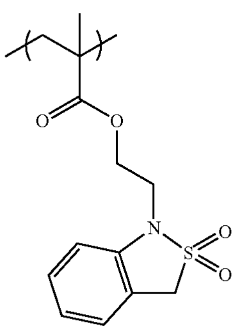
U-102
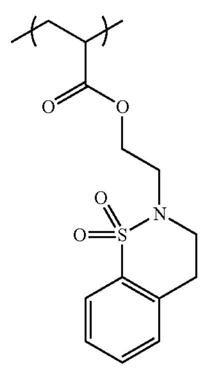
U-103
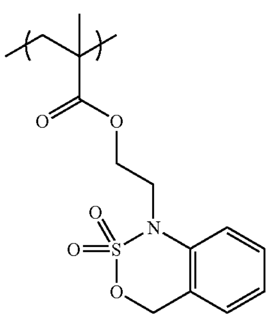
U-104
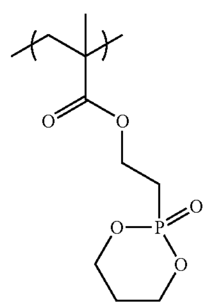
U-105
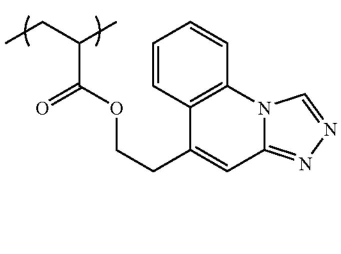
U-106
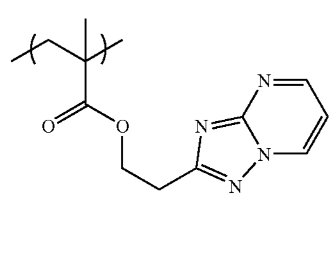

-continued
U-107
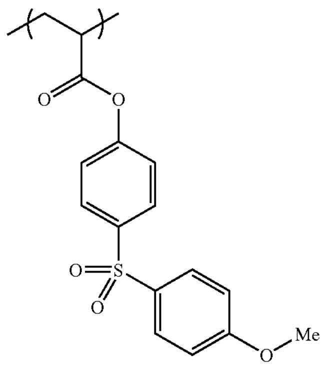
U-108
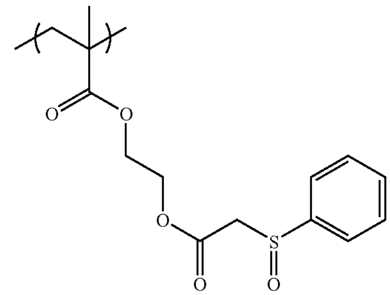
U-109
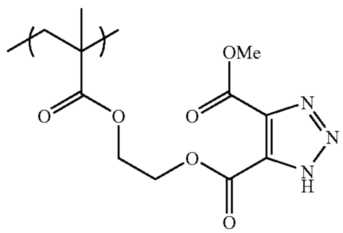
U-110
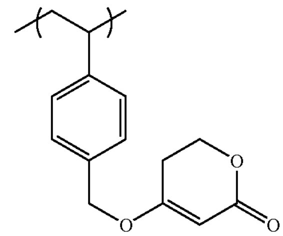
U-111
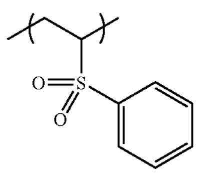
U-112
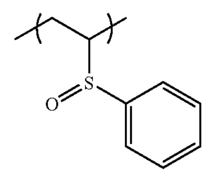
U-113
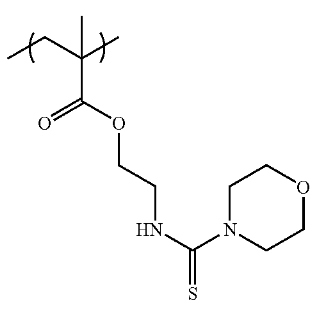
U-114
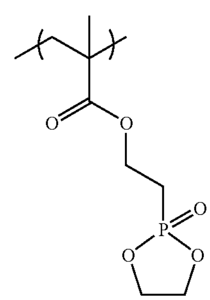
U-115
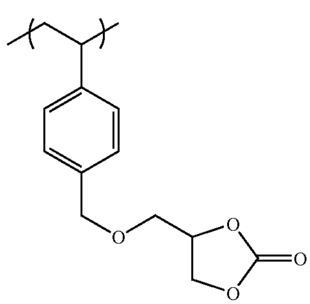
U-116
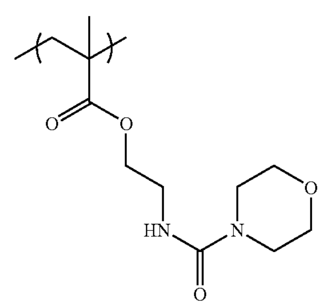

-continued
U-117
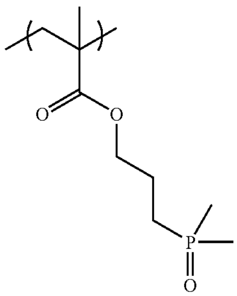
U-118
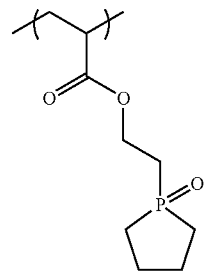
U-119
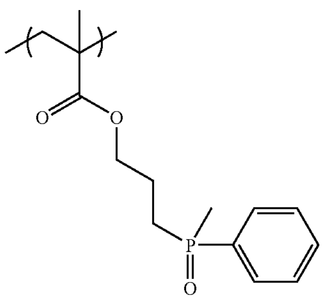
U-120
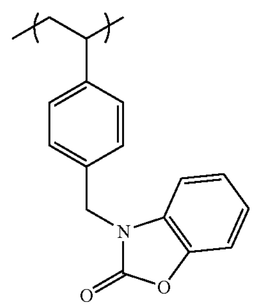
U-121
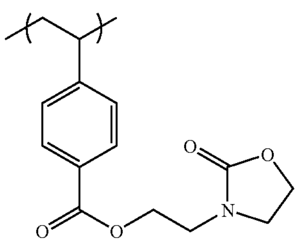
U-122
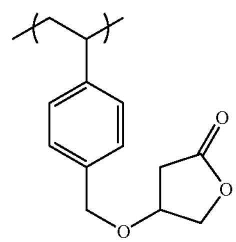
U-123
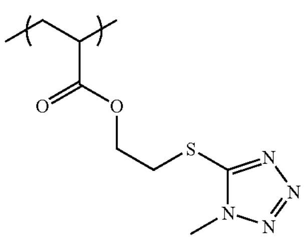
U-124
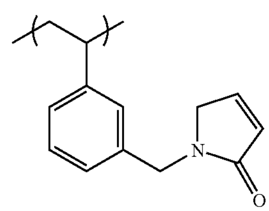
U-125
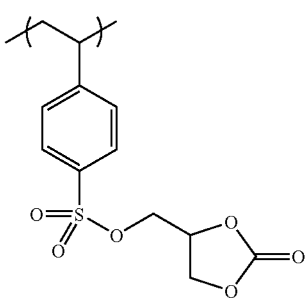
U-126
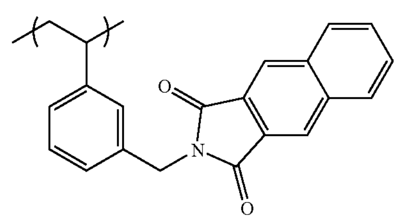

-continued
U-127
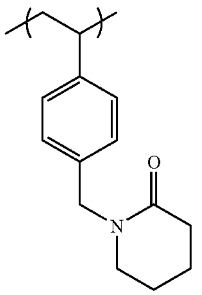
U-128
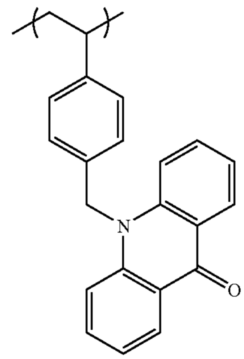
U-129
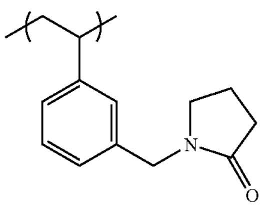
U-130
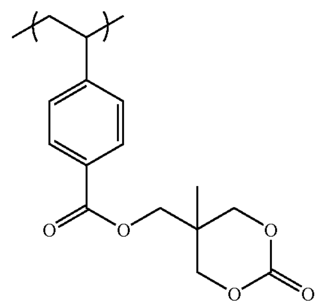
U-131
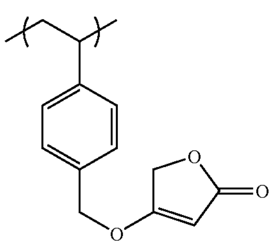
U-132
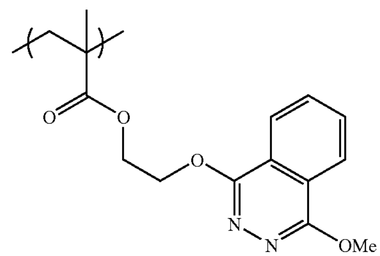
U-133
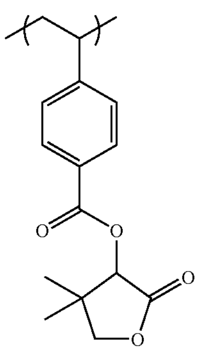
U-134
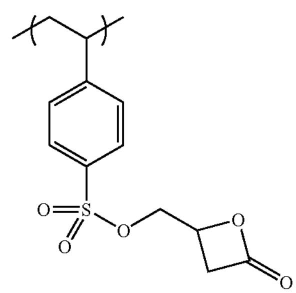
U-135
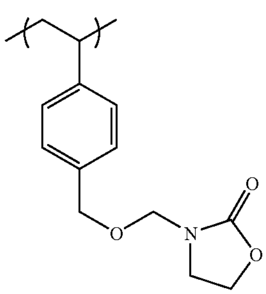
U-136
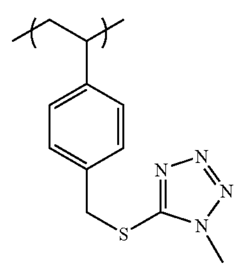

-continued
U-137
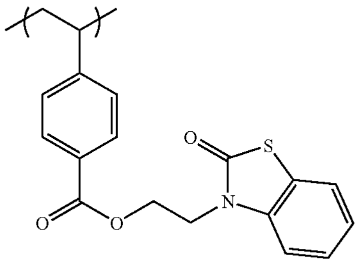
U-138
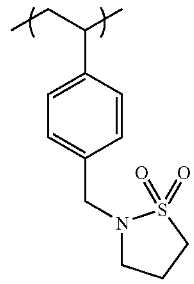
U-139
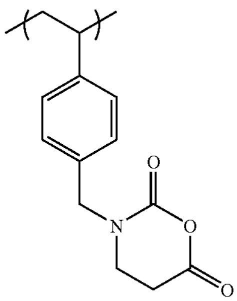
U-140
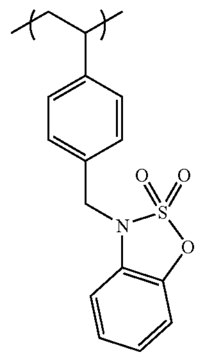
U-141
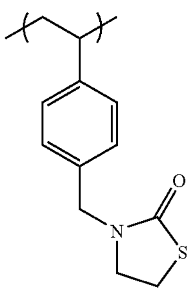
U-142
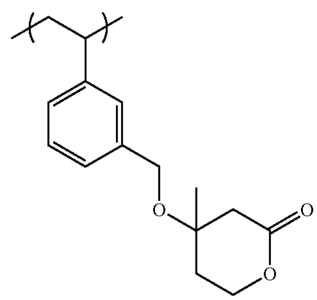
U-143
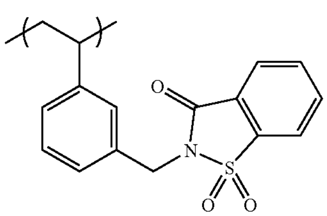
U-144
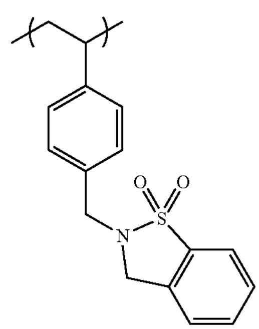
U-145
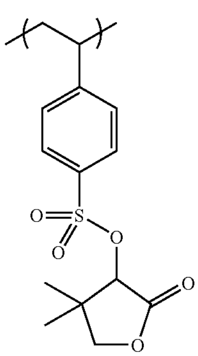
U-146
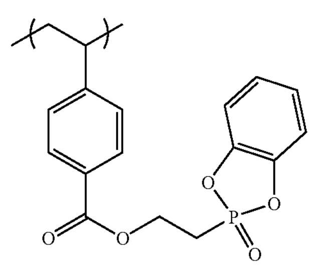

-continued
U-147
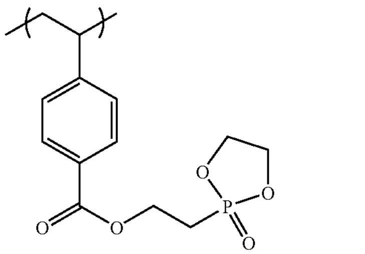
U-148
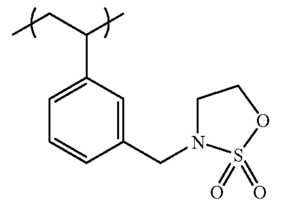
U-149
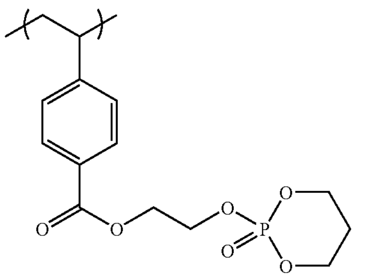
U-150
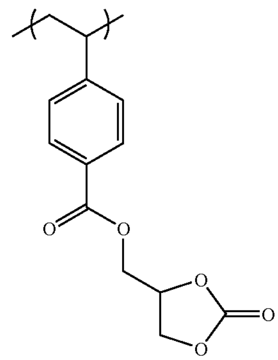
V-1
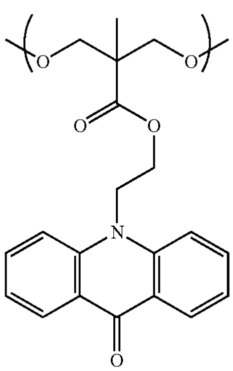
V-2
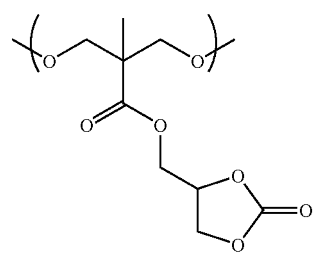
V-3
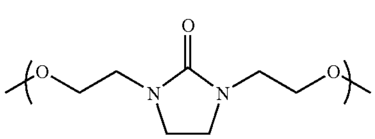
V-4
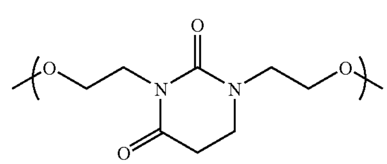
V-5
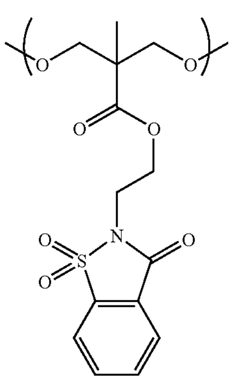

-continued
V-6
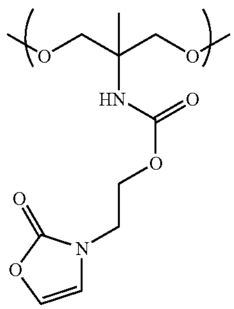
V-7
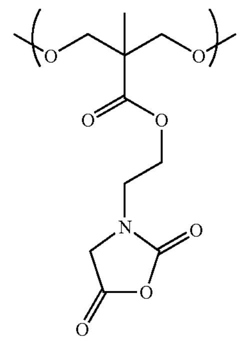
V-8
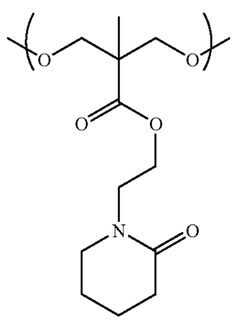
V-9
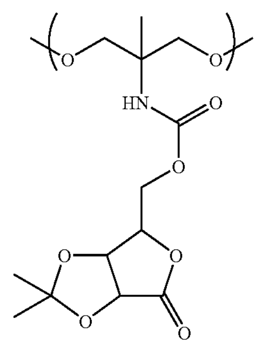
V-10
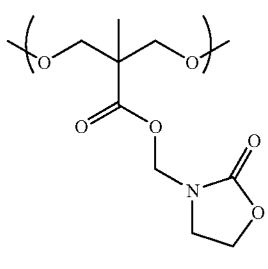
V-11
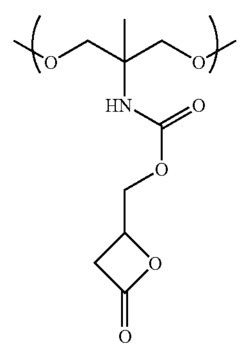
V-12
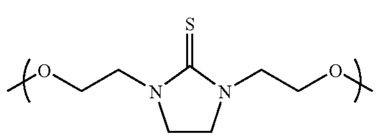
V-13
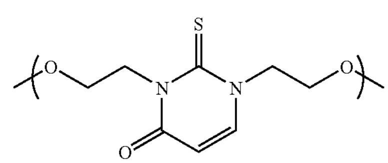
V-14
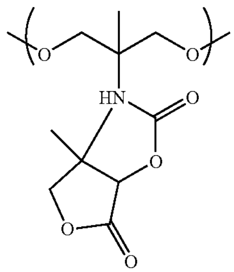
V-15
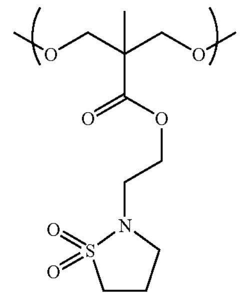

-continued
V-16
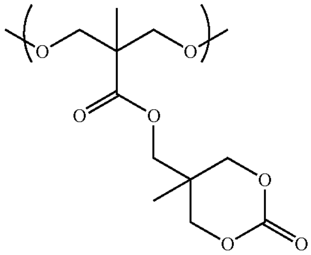
V-17
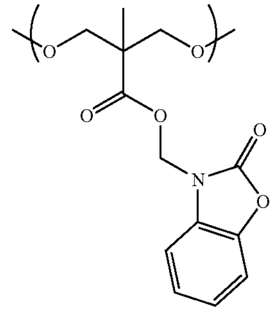
V-18
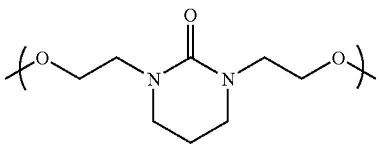
V-19
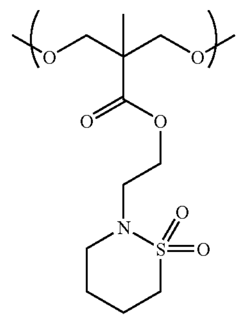
V-20
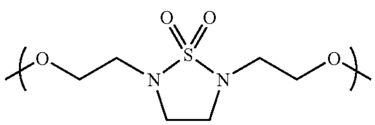
V-21
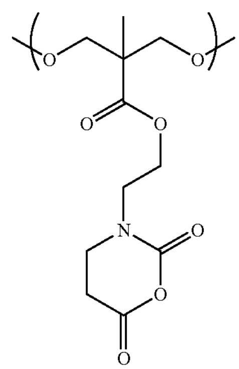
V-22
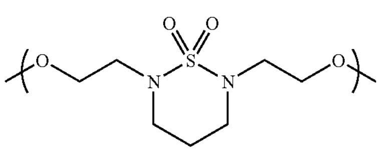
V-23
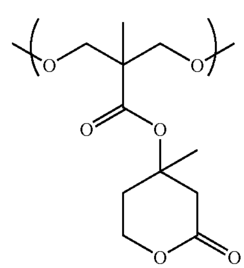
V-24
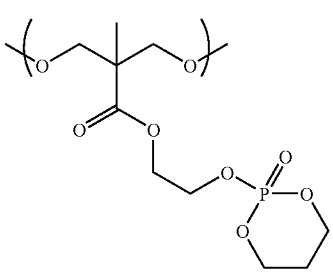
V-25
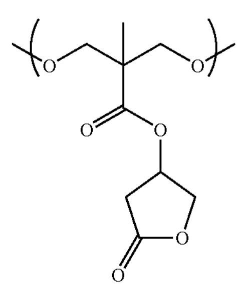

-continued
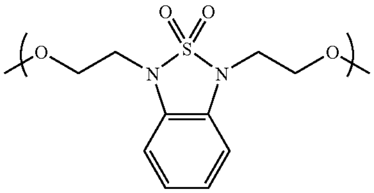
V-26
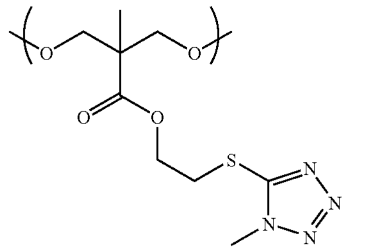
V-27
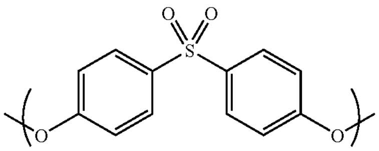
V-28
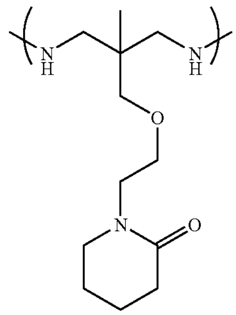
V-29
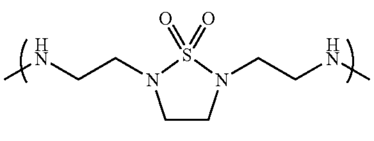
V-30
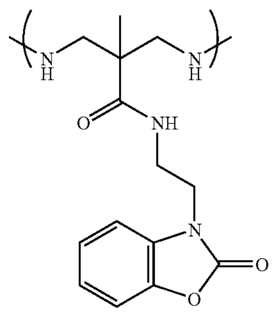
V-31
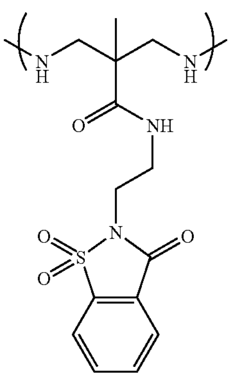
V-32
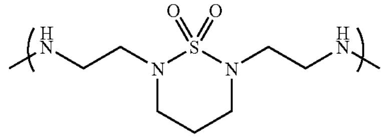
V-33
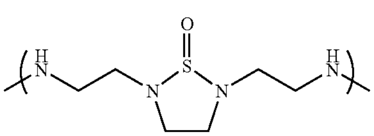
V-34
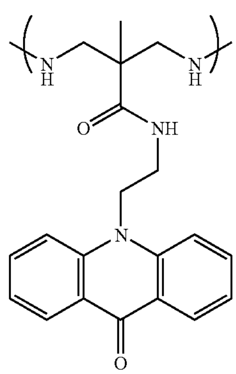
V-35

-continued
V-36
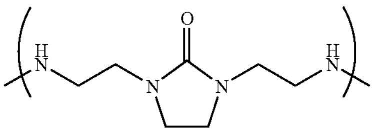
V-37
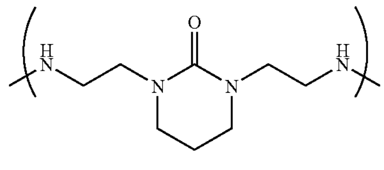
V-38
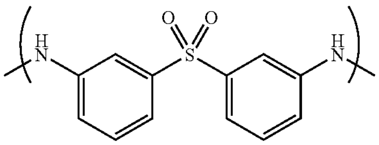
V-39
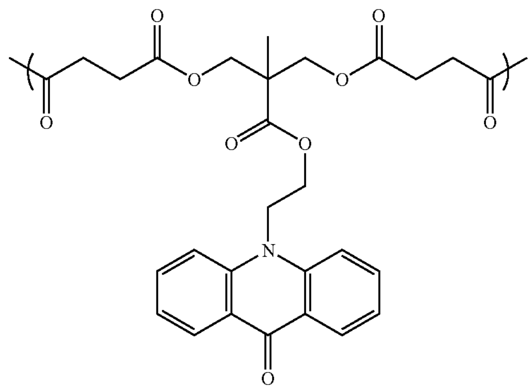
V-40
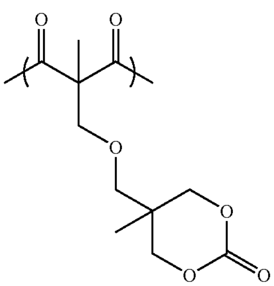
V-41
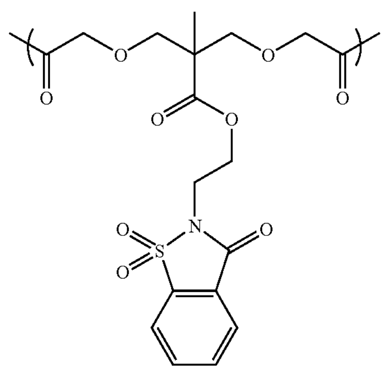
V-42
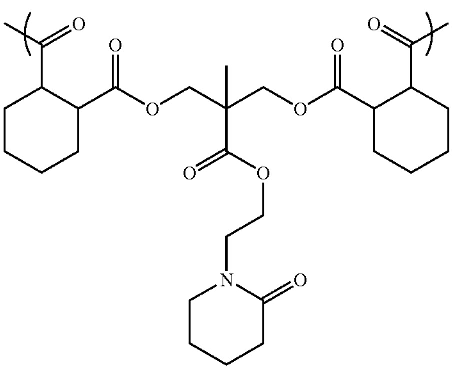
V-43
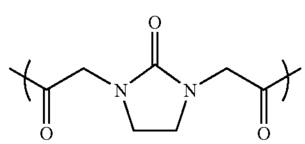
V-44
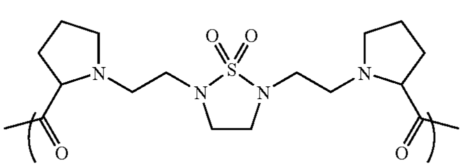
V-45
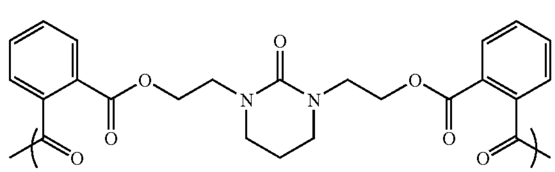

-continued
V-46
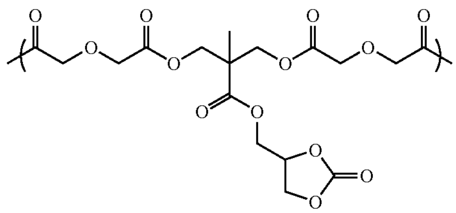
V-47
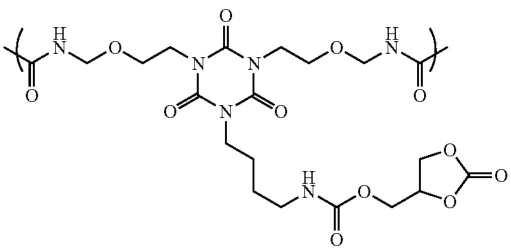
V-48
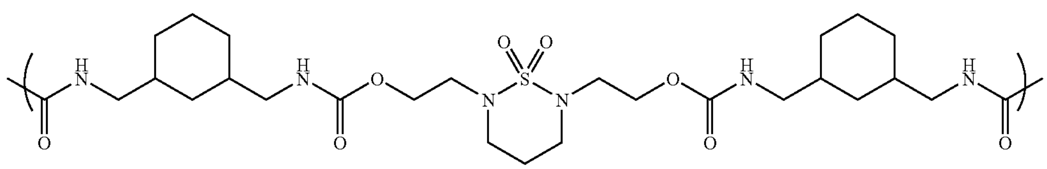
V-49
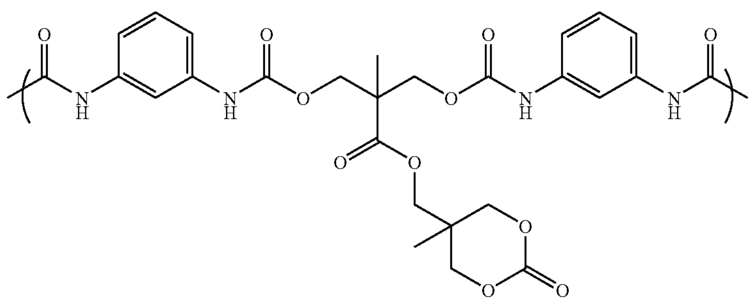
V-50
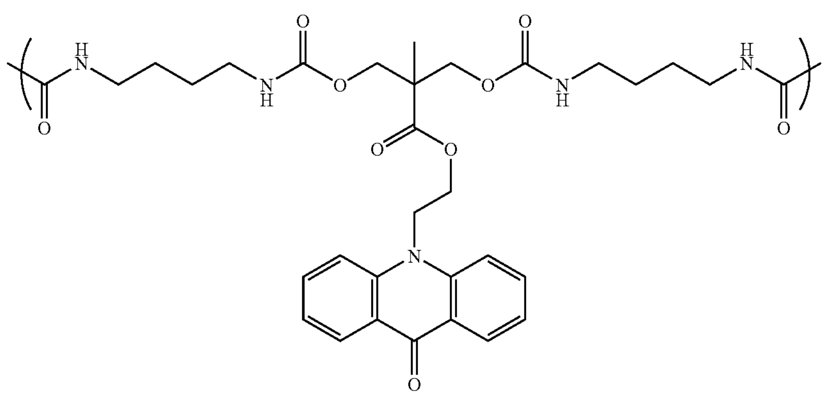
V-51
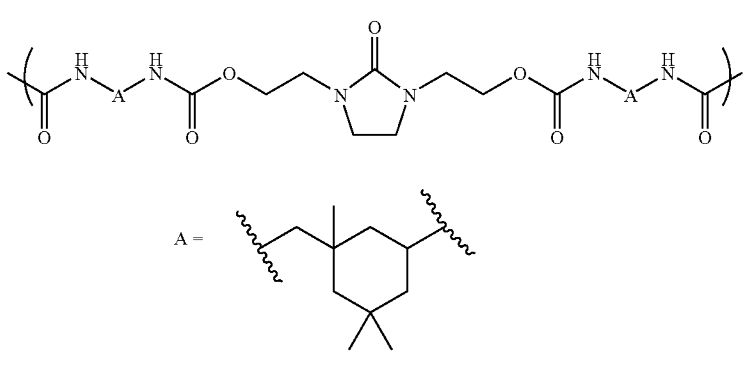

-continued

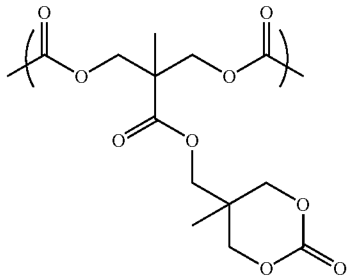

V-52

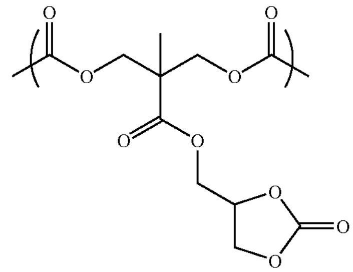

V-53

The polymerization components may be used individually or in combination of two or more thereof. The binder polymer used in the photosensitive layer of a lithographic printing plate precursor according to the invention may include a polymerization component which does not contain a functional group having a dipole moment of 3.8 debye or more as long as the effects of the invention are not damaged.

Further, the binder polymer used in the photosensitive layer of a lithographic printing plate precursor according to the invention may be imparted with a crosslinking property in order to increase the film strength of the image area. The means for imparting the crosslinking property to the binder polymer are same as those described with respect to the binder polymer for the polymerizable composition hereinbefore.

In view of improvement in the developing property with an aqueous solution, the binder polymer is preferably hydrophilic. On the other hand, in view of increasing the film strength, it is important that the binder polymer has good compatibility with the polymerizable compound contained in the photosensitive layer, that is, the binder polymer is preferably oleophilic. From these standpoints, it is also effective in the invention to introduce a hydrophilic group-containing component and an oleophilic group-containing component in the binder polymer in order to improve the developing property and the film strength. Examples of the hydrophilic group-containing component which can be preferably used include components having a hydrophilic group, for example, a hydroxy group, a carboxylate group, a hydroxyethyl group, an ethyleneoxy group, a hydroxypropyl group, a polyoxyethyl group, a polyoxypropyl group, an amino group, an aminoethyl group, an aminopropyl group, an ammonium group, an amido group or a carboxymethyl group.

Specific examples of the polymerization component which does not contain a functional group having a dipole moment of 3.8 debye or more for use in the binder polymer of the photosensitive layer of a lithographic printing plate precursor according to the invention are set forth below, but the invention should not be construed as being limited thereto.

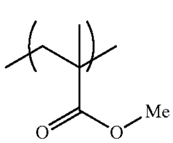

N-1

-continued

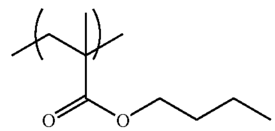

N-2

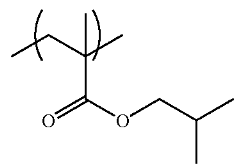

N-3

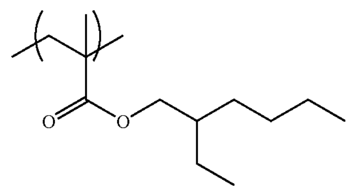

N-4

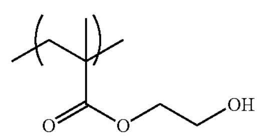

N-5

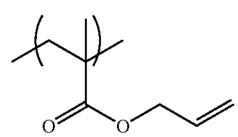

N-6

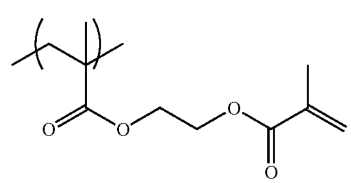

N-7

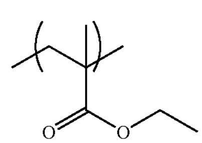

N-8

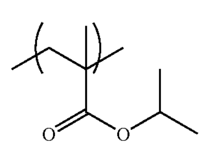

N-9

-continued
N-10
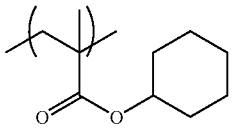
N-11
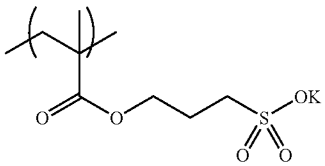
N-12
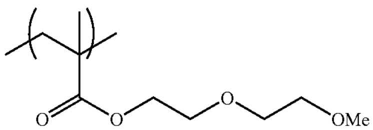
N-13
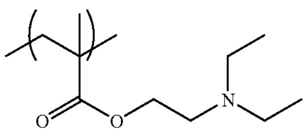
N-14
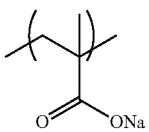
N-15
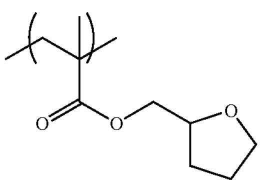
N-16
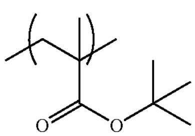
N-17
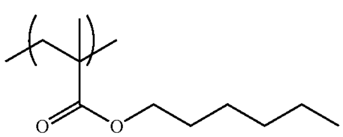
N-18
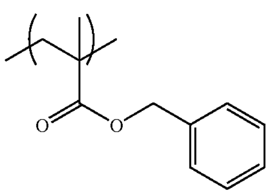
N-19
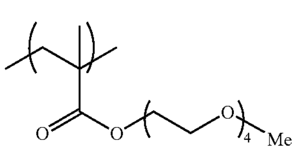
-continued
N-20
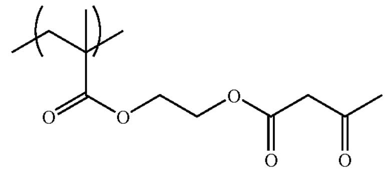
N-21
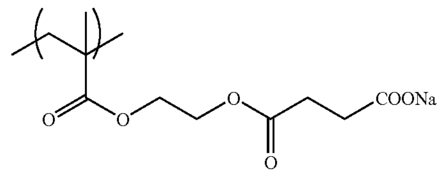
N-22
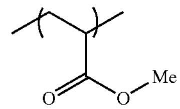
N-23
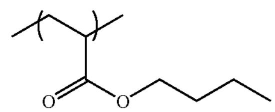
N-24
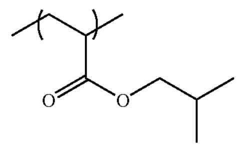
N-25
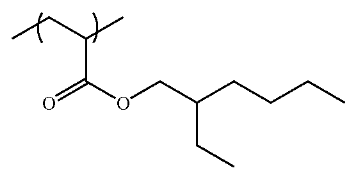
N-26
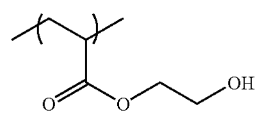
N-27
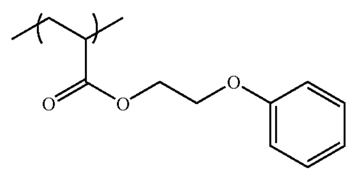
N-28
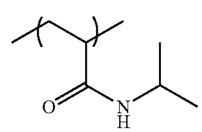
N-29
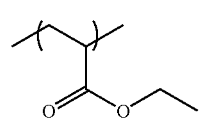
N-30
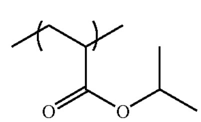

N-31
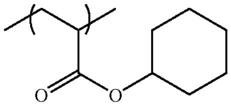
N-32
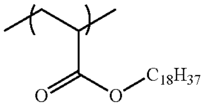
N-33
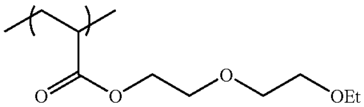
N-34
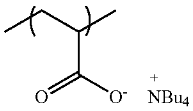
N-35
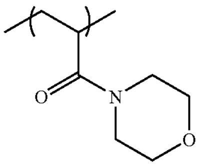
N-36
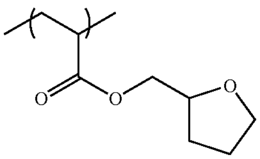
N-37
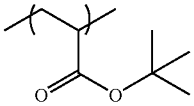
N-38
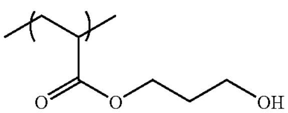
N-39
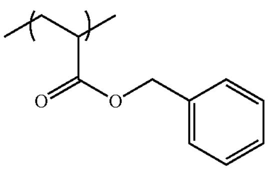
N-40
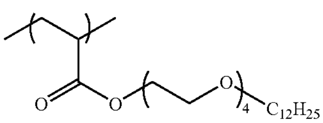
N-41
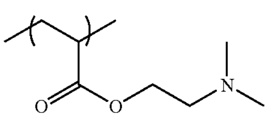
N-42
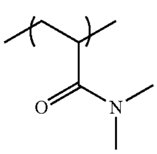
N-43
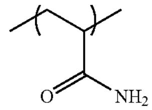
N-44
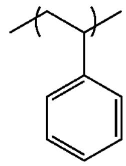
N-45
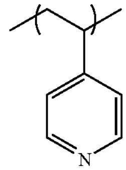
N-46
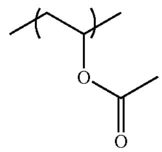
N-47
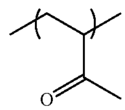
N-48
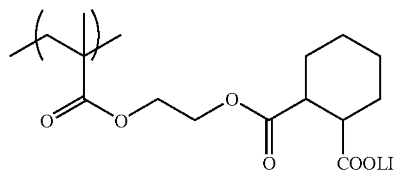
N-49
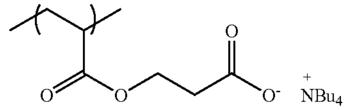
N-50
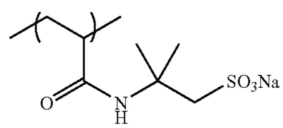
N-51
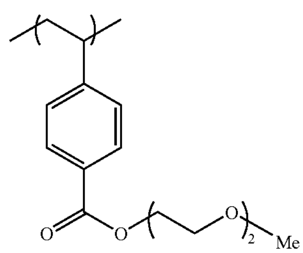

-continued
N-52
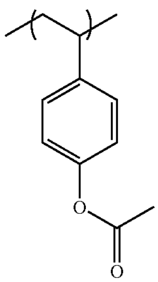
N-53
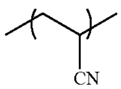
N-54
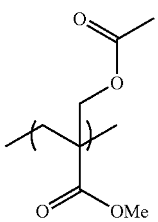
N-55
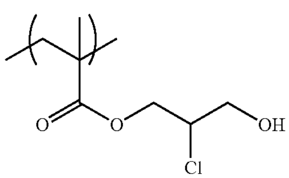
N-56
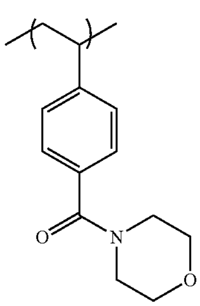
N-57
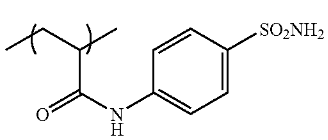
N-58
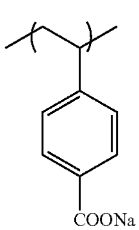
-continued
N-59
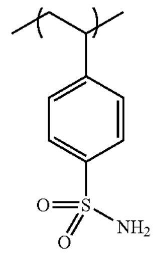
N-60
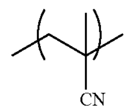
N-61
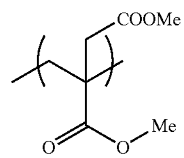
N-62
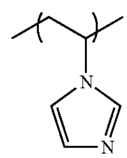
N-63
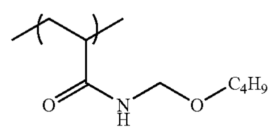
N-64
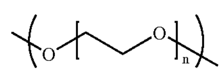
N-65
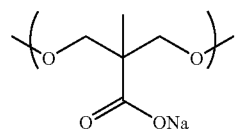
N-66
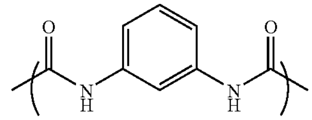
N-67
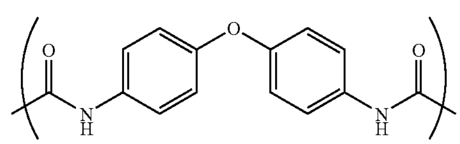
N-68
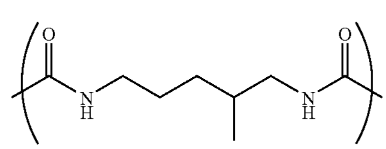
N-69
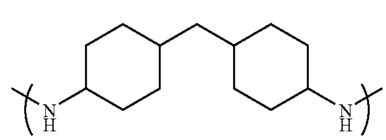

-continued
N-70
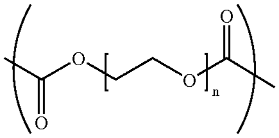
N-71
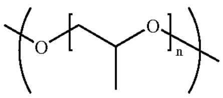
N-72
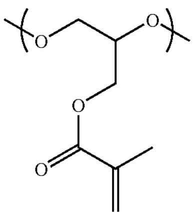
N-73
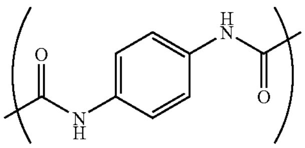
N-74
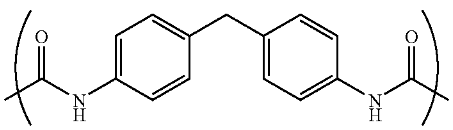
N-75
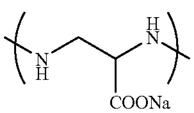
N-76
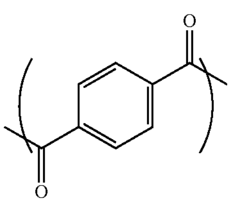
N-77
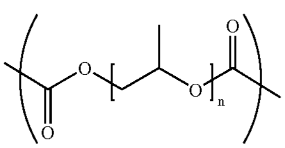
N-78
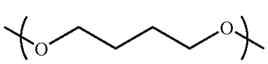
N-79
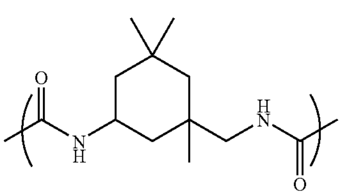
N-80
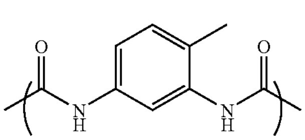
-continued
N-81
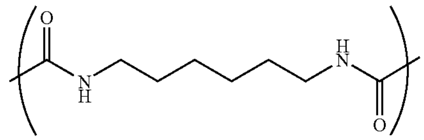
N-82
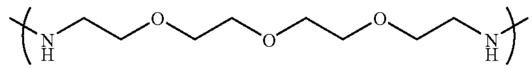
N-83
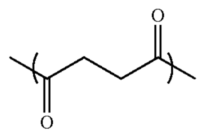
N-84
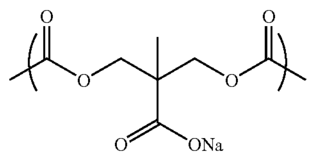
N-85
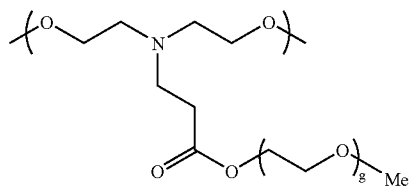
N-86
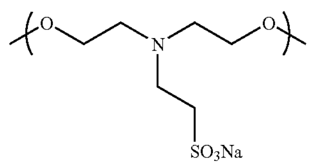
N-87
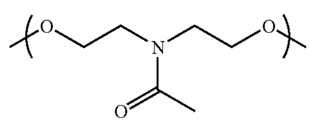
N-88
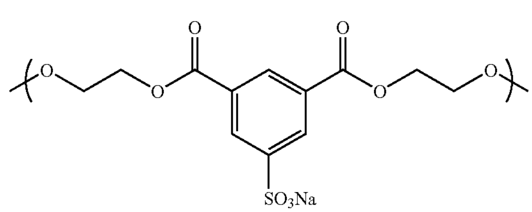
N-89
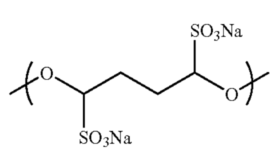
N-90
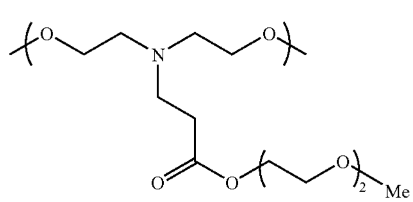

-continued

N-91

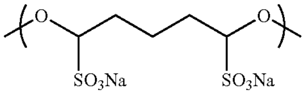

N-92

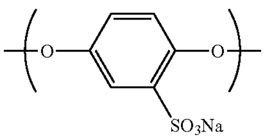

N-93

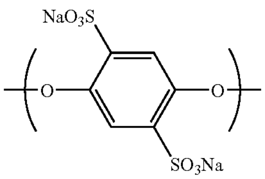

N-94

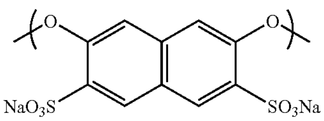

N-95

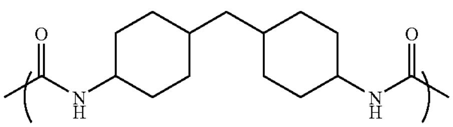

N-96

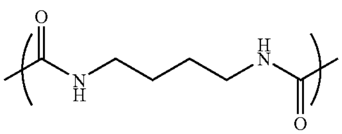

N-97

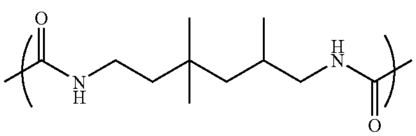

N-98

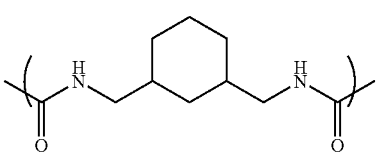

N-99

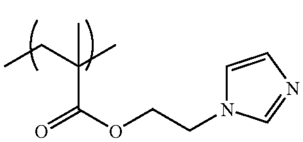

-continued

N-100

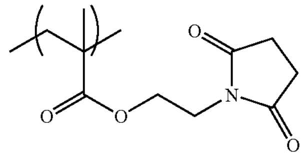

N-101

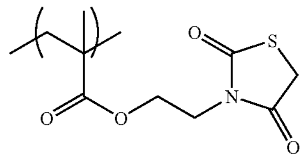

N-102

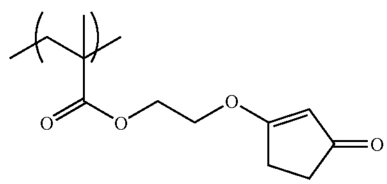

N-103

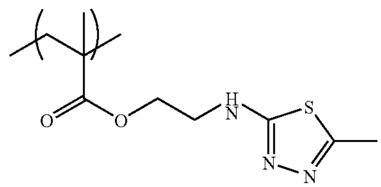

N-104

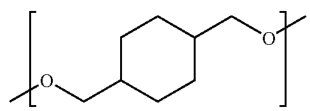

N-105

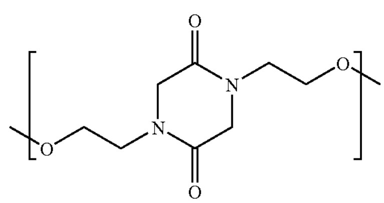

The content of the polymerization component (repeating unit) containing a functional group having a dipole moment of 3.8 debye or more in the binder polymer used in the photosensitive layer of a lithographic printing plate precursor according to the invention is preferably more than 20% by mole, more preferably more than 30% by mole. By using more than 20% by mole of the polymerization component, the radical polymerization accelerating effect sufficient for practical use can be obtained.

Specific examples of the binder polymer used in the photosensitive layer of a lithographic printing plate precursor according to the invention are set forth below, but the invention should not be construed as being limited thereto.

| Binder | Unit 1 | | Unit 2 | | Unit 3 | |
|---|---|---|---|---|---|---|
| Polymer | No. | Content (%) | No. | Content (%) | No. | Content (%) |
| B-1 | U-1 | 20 | N-12 | 20 | N-1 | 60 |
| B-2 | U-2 | 30 | N-19 | 10 | N-15 | 60 |
| B-3 | U-3 | 40 | N-14 | 20 | N-16 | 40 |
| B-4 | U-4 | 50 | N-1 | 12 | N-12 | 38 |
| B-5 | U-5 | 20 | N-21 | 10 | N-10 | 70 |
| B-6 | U-6 | 20 | N-11 | 20 | N-18 | 60 |

-continued

| | | | | | | |
|---|---|---|---|---|---|---|
| B-7 | U-7 | 30 | N-33 | 20 | N-6 | 50 |
| B-8 | U-8 | 60 | N-7 | 25 | N-19 | 15 |
| B-9 | U-9 | 30 | N-34 | 20 | N-7 | 50 |
| B-10 | U-10 | 20 | N-28 | 10 | N-22 | 70 |
| B-11 | U-11 | 30 | N-35 | 20 | N-27 | 50 |
| B-12 | U-12 | 30 | N-42 | 12 | N-44 | 58 |
| B-13 | U-13 | 90 | N-43 | 10 | — | — |
| B-14 | U-14 | 80 | N-50 | 20 | — | — |
| B-15 | U-15 | 80 | N-57 | 20 | — | — |
| B-16 | U-16 | 40 | N-48 | 10 | N-52 | 50 |
| B-17 | U-17 | 30 | N-49 | 20 | N-1 | 50 |
| B-18 | U-18 | 50 | N-63 | 12 | N-15 | 38 |
| B-19 | U-19 | 90 | N-51 | 10 | — | — |
| B-20 | U-20 | 80 | N-58 | 20 | — | — |
| B-21 | U-21 | 80 | N-33 | 20 | — | — |
| B-22 | U-22 | 40 | N-56 | 10 | N-16 | 50 |
| B-23 | U-23 | 20 | N-12 | 20 | N-10 | 60 |
| B-24 | U-24 | 30 | N-19 | 12 | N-18 | 58 |
| B-25 | U-25 | 85 | N-12 | 15 | — | — |
| B-26 | U-26 | 80 | N-14 | 20 | — | — |
| B-27 | U-27 | 60 | N-21 | 10 | N-6 | 30 |
| B-28 | U-28 | 60 | N-11 | 20 | N-7 | 20 |
| B-29 | U-29 | 30 | N-33 | 12 | N-22 | 58 |
| B-30 | U-30 | 70 | N-12 | 10 | N-7 | 20 |
| B-31 | U-31 | 80 | N-12 | 20 | — | — |
| B-32 | U-32 | 90 | N-33 | 10 | — | — |
| B-33 | U-33 | 50 | N-34 | 20 | N-27 | 30 |
| B-34 | U-34 | 40 | N-28 | 10 | N-44 | 50 |
| B-35 | U-35 | 70 | N-35 | 20 | N-6 | 10 |
| B-36 | U-36 | 90 | N-12 | 10 | — | — |
| B-37 | U-37 | 80 | N-42 | 20 | — | — |
| B-38 | U-38 | 50 | N-43 | 10 | N-1 | 40 |
| B-39 | U-39 | 30 | N-50 | 20 | N-15 | 50 |
| B-40 | U-40 | 60 | N-12 | 30 | N-10 | 10 |
| B-41 | U-41 | 90 | N-57 | 10 | — | — |
| B-42 | U-42 | 60 | N-33 | 10 | N-6 | 30 |
| B-43 | U-43 | 80 | N-48 | 20 | — | — |
| B-44 | U-44 | 40 | N-49 | 10 | N-16 | 50 |
| B-45 | U-45 | 30 | N-63 | 20 | N-10 | 50 |
| B-46 | U-46 | 30 | N-51 | 12 | N-18 | 58 |
| B-47 | U-47 | 90 | N-58 | 10 | — | — |
| B-48 | U-48 | 80 | N-56 | 20 | — | — |
| B-49 | U-49 | 80 | N-12 | 20 | — | — |
| B-50 | U-50 | 90 | N-19 | 10 | — | — |
| B-51 | U-51 | 30 | N-14 | 20 | N-6 | 50 |
| B-52 | U-52 | 40 | N-21 | 12 | N-7 | 48 |
| B-53 | U-53 | 40 | N-11 | 10 | N-22 | 50 |
| B-54 | U-54 | 80 | N-33 | 20 | — | — |
| B-55 | U-55 | 70 | N-35 | 10 | N-6 | 20 |
| B-56 | U-56 | 30 | N-34 | 12 | N-27 | 58 |
| B-57 | U-57 | 60 | N-28 | 10 | N-44 | 30 |
| B-58 | U-58 | 50 | N-35 | 20 | N-52 | 30 |
| B-59 | U-59 | 60 | N-42 | 10 | N-6 | 30 |
| B-60 | U-60 | 80 | N-42 | 20 | — | — |
| B-61 | U-61 | 90 | N-43 | 10 | — | — |
| B-62 | U-62 | 80 | N-50 | 20 | — | — |
| B-63 | U-63 | 88 | N-14 | 12 | — | — |
| B-64 | U-64 | 88 | N-57 | 12 | — | — |
| B-65 | U-65 | 50 | N-48 | 10 | N-1 | 40 |
| B-66 | U-66 | 30 | N-49 | 20 | N-15 | 50 |
| B-67 | U-67 | 50 | N-63 | 10 | N-16 | 40 |
| B-68 | U-68 | 80 | N-51 | 20 | | |
| B-69 | U-69 | 70 | N-43 | 10 | N-28 | 20 |
| B-70 | U-70 | 80 | N-58 | 20 | — | — |
| B-71 | U-71 | 30 | N-56 | 10 | N-10 | 60 |
| B-72 | U-72 | 60 | N-12 | 20 | N-18 | 20 |
| B-73 | U-73 | 50 | N-19 | 12 | N-6 | 38 |
| B-74 | U-74 | 30 | N-14 | 10 | N-7 | 60 |
| B-75 | U-75 | 30 | N-21 | 20 | N-22 | 50 |
| B-76 | U-76 | 30 | N-11 | 20 | N-27 | 50 |
| B-77 | U-77 | 90 | N-33 | 10 | — | — |
| B-78 | U-78 | 60 | N-34 | 20 | N-44 | 20 |
| B-79 | U-79 | 50 | N-28 | 12 | N-52 | 38 |
| B-80 | U-80 | 60 | N-35 | 10 | N-1 | 30 |
| B-81 | U-81 | 80 | N-42 | 20 | — | — |
| B-82 | U-82 | 80 | N-43 | 20 | — | — |
| B-83 | U-83 | 90 | N-50 | 10 | — | — |
| B-84 | U-84 | 70 | N-33 | 30 | — | — |
| B-85 | U-85 | 30 | N-57 | 12 | N-15 | 58 |
| B-86 | U-86 | 30 | N-48 | 10 | N-16 | 60 |

-continued

| | | | | | | |
|---|---|---|---|---|---|---|
| B-87 | U-87 | 80 | N-49 | 20 | — | — |
| B-88 | U-88 | 80 | N-63 | 20 | — | — |
| B-89 | U-89 | 90 | N-51 | 10 | — | — |
| B-90 | U-90 | 80 | N-58 | 20 | — | — |
| B-91 | U-91 | 50 | N-56 | 12 | N-10 | 38 |
| B-92 | U-92 | 40 | N-12 | 10 | N-18 | 50 |
| B-93 | U-93 | 50 | N-19 | 20 | N-6 | 30 |
| B-94 | U-94 | 80 | N-14 | 20 | — | — |
| B-95 | U-95 | 80 | N-12 | 20 | — | — |
| B-96 | U-96 | 30 | N-21 | 20 | N-7 | 50 |
| B-97 | U-97 | 30 | N-11 | 10 | N-22 | 60 |
| B-98 | U-98 | 40 | N-33 | 20 | N-27 | 40 |
| B-99 | U-99 | 88 | N-34 | 12 | — | — |
| B-100 | U-100 | 90 | N-28 | 10 | — | — |
| B-101 | U-101 | 80 | N-35 | 20 | — | — |
| B-102 | U-102 | 60 | N-42 | 20 | N-44 | 20 |
| B-103 | U-103 | 50 | N-49 | 10 | N-18 | 40 |
| B-104 | U-104 | 60 | N-12 | 30 | N-1 | 10 |
| B-105 | U-105 | 88 | N-50 | 12 | — | — |
| B-106 | U-106 | 90 | N-57 | 10 | — | — |
| B-107 | U-107 | 30 | N-48 | 20 | N-1 | 50 |
| B-108 | U-108 | 30 | N-49 | 20 | N-15 | 50 |
| B-109 | U-109 | 40 | N-63 | 10 | N-16 | 50 |
| B-110 | U-110 | 80 | N-51 | 20 | — | — |
| B-111 | U-111 | 88 | N-58 | 12 | — | — |
| B-112 | U-112 | 90 | N-56 | 10 | — | — |
| B-113 | U-113 | 50 | N-12 | 20 | N-10 | 30 |
| B-114 | U-114 | 50 | N-19 | 20 | N-18 | 30 |
| B-115 | U-115 | 50 | N-14 | 10 | N-6 | 40 |
| B-116 | U-116 | 50 | N-21 | 20 | N-7 | 30 |
| B-117 | U-117 | 40 | N-11 | 12 | N-22 | 48 |
| B-118 | U-118 | 50 | N-33 | 10 | N-27 | 40 |
| B-119 | U-119 | 80 | N-34 | 20 | — | — |
| B-120 | U-120 | 80 | N-28 | 20 | — | — |
| B-121 | U-121 | 60 | N-56 | 30 | N-44 | 10 |
| B-122 | U-122 | 80 | N-35 | 20 | — | — |
| B-123 | U-123 | 90 | N-42 | 10 | — | — |
| B-124 | U-124 | 80 | N-43 | 20 | — | — |
| B-125 | U-125 | 70 | N-51 | 30 | — | — |
| B-126 | U-126 | 60 | N-50 | 10 | N-44 | 30 |
| B-127 | U-127 | 60 | N-57 | 20 | N-52 | 20 |
| B-128 | U-128 | 40 | N-48 | 12 | N-1 | 48 |
| B-129 | U-129 | 80 | N-49 | 20 | — | — |
| B-130 | U-130 | 80 | N-51 | 20 | — | — |
| B-131 | U-131 | 50 | N-63 | 20 | N-15 | 30 |
| B-132 | U-132 | 50 | N-51 | 10 | N-16 | 40 |
| B-133 | U-133 | 30 | N-58 | 20 | N-10 | 50 |
| B-134 | U-134 | 80 | N-56 | 20 | — | — |
| B-135 | U-135 | 70 | N-51 | 20 | N-52 | 10 |
| B-136 | U-136 | 50 | N-12 | 20 | N-18 | 30 |
| B-137 | U-137 | 50 | N-19 | 20 | N-6 | 30 |
| B-138 | U-138 | 50 | N-14 | 20 | N-7 | 30 |
| B-139 | U-139 | 50 | N-21 | 20 | N-22 | 30 |
| B-140 | U-140 | 50 | N-11 | 20 | N-27 | 30 |
| B-141 | U-141 | 50 | N-33 | 20 | N-44 | 30 |
| B-142 | U-142 | 50 | N-34 | 20 | N-52 | 30 |
| B-143 | U-143 | 50 | N-28 | 20 | N-1 | 30 |
| B-144 | U-144 | 50 | N-58 | 20 | N-44 | 30 |
| B-145 | U-145 | 50 | N-35 | 20 | N-15 | 30 |
| B-146 | U-146 | 50 | N-42 | 20 | N-16 | 30 |
| B-147 | U-147 | 50 | N-43 | 20 | N-10 | 30 |
| B-148 | U-148 | 50 | N-50 | 20 | N-18 | 30 |
| B-149 | U-149 | 60 | N-51 | 20 | N-52 | 20 |
| B-150 | U-150 | 70 | N-51 | 20 | N-44 | 10 |

| Binder | Unit 1 | | Unit 2 | | Unit 3 | | Unit 4 | | Unit 5 | |
|---|---|---|---|---|---|---|---|---|---|---|
| Polymer | No. | Content (%) | No. | Content (%) | No. | Content (%) | No. | Content (%) | No. | Content (%) |
| B-151 | V-47 | 30 | N-74 | 20 | V-1 | 20 | N-64 | 20 | N-71 | 10 |
| B-152 | V-47 | 50 | V-2 | 30 | N-65 | 10 | N-64 | 10 | — | — |
| B-153 | V-48 | 40 | N-79 | 10 | V-3 | 30 | N-85 | 10 | N-72 | 10 |
| B-154 | N-66 | 30 | N-68 | 20 | V-4 | 25 | N-71 | 20 | N-88 | 5 |
| B-155 | V-49 | 30 | N-68 | 20 | V-5 | 42 | N-86 | 8 | — | — |
| B-156 | V-51 | 40 | N-96 | 10 | V-6 | 25 | N-87 | 15 | N-64 | 10 |
| B-157 | N-67 | 20 | N-97 | 30 | V-7 | 40 | N-88 | 10 | — | — |
| B-158 | N-68 | 20 | N-74 | 30 | V-8 | 30 | N-90 | 10 | N-72 | 10 |
| B-159 | N-95 | 30 | V-50 | 20 | V-9 | 20 | N-64 | 20 | N-78 | 10 |
| B-160 | V-47 | 40 | N-81 | 10 | V-10 | 30 | N-65 | 10 | N-78 | 10 |
| B-161 | N-73 | 20 | N-98 | 30 | V-11 | 35 | N-71 | 10 | N-86 | 5 |

-continued

| | | | | | | | | | | |
|---|---|---|---|---|---|---|---|---|---|---|
| B-162 | N-74 | 30 | N-81 | 20 | V-12 | 35 | N-85 | 15 | — | — |
| B-163 | N-79 | 30 | N-96 | 20 | V-13 | 42 | N-86 | 8 | — | — |
| B-164 | N-80 | 25 | N-68 | 25 | V-14 | 35 | N-87 | 15 | — | — |
| B-165 | N-81 | 20 | N-79 | 30 | V-15 | 40 | N-88 | 10 | — | — |
| B-166 | V-49 | 50 | V-16 | 25 | N-85 | 15 | N-72 | 10 | — | — |
| B-167 | N-96 | 30 | N-80 | 20 | V-17 | 25 | N-90 | 20 | N-78 | 5 |
| B-168 | N-98 | 25 | N-79 | 25 | V-18 | 30 | N-64 | 10 | N-87 | 10 |
| B-169 | N-97 | 50 | V-19 | 40 | N-65 | 10 | — | — | — | — |
| B-170 | V-48 | 50 | V-20 | 35 | N-86 | 5 | N-71 | 10 | — | — |
| B-171 | N-66 | 10 | N-68 | 40 | V-21 | 30 | N-87 | 10 | N-64 | 10 |
| B-172 | N-67 | 30 | N-96 | 20 | V-22 | 30 | N-71 | 10 | N-65 | 10 |
| B-173 | N-68 | 50 | V-23 | 30 | N-85 | 10 | N-78 | 10 | — | — |
| B-174 | V-51 | 50 | V-24 | 40 | N-88 | 10 | — | — | — | — |
| B-175 | N-95 | 30 | N-81 | 20 | V-25 | 32 | N-86 | 8 | N-78 | 10 |
| B-176 | N-73 | 30 | N-97 | 20 | V-26 | 35 | N-87 | 15 | — | — |
| B-177 | N-74 | 30 | N-96 | 20 | V-27 | 40 | N-88 | 10 | — | — |
| B-178 | N-79 | 25 | N-98 | 25 | V-24 | 20 | N-90 | 20 | N-72 | 10 |
| B-179 | N-74 | 30 | N-81 | 20 | V-16 | 20 | N-90 | 10 | N-72 | 20 |
| B-180 | V-47 | 50 | N-86 | 10 | N-72 | 20 | N-78 | 20 | — | — |
| B-181 | V-49 | 20 | V-47 | 30 | N-88 | 10 | N-72 | 20 | N-78 | 20 |
| B-182 | V-51 | 25 | V-48 | 25 | V-2 | 30 | N-90 | 10 | N-72 | 10 |
| B-183 | V-47 | 50 | N-75 | 15 | V-29 | 30 | N-69 | 5 | — | — |
| B-184 | V-48 | 40 | N-96 | 10 | N-82 | 20 | V-30 | 30 | — | — |
| B-185 | N-74 | 20 | N-97 | 30 | N-75 | 15 | V-31 | 35 | — | — |
| B-186 | N-95 | 20 | N-68 | 30 | N-82 | 20 | V-32 | 20 | N-69 | 10 |
| B-187 | N-73 | 10 | N-79 | 40 | N-75 | 15 | V-33 | 25 | N-69 | 10 |
| B-188 | V-49 | 50 | N-82 | 20 | V-34 | 30 | — | — | — | — |
| B-189 | N-67 | 20 | N-81 | 30 | N-75 | 10 | V-35 | 20 | N-69 | 20 |
| B-190 | V-51 | 50 | N-82 | 30 | V-36 | 20 | — | — | — | — |
| B-191 | N-98 | 50 | N-75 | 15 | V-37 | 20 | N-69 | 15 | — | — |
| B-192 | N-79 | 30 | N-98 | 20 | N-82 | 20 | V-38 | 20 | N-69 | 10 |
| B-193 | N-74 | 30 | N-81 | 20 | N-82 | 20 | V-34 | 15 | V-36 | 15 |
| B-194 | V-51 | 25 | V-48 | 25 | N-75 | 20 | N-69 | 30 | — | — |
| B-195 | V-39 | 30 | N-76 | 20 | N-85 | 10 | N-72 | 20 | N-78 | 20 |
| B-196 | V-40 | 50 | V-2 | 20 | N-90 | 10 | V-16 | 20 | — | — |
| B-197 | V-41 | 30 | V-44 | 20 | V-16 | 25 | N-85 | 15 | N-72 | 10 |
| B-198 | V-42 | 30 | N-83 | 20 | V-24 | 40 | N-88 | 10 | — | — |
| B-199 | V-43 | 30 | N-76 | 20 | N-75 | 20 | N-69 | 30 | — | — |
| B-200 | V-44 | 30 | V-39 | 20 | N-82 | 20 | V-34 | 15 | V-36 | 15 |
| B-201 | V-45 | 20 | N-83 | 30 | N-82 | 20 | V-30 | 30 | — | — |
| B-202 | V-46 | 20 | N-83 | 30 | N-75 | 20 | N-69 | 30 | — | — |
| B-203 | N-83 | 20 | N-76 | 30 | V-2 | 20 | N-90 | 10 | V-16 | 20 |
| B-204 | N-83 | 30 | N-76 | 20 | N-82 | 20 | V-34 | 15 | V-36 | 15 |
| B-205 | V-52 | 20 | N-70 | 30 | N-88 | 10 | N-72 | 20 | N-78 | 20 |
| B-206 | V-53 | 40 | N-77 | 10 | N-85 | 10 | V-2 | 40 | — | — |
| B-207 | N-70 | 20 | N-77 | 30 | N-85 | 10 | V-2 | 40 | — | — |
| B-208 | V-52 | 25 | V-53 | 25 | V-2 | 25 | V-16 | 25 | — | — |

It is believed that by using the binder polymer including a functional group having a dipole moment of 3.8 debye or more and having an acid value of 0.3 meq/g or less according to the invention, the polarity and hydrophilicity of the photosensitive layer increase and as a result, due to the polarity, the radical polymerization reaction is stabilized to increase the polymerization rate, whereby the sensitivity and printing durability are improved and also due to the hydrophilicity, the developing property with an aqueous solution having pH of 10 or less is improved.

The binder polymer used in the photosensitive layer of a lithographic printing plate precursor according to the invention preferably has a weight average molecular weight of 5,000 or more, more preferably from 10,000 to 300,000, and a number average molecular weight of 1,000 or more, more preferably from 2,000 to 250,000. The polydispersity (weight average molecular weight/number average molecular weight) is preferably from 1.1 to 10.

The binder polymer used in the photosensitive layer of a lithographic printing plate precursor according to the invention may be any of a random polymer, a block polymer, a graft polymer or the like, and it is preferably a random polymer.

The binder polymers used in the photosensitive layer of a lithographic printing plate precursor according to the invention may be used individually or in combination of two or more thereof. Further, it can be used together with a binder polymer which does not contain a functional group having a dipole moment of 3.8 debye or more as long as the effects of the invention are not damaged.

The content of the binder polymer used in the photosensitive layer of a lithographic printing plate precursor according to the invention is from 5 to 90% by weight, preferably from 10 to 70% by weight, more preferably from 10 to 60% by weight, based on the total solid content of the photosensitive layer. In the range described above, the preferable strength of the image area and good image-forming property can be achieved.

Now, the constituting components other than the binder polymer contained in the polymerizable composition or photosensitive layer provided on a support of a lithographic printing plate precursor according to the invention are described in more detail below.

[Radical Polymerizable Compound]

The radical polymerizable compound (hereinafter also simply referred to as a polymerizable compound) for use in the polymerizable composition or photosensitive layer of a lithographic printing plate precursor (hereinafter also simply referred to as a photosensitive layer) according to the invention is an addition-polymerizable compound having at least one ethylenically unsaturated double bond, and it is selected from compounds having at least one, preferably two or more, terminal ethylenically unsaturated double bonds. Such compounds are widely known in the art and they can be used in the invention without any particular limitation. The compound has a chemical form, for example, a monomer, a prepolymer, specifically, a dimer, a trimer or an oligomer, or a copolymer thereof, or a mixture thereof. Examples of the monomer include unsaturated carboxylic acids (for example, acrylic acid, methacrylic acid, itaconic acid, crotonic acid, isocrotonic acid or maleic acid) and esters or amides thereof. Preferably, esters of an unsaturated carboxylic acid with an aliphatic polyhydric alcohol compound and amides of an unsaturated carboxylic acid with an aliphatic polyvalent amine compound are used. An addition reaction product of an unsaturated carboxylic acid ester or amide having a nucleophilic substituent, for example, a hydroxy group, an amino group or a mercapto group, with a monofunctional or polyfunctional isocyanate or epoxy compound, or a dehydration condensation reaction product of the unsaturated oxylic acid ester or amide with a monofunctional or polyfunctional carboxylic acid is also preferably used. Moreover, an addition reaction product of an unsaturated carboxylic acid ester or amide having an electrophilic substituent for example, an isocyanate group or an epoxy group with a monofunctional or polyfunctional alcohol, amine or thiol, or a substitution reaction product of an unsaturated carboxylic acid ester or amide having a releasable substituent, for example, a halogen atom or a tosyloxy group with a monofunctional or polyfunctional alcohol, amine or thiol is also preferably used. In addition, compounds in which the unsaturated carboxylic acid described above is replaced by an unsaturated phosphonic acid, styrene, vinyl ether or the like can also be used.

Specific examples of the monomer, which is an ester of an aliphatic polyhydric alcohol compound with an unsaturated oxylic acid, include acrylic acid esters, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, isocyanuric acid ethylene oxide EO) modified triacrylate or polyester acrylate oligomer; methacrylic acid esters, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane or bis[p-(methacryloxyethoxy)phenyl]dimethylmethane;

itaconic acid esters, for example, ethylene glycol diitaconate, propylene glycol diitaconate, 1,3-butanediol diitaconate, 1,4-butanediol diitaconate, tetramethylene glycol diitaconate, pentaerythritol diitaconate or sorbitol tetraitaconate;

crotonic acid esters, for example, ethylene glycol dicrotonate, tetramethylene glycol dicrotonate, pentaerythritol dicrotonate or sorbitol tetracrotonate;

isocrotonic acid esters, for example, ethylene glycol diisocrotonate, pentaerythritol diisocrotonate or sorbitol tetraisocrotonate;

and maleic acid esters, for example, ethylene glycol dimaleate, triethylene glycol dimaleate, pentaerythritol dimaleate and sorbitol tetramaleate.

Other examples of the ester, which can be preferably used, include aliphatic alcohol esters described in JP-B-51-47334 and JP-A-57-196231, esters having an aromatic skeleton described in JP-A-59-5240, JP-A-59-5241 and JP-A-2-226149, and esters containing an amino group described in JP-A-1-165613.

The above-described ester monomers can also be used as a mixture.

Specific examples of the monomer, which is an amide of an aliphatic polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide. Other preferable examples of the amide monomer include amides having a cyclohexylene structure described in JP-B-54-21726.

Urethane type addition-polymerizable compounds produced using an addition reaction between an isocyanate and a hydroxy group are also preferably used, and specific examples thereof include vinylurethane compounds having two or more polymerizable vinyl groups per molecule obtained by adding a vinyl monomer containing a hydroxy group represented by formula (X) shown below to a polyisocyanate compound having two or more isocyanate groups per molecule, described in JP-B-48-41708.

$$CH_2{=}C(R_4)COOCH_2CH(R_5)OH \qquad (X)$$

wherein $R_4$ and $R_5$ each independently represents H or $CH_3$.

Also, urethane acrylates described in JP-A-51-37193, JP-B-2-32293 and JP-B-2-16765, and urethane compounds having an ethylene oxide skeleton described in JP-B-58-49860, JP-B-56-17654, JP-B-62-39417 and JP-B-62-39418 are preferably used. Further, a photopolymerizable composition having remarkably excellent photo-speed can be obtained by using an addition polymerizable compound having an amino structure or a sulfide structure in its molecule, described in JP-A-63-277653, JP-A-63-260909 and JP-A-1-105238.

Other examples include polyfunctional acrylates and methacrylates, for example, polyester acrylates and epoxy acrylates obtained by reacting an epoxy resin with (meth) acrylic acid, described in JP-A-48-64183, JP-B-49-43191 and JP-B-52-30490. Specific unsaturated compounds described in JP-B-46-43946, JP-B-1-40337 and JP-B-1-40336, and vinylphosphonic acid type compounds described in JP-A-2-25493 can also be exemplified. In some cases, structure containing a perfluoroalkyl group described in JP-A-61-22048 can be preferably used. Moreover, photocurable monomers or oligomers described in *Nippon Secchaku Kyokaishi* (*Journal of Japan Adhesion Society*), Vol. 20, No. 7, pages 300 to 308 (1984) can also be used.

Details of the method of using the polymerizable compound, for example, selection of the structure, individual or combination use or an amount added, can be appropriately determined in accordance with the performance, use or the like of the polymerizable composition or the characteristic design of lithographic printing plate precursor. For instance, the polymerizable compound is selected from the following standpoints.

In view of the sensitivity, a structure having a large content of unsaturated group per molecule is preferred and in many cases, a difunctional or more functional compound is preferred. Also, in order to increase the strength of the image areas that is, hardened layer, a trifunctional or more functional compound is preferred. A combination use of compounds different in the functional number or in the kind of polymerizable group (for example, an acrylic acid ester, a methacrylic acid ester, a styrene compound or a vinyl ether compound) is an effective method for controlling both the sensitivity and the strength.

The selection and use method of the polymerizable compound are also important factors for the compatibility and dispersibility with other components (for example, a binder polymer, a polymerization initiator or a coloring agent) in the polymerizable composition or photosensitive layer. For instance, the compatibility may be improved in some cases by using the compound of low purity or using two or more kinds of the compounds in combination. In case of using the photosensitive layer, a specific structure may be selected for the purpose of improving an adhesion property to a support a protective layer or the like described hereinafter.

The polymerizable compound is used preferably in a age from 5 to 80% by weight, more preferably in a range from 25 to 75% by weight, based on the total solid content of the polymerizable composition or photosensitive layer. The polymerizable compounds may be used individually or in combination of two or more thereof. In the method of using the polymerizable compound, the structure, blend and amount added can be appropriately selected by taking account of the degree of polymerization inhibition due to oxygen, resolution, fogging property, change in refractive index, surface tackiness and the like. Further, depending on the case, a layer construction, for example, an undercoat layer or an overcoat layer, and a coating method, may also be considered.

[Radical Polymerization Initiator]

The radical polymerization initiator for use in the polymerizable composition or photosensitive layer according to the invention is a compound which generates a radical with light energy or heat energy to initiate or accelerate polymerization of a compound having a polymerizable unsaturated group. The radical polymerization initiator is appropriately selected to use, for example, from known radical polymerization initiators and compounds containing a bond having small bond dissociation energy.

The radical polymerization initiators include, for example, organic halogen compounds, carbonyl compounds, organic peroxides, azo compounds, azido compounds, metallocene compounds, hexaarylbiimidazole compounds, organic boron compounds, disulfone compounds, oxime ester compounds and onium salt compounds.

The organic halogen compounds described above specifically include, for example, compounds described in Wakabayashi et al., *Bull. Chem. Soc. Japan,* 42, 2924 (1969), U.S. Pat. No. 3,905,815, JP-B-46-4605, JP-A-48-36281, JP-A-53-133428, JP-A-55-32070, JP-A-60-239736, JP-A-61-169835, JP-A-61-169837, JP-A-62-58241, JP-A-62-212401, JP-A-63-70243, JP-A-63-298339 and M. P. Hutt, *Journal of Heterocyclic Chemistry,* 1, No. 3 (1970). Among them, oxazole compounds and s-triazine compounds each substituted with a trihalomethyl group are preferable.

More preferably, s-triazine derivatives in which at least one of mono-, di- or tri-halogen substituted methyl group is connected to the s-triazine ring and oxadiazole derivatives in which at least one of mono-, di- or tri-halogen substituted methyl group is connected to the oxadiazole ring are exemplified. Specific examples thereof include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(dichloromethyl)-s-triazine, 2-n-propyl-4,6-bis(trichloromethyl)-s-triazine, 2-(α,α,β-trichloroethyl)-4,6-bis(trichloromethyl)-s-triazine, 2-(3,4-epoxyphenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl-4,6-bis(trichloromethyl)-s-triazine, 2-(p-isopropyloxystyryl-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis(tribromomethyl)-s-triazine and compounds shown below.

(I)-1

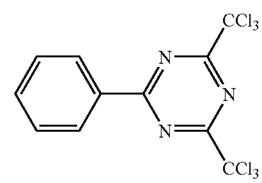

(I)-2

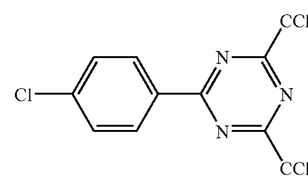

(I)-3

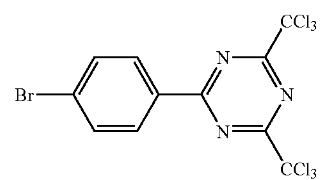

(I)-4

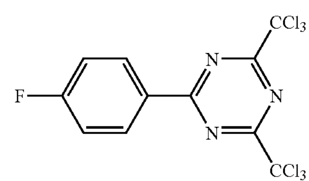

(I)-5

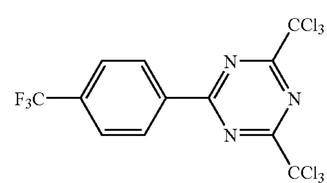

(I)-6

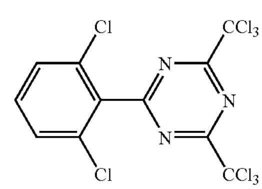

-continued
(I)-7
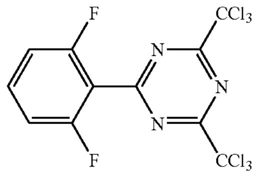
(I)-8
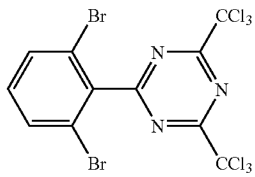
(I)-9
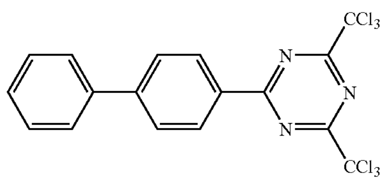
(I)-10
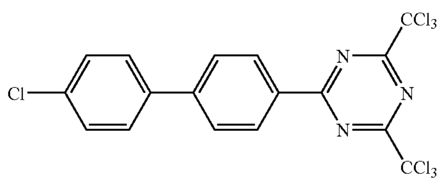
(I)-11
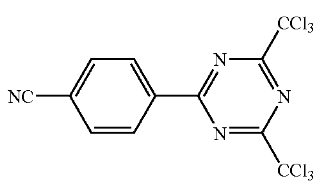
(I)-12
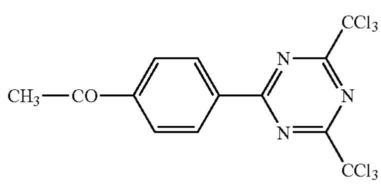
(I)-13
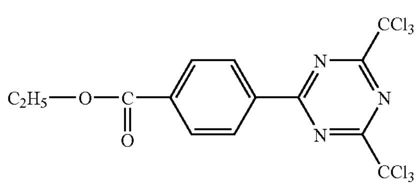
(I)-14
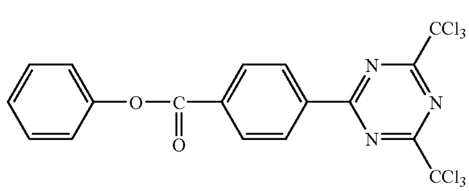
-continued
(I)-15
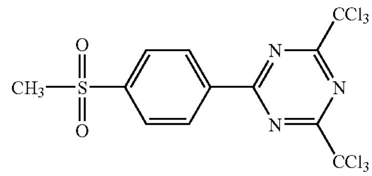
(I)-16
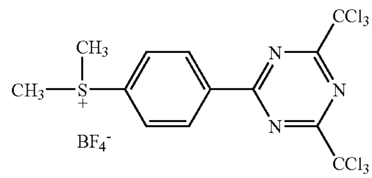
(I)-17
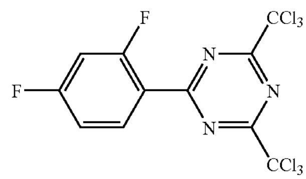
(I)-18
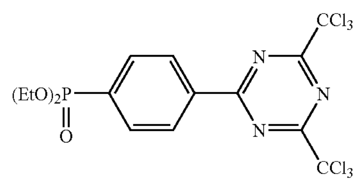
(I)-19
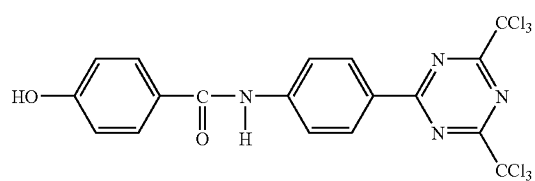
(I)-20
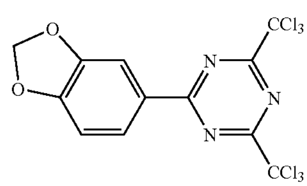
(I)-21
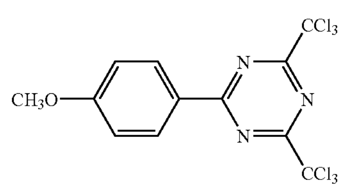
(I)-22
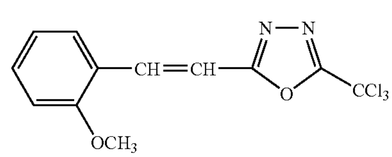
(I)-23
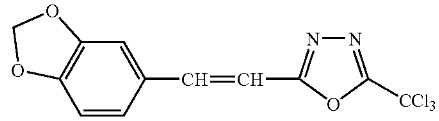

-continued (I)-24

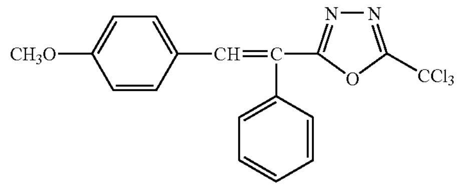

(I)-25

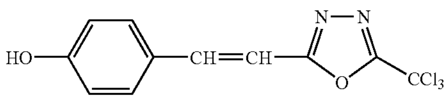

(I)-26

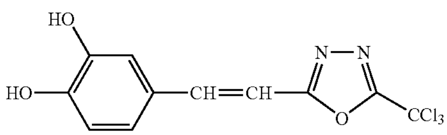

(I)-27

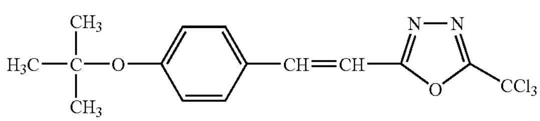

The carbonyl compounds described above include, for example, benzophenone derivatives, e.g., benzophenone, Michler's ketone, 2-methylbenzophenone, 3-methylbenzophenone, 4-methylbenzophenone, 2-chlorobenzophenone, 4-bromobenzophenone or 2-carboxybenzophenone, acetophenone derivatives, e.g., 2,2-dimethoxy-2-phenylacetophenone, 2,2-diethoxyacetophenone, 1-hydroxycyclohexylphenylketone, α-hydroxy-2-methylphenylpropane, 1-hydroxy-1-methylethyl-(p-isopropylphenyl)ketone, 1-hydroxy-1-(p-dodecylphenyl)ketone, 2-methyl-(4'-methylthio)phenyl)-2-morpholino-1-propane or 1,1,1-trichloromethyl-(p-butylphenyl)ketone, thioxantone derivatives, e.g., thioxantone, 2-ethylthioxantone, 2-isopropylthioxantone, 2-chlorothioxantone, 2,4-dimethylthioxanthone, 2,4-dietylthioxantone or 2,4-diisopropylthioxantone, and benzoic acid ester derivatives, e.g., ethyl p-dimethylaminobenzoate or ethyl p-diethylaminobenzoate.

The azo compounds described above include, for example, azo compounds described in JP-A-8-108621.

The organic peroxides described above include, for example, trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butylhydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, peroxy succinic acid, benzoyl peroxide, 2,4-dichlorobenzoyl peroxide, diisopropylperoxy dicarbonate, di-2-ethylhexylperoxy dicarbonate, di-2-ethoxyethylperoxy dicarbonate, dimethoxyisopropylperoxy dicarbonate, di(3-methyl-3-methoxybutyl)peroxy dicarbonate, tert-butylperoxy acetate, tert-butylperoxy pivalate, tert-butylperoxy neodecanoate, tert-butylperoxy octanoate, tert-butylperoxy laurate, tersyl carbonate, 3,3',4,4'-tetra(tert-butylperoxycarbonyl)benzophenone, 3,3',4,4'-tetra(tert-hexylperoxycarbonyl)benzophenone, 3,3',4,4'-tetra(p-isopropylcumylperoxycarbonyl)benzophenone, carbonyl di(tert-butylperoxydihydrogen diphthalate) and carbonyl di(tert-hexylperoxydihydrogen diphthalate).

The metallocene compounds described above include, for example, various titanocene compounds described in JP-A-59-152396, JP-A-61-151197, JP-A63-41484, JP-A-2-249, JP-A-2-4705 and JP-A-5-83588, for example, dicyclopentadienyl-Ti-bisphenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-triafluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-triafluorophen-1-yl, dimethylcyclopentadienyl-Ti-bis-2,3,5,6-tetrafluorophen-1-yl, dimethylcyclopentadienyl-Ti-bis-2,3,4,5,6-pentafluorophen-1-yl, or bis(cyclopentadienyl)-bis(2,6-difluoro-3-(pyr-1-yl)phenyl) titanium and iron-arene complexes described in JP-A-1-304453 and JP-A-1-152109.

The hexaarylbiimidazole compounds described above include, for example, various compounds described in JP-B-6-29285 and U.S. Pat. Nos. 3,479,185, 4,311,783 and 4,622,286, specifically, for example, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5''-tetraphenylbiimidazole, 2,2'-bis(o-methylphenyl)-4,4',5,5'-tetraphenylbiimidazole and 2,2'-bis(o-trifluoromethylphenyl)-4,4',5,5'-tetraphenylbiimidazole.

The organic boron compounds described above include, for example, organic boric acid salts described in JP-A-62-143044, JP-A-62-150242, JP-A-9-188685, JP-A-9-188686, JP-A-9-188710, JP-A-2000-131837, JP-A-2002-107916, Japanese Patent 2764769, JP-A-2002-116539 and Martin Kunz, *Rad Tech '98. Proceeding*, April 19-22 (1998), Chicago, organic boron sulfonium complexes or organic boron oxosulfonium complexes described in JP-A- 157623, JP-A-6-175564 and JP-A-6-175561, organic boron iodonium complexes described in JP-A-6-175554 and JP-A-6-175553, organic boron phosphonium complexes described in JP-A-9-188710, and organic boron transition metal coordination complexes described in JP-A-6-348011, JP-A-7-128785, JP-A-7-140589, JP-A-7-306527 and JP-A-7-292014.

The disulfone compounds described above include, for example, compounds described in JP-A-61-166544 and JP-A-2002-328465.

The oxime ester compounds described above include, for example, compounds described in *J. C. S. Perkin II* 1653-1660 (1979), *J. C. S. Perkin II,* 5-162 (1979), *Journal of Photopolymer Science and Technology,* 202-232 (1995) and JP-A-2000-66385, and compounds described in JP-A-2000-80068. Specific examples thereof include compounds represented by the following structural formulae:

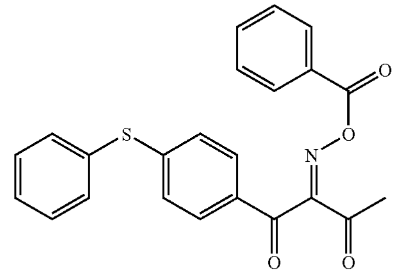

-continued
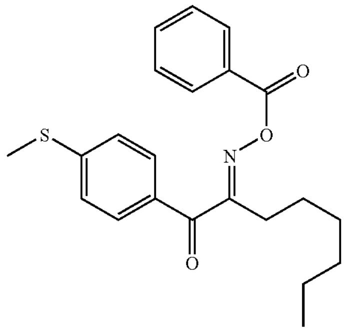
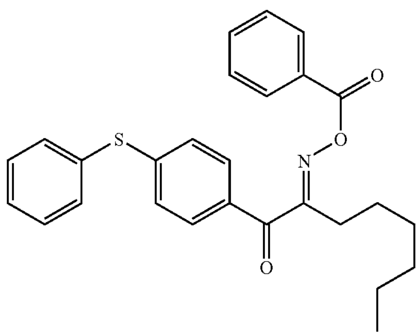
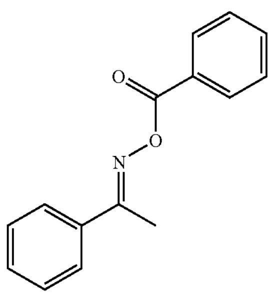
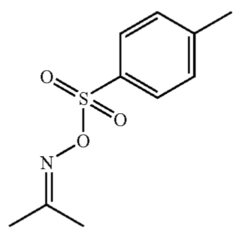
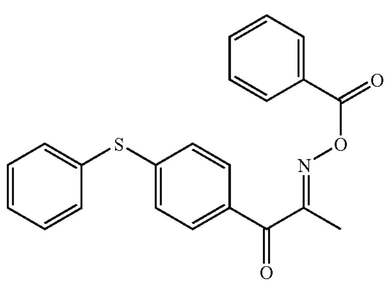
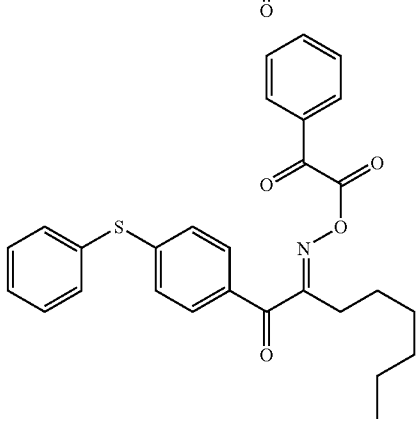
-continued
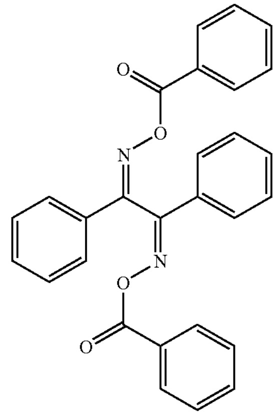
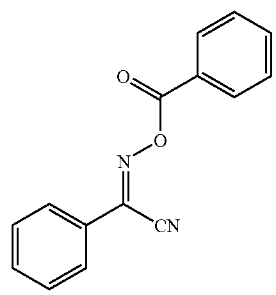
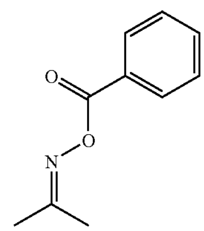
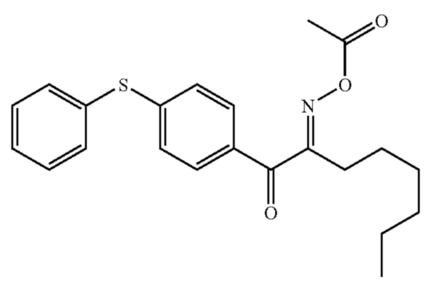
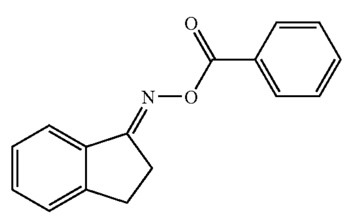
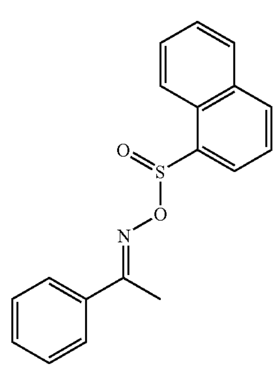

-continued

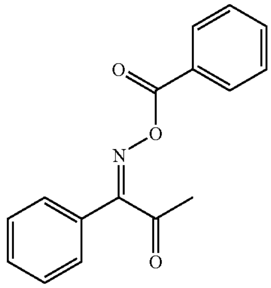

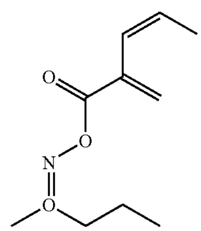

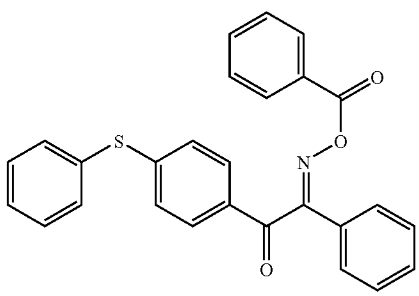

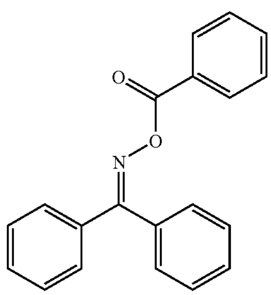

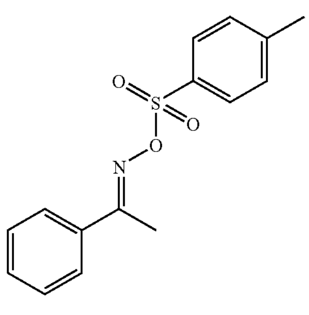

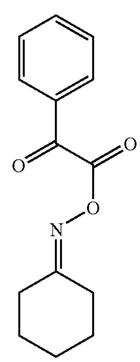

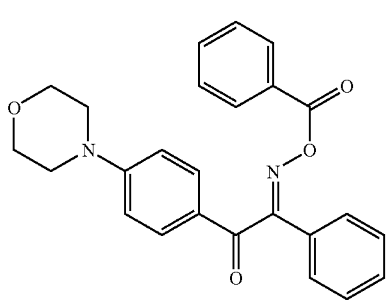

-continued

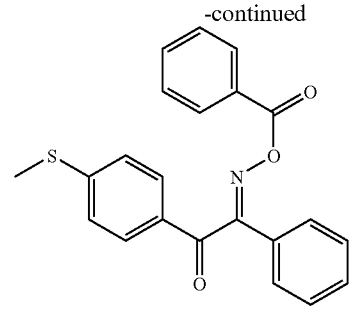

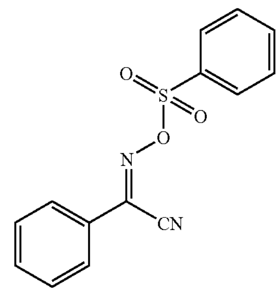

The onium salt compounds described above include onium salts, for example, diazonium salts described in S. I. Schlesinger, *Photogr. Sci. Eng.,* 18, 387 (1974) and T. S. Bal et al., *Polymer.* 21, 423 (1980), ammonium salts described in U.S. Pat. No. 4,069,055 and JP-A-4-365049, phosphonium salts described in U.S. Pat. Nos. 4,069,055 and 4,069,056, iodonium salts described in European Patent 104,143, U.S. Pat. Nos. 339,049 and 410,201, JP-A-2-150848 and JP-A-2-296514, sulfonium salts described in European Patents 370, 693, 390,214, 233,567, 297,443 and 297,442, U.S. Pat. Nos. 4,933,377, 161,811, 410,201, 339,049, 4,760,013, 4,734,444 and 2,833,827 and German Patents 2,904,626, 3,604,580 and 3,604,581, selenonium salts described in J. V. Crivello et al., *Macromolecules,* 10 (6), 1307 (1977) and J. V. Crivello et al., *J. Polymer Sci., Polymer Chem. Ed.,* 17, 1047 (1979), and arsonium salts described in C. S. Wen et al., *Teh, Proc. Conf. Rad. Curing ASIA*, p. 478, Tokyo, Oct. (1988).

In the invention, the onium salt functions not as an acid generator, but as an ionic radical polymerization initiator.

The onium salts preferably used in the invention include onium salts represented by the following formulae (RI-I) to (RI-II):

$$Ar_{11}-\overset{+}{N}\equiv N \quad Z_{11}^{-} \tag{RI-I}$$

$$Ar_{21}-I^{+}-Ar_{22} \quad Z_{21}^{-} \tag{RI-II}$$

$$R_{31}R_{32}\overset{+}{S}-R_{33} \quad Z_{31}^{-} \tag{RI-III}$$

In formula (RI-I), $Ar_{11}$ represents an aryl group having 20 or less carbon atoms, which may have 1 to 6 substituents. Preferable examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido group or arylamido having from 1 to 12 carbon atoms, a carbonyl group, a carboxyl group, a cyano group, a sulfonyl group, an thioalkyl group having from 1 to 12 carbon atoms and an thioaryl group having from 1 to 12 carbon atoms. $Z_{11}^-$ represents a monovalent anion. Specific examples of the monovalent anion include a halogen ion, a perchlorate ion, a hexafluorophosphate ion, a tetrafluoroborate ion, a sulfonate ion, a sulfinate ion, a thosulfonate ion and a sulfate ion. Among them, a perchlorate ion, a hexafluorophosphate ion, a tetrafluoroborate ion, a sulfonate ion and a sulfinate ion are preferred in view of stability.

In the formula (RI-II), $Ar_{21}$ and $Ar_{22}$ each independently represents an aryl group having 20 or less carbon atoms, which may have 1 to 6 substituents. Preferable examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 3 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido group or arylamido group having from 1 to 12 carbon atoms, a carbonyl group, a carboxyl group, a cyano group, a sulfonyl group, an thioalkyl group having from 1 to 12 carbon atoms and an thioaryl group having from 1 to 12 carbon atoms. $Z_{21}^-$ represents a monovalent anion. Specific examples of the monovalent anion include a halogen ion, a perchlorate ion, a hexafluorophosphate ion, a tetrafluoroborate ion, a sulfonate ion, a sulfinate ion, a thosulfonate ion, a sulfate ion and a carboxylate ion. Among them, a perchlorate ion, a hexafluorophosphate ion, a tetrafluoroborate ion, a sulfonate ion, a sulfinate ion and a carboxylate ion are preferred in view of stability and reactivity.

In the formula (RI-III), $R_{31}$, $R_{32}$ and $R_{33}$ each independently represents an aryl group having 20 or less carbon atoms, which may have 1 to 6 substituents, an alkyl group, an alkenyl group or an alkynyl group. Among them, the aryl group is preferred in view of reactivity and stability. Preferable examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido group or arylamido group having from 1 to 12 carbon atoms, a carbonyl group, a carboxyl group, a cyano group, a sulfonyl group, an thioalkyl group having from 1 to 12 carbon atoms and an thioaryl group having from 1 to 12 carbon atoms. $Z_{31}^-$ represents a monovalent anion. Specific examples of the monovalent anion include a halogen ion, a perchlorate ion, a hexafluorophosphate ion, a tetrafluoroborate ion, a sulfonate ion, a sulfinate ion, a thosulfonate ion, a sulfate ion and a carboxylate ion. Among them, a perchlorate ion, a hexafluorophosphate ion, a tetrafluoroborate ion, a sulfonate ion, a sulfinate ion and a carboxylate ion are preferred in view of stability and reactivity. Carboxylate ions described in JP-A-2001-343742 are more preferable, and carboxylate ions described in JP-A-2002-148790 are particularly preferable.

Specific examples of the onium salt are set forth below, but the invention should not be construed as being limited thereto.

(N-1)

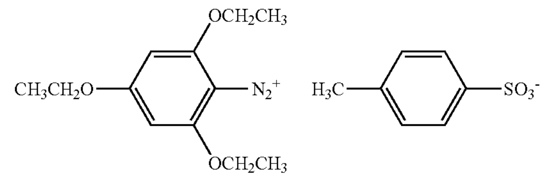

(N-2)

$PF_6^-$ (N-3)

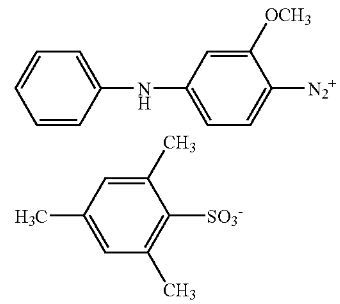

(N-4)

$ClO_4''$ (N-5)

$PF_6^-$ (N-6)

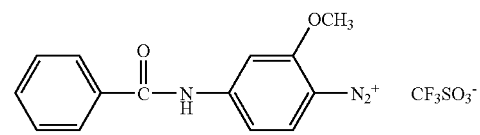

(N-7)

$BF_4^-$ (N-8)

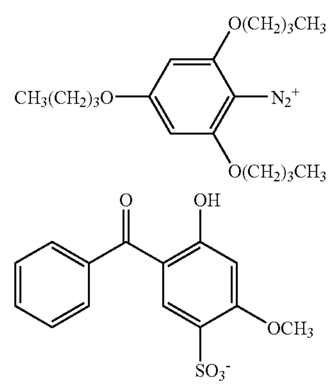

(N-9)

$ClO_4^-$ (N-10)

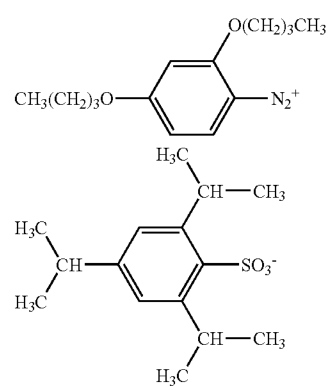

-continued
(N-11)
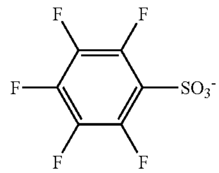
(N-12)
$PF_6^-$
(N-13)
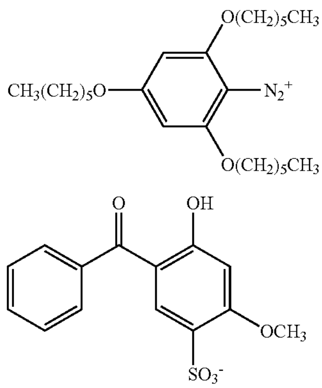
(N-14)
$ClO_4^-$
(N-15)
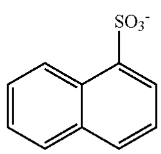
(N-16)
$PF_6^-$
(N-17)
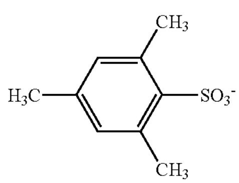
(I-1)
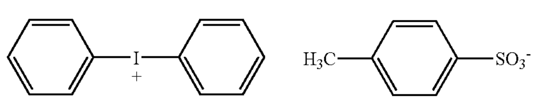
(I-2)
$PF_6^-$
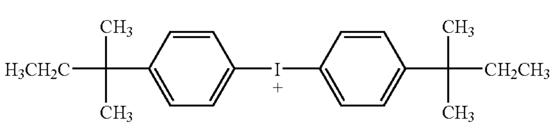
(I-3)
$PF_6^-$
(I-4)
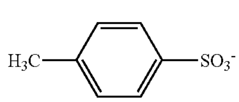
(I-5)
$ClO_4^-$
-continued
(I-6)
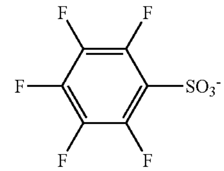
(I-7)
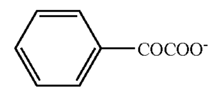
(I-8)
$CF_3SO_3^-$
(I-9)
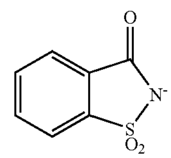
(I-10)
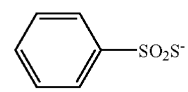
(I-11)
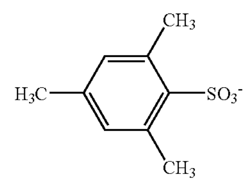
(I-12)
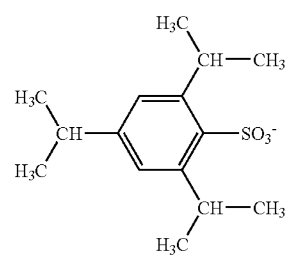
(I-13)
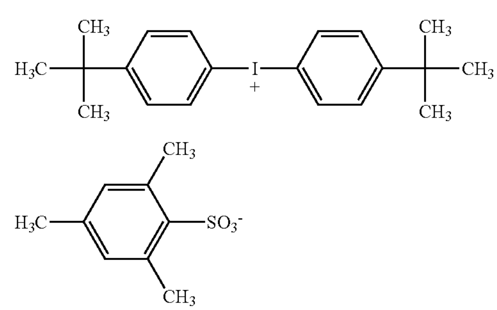
(I-14)
$ClO_4^-$
(I-15)
$PF_6^-$
(I-16)
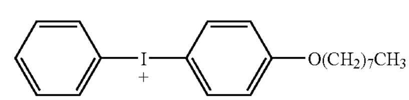

-continued
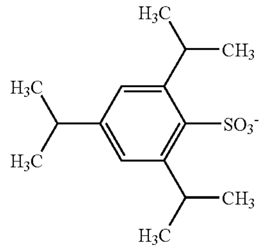
(I-17)
$CF_3COO^-$
(I-18)
$CF_3SO_3^-$
(I-19)
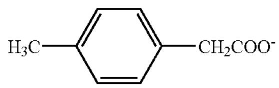
(I-20)
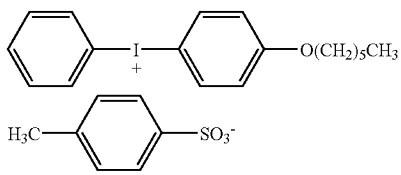
(I-21)
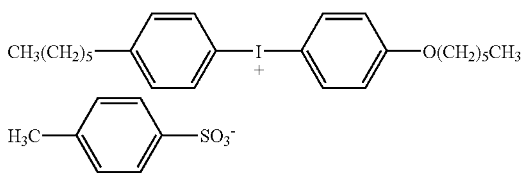
(I-22)
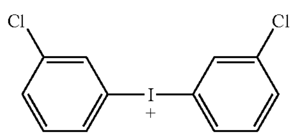
$BF_4^-$
(I-23)
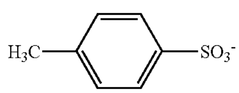
(I-18)
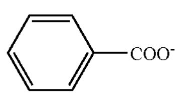
(S-1)
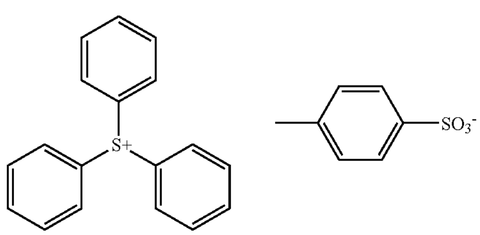
(S-2)
$PF_6^-$
(S-3)
$ClO_4^-$
(S-4)
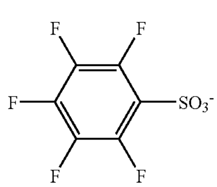
-continued
(S-5)
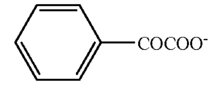
(S-6)
$CF_3SO_3^-$
(S-7)
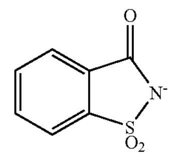
(S-8)
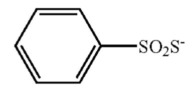
(S-9)
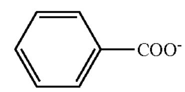
(S-10)
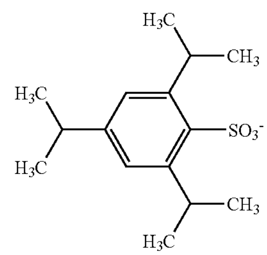
(S-11)
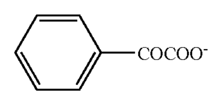
(S-12)
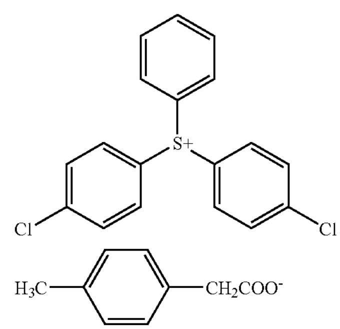
(S-13)
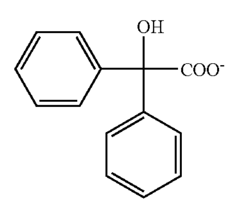
(S-14)
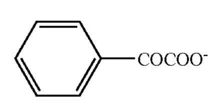

-continued (S-15)

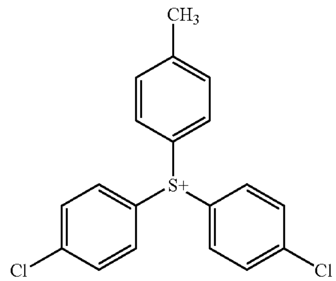

(S-16)

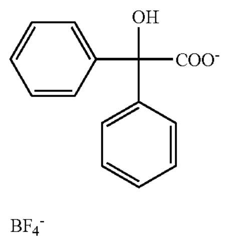

(S-17)

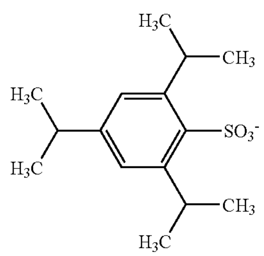

(S-18)

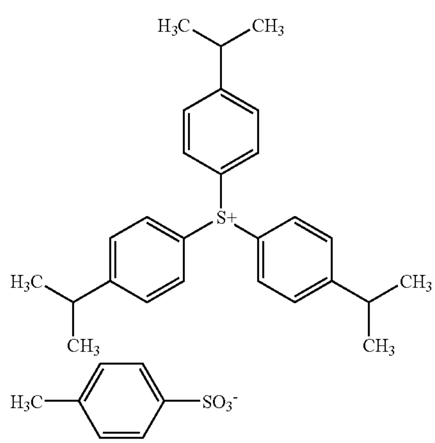

The radical polymerization initiator is not limited to those described above. In particular, from the standpoint of reactivity and stability, the triazine type initiators, organic halogen compounds, metallocene compounds, hexaarylbiimidazole compounds, organic boron compounds, oxine ester compounds and onium salt compounds are preferable and the triazine type initiators, organic halogen compounds, metallocene compounds, hexaarylbiimidazole compounds and onium salt compounds are more preferable.

The radical polymerization initiator can be added preferably in an amount from 0.1 to 50% by weight, more preferably from 0.5 to 30% by weight, particularly preferably from 0.8 to 20% by weight, based on the total solid content of the polymerizable composition or photosensitive layer.

The polymerizable composition or photosensitive layer according to the invention may contain as other additives, compounds described below depending on the use thereof, if desired

[Sensitizing Dye]

The sensitizing dye for use in the polymerizable composition or photosensitive layer according to the invention is appropriately selected depending on the use or the like and is not particularly restricted. For instance, an infrared absorbing agent and a sensitizing dye absorbing light of 360 to 450 nm are exemplified.

<Infrared Absorbing Agent>

The infrared absorbing agent is a component used for increasing sensitivity to an infrared laser. The infrared absorbing agent has a function of converting the infrared ray absorbed to heat. The infrared absorbing agent for use in the invention is preferably a dye or pigment having an absorption maximum in a wavelength range of 760 to 1,200 nm.

As the dye, commercially available dyes and known dyes described in literatures, for example, Senryo Binran (Dye Handbook) compiled by The Society of Synthetic Organic Chemistry, Japan (1970) can be used. Specifically, the dyes includes azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal thiolate complexes.

Examples of preferable dye include cyanine dyes described, for example, in JP-A-58-125246, JP-A-59-84356 and JP-A-60-78787, methine dyes described, for example, in JP-A-58-173696, JP-A-58-181690 and JP-A-58-194595, naphthoquinone dyes described, for example, in JP-A-58-112793, JP-A-58-224793, JP-A-59-48187, JP-A-59-73996, JP-A-60-52940 and JP-A-60-63744, squarylium dyes described, for example, in JP-A-58-112792, and cyanine dyes described, for example, in British Patent 434,875.

Also, near inflated absorbing sensitizers described in U.S. Pat. No. 5,156,938 are preferably used. Further, substituted arylbenzo(thio)pyrylium salts described in U.S. Pat. No. 3,881,924, trimethinethiapyrylium salts described in JP-A-57-142645 (corresponding to U.S. Pat. No. 4,327,169), pyrylium compounds described in JP-A-58-181051, JP-A-58-220143, JP-A-59-41363, JP-A-59-84248, JP-A-59-84249, JP-A-59-146063 and JP-A-59-146061, cyanine dyes described in JP-A-59-216146, pentamethinethiopyrylium salts described in U.S. Pat. No. 4,283,475, and pyrylium compounds described in JP-B-5-13514 and JP-B-5-19702 are also preferably used. Other preferred examples of the dye include near infrared absorbing dyes represented by formulae (I) and (II) in U.S. Pat. No. 4,756,993.

Other preferable examples of the infrared absorbing dye include specific indolenine cyanine dyes described in JP-A-2002-278057 as illustrated below.

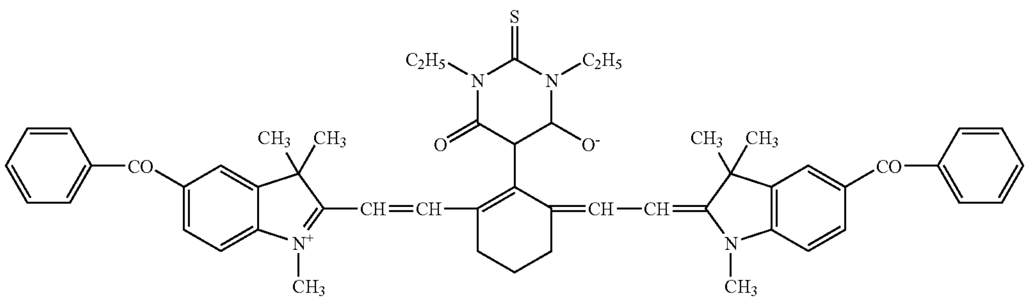

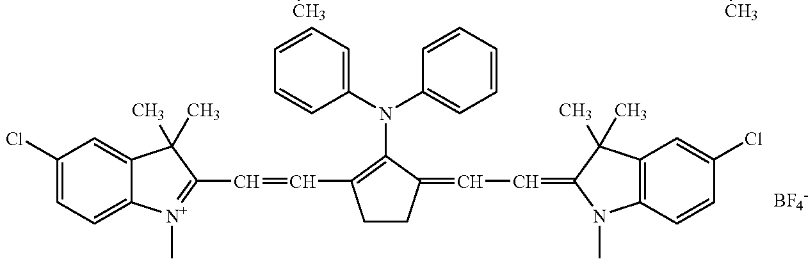

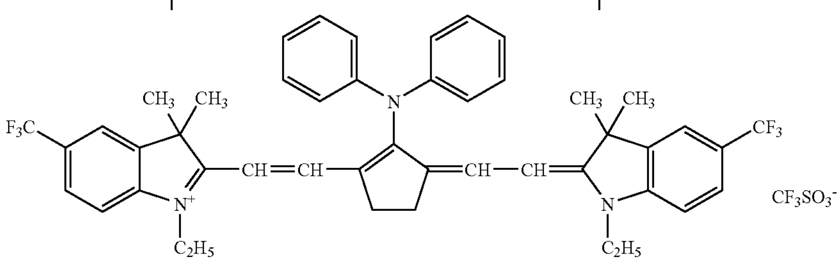

Of the dyes, cyanine dyes, squarylium dyes, pyrylium dyes, nickel thiolate complexes and indolenine cyanine dyes are particularly preferred. Further, cyanine dyes and indolenine cyanine dyes are more preferred. As a particularly preferable example of the dye, a cyanine dye represented by the following formula (I) is exemplified.

Formula (I):

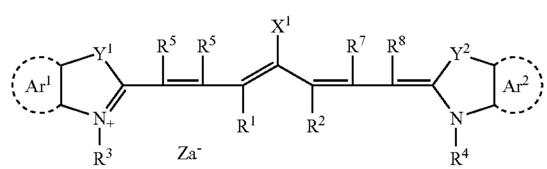

In formula (I), $X^1$ represents a hydrogen atom, a halogen atom, —$NPh_2$, $X^2$-$L^1$ or a group shown below. $X^2$ represents an oxygen atom, a nitrogen atom or a sulfur atom, $L^1$ represents a hydrocarbon group having from 1 to 12 carbon atoms, an aromatic ring containing a hetero atom or a hydrocarbon group having from 1 to 12 carbon atoms and containing a hetero atom. The hetero atom indicates here a nitrogen atom, a sulfur atom, an oxygen atom, a halogen atom or a selenium atom.

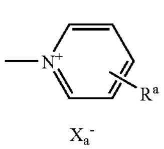

(wherein $Xa^-$ has the same meaning as $Za^-$ defined hereinafter. $R^a$ represents a substituent selected from a hydrogen atom, an alkyl group, an aryl group, a substituted or unsubstituted amino group and a halogen atom.)

$R^1$ and $R^2$ each independently represents a hydrocarbon group having from 1 to 12 carbon atoms. In view of the preservation stability of a coating solution for polymerizable composition or photosensitive layer, it is preferred that $R^1$ and $R^2$ each represents a hydrocarbon group having two or more carbon atoms, and it is particularly preferred that $R^1$ and $R^2$ are combined with each other to form a 5-membered or 6-membered ring.

$Ar^1$ and $Ar^2$, which may be the same or different, each represents an aromatic hydrocarbon group which may have a substituent. Preferable examples of the aromatic hydrocarbon group include a benzene ring and a naphthalene ring. Also, preferable examples of the substituent include a hydrocarbon group having 12 or less carbon atoms, a halogen atom and an alkoxy group having 12 or less carbon atoms. $Y^1$ and $Y^2$, which may be the same or different each represents a sulfur atom or a dialkylmethylene group having 12 or less carbon atoms. $R^3$ and $R^4$, which may be the same or different, each represents a hydrocarbon group having 20 or less carbon atoms, which may have a substituent. Preferable examples of the substituent include an alkoxy group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms. In view of the availability of raw materials, a hydrogen atom is preferred. $Za^-$ represents a counter anion. However, $Za^-$ is not necessary when the cyanine dye represented by formula (I) has an anionic substituent in the structure thereof and neutralization of charge is not needed. Preferable examples of the counter ion for $Za^-$ include a halogen ion, a perchlorate ion, a tetrafluoroborate ion, a hexafluorophosphate ion and a sulfonate ion, and particularly preferable examples thereof include a perchlorate ion, a hexafluorophosphate ion and an arylsulfonate ion in view of the preservation stability of a coating solution for polymerizable composition or photosensitive layer.

Specific examples of the cyanine dye represented by formula (I), which can be preferably used in the invention, include those described in Paragraph Nos. [0017] to [0019] of JP-A-2001-133969.

Further, other particularly preferable examples include specific indolenine cyanine dyes described in JP-A-2002-278057 described above.

Examples of the pigment for use in the invention include commercially available pigments and pigments described in *Colour Index* (*C.I.*), *Saishin Ganryo Binran* (*Handbook of the Newest Pigments*) compiled by Pigment Technology Society of Japan (1977), *Saishin Ganryo Oyou Gijutsu* (*Newest Application on Technologies for Pigments*), CMC Publishing Co., Ltd. (1986) and *Insatsu Ink Gijutsu* (*Printing Ink Technology*), CMC Publishing Co., Ltd. (1984).

Examples of the pigment include black pigments, yellow pigments, orange pigments, brown pigments red pigments, purple pigments, blue pigments, green pigments, fluorescent pigments, metal powder pigments and polymer-bonded dyes. Specific examples of usable pigment include insoluble azo pigments, azo lake pigments, condensed azo pigments, chelated azo pigments, phthalocyanine pigments anthraquinone pigments, perylene and perynone pigments, thioindigo pigments, quinacridone pigments, dioxazine pigments, isoindolinone pigments, quinophthalone pigments, dying lake pigments, azine pigments, nitroso pigments, nitro pigments, natural pigments, fluorescent pigments, inorganic pigments and carbon black. Of the pigments, carbon black is preferred.

The pigment may be used without undergoing surface treatment or may be used after the surface treatment. For the surface treatment, a method of coating a resin or wax on the surface, a method of attaching a surfactant and a method of bonding a reactive substance (for example, a silane coupling agent, an epoxy compound or polyisocyanate) to the pigment surface. The surface treatment methods are described in *Kinzoku Sekken no Seishitsu to Oyo* (*Properties and Applications of Metal Soap*), Saiwai Shobo, *Insatsu Ink Gijutsu* (*Printing Ink Technology*). CMC Publishing Co., Ltd. (1984), and *Saishin Ganryo Oyo Gijutsu* (*Newest Application on Technologies for Pigments*), CMC Publishing Co., Ltd. (1986).

The pigment has a particle size of preferably from 0.01 to 10 μm, more preferably from 0.05 to 1 μm, particularly preferably from 0.1 to 1 μm. In the above-described range, good stability and good uniformity of the pigment dispersion in the polymerizable composition or photosensitive layer can be obtained.

For dispersing the pigment, a known dispersion technique for use in the production of ink or toner may be used. Examples of the dispersing machine include an ultrasonic dispersing machine, a sand mill, an attritor, a pearl mill, a super-mill, a ball mill, an impeller, a disperser, a KD mill, a colloid mill, a dynatron, a three roll mill and a pressure kneader. The dispersing machines are described in detail in *Saishin Ganryo Oyo Gijutsu* (*Newest Application on Technologies for Pigments*), CMC Publishing Co., Ltd. (1986).

The infrared absorbing agent may be added by being incorporated into a microcapsule.

The amount of the infrared absorbing agent added to the polymerizable composition is preferably from 0.1 to 50% by weight, more preferably from 0.5 to 40% by weight, still more preferably from 1 to 350% by weight. In case of using the polymerizable composition according to the invention in a photosensitive layer of a negative-working lithographic printing plate precursor, the amount of the infrared absorbing agent is so controlled that absorbance of the photosensitive layer at the maximum absorption wavelength in the wavelength region of 760 to 1,200 nm measured by reflection measurement is in a range of 0.3 to 1.3, preferably in a range of 0.4 to 1.2. In the above-described range, the polymerization reaction proceeds uniformly in the thickness direction of the photosensitive layer and good film strength of the image area and good adhesion property of the image area to a support are achieved.

The absorbance of the photosensitive layer can be controlled depending on the amount of the infrared absorbing agent added to the photosensitive layer and the thickness of the photosensitive layer. The measurement of the absorbance can be carried out in a conventional manner. The method for measurement includes, for example, a method of forming a photosensitive layer having a thickness determined appropriately in the range necessary for the lithographic printing plate precursor on a reflective support, for example, an aluminum plate, and measuring reflection density of the photosensitive layer by an optical densitometer or a spectrophotometer according to a reflection method using an integrating sphere.

<Sensitizing Dye Absorbing Light of 360 to 450 nm>

The sensitizing dye absorbing light of 360 to 450 nm include, for example, merocyanine dyes represented by formula (I) shown below, benzopyranes or coumarins represented by formula (II) shown below, aromatic ketones represented by formula (III) shown below and anthracenes represented by formula (IV) shown below.

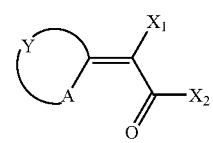

(I)

In formula (I), A represents a sulfur atom or $NR_6$, $R_6$ represents a monovalent non-metallic atomic group, Y represents a non-metallic atomic group necessary for forming a basic nucleus of the dye together with adjacent A and the adjacent carbon atom, and $X_1$ and $X_2$ each independently represents a monovalent non-metallic atomic group or $X_1$ and $X_2$ may be combined with each other to form an acidic nucleus of the dye.

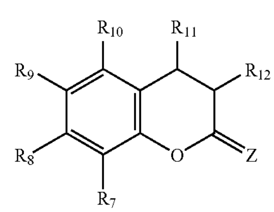

(II)

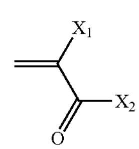

(I')

In formula (II), =Z represents an oxo group, a thioxo group, an imino group or an alkylydene group represented by the partial structural formula (I') described above, $X_1$ and $X_2$ have the same meanings as defined in formula (II) respectively, and $R_7$ to $R_{12}$ each independently represents a monovalent non-metallic atomic group.

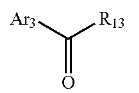

(III)

In formula (III), $Ar_3$ represents an aromatic group which may have a substituent or a heteroaromatic group which may have a substituent, and $R_{13}$ represents a monovalent non-metallic atomic group. $R_{13}$ preferably represents an aromatic group or a heteroaromatic group. $Ar_3$ and $R_{13}$ may be combined with each other to form a ring.

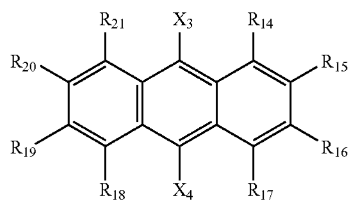

(IV)

In formula (IV), $X_3$, $X_4$ and $R_{14}$ to $R_{21}$ each independently represents a monovalent non-metallic atomic group. Preferably, $X_3$ and $X_4$ each independently represents an electron-donating group having a negative Hammett substituent constant.

In formulae (I) to (IV), preferable examples of the monovalent non-metallic atomic group represented by any one of $X_1$ to $X_4$ and $R_6$ to $R_{21}$ include a hydrogen atom, an alkyl group (for example, a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group, a 2-norbornyl group, a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-methoxyphenyl)carbamoylethyl group, an N-methyl-N-sulfophenyl)carbamoylmethyl group, a sulfobutyl group, a sulfonatobutyl group, a sulfamoylbutyl group, an N-ethylsulfamoylmethyl group, an N,N-dipropyl-sulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group or a 3-butynyl group), an aryl group (for example, a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a nitrophenyl group, a cyanophenyl group, a sulfophenyl group, a sulfonatophenyl group, a phosphonophenyl group or a phosphonatophenyl group), a heteroaryl group (for example, a group derived from a heteroaryl ring, for example, thiophene, thiathrene, furan, pyran, isobenzofuran, chromene, xanthene, phenoxazine, pyrrole, pyrazole, isothiazole, isoxazole, pyrazine, pyrimidine, pyridine, indolizine, isoindolizine, indole, indazole, purine, quinolizine, isoquinoline, phthalazine, naphthylidine, quinazoline, cinnoline, pteridine, carbazole, carboline, phenanthrine, acridine, perimidine, phenanthroline, phthalazine, phenarsazine, phenoxazine, furazane or phenoxazine), an alkenyl group (for example, a vinyl group, a 1-propenyl group, a 1-butenyl group, a cinnamyl group or a 2-chloro-1-ethenyl group), an alkynyl group (for example, an ethynyl group, a 1-propynyl group, a 1-butynyl group or a trimethylsilylethynyl group), a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and its conjugated base group (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—$PO_3H_2$) and its conjugated base group (hereinafter referred to as a "phosphonato group"), a dialkylphosphono group (—$PO_3$(alkyl)$_2$), a diarylphosphono group (—$PO_3$(aryl)$_2$), an alkylarylphosphono group (—$PO_3$(alkyl)(aryl)), a monoalkylphosphono group (—$PO_3H$(alkyl)) and its conjugated base group hereinafter referred to as an "alkylphosphonato group"), a monoarylphosphono group (—$PO_3H$(aryl)) and its conjugated base group (hereinafter referred to as an "arylphosphonato group"), a phosphonooxy group (—$OPO_3H_2$) and its conjugated base group (hereinafter referred to as a "phosphonatooxy group"), a dialkylphosphonooxy group (—$OPO_3$(alkyl)$_2$), a diarylphosphonooxy group (—$OPO_3$(aryl)$_2$), an alkylarylphosphonooxy group (—$OPO_3$(alkyl)(aryl)), a monoalkylphosphonooxy group (—$OPO_3H$(alkyl)) and its conjugated base group (hereinafter referred to as an "alkylphosphonatooxy group"), a monoarylphosphonooxy group (—$OPO_3H$(aryl)) and its conjugated base group (hereinafter referred to as an "arylphosphonatooxy group"), a cyano group and a nitro group. Among the above-described groups, a hydrogen atom, an alkyl group, an aryl group, a halogen atom, an alkoxy group and an acyl group are particularly preferred.

The basic nucleus of the dye formed by Y together with the adjacent A and the adjacent carbon atom in formula (I) includes, for example, a 5-membered, 6-membered or 7-membered, nitrogen-containing or sulfur-containing heterocyclic ring, and is preferably a 5-membered or 6-membered heterocyclic ring.

As the nitrogen containing heterocyclic ring, those which are known to constitute basic nuclei in merocyanine dyes described in L. G. Brooker et al, *J. Am. Chem. Soc.* Vol. 73, pp. 5326 to 5358 (1951) and references cited therein can be preferably used. Specific examples thereof include thiazoles (for example, thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenyl)thiazole or 4-(2-thienyl)thiazole); benzothiazoles (for example, benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5-bromobenzothiazole, 4-phenylbenzothiazole, 5-phenylbenzothiazole, 4-methoxybenzothiazole, 5-methoxybenzothiazole, 6-methoxybenzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxymethylenebenzothiazole, 5-hydroxybenzothiazole, 6-hydroxybenzothiazole, 6-dimethylaminobenzothiazole or 5-ethoxycarbonylbenzothiazole); naphthothiazoles (for example, naphtho[1,2] thiazole, naphtho[2,1]thiazole, 5-methoxynaphtho[2,1]thiazole, 5-ethoxynaphtho[2,1]thiazole, 8-methoxynaphtho[1,2] thiazole or 7-methoxynaphtho[1,2]thiazole); thianaphtheno-7',6'4,5-thiazoles (for example, 4'-methoxythianaphtheno-7',6',4,5-thiazole); oxazoles (for example, 4-methyloxazole, 5-methyloxazole, 4-phenyloxazole, 4,5-phenyloxazole, 4-ethyloxazole, 4,5-dimethyloxazole or 5-phenyloxazole); benzoxazoles (for example, benzoxazole, 5-chlorobenzoxazole, 5-methylbenzoxazole, 5-phenylbenzoxazole, methylbenzoxazole, 5,6-dimethylbenzoxazole, 4,6-dimethylbenzoxazole, 6-methoxybenzoxazole, 5-methoxybenzoxazole, 4-ethoxybenzoxazole, 5-chlorobenzoxazole, 6-methoxybenzoxazole, 5-hydroxybenzoxazole or 6-hydroxybenzoxazole); naphthoxazoles (for example, naphth[1,2]oxazole or naphth[2,1]oxazole); selenazoles (for example, 4-methylselenazole or 4-phenylselenazole); benzoselenazoles (for example, benzoselenazole, 5-chlorobenzoselenazole, 5-methoxybenzoselenazole, 5-hydroxybenzoselenazole or tetrahydrobenzoselenazole); naphthoselenazoles (for example, naphtho[1,2]selenazole or naphtho[2,1]selenazole); thiazolines (for example, thiazoline or 4-methylthiazoline); quinolines (for example, quinoline, 3-methylquinoline, 5-methylquinoline, 7-methylquinoline, 8-methylquinoline, 6-chloroquinoline, 8-chloroquinoline, 6-methoxyquinoline, 6-ethoxyquinoline, 6-hydroxyquinoline or 8-hydroxyquinoline); isoquinolines (for example, isoquinoline or 3,4-dihydroisoquinoline); benzimidazoles (for example, 1,3-diethylbenzimidazole or 1-ethyl-3-phenylbenzimidazole); 3,3-dialkylindolenines (for example, 3,3-dimethylindolenine, 3,3,5-trimethylindolenine or 3,3,7-trimethylindolenine); and pyridines (for example, pyridine or 5-methylpyridine).

Examples of the sulfur-containing heterocyclic ring include dithiol partial structures in dyes described in JP-A-3-296759.

Specific examples thereof include benzodithiols (for example, benzodithiol, 5-tert-butylbenzodithiol or 5-methylbenzodithiol); naphthodithiols (for example, naphtho[1,2] dithiol or naphtho[2,1]dithiol); and dithiols (for example, 4,5-dimethyldithiol, 4-phenyldithiol, 4-methoxycarbonyldithiol, 4,5-dimethoxycarbonyldithiol, 4,5-ditrifluoromethyldithiol, 4,5-dicyanodithiol, 4-methoxycarbonylmethyldithiol or 4-carboxymethyldithiol).

In the description with respect to the heterocyclic ring above, for convenience and by convention, the names of heterocyclic mother skeletons are used. In the case of constituting the basic nucleus partial structure in the sensitizing dye, the heterocyclic ring is introduced in the form of a substituent of alkylydene type where a degree of unsaturation is decreased one step. For example, a benzothiazole skeleton is introduced as a 3-substituted-2(3H)-benzothiazolilydene group.

Of the compounds having an absorption maximum in a wavelength range of 360 to 450 nm, dyes represented by formula (V) shown below are more preferable in view of high sensitivity.

(V)

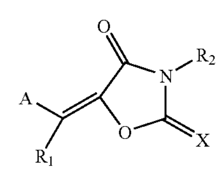

In formula (V), A represents an aromatic cyclic group which may have a substituent or a heterocyclic group which may have a substituent, X represents an oxygen atom, a sulfur, atom or =N($R_3$), and $R_1$, $R_2$ and $R_3$ each independently repents a monovalent non-metallic atomic group, or A and $R_1$ or $R_2$ and $R_3$ may be combined with each other to form an aliphatic or aromatic ring.

The formula (V) will be described in more detail below. $R_1$, $R_2$ and $R_3$ each independently represents a monovalent non-metallic atomic group, preferably a substituted or unsubstituted alkyl group, a substituted or unsubstituted alkenyl group, a substituted or unsubstituted aryl group, a substituted or unsubstituted heteroaryl group, a substituted or unsubstituted alkoxy group, a substituted or unsubstituted alkylthio group, a hydroxy group or a halogen atom.

Preferable examples of $R_1$, $R_2$ and $R_3$ will be specifically described below. Preferable examples of the alkyl group include a straight chain, branched or cyclic alkyl group having from 1 to 20 carbon atoms. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among them, a straight chain all group having from 1 to 12 carbon atoms, a branched alkyl group having from 3 to 12 carbon atoms and a cyclic alkyl group having from 5 to 10 carbon atoms are more preferable.

As the substituent for the substituted alkyl group, a monovalent non-metallic atomic group exclusive of a hydrogen atom is used. Preferable examples thereof include a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-alkylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N,N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-aryl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and its conjugated base group (hereinafter referred to as a “sulfonato group”), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—$PO_3H_2$) and its conjugated base group (hereinafter referred to as a “phosphonato group”), a dialkylphosphono group (—$PO_3$(alkyl)$_2$), a diarylphosphono group (—$PO_3$(aryl)$_2$), an alkylarylphosphono group (—$PO_3$(alkyl)(aryl)), a monoalkylphosphono group (—$PO_3$H(alkyl)) and its conjugated base group (hereinafter referred to as an “alkylphosphonato group”), a monoarylphosphono group (—$PO_3$H(aryl)) and its conjugated base group (hereinafter referred to as an “arylphosphonato group”), a phosphonooxy group (—$OPO_3H_2$) and its conjugated base group (hereinafter referred to as a “phosphonatooxy group”), a dialkylphosphonooxy group (—$OPO_3$(alkyl)$_2$), a diarylphosphonooxy group (—$OPO_3$(aryl)$_2$, an alkylarylphosphonooxy group (—$OPO_3$(alkyl)(aryl)), a monoalkylphosphonooxy group (—$OPO_3$H(alkyl)) and its conjugated base group (hereinafter referred to as an “alkylphosphonatooxy group”), a monoarylphosphonooxy group (—$OPO_3$H(aryl)) and its conjugated base group (hereinafter referred to as an “arylphosphonatooxy group”), a cyano group, a nitro group, an aryl group, a heteroaryl group, an alkenyl group and an alkynyl group.

In the substituents, specific examples of the alkyl group include those described for the alkyl group above. Specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a nitrophenyl group, a cyanophenyl group, a sulfophenyl group, a sulfonatophenyl group, a phosphonophenyl group and a phosphonatophenyl group.

Examples of the heteroaryl group include a monocyclic or polycyclic aromatic cyclic group containing at least one of a nitrogen atom, an oxygen atom and a sulfur atom. Examples of especially preferable heteroaryl group include a group derived from a heteroaryl ring, for example, thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthylidine, quinazoline, cinnoline, pteridine, carbazole, carboline, phenanthrene, acridine, perimidine, phenanthroline, phthalazine, phenarsazine, phenoxazine, furazane or phenoxazine. These groups may be benzo-fused or may have a substituent.

Also, examples of the alkenyl group include a vinyl group, a 1-propenyl group, a 1-butenyl group, a cinnamyl group and a 2-chloro-1-ethenyl group. Examples of the alkynyl group include an ethynyl group, a 1-propynyl group, a 1-butynyl group and a trimethylsilylethynyl group. Examples of $G_1$ in the acyl group ($G_1$CO—) include the above-described alkyl group and aryl group. Of the substituents, a halogen atom (for example, —F, —Br, —Cl or —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonooxy group, a phosphonatooxy group, an aryl group and an alkenyl group are more preferable.

On the other hand, as an alkylene group in the substituted alkyl group, a divalent organic residue resulting from elimination of any one of hydrogen atoms on the above-described alkyl group having from 1 to 20 carbon atoms can be enumerated. Examples of preferable alkylene group include a straight chain alkylene group having from 1 to 12 carbon atoms, a branched alkylene group having from 3 to 12 carbon atoms and a cyclic alkylene group having from 5 to 10 carbon atoms.

Specific examples of the preferable substituted alkyl group represented by any one of $R_1$, $R_2$ and $R_1$, which is obtained by combining the above-described substituent with the alkylene group, include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-methoxyphenyl)carbamoylethyl group, an N-methyl-N-sulfophenyl)carbamoylmethyl group, a sulfobutyl group, a sulfonatobutyl group, a sulfamoylbutyl group, an N-ethylsulfamoylmethyl group, an N,N-dipropyl-sulfamoylpropyl group, an N-tolylsulfamoylpropyl group, an N-methyl-N-phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 2-butenyl group, a 2-methylallyl group, a 2-propynyl group, a 2-butynyl group and a 3-butynyl group.

Preferable examples of the aryl group represented by any one of $R_1$, $R_2$ and $R_3$ include a fused ring formed from one to three benzene rings and a fused ring formed from a benzene ring and a 5-membered unsaturated ring. Specific examples thereof include a phenyl group, a naphthyl group, an anthryl group, a phenanthryl group, an indenyl group, an acenaphthenyl group and a fluorenyl group. Among them, a phenyl group and a naphthyl group are more preferable.

Specific examples of the preferable substituted aryl group represented by any one of $R_1$, $R_2$ and $R_3$ include aryl groups having a monovalent non-metallic atomic group exclusive of a hydrogen atom as a substituent on the ring-forming carbon atom of the above-described aryl group. Preferable examples of the substitutent include the above-described alkyl groups and substituted alkyl groups, and the substituents described for the above-described substituted all group. Specific examples of the preferable substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyl-oxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-sulfophenyl)carbamoylphenyl group, a sulfophenyl group, a sulfonatophenyl group, a sulfamoylphenyl group, an N-ethylsulfamoylphenyl group, an N,N-dipropyl-sulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allylphenyl group, a 1-propenylmethylphenyl group, a 2-butenylphenyl group, a 2-methylallylphenyl group, a 2-methylpropenylphenyl group, a 2-propynylphenyl group, a 2-butynylphenyl group and a 3-butynylphenyl group.

Examples of the preferable alkenyl group and the preferable heteroaryl group represented by any one of $R_1$, $R_2$ and $R_3$ include those described with respect to the alkenyl group and heteroaryl group above, respectively.

Next, A in formula (V) will be described below. A represents an aromatic cyclic group which may have a substituent or heterocyclic group which may have a substituent. Specific examples of the aromatic cyclic group which may have a substituent or heterocyclic group which may have a substituent include those described for the aryl group and heteroaryl group for any one of $R_1$, $R_2$ and $R_1$ in formula (V).

The sensitizing dye represented by formula (V) is obtained by a condensation reaction of the above-described acidic nucleus or an active methyl group-containing acidic nucleus with a substituted or unsubstituted, aromatic ring or hetero ring and can be synthesized with reference to the description of JP-B-59-28329.

Preferable specific examples (D1) to (D41) of the compound represented by formula (V) are set forth below. Further, when isomers with respect to a double bond connecting an acidic nucleus and a basic nucleus are present in each of the compounds, the invention should not be construed as being limited to any one of the isomers.

(D1)
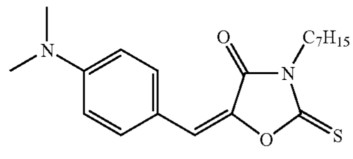
(D2)
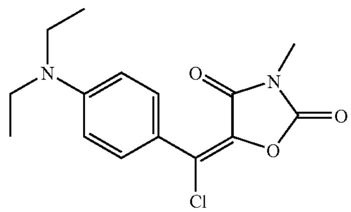
(D3)
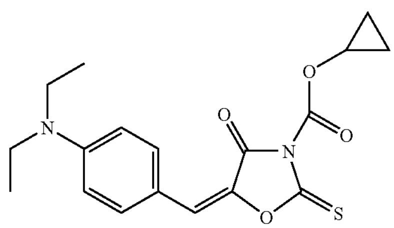
(D4)
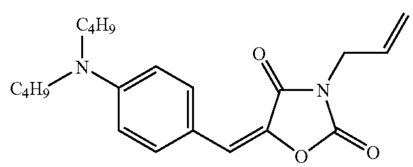
(D5)
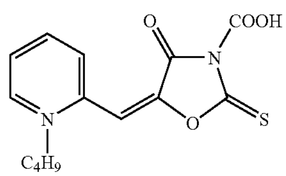
(D6)
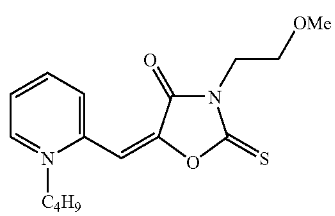
(D7)
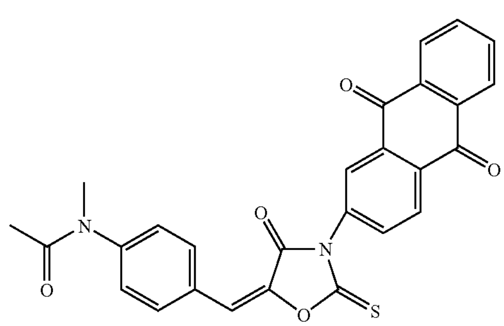
-continued
(D8)
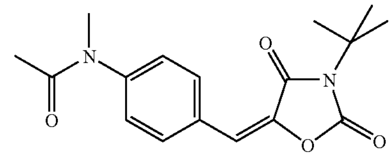
(D9)
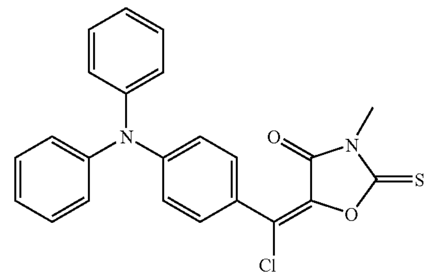
(D10)
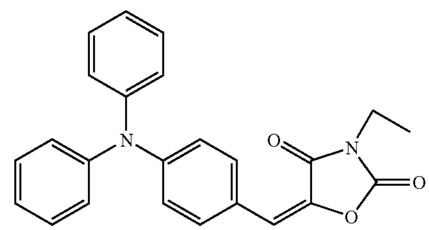
(D11)
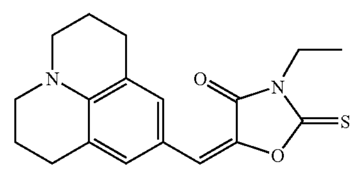
(D12)
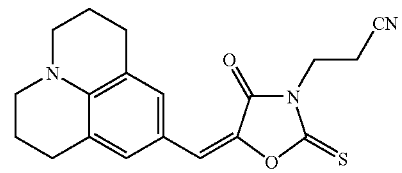
(D13)
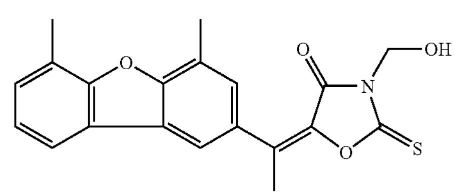
(D14)
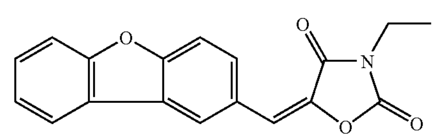
(D15)
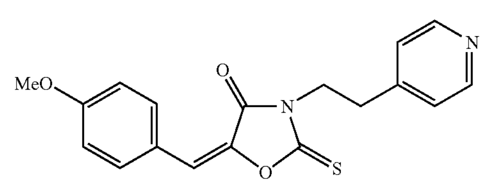

(D16)
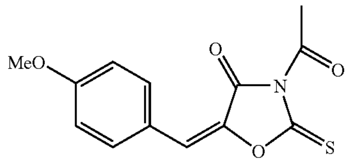
(D17)
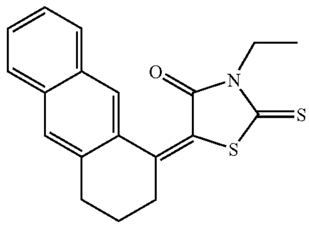
(D18)
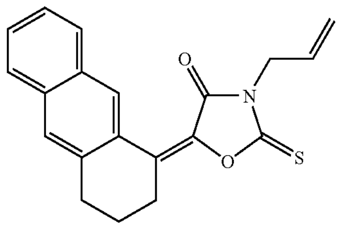
(D19)
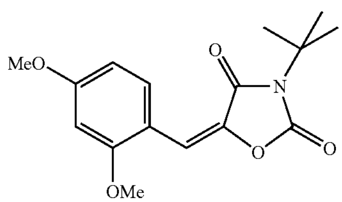
(D20)
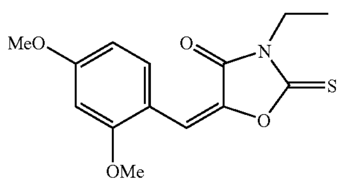
(D21)
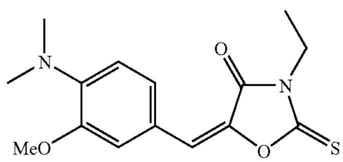
(D22)
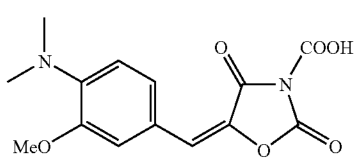
(D23)
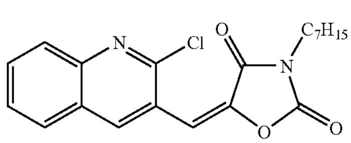
(D24)
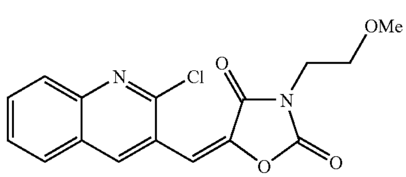
(D25)
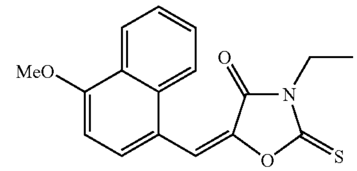
(D26)
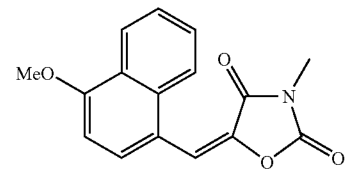
(D27)
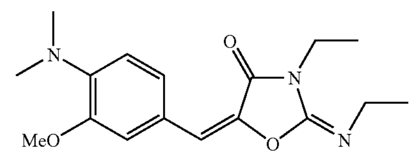
(D28)
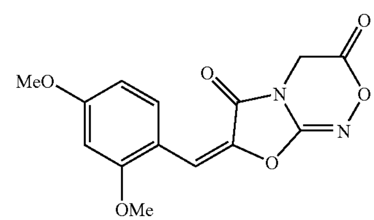
(D29)
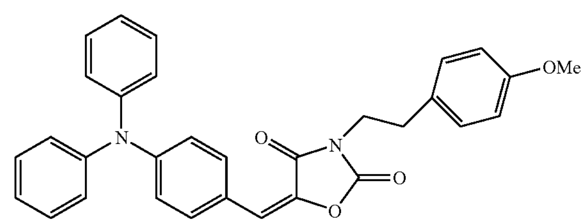
(D30)
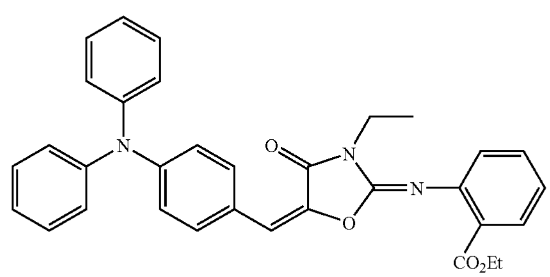
(D31)
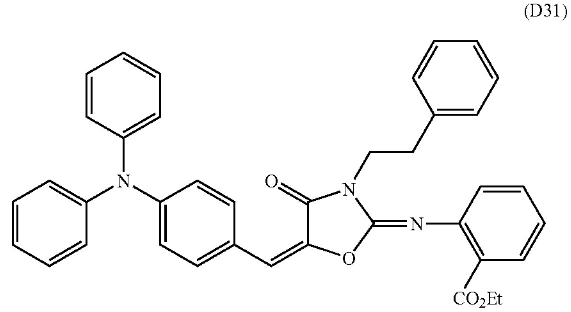

-continued
(D32)
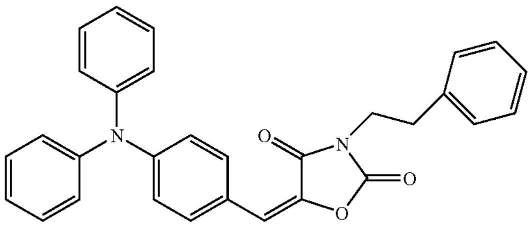
(D33)
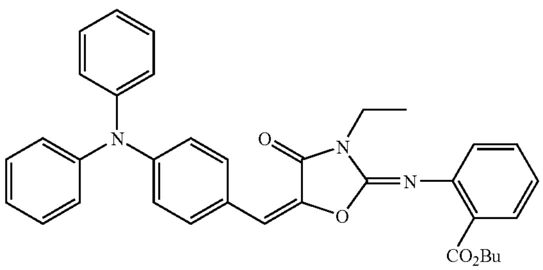
(D34)
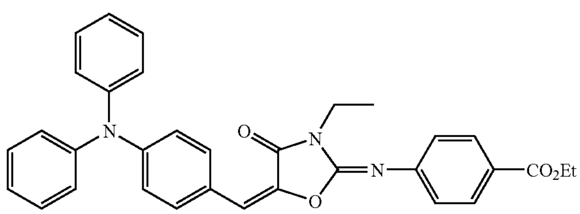
(D35)
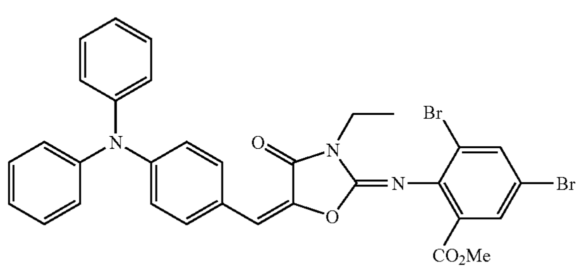
(D36)
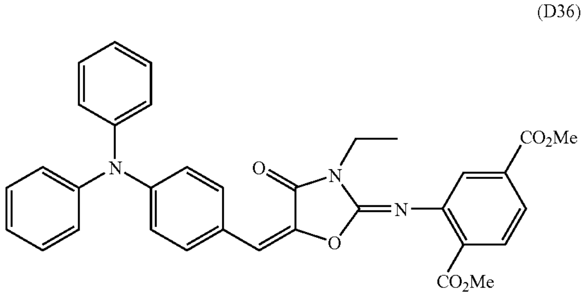
-continued
(D37)
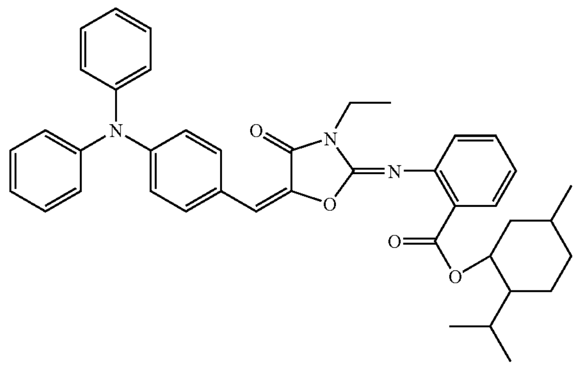
(D38)
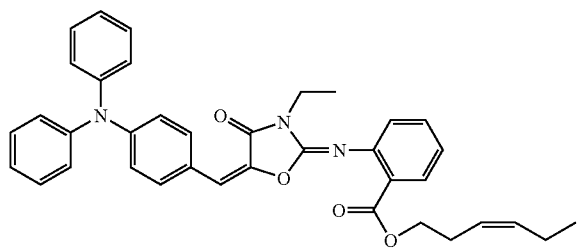
(D39)
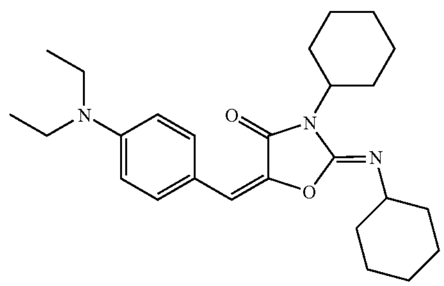
(D40)
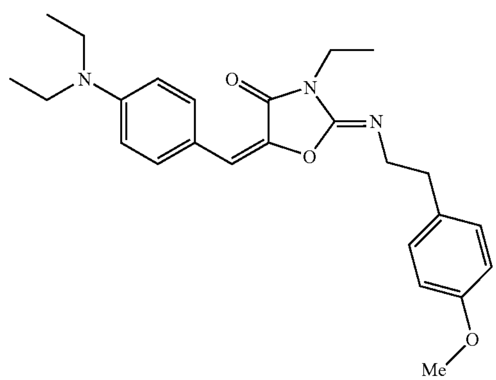
(D41)
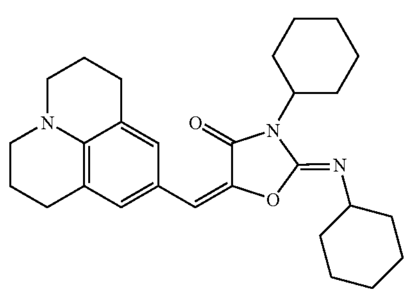

The sensitizing dye absorbing light of 360 to 450 nm is used preferably in a range of 1.0 to 10.0% by weight, more preferably in a range of 1.5 to 5.0% by weight, based on the total components of the polymerizable composition or photosensitive layer.

[Co-sensitizer]

The sensitivity of the polymerizable composition or photosensitive layer can be further increased by using a certain additive. Such a compound is referred to as a co-sensitizer in the invention. The operation mechanism of the co-sensitizer is not quite clear but may be considered to be mostly based on the following chemical process. Specifically, the co-sensitizer reacts with various intermediate active species (for example, a radical, a peroxide, an oxidizing agent or a reducing agent) generated during the process of photo-reaction initiated by light absorption of the photopolymerization initiation system and subsequent addition-polymerization reaction to produce new active radicals. The co-sensitizers are roughly classified into (a) a compound which is reduced to produce an active radical, (b) a compound which is oxidized to produce an active radical and (c) a compound which reacts with a radical having low activity to convert it into a more highly active radical or acts as a chain transfer agent. However, in many cases, a common view about that an individual compound belongs to which type is not present (a) Compound which is Reduced to Produce an Active Radical Compound Having Carbon-Halogen Bond:

An active radical is considered to be generated by the reductive cleavage of the carbon-halogen bond. Specific examples of the compound preferably used include a trihalomethyl-s-triazine and a trihalomethyloxadiazole.

Compound Having Nitrogen-Nitrogen Bond:

An active radical is considered to be generated by the reductive cleavage of the nitrogen-nitrogen bond. Specific examples of the compound preferably used include a hexaarylbiimidazole.

Compound Having Oxygen-Oxygen Bond:

An active radical is considered to be generated by the reductive cleavage of the oxygen-oxygen bond. Specific examples of the compound preferably used include an organic peroxide.

Onium Compound:

An active radical is considered to be generated by the reductive cleavage of a carbon-hetero bond or oxygen-nitrogen bond, Specific examples of the compound preferably used include a diaryliodonium salt, a triarylsulfonium salt and an N-alkoxypyridinium (azinium) salt.

Ferrocene and Iron Allene Complex:

An active radical can be reductively generated.

(b) Compound which is Oxidized to Produce an Active Radical

Alkylate Complex:

An active radical is considered to be generated by the oxidative cleavage of a carbon-hetero bond. Specific examples of the compound preferably used include a triaryl all borate.

Alkylamine Compound:

An active radical is considered to be generated by the oxidative cleavage of a C—X bond on the carbon adjacent to nitrogen, wherein X is preferably a hydrogen atom, a carboxy group, a trimethylsilyl group or a benzyl group. Specific examples of the compound include an ethanolamine, an N-phenylglycine and an N-trimethylsilylmethylaniline.

Sulfur-containing or Tin-containing Compound:

A compound in which the nitrogen atom of the above-described amine is replaced by a sulfur atom or a tin atom is considered to generate an active radical in the same manner. Also, a compound having an S—S bond is known to effect sensitization by the cleavage of the S—S bond.

α-Substituted Methylcarbonyl Compound:

An active radical can be generated by the oxidative cleavage of carbonyl-α-carbon bond. The compound in which the carbonyl is converted into an oxime ether also shows the similar function. Specific examples of the compound include an 2-alkyl-1-[(alkylthio)phenyl]-2-morpholinopronone-1 and an oxime ether obtained by a reaction of the 2-alkyl-1-[4-(alkylthio)phenyl]-2-morpholinopronone-1 with a hydroxyamine and subsequent etherification of the N—OH.

Sulfinic Acid Salt:

An active radical can be reductively generated. Specific examples of the compound include sodium arylsulfinate.

(c) Compound which Reacts with a Radical to Convert it into a More Highly Active Radical or Acts as a Chain Transfer Agent:

For example, a compound having SH, PH, SiH or GeH in its molecule is used as the compound which reacts with a radical to convert it into a more highly active radical or acts as a chain transfer agent. The compound donates hydrogen to a low active radical species to generate a radical or is oxidized and deprotonized to generate a radical. Specific examples of the compound include a 2-mercaptobenzimidazole.

A large number of examples of the co-sensitizer are more specifically described, for example, in JP-A-9-236913 as additives for the purpose of increasing sensitivity. Some of them are set forth below, but the invention should not be construed as being limited thereto.

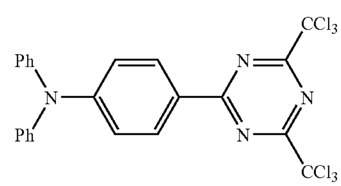

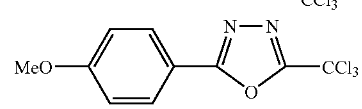

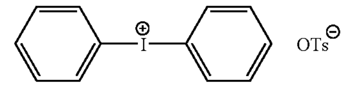

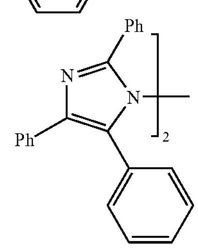

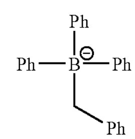

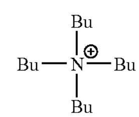

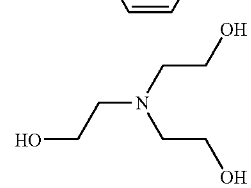

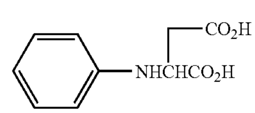

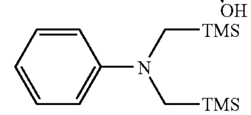

-continued

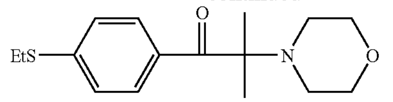

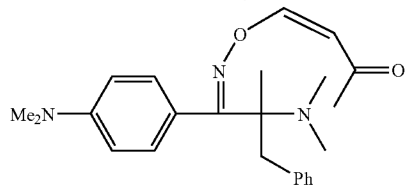

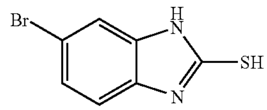

Similarly to the above-described sensitizing dye, the co-sensitizer can be subjected to various chemical modifications so as to improve the characteristics of the polymerizable composition or photosensitive layer according to the invention. For instance, methods, for example, binding to the sensitizing dye, polymerization initiator, polymerizable compound or other radical-generating part, introduction of a hydrophilic site, introduction of a substituent for improving compatibility or inhibiting deposition of crystal, introduction of a substituent for improving adhesion property, and formation of a polymer, may be used. The co-sensitizers may be used individually or in combination of two or more thereof. The amount of the co-sensitizer used is ordinarily from 0.05 to 100 parts by weight, preferably from 1 to 80 parts by weight, more preferably from 3 to 50 parts by weight, per 100 parts by weight of the polymerizable compound.

[Surfactant]

It is preferred to use a surfactant in the polymerizable composition or photosensitive layer in order to progress the developing property and to improve the state of she coated. The surfactant includes, for example, a nonionic surfactant, an anionic surfactant, a cationic surfactant, an amphoteric surfactant and a fluorine-based surfactant.

The nonionic surfactant used in the invention is not particular restricted, and nonionic surfactants hitherto known can be used. Examples of the nonionic surfactant include polyoxyethylene alkyl ethers, polyoxyethylene alkyl phenyl ethers, polyoxyethylene polystyryl phenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters polyglycerol fatty acid partial esters, polyoxyethylenated castor oils, polyoxyethylene glycerol fatty acid partial esters, fifty acid diethanolamides, N,N-bis-2-hydroxyalkylamines, polyoxyethylene alkylamines, triethanolamine fatty acid esters, trialylamine oxides, polyethylene glycols, and copolymers of polyethylene glycol and polypropylene glycol.

The anionic surfactant used in the invention is not particularly restricted and anionic surfactants hitherto known can be used. Examples of the anionic surfactant include fatty acid salts, abietic acid salts, hydroxyalkanesulfonic acid salts, alkanesulfonic acid salts, dialkylsulfosuccinic ester salts, straight-chain alkylbenzenesulfonic acid salts, branched alkylbenzenesulfonic acid salts, alkylnaphthalenesulfonic acid salts, alkylphenoxypolyoxy ethylene propylsulfonic acid salts, polyoxyethylene alkylsulfophenyl ether salts, N-methyl-N-oleyltaurine sodium salt, N-alkylsulfosuccinic monoamide disodium salts, petroleum sulfonic acid salts, sulfated beef tallow oil sulfate ester salts of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styrylphenyl ether sulfate ester salts, alkyl phosphate ester salts, polyoxyethylene alkyl ether phosphate ester salts, polyoxyethylene alkyl phenyl ether phosphate ester salts, partial saponification products of styrene/maleic anhydride copolymer, partial saponification products of olefin/maleic anhydride copolymer and naphthalene sulfonate formalin condensates.

The cationic surfactant used in the invention is not particularly restricted and cationic surfactants hitherto known can be used. Examples of the cationic surfactant include alkylamine salts quaternary ammonium salts, polyoxyethylene alkyl amine salts and polyethylene polyamine derivatives.

The amphoteric surfactant used in the invention is not particularly restricted and amphoteric surfactants hitherto known can be used. Examples of the amphoteric surfactant include carboxybetaines, aminocarboxylic acids, sulfobetaines, aminosulfuric esters and imidazolines.

In the surfactants described above, the term "polyoxyethylene" can be replaced with "polyoxyalkylene", for example, polyoxymethylene, polyoxypropylene or polyoxybutylene, and such surfactants can also be used in the invention.

Further, a preferred surfactant includes a fluorine-based surfactant containing a perfluoroalkyl group in its molecule. Examples of the fluorine-based surfactant include an anionic type, for example, perfluoroalkyl carboxylates, perfluoroalkyl sulfonates or perfluoroalkylphosphates; an amphoteric type, for example, perfluoroalkyl betaines; a cationic type, for example, perfluoroalkyl trimethyl ammonium salts; and a nonionic type, for example, perfluoroalkyl amine oxides, perfluoroalkyl ethylene oxide adducts, oligomers having a perfluoroalkyl group and a hydrophilic group, oligomers having a perfluoroalkyl group and an oleophilic group, oligomers having a perfluoroalkyl group, a hydrophilic group and an oleophilic group or urethanes having a perfluoroalkyl group and an oleophilic group. Further, fluorine-based surfactants described in JP-A-62-170950, JP-A-62-226143 and JP-A-60-168144 are also preferably exemplified.

The surfactants may be used individually or in combination of two or more thereof. The content of the surfactant is preferably from 0.001 to 10% by weight, more preferably from 0.01 to 7% by weight, based on the total solid content of the polymerizable composition or photosensitive layer.

[Hydrophilic Polymer]

A hydrophilic polymer may be incorporated into the polymerizable composition or photosensitive layer for the purpose of improving the developing property, dispersion stability of microcapsule or the like.

Preferable examples of the hydrophilic polymer include those having a hydrophilic group, for example, a hydroxy group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfonic acid group and a phosphoric acid group.

Specific examples of the hydrophilic polymer include gum arabic, casein, gelatin, a starch derivative, carboxymethyl cellulose or a sodium salt thereof, cellulose acetate, sodium alginate, a vinyl acetate-maleic acid copolymer, a styrene-maleic acid copolymer, polyacrylic acid or a salt thereof, polymethacrylic acid or a salt thereof, a homopolymer or copolymer of hydroxyethyl methacrylate, a homopolymer or copolymer of hydroxyethyl acrylate, a homopolymer or copolymer of hydroxypropyl methacrylate, a homopolymer or copolymer of hydroxypropyl acrylate, a homopolymer or copolymer of hydroxybutyl methacrylate, a homopolymer or copolymer of hydroxybutyl acrylate, polyethylene glycol, a hydroxypropylene polymer, polyvinyl alcohol, a hydrolyzed polyvinyl acetate having a hydrolysis degree of 60% by mole or more, preferably 80% by mole or more, polyvinyl formal, polyvinyl butyral, polyvinyl pyrrolidone, a homopolymer or polymer of acrylamide, a homopolymer or copolymer of methacrylamide, a homopolymer or copolymer of N-methylolacrylamide, polyvinyl pyrrolidone, an alcohol-soluble nylon, and a polyether of 2,2-bis(4-hydroxyphenyl)propane with epichlorohydrin.

The hydrophilic polymer preferably has a weight average molecular weight of 5,000 or more, more preferably from 10,000 to 300,000. The hydrophilic polymer may be any of a random polymer, a block polymer, a graft polymer or the like.

The content of the hydrophilic polymer is preferably 20% by weight or less, more preferably 10% by weight or less, based on the total solid content of the polymerizable composition or photosensitive layer.

[Coloring Agent]

A dye having large absorption in the visible light region can be added as a coloring agent for the image to the polymerizable composition or photosensitive layer. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 produced by Orient Chemical Industry Co., Ltd), Victoria Pure Blue, Crystal Violet (CI42555), Methyl Violet (CI42535), Ethyl Violet, Rhodamine B (CI45170B), Malachite Green((CI42000), Methylene Blue (CI52015), and dyes described in JP-A62-293247. Also, a pigment, for example, phthalocyanine-based pigment, azo-based pigment, carbon black and titanium oxide can be preferably used.

It is preferable to add the coloring agent, because the image area and the non-image area after the image formation can be easily distinguished. The amount of the coloring agent added is preferably from 0.01 to 10% by weight in the polymerizable composition or photosensitive layer.

[Polymerization Inhibitor]

To the polymerizable composition or photosensitive layer according to the invention, a small amount of a thermal polymerization inhibitor is preferably added in order to prevent the radical polymerizable compound from undergoing undesirable thermal polymerization during the use or preservation of the polymerizable composition or photosensitive layer.

Preferable examples of the thermal polymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-tert-butylphenol) and N-nitroso-N-phenylhydroxylamine aluminum salt.

The amount of the thermal polymerization inhibitor added is preferably from about 0.01 to about 5% by weight based on the total solid content of the polymerizable composition or photosensitive layer.

[Higher Fatty Acid Derivative]

In the polymerizable composition or photosensitive layer according to the invention, for example, a higher fatty acid derivative, e.g., behenic acid or behenic acid amide may be added and localized on the surface of the coated layer during the process of drying after coating in order to avoid polymerization inhibition due to oxygen. The amount of the higher fatty acid derivative added is preferably from about 0.1 to about 10% by weight based on the total solid content of the polymerizable composition or photosensitive layer.

[Plasticizer]

The polymerizable composition or photosensitive layer according to the invention may contain a plasticizer. Preferable examples of the plasticizer include a phthalic acid ester, for example, dimethyl phthalate, diethyl phthalate, dibutyl phthalate, diisobutyl phthalate, diocyl phthalate, octyl capryl phthalate, dicyclohexyl phthalate, ditridecyl phthalate, butyl benzyl phthalate, diisodecyl phthalate or diallyl phthalate; a glycol ester, for example, dimethyl glycol phthalate, ethyl phthalylethyl glycolate, methyl phthalylethyl glycolate, butyl phthalylbutyl glycolate or triethylene glycol dicaprylic acid ester, a phosphoric acid ester, for example, tricresyl phosphate or triphenyl phosphate; an aliphatic dibasic acid ester, for example, diisobutyl adipate, dioctyl adipate, dimethyl sebacate, dibutyl sebacate, dioctyl azelate or dibutyl maleate; polyglycidyl methacrylate, triethyl citrate, glycerin triacetyl ester and butyl laurate. The content of the plasticizer is preferably about 30% by weight or less based on the total solid content of the polymerizable composition or photosensitive layer,

[Fine Inorganic Particle]

The polymerizable composition or photosensitive layer according to the invention may contain fine inorganic particle in order to increase strength of the cured layer in the image area. The fine inorganic particle preferably includes, for example, silica, alumina, magnesium oxide, titanium oxide, magnesium carbonate, calcium alginate and a mix thereof. Even if the fine inorganic particle has no light to heat converting property, it can be used, for example, for strengthening the layer or enhancing interface adhesion property due to surface roughening. The fine inorganic particle preferably has an average particle size from 5 nm to 10 μm and more preferably from 0.5 to 3 μm. In the above-described range, it is stably dispersed in the polymerizable composition or photosensitive layer, sufficiently maintains the film strength and can form the non-image area excellent in hydrophilicity and preventing from stain at the printing.

The fine inorganic particle described above is easily available as a commercial product, for example, colloidal silica dispersion.

The content of the fine inorganic particle is preferably 20% by weight or less, more preferably 10% by weight or less, based on the total solid content of the polymerizable composition or photosensitive layer.

[Hydrophilic Low Molecular Weight Compound]

The polymerizable composition or photosensitive layer according to the invention may contain a hydrophilic low molecular weight compound in order to improve the developing property. The hydrophilic low molecular weight compound includes a water-soluble organic compound, for example, a glycol compound, e.g., ethylene glycol, diethylene glycol, triethylene glycol, propylene glycol dipropylene glycol or tripropylene glycol, or an ether or ester derivative thereof, a polyhydroxy compound, e.g., glycerine or pentaerythritol, an organic amine, e.g., triethanol amine, diethanol amine or monoethanol amine, or a salt thereof, an organic sulfonic acid, e.g., toluene sulfonic acid or benzene sulfonic acid, or a salt thereof, an organic phosphonic acid, e.g., phenyl phosphonic acid, or a salt thereof, and an organic carboxylic acid, e.g., tartaric acid, oxalic acid, citric acid, maleic acid, lactic acid, gluconic acid or an amino acid, or a salt thereof.

The polymerizable composition according to the invention can be used as a material for forming a color filter, paint curable with an ultraviolet ray or sunlight, a coating material or the like, in addition to the photosensitive layer of a lithographic printing plate precursor.

[Formation of Photosensitive Layer]

Several embodiments can be employed in order to form the photosensitive layer. One embodiment is a method of dissolving the constituting components for photosensitive layer in an appropriate solvent to coat as described, for example, in JP-A-2002-287334. Another embodiment is a method (photosensitive layer of microcapsule type) of encapsulating the constituting components for photosensitive layer into microcapsule to incorporate into the photosensitive layer as described, for example, in JP-A-2001-277740 and JP-A-2001-277742. In the photosensitive layer of microcapsule type, the constituting components may be present outside the microcapsules. It is a more preferable embodiment of the photosensitive layer of microcapsule type that the hydrophobic constituting components are encapsulated in microcapsules and the hydrophilic components are present outside the microcapsules.

As a method for microencapsulation of the constituting components for photosensitive layer, known methods can be used. Methods of producing the microcapsule include, for example, a method of using coacervation described in U.S. Pat. Nos. 2,800,457 and 2,800,458, a method of using interfacial polymerization described in U.S. Pat. No. 3,287,154, JP-B-38-19574 and JP-B-42-446, a method of using deposition of polymer described in U.S. Pat. Nos. 3,418,250 and 3,660,304, a method of using an isocyanate polyol wall material described in U.S. Pat. No. 3,796,669, a method of using an isocyanate wall material described in U.S. Pat. No. 3,914,511, a method of using a urea-formaldehyde-type or urea-formaldehyde-resorcinol-type wall-forming material described in U.S. Pat. Nos. 4,001,140, 4,087,376 and 4,089,802, a method of using a wall material, for example, a melamine-formaldehyde resin or hydroxycellulose described in U.S. Pat. No. 4,025,445, an in-situ method by monomer polymerization described in JP-B-36-9163 and JP-B-51-9079, a spray drying method described in British Patent 930,422 and U.S. Pat. No. 3,111,407, and an electrolytic dispersion cooling method described in British Patents 952,807 and 967,074, but the invention should not be construed as being limited thereto.

A preferable microcapsule wall used in the invention has three-dimensional crosslinking and has a solvent-swellable property. From this point of view, a preferable wall material of the microcapsule includes polyurea polyurethane, polyester, polycarbonate, polyamide and a mixture thereof, and polyurea and polyurethane are particularly preferred. Further, a compound having a crosslinkable functional group, for example, an ethylenically unsaturated bond, capable of being introduced into the binder polymer described above may be introduced into the microcapsule wall.

The average particle size of the microcapsule is preferably from 0.01 to 3.0 μm, more preferably from 0.05 to 2.0 μm, particularly preferably from 0.10 to 1.0 μm. In the range described above, preferable resolution and good preservation stability can be achieved.

Further, an embodiment of incorporating the constituting component for photosensitive layer, especially, the infrared absorbing agent, into fine resin particles is also used according to the invention. The embodiment is performed by dissolving the constituting component for photosensitive layer in a solvent and mixing the resulting solution with a polymer solution preferably an aqueous polymer solution) using, for example, a homogenizer to prepare a dispersion of fine resin particles for use.

As the solvent used, ethyl acetate, methyl ethyl ketone MEK), diisopropyl ether, dichloromethane, chloroform, toluene, dichloroethane and mixed solvents thereof are exemplified.

As the polymer, polyvinyl alcohol (PVA), polyacrylic acid, sodium polyacrylate, polyacrylamide, polymethacrylic acid, sodium polymethacrylate, polymethacrylamide, polystyrenesulfonic acid, sodium polystyrenesulufonate, acrylic acid/methyl acrylate copolymer, methacrylic acid/methyl methacrylate copolymer and styrene/sodium styrenesulfonate copolymer are exemplified, but the invention should not be construed as being limited thereto.

The solvents may be used individually or as a mixture. The solid concentration of the coating solution is preferably from 1 to 50% by weight.

The photosensitive layer according to the invention may also be formed by preparing plural coating solutions by dispersing or dissolving the same or different constituting components into the same or different solvents and conducting repeatedly the coating and drying plural times.

The coating amount of the photosensitive layer (solid content) formed on a support after drying may be varied according to the use but is preferably from 0.3 to 3.0 g/m$^2$. In the rage described above, good sensitivity and preferable film property of the photosensitive layer can be achieved.

Various methods can be used for the coating. Examples of the coating method include bar coater coating, spin coating, spray coating, curtain coating, dip coating, air knife coating, blade coating and roll coating.

[Protective Layer]

In the lithographic printing plate precursor according to the invention, a protective layer (oxygen-blocking layer) is preferably provided on the photosensitive layer in order to prevent diffusion and penetration of oxygen which inhibits the polymerization reaction at the time of exposure. The protective layer for use in the invention preferably has oxygen permeability (A) at 25° C. under one atmosphere of $1.0 \le (A) \le 20$ (ml/m$^2$·day). When the oxygen permeability (A) is extremely lower than 1.0 (ml/m$^2$·day), problems may occur in that an undesirable polymerization reaction arises during the production or preservation before image exposure and in that undesirable fog or spread of image line occurs at the image exposure. On the contrary, when the oxygen permeability (A) greatly exceeds 20 (ml/m$^2$·day), decrease in sensitivity may be incurred. The oxygen permeability (A) is more preferably in a range of $1.5 \le (A) \le 12$ (ml/m$^2$·day), and still more preferably in a range of $2.0 \le (A) \le 10.0$ (ml/m$^2$·day). Besides the above described oxygen permeability, as for the characteristics required of the protective layer, it is desired that the protective layer does not substantially hinder the transmission of light for the exposure, is excellent in adhesion to the photosensitive layer, and can be easily removed during a development step after the exposure. Contrivances on the protective layer have been heretofore made and described in detail in U.S. Pat. No. 3,458,311 and JP-B-55-49729.

As the material of the protective layer, a water-soluble polymer compound relatively excellent in crystallizability is preferably used. Specifically, a water-soluble polymer, for example, polyvinyl alcohol, vinyl alcohol/vinyl phthalate copolymer, vinyl acetate/vinyl alcohol/vinyl phthalate copolymer, vinyl acetate/crotonic acid copolymer, polyvinyl pyrrolidone, acidic cellulose, gelatin, gum arabic, polyacrylic acid or polyacrylamide is enumerated. The water-soluble polymer compounds may be used individually or as a mixture. Of the compounds, when polyvinyl alcohol is used as a main component, the best results can be obtained in the fundamental characteristics, for example, oxygen-blocking property and removability of the protective layer by development.

Polyvinyl alcohol for use in the protective layer may be partially substituted with ester, ether or acetal as long as it contains unsubstituted vinyl alcohol units for achieving the necessary oxygen-blocking property and water solubility. Also, a part of polyvinyl alcohol may have other copolymer component. As specific examples of polyvinyl alcohol, those having a hydrolyzing rate of 71 to 100% and a polymerization repeating unit number of 300 to 2,400 are exemplified. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 produced by Kuraray Co., Ltd.). They can be used individually or as a mixture. According to a preferred embodiment the content of polyvinyl alcohol in the protective layer is from 20 to 95% by weight, more preferably from 30 to 90% by weight.

Also, known modified polyvinyl alcohol can be preferably used. For instance, polyvinyl alcohols of various polymerization degrees having at random a various kind of hydrophilic modified cites, for example, an anion-modified cite modified with an anion, e.g., a carboxyl group or a sulfo group, a cation-modified cite modified with a cation, e.g., an amino group or an ammonium group, a silanol-modified cite or a thiol-modified cite, and polyvinyl alcohols of various polymerization degrees having at the terminal of the polymer a various kind of modified cites, for example, the above-described anion-modified cite, cation modified cite, silanol-modified cite or thiol-modified cite, an alkoxy-modified cite, a sulfide-modified cite, an ester modified cite of vinyl alcohol with a various kind of organic acids, an ester modified cite of the above-described anion-modified cite with an alcohol or an epoxy-modified cite are exemplified.

As a component used as a mixture with polyvinyl alcohol, polyvinyl pyrrolidone or a modified product thereof is preferable from the viewpoint of the oxygen-blocking property and removability by development. The content thereof is ordinarily from 3.5 to 80% by weight, preferably from 10 to 60% by weight, and more preferably from 15 to 30% by weight, in the protective layer.

The components of the protective layer (selection of PVA and use of additives) and the coating amount are determined taking into consideration fog-preventing property, adhesion property and scratch resistance besides the oxygen-blocking property and removability by development. In general, the higher the hydrolyzing rate of the PVA used (the higher the unsubstituted vinyl alcohol unit content in the protective layer) and the larger the layer thickness, the higher is the oxygen-blocking property, thus it is advantageous in the point of sensitivity. The molecular weight of the polymer compound, for example, polyvinyl alcohol (PVA) is ordinarily from 2,000 to 10,000,000, and preferably from 20,000 to 3,000,000.

As other component of the protective layer, glycerin, dipropylene glycol or the like can be added in an amount corresponding to several % by weight of the polymer compound to provide flexibility. Further, an anionic surfactant, for example, sodium alkylsulfate or sodium alkylsulfonate; an amphoteric surfactant, for example, alkylaminocarboxylate and alkylaminodicarboxylate; or a nonionic surfactant, for example, polyoxyethylene alkyl phenyl ether can be added in an amount corresponding to several % by weight of the polymer compound.

The adhesion property of the protective layer to the photosensitive layer and scratch resistance are also extremely important in view of handling of the printing plate precursor. Specifically, when a hydrophilic layer comprising a water-soluble polymer is laminated on an oleophilic photosensitive layer, layer peeling due to insufficient adhesion is liable to occur, and the peeled portion causes such a defect as failure in curing of the photosensitive layer due to polymerization inhibition by oxygen. Various proposals have been made for improving the adhesion between the photosensitive layer and the protective layer. For example, it is described in U.S. Pat. Nos. 292,501 and 44,563 that a sufficient adhesion property can be obtained by mixing from 20 to 60% by weight of an acryl-based emulsion or a water-insoluble vinyl pyrrolidone/vinyl acetate copolymer with a hydrophilic polymer mainly comprising polyvinyl alcohol and laminating the resulting mixture on the photosensitive layer. Any of these known techniques can be applied to the protective layer according to the invention. Coating methods of the protective layer are described in detail, for example, in U.S. Pat. No. 3,458,311 and JP-B-55-49729.

Further, it is also preferred to incorporate an inorganic stratiform compound into the protective layer of the lithographic printing plate precursor according to the invention for the purpose of improving the oxygen-blocking property and property for protecting the surface of photosensitive layer. The inorganic stratiform compound used here is a particle having a thin tabular shape and includes, for instance, mica, for example, natural mica represented by the following formula: $A(B, C)_{2\text{-}5}D_4O_{10}(OH, F, O)_2$, (wherein A represents any one of K, Na and Ca, B and C each represents any one of Fe (II), Fe(III), Mn, Al, Mg and V, and D represents Si or Al) or synthetic mica; talc represented by the following formula: $3MgO.4SiO.H_2O$; teniolite; montmorillonite; saponite; hectolite; and zirconium phosphate.

Of the micas, examples of the natural mica include muscovite, paragonite, phlogopite, biotite and lepidolite. Examples of the synthetic mica include non-swellable mica, for example, fluorphlogopite $KMg_3(AlSi_3O_{10})F_2$ or potassium tetrasilic mica $KMg_{2.5}(Si_4O_{10})F_2$, and swellable mica, for example, Na tetrasilic mica $NaMg_{2.5}(Si_4O_{10})F_2$, Na or Li teniolite $(Na, Li)Mg_2Li(Si_4O_{10})F_2$, or montmorillonite based Na or Li hectolite $(Na, Li)_{1/8}Mg_{2/5}Li_{1/8}/(Si_4O_{10})F_2$. Synthetic smectite is also useful.

Of the inorganic stratiform compounds, fluorine based swellable mica, which is a synthetic inorganic stratiform compound, is particularly useful in the invention. Specifically, the swellable synthetic mica and an swellable clay mineral, for example, montmorillonite, saponite, hectolite or bentonite have a stratiform structure comprising a unit crystal lattice layer having thickness of approximately 10 to 15 angstroms, and metallic atom substitution in the lattices thereof is remarkably large in comparison with other clay minerals. As a result, the lattice layer results in lack of positive charge and to compensate it, a cation, for example, $Na^+$, $Ca^{2+}$ or $Mg^{2+}$, is adsorbed between the lattice layers. The cation existing between the lattice layers is referred to as an exchangeable cation and is exchangeable with various cations. In particular, in the case where the cation between the lattice layers is Li+ or $Na^+$, because of a small ionic radius, a bond between the stratiform crystal lattices is week, and the inorganic stratiform compound greatly swells upon contact with water. When share is applied under such condition, the stratiform crystal lattices are easily cleaved to form a stable sol in water. The bentnite and swellable synthetic mica have strongly such tendency and are useful in the invention. Particularly, the swellable synthetic mica is preferably used.

With respect to the shape of the inorganic stratiform compound used in the invention, the thinner the thickness or the larger the plain size as long as smoothness of coated surface and transmission of actinic radiation are not damaged, the better from the standpoint of control of diffusion. Therefore, an aspect ratio of the inorganic stratiform compound is ordinarily 20 or more, preferably 100 or more, particularly preferably 200 or more. The aspect ratio is a ratio of thickness to major axis of particle and can be determined, for example, from a projection drawing of particle by a microphotography. The larger the aspect ratio, the greater the effect obtained.

As for the particle size of the inorganic stratiform compound used in the invention, an average major axis is ordinarily from 0.3 to 20 μm, preferably from 0.5 to 10 μm, particularly preferably from 1 to 5 μm. An average thickness of the particle is ordinarily 0.1 μm or less, preferably 0.05 μm or less, particularly preferably 0.01 μm or less. For example, in the swellable synthetic mica that is the representative compound of the inorganic stratiform compounds, thickness is approximately from 1 to 50 nm and plain size is approximately from 1 to 20 μm.

When such an inorganic stratiform compound particle having a large aspect ratio is incorporated into the protective layer, strength of coated layer increases and penetration of oxygen or moisture can be effectively inhibited so that the protective layer can be prevented from deterioration due to deformation, and even when the lithographic printing plate precursor is preserved for a long period of time under a high humidity condition, it is prevented from decrease in the image-forming property thereof due to the change of humidity and exhibits excellent preservation stability.

The content of the inorganic stratiform compound in the protective layer is preferably from 5/1 to 1/00 in terms of weight ratio to the amount of binder used in the protective layer. When a plurality of inorganic stratiform compounds is used in combination, it is also preferred that the total amount of the inorganic stratiform compounds fulfills the above-described weight ratio.

An example of common dispersing method for the inorganic stratiform compound used in the protective layer is described below. Specifically, from 5 to 10 parts by weight of a swellable stratiform compound that is exemplified as a preferred inorganic stratiform compound is added to 100 parts by weight of water to adapt the compound to water and to be swollen, followed by dispersing using a dispersing machine. The dispersing machine used include, for example, a variety of mills conducting dispersion by directly applying mechanical power, a high-speed agitation type dispersing machine providing a large shear force and a dispersion machine providing ultrasonic energy of high intensity. Specific examples thereof include a ball mill, a sand a grinder mill) a visco mill, a colloid mill, a homogenizer, a dissolver, a polytron, a homomixer, a homoblender, a keddy mill, a jet agitor, a capillary type emulsifying device, a liquid siren, an electromagnetic strain type ultrasonic generator and an emulsifying device having a Polman whistle. A dispersion containing from 5 to 10% by weight of the inorganic stratiform compound thus prepared is highly viscous or gelled and exhibits extremely good preservation stability. In the formation of a coating solution for protective layer using the dispersion, it is preferred that the dispersion is diluted with water, sufficiently stirred and then mixed with a binder solution.

To the coating solution for protective layer can be added known additives, for example, a surfactant for improving coating property or a water-soluble plasticizer for improving physical property of coated layer in addition to the inorganic stratiform compound. Examples of the water-soluble plasticizer include propionamide, cyclohexanediol, glycerin or sorbitol. Also, a water-soluble (meth)acrylic polymer can be added. Further, to the coating solution may be added known additives for increasing adhesion property to the photosensitive layer or for improving preservation stability of the coating solution.

The coating solution for protective layer thus-prepared is coated on the photosensitive layer provided on the support and then dried to form a protective layer. The coating solvent may be appropriately selected in view of the binder used, and when a water-soluble polymer is used, distilled water or purified water is preferably used as the solvent. A coating method of the protective layer is not particularly limited, and known methods, for example, methods described in U.S. Pat. No. 3,458,311 and JP-B-55-49729 can be utilized. Specific examples of the coating method for the protective layer include a blade coating method, an air knife coating method, a gravure coating method, a roll coating method, a spray coating method, a dip coating method and a bar coating method.

A coating amount of the protective layer is preferably in a range from 0.05 to 10 g/m$^2$ in terms of the coating amount after drying. When the protective layer contains the inorganic stratiform compound, it is more preferably in a range from 0.1 to 0.5 g/m$^2$, and when the protective layer does not contain the inorganic stratiform compound, it is more preferably in a range from 0.5 to 5 g/m$^2$.

[Support]

The support for use in the lithographic printing plate precursor according to the invention is not particularly restricted as long as it is a dimensionally stable plate-like hydrophilic support. The support includes, for example, paper, paper laminated with plastic (for example, polyethylene, polypropylene or polystyrene), a metal plate (for example, aluminum, zinc or copper plate), a plastic film (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal film) and paper or a plastic film laminated or deposited with the metal described above. Preferable examples of the support include a polyester film and an aluminum plate. Among them, the aluminum plate is preferred since it has good dimensional stability and is relatively inexpensive.

The aluminum plate includes a pure aluminum plate, an alloy plate composing aluminum as a main component and containing a trace amount of hetero elements and a thin film of aluminum or aluminum alloy laminated with plastic. The hetero element contained in the aluminum alloy includes, for example, silicon, iron, manganese, copper, magnesium, chromium, zinc, bismuth, nickel and titanium. The content of the hetero element in the aluminum alloy is preferably 10% by weight or less. Although a pure aluminum plate is preferred in the invention, since completely pure aluminum is difficult to be produced in view of the refining technique, the aluminum plate may slightly contain the hetero element. The composition is not specified for the aluminum plate and those materials known and used conventionally can be appropriately utilized.

The thickness of the support is preferably from 0.1 to 0.6 mm, more preferably from 0.15 to 0.4 mm, and still more preferably from 0.2 to 0.3 mm.

Prior to the use of aluminum plate, a surface treatment, for example, roughening treatment or anodizing treatment is preferably performed. The surface treatment facilitates improvement in the hydrophilic property and ensures adhesion between the photosensitive layer and the support. In advance of the roughening treatment of the aluminum plate, a degreasing treatment, for example, with a surfactant, an organic solvent or an aqueous alkaline solution is conducted for removing rolling oil on the surface thereof, if desired.

The roughening treatment of the surface of the aluminum plate is conducted by various methods and includes, for example, mechanical roughening treatment, electrochemical roughening treatment (roughening treatment of electrochemically dissolving the surface) and chemical roughening treatment (roughening treatment of chemically dissolving the surface selectively).

As the method of the mechanical roughening treatment, a known method, for example, a ball grinding method, a brush grinding method, a blast grinding method or a buff grinding method can be used.

The electrochemical roughening treatment method includes, for example, a method of conducting it by passing alternating current or direct current in an electrolyte containing an acid, for example, hydrochloric acid or nitric acid. Also, a method of using a mixed acid described in JP-A-54-63902 can be used.

The aluminum plate after the roughening treatment is then subjected, if desired, to an alkali etching treatment using an aqueous solution, for example, of potassium hydroxide or sodium hydroxide and further subjected to a neutralizing treatment, and then subjected to an anodizing treatment in order to enhance the abrasion resistance, if desired.

As the electrolyte used for the anodizing treatment of the aluminum plate, various electrolytes capable of forming porous oxide film can be used. Ordinarily, sulfuric acid, hydrochloric acid, oxalic acid, chromic acid or a mixed acid thereof is used. The concentration of the electrolyte can be appropriately determined depending on the kind of the electrolyte.

Since the conditions of the anodizing treatment are varied depending on the electrolyte used, they cannot be defined generally. However, it is ordinarily preferred that electrolyte concentration in the solution is from 1 to 80% by weight, liquid temperature is from 5 to 70° C., current density is from 5 to 60 A/dm$^2$, voltage is from 1 to 100 V, and electrolysis time is from 10 seconds to 5 minutes. The amount of the anodized film formed is preferably from 1.0 to 5.0 g/m$^2$ and more preferably from 1.5 to 4.0 g/m$^2$. In the range described above, good printing durability and preferable scratch resistance in the non-image area of lithographic printing plate can be achieved.

The aluminum plate subjected to the surface treatment and having the anodized film is used as it is as the support in the invention. However, in order to more improve adhesion to a layer provided thereon, hydrophilicity, resistance to stain, heat insulating property or the like, other treatment, for example, a treatment for enlarging micropores or a sealing treatment of micropores of the anodized film described in JP-A-2001-253181 and JP-A-2001-322365, or a surface hydrophilizing treatment by immersing in an aqueous solution containing a hydrophilic compound, may be appropriately conducted. Needless to say, the enlarging treatment and sealing treatment are not limited to those described in the above-described patents and any conventionally known method may be employed.

As the sealing treatment, as well as a sealing treatment with steam, a sealing treatment with an aqueous solution containing an inorganic fluorine compound, for example, fluorozirconic acid alone or sodium fluoride, a sealing treatment with steam having added thereto lithium chloride or a sealing treatment with hot water may be employed.

Among them, the sealing treatment with an aqueous solution containing an inorganic fluorine compound, the sealing treatment with water vapor and a sealing treatment with hot water are preferred.

The hydrophilizing a treatment includes an alkali metal silicate method described in U.S. Pat. Nos. 2,714,066, 3,181,461, 3,280,734 and 3,902,734. In the method, the support is subjected to an immersion treatment or an electrolytic treatment in an aqueous solution, for example, of sodium silicate, In addition, the hydrophilizing treatment includes, for example, a method of treating with potassium fluorozirconate described in JP-B-36-22063 and a method of treating with polyvinylphosphonic acid described in U.S. Pat. Nos. 3,276,868, 4,153,461, and 4,689,272.

In the case of using a support having a surface of insufficient hydrophilicity, for example, a polyester film, in the invention, it is desirable to coat a hydrophilic layer thereon to make the surface sufficiently hydrophilic. Examples of the hydrophilic layer preferably includes a hydrophilic layer formed by coating a coating solution containing a colloid of oxide or hydroxide of at least one element selected from beryllium, magnesium, aluminum, silicon, titanium, boron, germanium tin, zirconium, iron, vanadium, antimony and a transition metal described in JP-A-2001-199175, a hydrophilic layer containing an organic hydrophilic matrix obtained by crosslinking or pseudo-crosslinking of an organic hydrophilic polymer described in JP-A-2002-79772, a hydrophilic layer containing an inorganic hydrophilic matrix obtained by sol-gel conversion comprising hydrolysis and condensation reaction of polyalkoxysilane and titanate, zirconate or aluminate, and a hydrophilic layer comprising an inorganic tin layer having a surface containing metal oxide. Among them, the hydrophilic layer formed by coating a coating solution containing a colloid of oxide or hydroxide of silicon is preferred.

Further, in the case of using, for example, a polyester film as the support in the invention, it is preferred to provide an antistatic layer on the hydrophilic layer side, opposite side to the hydrophilic layer or both sides. When the antistatic layer is provided between the support and the hydrophilic layer, it also contributes to improve the adhesion of the hydrophilic layer to the support. As the antistatic layer, a polymer layer having fine particles of metal oxide or a matting agent dispersed therein described in JP-A-2002-79772 can be used.

The support preferably has a center line average roughness of 0.10 to 1.2 μm. In the range described above, good adhesion to the photosensitive layer, good printing durability, and good stain resistance can be achieved.

The color density of the support is preferably from 0.15 to 0.65 in terms of the reflection density value. In the range described above, good image-forming property by preventing halation at the image exposure and good aptitude for plate inspection after development can be achieved.

[Undercoat Layer]

In the lithographic printing plate precursor according to the invention, it is preferred that an undercoat layer comprising a compound containing a polymerizable group is provided on the support. When the undercoat layer is used, the photosensitive layer is provided on the undercoat layer. The undercoat layer has the effects of strengthening an adhesion property between the support and the photosensitive layer in the exposed area and facilitating separation of the photosensitive layer from the support in the unexposed area, thereby improving the developing property.

As the compound for the undercoat layer, specifically, a silane coupling agent having an addition-polymerizable ethylenic double bond reactive group described in JP-A-10-

282679 and a phosphorus compound having an ethylenic double bond reactive group described in JP-A-2-304441 are preferably exemplified. A particularly preferable compound is a compound having both a polymerizable group, for example, a methacryl group or an allyl group and a support-adsorbing group, for example, a sulfonic acid group, a phosphoric acid group or a phosphoric acid ester group. Also, a compound having a hydrophilicity-imparting group, for example, an ethylene oxide group, in addition to the polymerizable group and the support-adsorbing group, can be preferably used.

The coating amount (solid content) of the undercoat layer is preferably from 0.1 to 100 $mg/m^2$, more preferably from 1 to 30 $mg/m^2$.

[Backcoat Layer]

After applying the surface treatment to the support or forming the undercoat layer on the support, a backcoat layer can be provided on the back surface of the support if desired.

The backcoat layer preferably includes, for example, a coating layer comprising an organic polymer compound described in JP-A-5-45885 and a coating layer comprising a metal oxide obtained by hydrolysis and polycondensation of an organic metal compound or an inorganic metal compound described in JP-A-6-35174. Among them, use of an alkoxy compound of silicon, for example, $Si(OCH_3)_4$, $Si(OC_2H_5)_4$, $Si(OC_3H_7)_4$ or $Si(OC_4H_9)_4$ is preferred since the starting material is inexpensive and easily available.

[Plate-Making Process]

(Exposure)

(1) The lithographic printing plate precursor according to the invention is exposed imagewise with an infrared laser. The infrared laser used is not particularly restricted and, for example, a solid laser or semiconductor laser emitting an infrared ray having a wavelength of 760 to 1,200 nm is preferably exemplified. The output of the infrared laser is preferably 100 mW or more. Further, in order to shorten the exposure time, it is preferred to use a multibeam laser device.

The exposure time per pixel is preferably within 20 microseconds, and the irradiation energy is preferably from 10 to 300 $mJ/cm^2$.

(2) On the other hands a semiconductor laser of 405 nm, an Ar laser, an FD-YAG laser or the like is also used as the laser light source. In recent years, a CTP system equipped with a semiconductor laser of 405 nm has become widespread in view of handling properties.

The plate-making of the lithographic printing plate precursor according to the invention is conducted, for example, by a method of exposing the lithographic printing plate precursor using an inner drum exposure apparatus equipped with a light source having an oscillation wavelength in a range of 360 to 550 nm. In the exposure apparatus, a light beam emitted from the light source is parallel divided into an ordinary beam and an extraordinary beam in an equal amount and these two beam spots are adjacently aligned with a partial overlap in the sub-scanning direction to form a spot shape of light beam. The lithographic printing plate precursor is loaded in the inner drum exposure apparatus and exposed with the spot shape of light beam to perform image recording.

The plate-making process is described in more detail below.

In the invention, although the development processing can be carried out just after the exposure step, the heat treatment step may intervene between the exposure step and the development step. The heat treatment is effective for increasing the printing durability and improving uniformity of the image curing degree in the entire surface of printing plate precursor. The conditions of the heat treatment can be appropriately determined in a range for providing such effects. Examples of the heating means include a conventional convection oven, an IR irradiation apparatus, an IR laser, a microwave apparatus or a Wisconsin oven. For instance, the heat treatment can be conducted by maintaining the printing plate precursor at a plate surface temperature ranging from 70 to 150° C. for a period of one second to 5 minutes, preferably at 80 to 140° C. for 5 seconds to one minute, more preferably at 90 to 130° C. for 10 to 30 seconds. In the range described above, the effects described above are efficiently achieved and an adverse affect, for example, change in shape of the printing plate precursor due to the heat can be preferably avoided.

According to the invention, the development processing step is conducted after the exposure step, preferably after the exposure step and the heat treatment step to prepare a lithographic printing plate. It is preferable that a plate setter used in the exposure step, a heat treatment means used in the heat treatment step and a development apparatus used in the development processing step are connected with each other and the lithographic printing plate precursor is subjected to automatically continuous processing. Specifically, a plate-making line wherein the plate setter and the development apparatus are connected with each other by transport means, for example, a conveyer is illustrated. Also, the heat treatment means may be placed between the plate setter and the development apparatus or the heat treatment means and the development apparatus may constitute a unit apparatus.

In case where the lithographic printing plate precursor used is apt to be influenced by surrounding light under a working environment, it is preferable that the plate-making line is blinded by a filter, a cover or the like.

After the image formation as described above, the entire surface of lithographic printing plate may be exposed to active ray, for example, ultraviolet light to accelerate curing of the image area. As a light source for the entire surface exposure, for example, a carbon arc lamp, a mercury lamp, a gallium lamp, a metal halide lamp, a xenon lamp, a tungsten lamp or various laser beams are exemplified. In order to obtain sufficient printing durability, the amount of the entire surface exposure is preferably 10 $mJ/cm^2$ or more, more preferably 100 $mJ/cm^2$ or more.

Heating may be performed at the same time with the entire surface exposure. By performing the heating, further improvement in the printing durability is recognized. Examples of the heating means include a conventional convection oven, an IR irradiation apparatus an IR, laser, a microwave apparatus or a Wisconsin oven. The plate surface tenure at the heating is preferably from 30 to 150° C., more preferably from 35 to 130° C., still more preferably from 40 to 120° C.

(Developer)

The developer used for the plate-making method of the lithographic printing plate precursor according to the invention is not particularly limited but, for example, a solution containing an inorganic alkali salt and a nonionic surfactant and having a pH of 11.0 to 12.7 is preferably used.

The inorganic alkali salt is appropriately used. Examples thereof include an inorganic alkali agent, for example, sodium hydroxide, potassium hydroxide, ammonium hydroxide, lithium hydroxide, sodium silicate, potassium silicate, ammonium silicate, lithium silicate, sodium tertiary phosphate, potassium tertiary phosphate, ammonium tertiary phosphate, sodium carbonate, potassium carbonate, ammonium carbonate, sodium hydrogencarbonate, potassium hydrogencarbonate, ammonium hydrogencarbonate, sodium borate, potassium borate and ammonium borate. The inorganic alkali salts may be used independently or in combination of two or more thereof.

In the case of using a silicate, developing property can be easily adjusted by selecting a mixing ratio of silicon oxide ($SiO_2$) to alkali oxide ($M_2O$ (wherein M represents an alkali metal or an ammonium group)), which are components of the silicate, and the concentration thereof. Of the alkali aqueous solutions, an alkali aqueous solution having the mixing ratio of silicon oxide ($SiO_2$) to alkali oxide ($M_2O$) ($SiO_2/M_2O$ in molar ratio) of 0.5 to 3.0 is preferred, and that of 1.0 to 2.0 is more preferred. The total amount of $SiO_2/M_2O$ in the alkali aqueous solution is preferably from 1 to 10% by weight, more preferably from 3 to 8% by weight, most preferably from 4 to 7% by weight, based on the weight of the alkali aqueous solution. When the concentration is 1% by weight or more, the developing property and processing ability are not decreased and whereas, when it is 10% by weight or less, the formation of precipitates and crystals is hard to occur and gelation at neutralization of waste liquor of the developer hardly occurs, thereby causing no troubles in treatment of the waste liquor.

Also, an organic alkali agent may be supplementarily used for the purpose of delicate adjustment of alkali concentration and assisting dissolution of the photosensitive layer. The organic alkali agent includes monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine and tetramethylammonium hydroxide. The organic alkali agents may be used independently or in combination of two or more thereof.

The surfactant can be appropriately used. Examples thereof include nonionic surfactants, for example, a nonionic surfactant having polyoxyalkylene ether group, a polyoxyethylene alkyl ester (e.g., polyoxyethylene stearate), a sorbitan alkyl ester (e.g., sorbitan monolaurate, sorbitan monostearate, sorbitan distearate, sorbitan monooleate, sorbitan sesquioleate or sorbitan trioleate) and a monoglyceride alkyl ester (e.g., glycerol monostearate or glyceron monooleate); anionic surfactants, for example, an alkylbenzenesulfonate (e.g. sodium dodecylbenzenesulfonate), an alkylnaphthalenesulfonate (e.g., sodium butylnaphthalenesulfonate, sodium pentylnapthalenesulfonate, sodium hexylnaphthalenesulfonate or sodium octylnaphthalenesulfonate), an alkylsulfate (e.g., sodium laurylsulfate), an alkylsulfonate (e.g., sodium dodecylsulfonate) and a sulfosuccinic acid ester salt (e.g., sodium dilaurylsulfosuccinate); and amphoteric surfactants, for example, an alkylbetaine (e.g., laurylbetaine or stearylbetaine) and an amino acid Nonionic surfactants having a polyoxyalkylene ether group are particularly preferred.

As the surfactant having a polyoxyalkylene ether group, a compound having the structure represented by formula (I), shown below is preferably used.

$$R_{40}—O—(R_{41}—O)_pH \qquad (I)$$

In formula (I), $R_{40}$ represents an alkyl group having from 3 to 15 carbon atoms, which may have a substituent, an aromatic hydrocarbon group having from 6 to 15 carbon atoms, which may have a substituent or a heteroaromatic cyclic group having from 4 to 15 carbon atoms, which may have a substituent. Examples of the substituent include an alkyl group having from 1 to 20 carbon atoms, a halogen atom, e.g., Br, Cl or I , an aromatic hydrocarbon group having from 6 to 15 carbon atoms, an aralkyl group containing 7 to 17 carbon atoms, an alkoxy group having from 1 to 20 con atoms, an alkoxycarbonyl group having from 2 to 20 carbon atoms and an acyl group having from 2 to 15 carbon atoms. $R_{41}$ represents an alkylene group having from 1 to 100 carbon atoms, which may have a substituent. Examples of the substituent include an alkyl group having from 1 to 20 carbon atoms and an aromatic hydrocarbon group having from 6 to 15 carbon atoms. p represents an integer of 1 to 100.

In the definition of the formula (I), specific examples of "aromatic hydrocarbon group" include a phenyl group, a tolyl group, a naphthyl group, an anthryl group, a biphenyl group and a phenanthryl group, and specific examples of "heteroaromatic ring group" include a furyl group, a thionyl group, an oxazolyl group, an imidazolyl group, a pyranyl group, a pyridinyl group, an acridinyl group, a benzofuranyl group, a benzothionyl group, a benzopyranyl group, a benzoxazolyl group and a benzimidazolyl group.

Also, the moiety of $(R_{41}—O)_p$ in the formula (I) may be two or three kinds of groups within the above-described scope. Specifically, there may be illustrated a random or block chain of a combination of ethyleneoxy group and propyleneoxy group, a combination of ethyleneoxy group and isopropyleneoxy group, a combination of ethyleneoxy group and butyleneoxy group, and a combination of ethyleneoxy group and isobutyleneoxy group. In the invention, the surfactants having polyoxyalkylene ewer group are used independently or in combination. The surfactant is effectively added in an amount from 1 to 30% by weight, preferably from 2 to 20/a by weight, in the developer. When the amount of the surfactant is too small, deterioration of developing property may occur and whereas, it is too large, damage of the development increase and printing durability of printing plate degrades.

Examples of the nonionic surfactant having polyoxyalkylene ether group represented by formula (I) include a polyoxyethylene alkyl ether, e.g., polyoxyethylene lauryl ether, polyoxyethylene cetyl ether and polyoxyethylene stearyl ether, a polyoxyethylene aryl ether, e.g., polyoxyethylene phenyl ether and polyoxyethylene naphthyl ether; and a polyoxyethylene alkylaryl ether, e.g., polyoxyethylene methylphenyl ether, polyoxyethylene octylphenyl ether and polyoxyethylene nonylphenyl ether.

The surfactants can be used independently or in combination thereof. The content of the surfactant in the developer is preferably in a range of 0.1 to 20% by weight.

The pH of the developer for use in the plate-making of the lithographic printing plate precursor according to the invention is not particularly restricted and preferably from 11.0 to 12.7, more preferably from 11.5 to 12.5. When the pH of the developer is 11.0 or more, the image formation is surely conducted and whereas, when it is 12.7 or less, over development is prevented and the damage of the exposed area due to the development is restrained.

Further, the electric conductivity of the developer is preferably from 3 to 30 mS/cm. When the electric conductivity of the developer is 3 mS/cm or more, the dissolution of the photosensitive layer in the unexposed area on the surface of support is surely performed to prevent the occurrence of stain at printing and whereas, when it is 30 mS/cm or less, since the salt concentration is not too high, it is prevented that a dissolution rate of the photosensitive layer becomes extremely slow and the residual layer in the unexposed area does not occur. The electric conductivity is particularly preferably in a range of 5 to 20 mS/cm.

The development of the lithographic printing plate precursor according to the invention is conducted in a conventional manner at a temperature ordinarily from about 0 to about 60° C., preferably from about 15 to about 40° C., for example, by immersing the exposed photosensitive lithographic printing plate in the developer and rubbing with a brush.

Further, in the case of conducting the development processing using an automatic developing machine, the developer becomes fatigued in accordance with the processing amount, and hence the processing ability may be restored by using a replenishing solution or a fresh developer.

The thus development-processed lithographic printing plate precursor is subjected to after-treatment with washing water, a rinsing solution containing a surfactant or an oil-desensitizing solution containing gum arabic or a starch derivative as described in JP-A-54-8002, JP-A-55-115045 and JP-A-59-58431. In the after-treatment of the lithographic printing plate precursor according to the invention, these processings can be used in combination.

The lithographic printing plate thus-obtained by the above-described processing may be subjected to the after-exposure treatment described in JP-A-2000-89478 or a heat treatment, for example, baking, to improve printing durability.

The lithographic printing plate obtained by the processing is mounted on an offset printing machine to perform printing of a large number of sheets.

[Printing Method]

The lithographic printing plate precursor according to the invention is exposed imagewise with a laser as described in (1) or (2) above, heated the entire surface as described above and then subjected to printing by supplying oily ink and an aqueous component without undergoing the development processing step.

Specifically, for example, a method wherein the lithographic printing plate precursor is exposed with a laser, heated the entire surface in an oven and then mounted on a printing machine to conduct printing without undergoing the development processing step or a method wherein the lithographic printing plate precursor is mounted on a printing machine, exposed with a laser on the printing machine, heated the entire surface on the printing machine and then subjected to printing without undergoing the development processing step is exemplified.

For instance, according to one embodiment of negative-working lithographic printing plate precursor of on-machine development type, after the imagewise exposure of the lithographic printing plate precursor with a laser, when an aqueous component and oily ink are supplied to conduct printing without undergoing the development processing step, for example, a wet development processing step, in the exposed area of the photosensitive layer, the photosensitive layer cured by the exposure forms the oily ink receptive area having the oleophilic surface. On the other hand, in the unexposed area, the uncured photosensitive layer is removed by dissolution or dispersion with the aqueous component and/or oily ink supplied to reveal a hydrophilic surface in the area.

As a result, the aqueous component adheres on the revealed hydrophilic surface and the oily ink adheres to the exposed area of the photosensitive layer, whereby printing is initiated. While either the aqueous component or oily ink may be supplied at first on the surface of lithographic printing plate precursor, it is preferred to supply the oily ink at first in view of preventing the aqueous component from contamination with the unexposed area of the photosensitive layer. For the aqueous component and oily ink, dampening water and printing ink for conventional lithographic printing are used respectively.

Thus, the lithographic printing plate precursor is subjected to the on-machine development on an offset printing machine and used as it is for printing a large number of sheets.

In accordance with the plate-making method of lithographic printing plate precursor according to the invention, the lithographic printing plate precursor is exposed as described in (1) or (2) above, and then rubbed a surface of the exposed lithographic printing plate precursor with a rubbing member in the presence of a developer having pH of 2 to 10 in an automatic processor equipped with the rubbing member to remove the unexposed area of the photosensitive layer to prepare a lithographic printing plate.

Specifically, after removing the unexposed area of the photosensitive layer together with a protective layer, when the protective layer exists, the resulting lithographic printing plate can be immediately mounted on a printing machine to conduct printing.

The processing by the automatic processor in such a manner is advantageous in view of being free from the measures against development scum resulting from the protective layer and/or photosensitive layer encountered in case of the on-machine development.

The developer used is an aqueous solution having pH of 2 to 10. For instance, the developer is preferably water alone or an aqueous solution containing water as a main component (containing 60% by weight or more of water). Particularly, an aqueous solution having the same composition as conventionally known dampening water, an aqueous solution containing a surfactant (for example, an anionic, nonionic or cationic surfactant) and an aqueous solution containing a water-soluble polymer compound are preferable. An aqueous solution containing both a surfactant and a water-soluble polymer compound is especially preferable. The pH of the developer is preferably from 3 to 8, and more preferably from 4 to 7.

The anionic surfactant includes, for example, fatty acid salt, abietic acid salts, hydroxyalkanesulfonic acid salts, alkanesulfonic acid salts, dialkylsulfosuccinic acid Salts, straight-chain alkylbenzenesulfonic acid salts, branched alkylbenzenesulfonic acid salts, alkylnaphthalenesulfonic acid salts, alkylphenoxypolyoxy ethylene propylsulfonic acid salts, polyoxyethylene alkylsulfophenyl ether salts, N-methyl-N-oleyltaurine sodium salt, N-alkylsulfosuccinic acid monoamide disodium salts, petroleum sulfonic acid salts, sulfated castor oil, sulfated beef tallow oil, sulfate ester salts of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styryl phenyl ether sulfate ester salts, alkyl phosphate ester salts, polyoxyethylene alkyl ether phosphate ester salts, polyoxyethylene alkyl phenyl ether phosphate ester salts, partially saponified products of styrene-maleic anhydride copolymer, partially saponified products of olefin-maleic anhydride copolymer and naphthalene sulfonate formalin condensates. Of the compounds, dialkylsulfosuccinic acid salts, alkyl sulfate ester salts and alkylnaphthalenesulfonic acid salts are particularly preferably used.

The cationic surfactant is not particularly limited and conventionally known cationic surfactants can be used. Examples of the cationic surfactant include alkylamine salts, quaternary ammonium salts, polyoxyethylene alkyl amine salts and polyethylene polyamine derivatives.

The nonionic surfactant includes, for example, polyethylene glycol type higher alcohol ethylene oxide addacts, alkylphenol ethylene oxide addacts, fatty acid ethylene oxide addacts, polyhydric alcohol fatty acid ester ethylene oxide addacts, higher allylamine ethylene oxide addacts, fatty acid amide ethylene oxide addacts, ethylene oxide addacts of fat, polypropylene glycol ethylene oxide addacts, dimethylsiloxane-ethylene oxide block copolymers, dimethylsiloxane-(propylene oxide-ethylene oxide) block copolymers, fatty acid esters of polyhydric alcohol type glycerol, fatty acid esters of pentaerythritol, fatty acid esters of sorbitol and sorbitan, fatty acid esters of sucrose, alkyl ethers of polyhydric alcohols and fatty acid amides of alkanolamines.

Among them, ethylene oxide addacts of sorbitol and/or sorbitan fatty acid esters, polypropylene glycol ethylene oxide addacts, dimethylsiloxane-ethylene oxide block copolymers, dimethylsiloxane-(propylene oxide-ethylene oxide) block copolymers and fatty acid esters of polyhydric alcohols are more preferable.

Further, from the standpoint of stable solubility in water or opacity, with respect to the nonionic surfactant used in the developer, the HLB (hydrophile-lipophile balance) value thereof is preferably 6 or more, and more preferably 8 or more.

Furthermore, an oxyethylene adduct of acetylene glycol type or acetylene alcohol type or a surfactant, for example, a fluorine-based surfactant or a silicon-based surfactant can also be used.

Of the surfactants used in the developer, the nonionic surfactant is particularly preferable in view of foam depressing property.

The surfactants may be used individually or as a mixture of two or more thereof. The amount of the surfactant contained in the developer is preferably from 0.01 to 20% by weight, more preferably from 1 to 15% by weight.

The water-soluble polymer compound for use in the developer includes, for example, soybean polysaccharide, modified starch, gum arabic, dextrin, a cellulose derivative (for example, carboxymethyl cellulose, carboxyethyl cellulose or methyl cellulose) or a modified product thereof, pllulan, polyvinyl alcohol or a derivative thereof, polyvinyl pyrrolidone, polyacrylamide, an acrylamide copolymer, a vinyl methyl ether/maleic anhydride copolymer, a vinyl acetate/maleic anhydride copolymer and a styrene/maleic anhydride copolymer.

As the soybean polysaccharide, those known can be used. For example, as a commercial product Soyafive (trade name, produced by Fuji Oil Co., Ltd.) is available and various grade products can be used. The soybean polysaccharide preferably used has viscosity in a range from 10 to 100 mPa/sec in a 10% by weight aqueous solution thereof.

As the modified starch, known modified starch can be used. The modified starch can be prepared, for example, by a method wherein starch, for example, of corn, potato, tapioca, rice or wheat is decomposed, for example, with an acid or an enzyme to an extent that the number of glucose residue per molecule is from 5 to 30 and then oxypropylene is added thereto in an alkali.

Two or more of the water-soluble polymer compounds may be used in combination. The content of the water-soluble polymer compound is preferably from 0.1 to 20% by weight, more preferably from 0.5 to 10% by weight, in the developer.

The developer may contain an organic solvent. The organic solvent that can be contained in the developer include, for example, an aliphatic hydrocarbon (e.g., hexane, heptane, Isopar E, Isopar H, Isopar G (produced by Esso Chemical Co., Ltd.), gasoline or kerosene), an aromatic hydrocarbon (e.g., toluene or xylene), a halogenated hydrocarbon (methylene dichloride, ethylene dichloride, trichlene or monochlorobenzene) and a polar solvent.

Examples of the polar solvent include an alcohol (e.g., methanol, ethanol, propanol, isopropanol, benzyl alcohol, ethylene glycol monomethyl ether, 2-ethyoxyethanol, diethylene glycol monoethyl ether, diethylene glycol monohexyl ether, triethylene glycol monomethyl ether, propylene glycol monoethyl ether, dipropylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, methyl phenyl carbinol, n-amyl alcohol or methylamyl alcohol), a ketone (e.g., acetone, methyl ethyl ketone, ethyl butyl ketone, methyl isobutyl ketone or cyclohexanone), an ester (e.g., ethyl acetate, propyl acetate, butyl acetate, amyl acetate, benzyl acetate, methyl lactate, butyl lactate, ethylene glycol monobutyl acetate, polyethylene glycol monomethyl ether acetate, diethylene glycol acetate, diethyl phthalate or butyl levulinate) and others (e.g., triethyl phosphate, tricresyl phosphate, N-phenylehanolamine or N-phenyldiethanolamine).

When the organic solvent is insoluble in water, it may be employed by being solubilized in water using a surfactant or the like. In the case where the developer contains the organic solvent, the concession of the organic solvent is desirably less than 40% by weight in view of safety and inflammability.

Into the developer, an antiseptic agent, a chelating agent, a defoaming agent, an organic acid, an inorganic acid, an inorganic salt or the like can be incorporated in addition to the above components.

As the antiseptic agent, for example, phenol or a derivative thereof, formalin, an imidazole derivative, sodium dehydroacetate, a 4 isothiazolin-3-one derivative, benzisotiazolin-3-one, a benzotriazole derivative, an amidine guanidine derivative, a quaternary ammonium salt, a pyridine derivative, a quinoline derivative, a guanidine derivative, diazine, a triazole derivative, oxazole, an oxazine derivative and a nitro bromo alcohol, e.g., 2-bromo-2-nitropropane-1,3-diol, 1,1-dibromo-1-nitro-2-ethanol or 1,1-dibromo-1-nitro-2-propanol are preferably used.

As the chelating agent, for example, ethylenediaminetetraacetic acid, potassium salt thereon sodium salt thereof diethylenetriaminepentaacetic acid, potassium salt thereof, sodium salt thereof; triethylenetetraminehexaacetic acid, potassium salt thereof, sodium salt thereof; hydroxyethylethylenediaminetriacetic acid, potassium salt thereof, sodium salt thereof; nitrilotriacetic acid, sodium salt thereof, organic phosphonic acids, for example, 1-hydroxyethane-1,1-diphosphonic acid, potassium salt thereof, sodium salt thereof; aminotri(methylenephosphonic acid), potassium salt thereof, sodium salt thereof; and phophonoalkanetricarboxylic acids are illustrated. A salt of an organic amine is also effectively used in place of the sodium salt or potassium salt in the chelating agents.

As the defoaming agent for example, a conventional silicone-based self-emulsifying type or emulsifying type defoaming agent, and a nonionic surfactant having HLB of 5 or less are used. The silicone defoaming agent is preferably used. Any of emulsifying dispersing type and solubilizing type can be used.

As the organic acid, for example, citric acid, acetic acid, oxalic acid, malonic acid, salicylic acid, caprylic acid, tartaric acid, malic acid, lactic acid, levulinic acid, p-toluenesulfonic acid, xylenesulfonic acid, phytic acid and an organic phosphonic acid are illustrated. The organic acid can also be used in the form of an alkali metal salt or an ammonium salt.

As the inorganic acid and inorganic salt, for example, phosphoric acid, methaphosphoric acid, ammonium primary phosphate, ammonium secondary phosphate, sodium primary phosphate, sodium secondary phosphate, potassium primary phosphate, potassium secondary phosphate, sodium tripolyphosphate, potassium pyrophosphate, sodium hexamethaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate and nickel sulfate are illustrated.

The developer can be used at an appropriate temperature, and the developer temperature is preferably from 10 to 50° C.

The developer described above can be used as a developer and a development replenisher for an exposed negative-working lithographic printing plate precursor, and it is preferably applied to an automatic processor described hereinafter. In the case of conducting the development processing using an automatic processor, the developer becomes fatigued in accordance with the processing amount, and hence the processing ability may be restored using a replenisher or a fresh developer. Such a replenishment system can be preferably applied to the plate-making method of the lithographic printing plate precursor according to the invention.

The development processing using the aqueous solution having pH of 2 to 10 according to the invention is preferably performed by an automatic processor equipped with a supplying means for a developer and a rubbing member. As the automatic processor, there are illustrated an automatic processor in which a lithographic printing plate precursor after image-recording is subjected to a rubbing treatment while it is transporting described in JP-A-2-220061 and JP-A-60-59351, and an automatic processor in which a lithographic printing plate precursor after image-recording placed on a cylinder is subjected to a rubbing treatment while rotating the cylinder described in U.S. Pat. Nos. 5,148,746 and 5,568,768 and British Patent 2,297,719. Among them, the automatic processor using a rotating brush roll as the rubbing member is particularly preferred.

The rotating brush roller which can be preferably used in the invention can be appropriately selected by taking account, for example, of scratch resistance of the image area and nerve strength of the support of the lithographic printing plate precursor. As for the rotating brush roller, a known rotating brush roller produced by implanting a brush material in a plastic or metal roller can be used. For example, a rotating brush roller described in JP-A-58-159533 and JP-A-3-100554, or a brush roller described in JP-U-B-62-167253 (the term "JP-UM-B" as used herein means an "examined Japanese utility model publication"), in which a metal or plastic groove-type member having implanted therein in rows a brush material is closely radially wound around a plastic or metal roller acting as a core, can be used.

As the brush material, a plastic fiber (for example, a polyester-based synthetic fiber, e.g., polyethylene terephthalate or polybutylene terephthalate; a polyamide-based synthetic fiber, e.g., nylon 6.6 or nylon 6.10; a polyacrylic synthetic fiber, e.g., polyacrylonitrile or polyalkyl (meth)acrylate; and a polyolefin-based synthetic fiber, e.g., polypropylene or polystyrene) can be used. For instance, a brush material having a fiber bristle diameter of 20 to 400 μm and a bristle length of 5 to 30 mm can be preferably used.

The outer diameter of the rotating brush roller is preferably from 30 to 200 mm, and the peripheral velocity at the tip of the brush rubbing the plate surface is preferably from 0.1 to 5 m/sec. It is preferred to use a plurality, that is, two or more of the rotating brush rollers.

The rotary direction of the rotating brush roller may be the same direction or the opposite direction with respect to the transporting direction of the lithographic printing plate precursor, but when two or more rotating brush rollers are used in an automatic processor as shown in FIG. 1, it is preferred that at least one rotating brush roller rotates in the same direction and at least one rotating brush roller rotates in the opposite direction with respect to the transporting direction. By such arrangement, the photosensitive layer in the non-image area can be more steadily removed. Further, a technique of rocking the rotating brush roller in the rotation axis direction of the brush roller is also effective.

In the invention, the lithographic printing plate after the rubbing treatment may be subsequently subjected to water washing, a drying treatment and an oil-desensitization treatment, if desired. In the oil-desensitization treatment, a known oil-desensitizing solution can be used.

In a plate-making process of the lithographic printing plate precursor to prepare a lithographic printing plate according to the invention, the entire surface of the lithographic printing plate precursor may be heated, if desired before or during the exposure or between the exposure and the development. By the heating, the image-forming reaction in the photosensitive layer is accelerated and advantages, for example, improvement in the sensitivity and printing durability and stabilization of the sensitivity are achieved. For the purpose of increasing the image strength and printing durability, it is also effective to perform entire after-heating or entire exposure of the image after the development. Ordinarily, the heating before the development is preferably performed under a mild condition of 150° C. or lower. When the temperature is too high, a problem may arise in that undesirable fog occurs in the non-image area. On the other hand, the beating after the development can be performed using a very strong condition. Ordinarily, the heat treatment is carried out in a temperate range of 200 to 500° C. when the temper is too low, a sufficient effect of strengthening the image may not be obtained, whereas when it is excessively high, problems of deterioration of the support and thermal decomposition of the image area may occur.

In the invention, although the development processing can be cared out just after the exposure step, the heat treatment step may intervene between the exposure step and the development step as described above. The heat treatment is effective for increasing the printing durability and improving uniformity of the image hardness degree in the entire surface of printing plate precursor. The conditions of the heat treatment can be appropriately determined in a range for providing such effects. Examples of the heating means include a conventional convection oven, an IR irradiation apparatus, an IR laser, a microwave apparatus or a Wisconsin oven. Specifically, the heat treatment can be conducted by maintaining the printing plate precursor at a plate surface temperature ranging from 70 to 150° C. for a period of one second to 5 minutes, preferably at 80 to 140° C. for 5 seconds to one minute, more preferably at 90 to 130° C. for 10 to 30 seconds. In the range described above, the effect described above are efficiently achieved and an adverse affect, for example, change in shape of the printing plate precursor due to the heat can be preferably avoided.

According to the invention, the development processing step is conducted after the exposure step, preferably after the exposure step and the heat treatment step to prepare a lithographic printing plate. It is preferable that a plate setter used in the exposure step, a heat treatment means used in the heat treatment step and a development apparatus used in the development processing step arm connected with each other and the lithographic printing plate precursor is subjected to automatically continuous processing. Specifically, a plate-making line wherein the plate setter and the development apparatus are connected with each other by transport means, for example, a conveyer is illustrated. Also, the heat treatment means may be placed between the plate setter and the development apparatus or the heat treatment means and the development apparatus may constitute a unit apparatus.

In case where the lithographic printing plate precursor used is apt to be influenced by surrounding light under a working environment, it is preferable that the plate-making line is blinded by a filter, a cover or the like.

After the image formation, the entire surface of lithographic printing plate may be exposed to active ray, for example, ultraviolet light to accelerate hardening of the image area. As a light source for the entire surface exposure, for example, a carbon arc lamp, a mercury lamp, a gallium lamp, a metal halide lamp, a xenon lamp, a tungsten lamp or various laser beams are exemplified. In order to obtain sufficient printing durability, the amount of the entire surface exposure is preferably 10 mJ/cm$^2$ or more, more preferably 100 mJ/cm$^2$ or more.

Heating may be performed at the same time with the entire surface exposure. By performing the heating, further improvement in the printing durability is recognized. Examples of the heating means include a conventional convection oven, an IR irradiation apparatus, an IR laser, a microwave apparatus or a Wisconsin oven. The plate surface temperature at the heating is preferably from 30 to 150° C., more preferably from 35 to 130° C., and still more preferably from 40 to 120° C.

EXAMPLES

The present invention will be described in more detail with reference to the following examples, but the invention should not be construed as being limited thereto.

Examples 1 to 4 and Comparative Example 1

<Preparation of Radical Polymerizable Compositions 1 to 5>

In a 20 ml brown glass bottle, was added each of the compounds and solvents to form the composition shown below, followed by stirring at room temperature for one hour. The resulting solution was filtered to prepare Radical polymerizable compositions 1 to 5.

| (Radical polymerizable compositions 1 to 5) | |
|---|---|
| Binder polymer shown in Table A below | 0.54 g |
| Polymerizable compound | 0.48 g |
| Dipentaerythritol pentaacrylate | |
| Sensitizing Dye (1) shown below | 0.06 g |
| Polymerization Initiator (1) shown below | 0.10 g |
| Co-sensitizer (1) shown below | 0.07 g |
| Dispersion of ϵ-phthatlocyanine pigment: | 0.40 g |
| [pigment: 15 parts by weight; dispersing agent (allyl methacrylate/methacrylic acid (80/20) copolymer): 10 parts by weight; solvent (cyclohexanone/methoxypropyl acetate/1-methoxy-2-propanol = 15 parts by weight/20 parts by weight/40 parts by weight)] | |
| Methyl ethyl ketone | 4.80 g |
| Dimethylsulfoxide | 4.80 g |

-continued (Radical polymerizable compositions 1 to 5)

Sensitizing Dye (1):

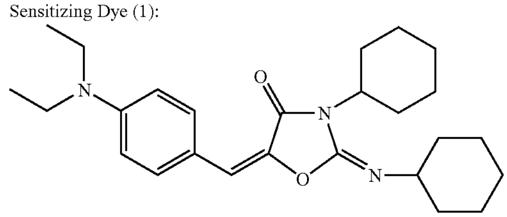

Polymerization Initiator (1)

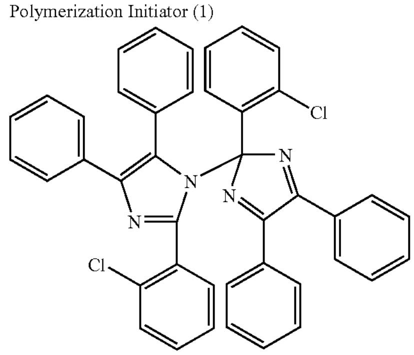

Co-sensitizer (1)

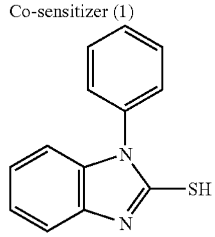

Radical polymerizable compositions 1 to 5 were coated on a silicon wafer and dried at 100° C. for one minutes to prepare Coating plates 1 to 5, respectively. The dry coating amount of the radical polymerizable composition layer thus-formed was 1.5 g/m$^2$. Each of Coating plates 1 to 5 was exposed to light having a wavelength of 405 nm and illuminance of 0.1 mW while varying a period of time under nitrogen atmosphere. Within 30 seconds after the exposure, the coating plate was immersed in an aqueous sodium hydroxide solution having pH of 12 for one minute to develop, washed with distilled water and dried in an oven at 100° C. for one minute. Using the coating plate thus-obtained, the following evaluation was conducted.

(Sensitivity)

Taking cyan density of the coating plate without conducting any treatment as 100% and cyan density of the coating plate developed without the exposure to light as 0% respectively, an exposure amount necessary for obtaining cyan density of 50% on the coating plate obtained by the treatments described above was determined to evaluate the sensitivity. The results are shown in Table A The results are indicated as relative sensitivities, when the sensitivity of Comparative Example 1 is taken as 1. The relative sensitivity is calculated by the following formula:

Relative sensitivity=Light exposure time of Comparative Example 1/Light exposure time of Example The larger the value of the relative sensitivity, the higher the sensitivity.

(Radical Polymerization Property)

An IR spectrum of the coating plate exposed to light for 5 second under the same condition as described above was measured to determine an absorption area around 1410 cm$^{-1}$ derived from a polymerizable unsaturated double bond of the polymerizable compound and taking an absorption area obtained by the measurement of the unexposed coating plate as 100%, a reaction rate of the polymerizable unsaturated double bond was determined The results are shown in Table A. The results are indicated as relative reaction rates, when the reaction rate of Comparative Example 1 is taken as 1. The relative reaction rate is calculated by the following formula:

Relative reaction rate=Reaction rate of Example/Reaction rate of Comparative Example 1

The larger the value of the relative reaction rate, the higher the radical polymerization property.

TABLE A

| | Polymerizable Composition | Binder Polymer U-31 | N-1 | N-14 | Relative Sensitivity | Relative Reaction Rate |
|---|---|---|---|---|---|---|
| Example 1 | 1 | 80 | 0 | 20 | 2.1 | 2.2 |
| Example 2 | 2 | 60 | 20 | 20 | 1.9 | 2 |
| Example 3 | 3 | 40 | 40 | 20 | 1.6 | 1.6 |
| Example 4 | 4 | 20 | 60 | 20 | 1.4 | 1.5 |
| Comparative Example 1 | 5 | 0 | 80 | 20 | 1 | 1 |

As is apparent from Table A, the radical polymerizable composition according to the invention has very high sensitivity because the radical polymerization property is high. Further, it can be seen that by introducing 20% of the copolymerization component containing a functional group having a dipole moment of 3.8 debye or more into the binder polymer, the sensitivity is increased 1.4 times in comparison with the comparative example and the radical polymerization property is increased 1.5 times in comparison with the comparative example and radical polymerization property is further improved and the sensitivity becomes higher as the introduction rate increases.

Examples 5 to 12 and Comparative Examples 2 to 6

<Preparation of Radical Polymerizable Compositions 6 to 18>

In a 20 ml brown glass bottle, was added each of the compounds and solvents to form the composition shown below, followed by stirring at room temperature for one hour. The resulting solution was filtered to prepare Radical polymerizable compositions 6 to 18.

| (Radical polymerizable compositions 6 to 18) | |
|---|---|
| Binder polymer shown in Table B below | 0.54 g |
| Polymerizable compound (1) shown below | 0.48 g |
| Sensitizing Dye (1) shown below | 0.06 g |
| Polymerization Initiator (1) shown above | 0.10 g |
| Co-sensitizer (1) shown above | 0.07 g |
| Dispersion of ϵ-phthatlocyanine pigment: [pigment: 15 parts by weight; dispersing agent (allyl methacrylate/methacrylic acid (80/20) copolymer): 10 parts by weight; solvent (cyclohexanone/methoxypropyl acetate/1-methoxy-2-propanol = 15 parts by weight/20 parts by weight/40 parts by weight)] | 0.40 g |
| Methyl ethyl ketone | 4.80 g |
| Dimethylsulfoxide | 4.80 g |

-continued (Radical polymerizable compositions 6 to 18)

Polymerizable Compound(1):

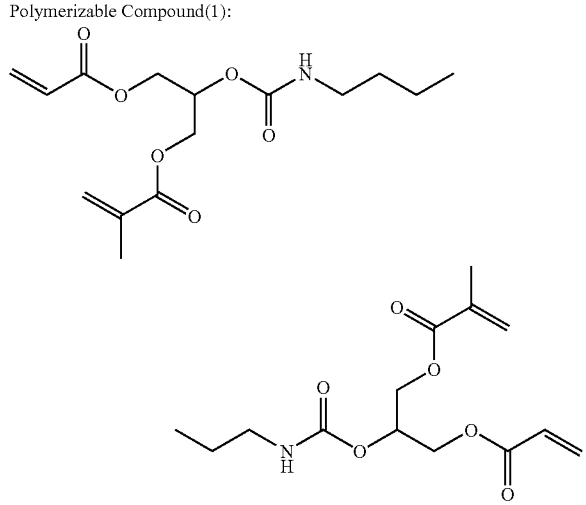

Each of Radical polymerizable compositions 6 to 18 was coated on Aluminum support 1 prepared shown below and dried at 100° C. for one minutes. The dry coating amount of the radical polymerizable composition layer thus-formed was 1.5 g/m$^2$. The resulting aluminum coating plate in size 3 cm×3 cm was exposed to light having a wavelength of 405 nm under nitrogen atmosphere. The exposure was conducted for the exposure time of 10 seconds while varying the illuminance on the surface of aluminum coating plate.

Then, the aluminum coating plate was immersed in an aqueous potassium hydroxide solution having pH of 12 maintained at 25° C. for 20 seconds to develop, washed with distilled water and dried at 100° C. for one minute. The sensitivity and radical polymerization properly of the aluminum coating plate thus-obtained were evaluated in the same manner as in Example 1. The results are shown in Table B.

(Preparation of Aluminum Support 1)

An aluminum plate (material: JIS A1050) having a thickness of 0.3 mm was subjected to a degrease treatment with an aqueous 10% by weight sodium aluminate solution at 50° C. for 30 seconds in order to remove rolling oil on the surface thereof. Thereafter, the aluminum plate surface was grained using three nylon brushes implanted with bundled bristles having a diameter of 0.3 mm and an aqueous suspension (specific gravity: 1.1 g/cm$^3$) of pumice having a median diameter of 25 μm, and then thoroughly washed with water. The plate was etched by dipping it in an aqueous 25% by weight sodium hydroxide solution at 45° C. for 9 seconds and after washing with water, dipped in an aqueous 20% by weight nitric acid solution at 60° C. for 20 seconds, followed by washing with water. The etching amount of the grained surface was about 3 g/m$^2$.

Subsequently, the aluminum plate was subjected to a continuous electrochemical surface roughening treatment using alternate current voltage of 60 Hz. The electrolytic solution used was an aqueous 1% by weight nitric acid solution (containing 0.5% by weight of aluminum ion) at a liquid temperature of 50° C. The electrochemical surface roughening treatment was performed using a rectangular wave alternate current having a trapezoidal waveform such that the time TP necessary for the current value to reach the peek from zero was 0.8 msec and the duty ratio was 1:1, and disposing a carbon electrode as the counter electrode. The auxiliary anode used was a ferrite. The current density was 30 A/dm$^2$ in terms of the peak value of current and 5% of the current flowing from the power source was divided to the auxiliary anode. The quantity of electricity at the nitric acid electrolysis was 175 C/dm$^2$ when the aluminum plate was serving as the anode. Then, the aluminum plate was washed with water by spraying.

Then, the aluminum plate was subjected to an electrochemical surface roughening treatment in the same manner as in the nitric acid electrolysis above using, as the electrolytic solution, an aqueous 0.5% by weight hydrochloric acid solution (containing 0.5% by weight of aluminum ion) at a liquid temperature of 50° C. under the conditions that the quantity of electricity was 50 C/dm$^2$ when the aluminum plate was serving as the anode, and then washed with water by spraying. The plate was then treated in an aqueous 15% by weight sulfuric acid solution (containing 0.5% by weight of aluminum ion) as the electrolytic solution at a current density of 15 A/dm$^2$ to provide a direct current anodic oxide film of 2.5 g/m$^2$, thereafter washed with water and dried.

The center line average roughness (Ra) of the thus-obtained aluminum support was measured using a stylus having a diameter of 2 μm and found to be 0.51 μm.

acid solution and then washed with water. The aluminum plate was then subjected to an electrolytic surface roughening treatment in an aqueous 1% by weight nitric acid solution using an alternating current with a sinusoidal waveform at an anode time electricity of 300 coulomb/dm$^2$. Subsequently, the aluminum plate was immersed in an aqueous 1% by weight sodium hydroxide solution at 40° C. for 5 seconds, immersed in an aqueous 30% by weight sulfuric acid solution at 60° C. for 40 seconds to effect a desmut treatment, and then subjected to an anodizing treatment in an aqueous 20% by weight sulfinic acid solution for 2 minutes at a current density of 2 A/dm$^2$ to form an anodic oxide film having a thickness of 2.7 g/m$^2$. The surface roughness of the aluminum plate thus-treated was measured and found to be 0.3 μm (Ra value according to JIS B0601).

On the back surface of the aluminum plate thus-treated, a coating solution for backcoat layer shown below was coated by a bar coater and dried at 100° C. for 1 minute, thereby preparing Aluminum support 2 having provided thereon a backcoat layer having a coating amount after drying of 70 mg/m$^2$.

TABLE B

| | Polymerizable Composition | Binder Polymer Unit 1 30 mol % | Binder Polymer Unit 2 20 mol % | Binder Polymer Unit 3 20 mol % | Binder Polymer Unit 4 15 mol % | Binder Polymer Unit 5 15 mol % | Kind of Resin | Relative Sensitivity | Relative Reaction Rate |
|---|---|---|---|---|---|---|---|---|---|
| Example 5 | 6 | V-35 | N-74 | V-2 | N-65 | N-71 | Urethane | 1.7 | 1.8 |
| Example 6 | 7 | V-40 | N-68 | V-15 | N-65 | N-71 | Urethane | 1.5 | 1.5 |
| Example 7 | 8 | V-44 | N-74 | V-11 | N-65 | N-71 | Urethane | 1.6 | 1.7 |
| Example 8 | 9 | V-45 | N-68 | V-7 | N-65 | N-71 | Urethane | 1.8 | 1.9 |
| Example 9 | 10 | V-36 | N-76 | V-6 | N-65 | N-71 | Ester | 1.4 | 1.5 |
| Example 10 | 11 | V-34 | N-70 | V-17 | N-65 | N-71 | Carbonate | 1.7 | 1.8 |
| Example 11 | 12 | V-33 | N-76 | V-28 | N-75 | N-69 | Amide | 1.5 | 1.5 |
| Example 12 | 13 | V-40 | N-74 | V-28 | N-75 | N-69 | Urea | 1.6 | 1.7 |
| Comparative Example 2 | 14 | V-74 | N-68 | N-78 | N-65 | N-71 | Urethane | 1 | 1 |
| Comparative Example 3 | 15 | N-83 | N-76 | N-64 | N-65 | N-71 | Ester | 1 | 1 |
| Comparative Example 4 | 16 | N-77 | N-70 | N-72 | N-65 | N-71 | Carbonate | 1 | 1 |
| Comparative Example 5 | 17 | N-83 | N-76 | N-82 | N-75 | N-69 | Amide | 1 | 1 |
| Comparative Example 6 | 18 | N-68 | N-74 | N-78 | N-75 | N-69 | Urea | 1 | 1 |

As is apparent from Table B, the effects of acceleration of radical polymerization by the introduction of a functional group having a dipole moment of 3.8 debye or more are recognized with respect to the polyurethane resin, polyurea resin, polyamide resin, polyester resin and polycarbonate resin and the radical polymerizable compositions containing these binder resins exhibit the high sensitivity and high radical polymerization property.

Examples 13 to 74 and Comparative Examples 7 to 40

<Preparation of Lithographic Printing Plate Precursors (1) to (96)>

(Preparation of Aluminum Support 2)

A 0.3 mm-thick aluminum plate was etched by immersing the plate in an aqueous 10% by weight sodium hydroxide solution at 60° C. for 25 seconds, washed with running water, neutralized and cleaned with an aqueous 20% by weight nitric

| (Preparation of coating solition for backcoat layer) | |
|---|---|
| Tetraethyl silicate | 50 parts by weight |
| Water | 20 parts by weight |
| Methanol | 15 parts by weight |
| Phosphoric acid | 0.05 parts by weight |

The above components were mixed and stirred, and heat generation was started within about 5 minutes. After the mixture was reacted for 60 minutes, the solution having the composition shown below was added thereto to prepare the coating solution for backcoat layer.

| | |
|---|---|
| Pyrogallol formaldehyde condensed resin (molecular weight: 2,000) | 4 parts by weight |
| Dimethyl phthalate | 5 parts by weight |
| Fluorine-based surfactant (N-butylperfluorooctane-sulfonamidoethyl acrylate/polyoxyethylene acrylate copolymer, molecular weight: 20,000) | 0.7 parts by weight |

-continued

| | |
|---|---|
| Methanol silica sol (produced by Nissan Chemical Industries, Ltd., methanol 30% by weight) | 50 parts by weight |
| Methanol | 800 parts by weight |

(Formation of Photosensitive Layer)

On the aluminum support provided with the backcoat layer, a radical polymerizable composition (coating solution for photosensitive layer) having the composition shown below was coated to have a dry coating amount of 1.5 g/m$^2$ and dried at 100° C. for one minute to form a photosensitive layer.

| (Coating solution for photosensitive layer) | |
|---|---|
| Binder polymer shown in Tables C to F | 1.2 g |
| Sensitizing dye shown in Tables C to F | 0.3 g |
| Polymerization initiator shown in Tables C to F | 0.3 g |
| Polymerizable compound shown in Tables C to F | 1.0 g |
| Phenyliminodiacetate | 0.2 g |
| Fluorine-based nonionic surfactant (Megafac F-780F, produced by Dainippon Ink & Chemicals Inc.) | 0.03 g |
| Naphthalene sulfonate of Victoria Pure Blue | 0.04 g |
| Methyl ethyl ketone | 9.0 g |
| Propylene glycol monomethyl ether | 8.0 g |
| Methanol | 10.0 g |

(Formation of Protective Layer)

On the photosensitive layer, an aqueous solution containing 3% by weight of polyvinyl alcohol (saponification degree: 98% by mole; polymerization degree: 550) was coated to have a dry coating weight of 2 g/m$^2$ and dried at 100° C. for 2 minutes to form a protective layer. The presence or absence of the protective layer is shown in Tables C to F.

Thus, Lithographic printing plate precursors (1) to (94) were prepared.

(Exposure of Lithographic Printing Plate Precursor)

The lithographic printing plate precursors were subjected to scanning exposure using a laser corresponding to the light-sensitive region of each of the lithographic printing plate precursors. The details of exposure conditions are described below.

(1) Examples 13 to 31 and 51 to 62 and Comparative Examples 7 to 15 and 25 to 32

The lithographic printing plate precursor was subjected to scanning exposure using an InGaN semiconductor laser having an oscillation wavelength of 400 nm under conditions of a beam diameter of 25 μm and an exposure energy density of 0.15 mJ/cm$^2$ on the plate surface.

(2) Examples 32 to 50 and 63 to 74 and Comparative Examples 16 to 24 and 33 to 40

The lithographic printing plate precursor was subjected to scanning exposure using Trendsetter 3244VFS equipped with 40 W water-cooling infrared semiconductor laser (830 nm) under conditions of output of 9 W, external surface drum rotation number of 210 rpm, plate surface energy of 100 mJ/cm$^2$ and resolution of 2,400 dpi.

(Development/Plate-Making)

After the exposure, the lithographic printing plate precursor was subjected to development/plate-making at 30° C. using an automatic developing machine (Stablon 900N, produced by Fuji Film Co., Ltd.) loaded with a developer (pH: 12.5) described below and a solution obtained by 1:1 dilution of finisher (FN-6, produced by Fuji Film Co., Ltd.) with water to prepare a lithographic printing plate.

| <Developer> | |
|---|---|
| Water | 800 g |
| DV-2 (produced by Fuji Film Co., Ltd.) | 200 g |

(Evaluation of Sensitivity)

The evaluation of sensitivity was performed by decreasing the exposure amount from the above-described standard exposure amount, the minimum exposure amount necessary for forming an image after development is determined as the sensitivity. The evaluation results are indicated as relative sensitivities defined below, using Comparative Examples 7, 16, 25 and 33 as criteria (1.0) in the respective exposure systems according to the exposure wavelength. As the value of the relative sensitivity increase, the sensitivity becomes higher and the performance is better.

Relative sensitivity=Sensitivity of criterion lithographic printing plate precursor/Sensitivity of subject lithographic printing plate precursor (Evaluation of Printing Durability)

The lithographic printing plate precursor was subjected to the scanning exposure using the laser corresponding to the lithographic printing plate precursor described above to form 2.0% halftone dots (highlight) and subjected to development/plate-making under the conditions described above. The resulting lithographic printing plate was subjected to printing using a printing machine Heidelberg KOR-D, and a number of prints obtained until the termination of printing was relatively compared as the index of printing durability, using Comparative Examples 7, 16, 25 and 33 as criteria (200) in the respective exposure systems according to the exposure wavelength. The larger the number, the higher the printing durability.

TABLE C

| | Lithographic Printing Plate Precursor | Binder Polymer | Polymerization Initiator | Sensitizing Dye | Polymerizable Compound | Protective Layer | Relative Sensitivity | Relative Printing Durability |
|---|---|---|---|---|---|---|---|---|
| Example 13 | (1) | B-4 | X-1 | Y-1 | R-1 | Presence | 1.5 | 250 |
| Example 14 | (2) | B-8 | X-1 | Y-1 | R-2 | Presence | 1.6 | 270 |
| Example 15 | (3) | B-25 | X-1 | Y-1 | R-3 | Presence | 2.2 | 320 |
| Example 16 | (4) | B-30 | X-1 | Y-1 | R-4 | Presence | 1.7 | 280 |
| Example 17 | (5) | B-31 | X-1 | Y-1 | R-5 | Presence | 1.7 | 280 |
| Example 18 | (6) | B-32 | X-1 | Y-1 | R-6 | Presence | 1.9 | 290 |
| Example 19 | (7) | B-36 | X-1 | Y-1 | R-1 | Presence | 1.8 | 290 |
| Example 20 | (8) | B-42 | X-1 | Y-1 | R-2 | Presence | 1.6 | 260 |
| Example 21 | (9) | B-55 | X-1 | Y-1 | R-3 | Presence | 1.6 | 270 |
| Example 22 | (10) | B-56 | X-1 | Y-1 | R-4 | Presence | 1.4 | 250 |

TABLE C-continued

| | Lithographic Printing Plate Precursor | Binder Polymer | Polymerization Initiator | Sensitizing Dye | Polymerizable Compound | Protective Layer | Relative Sensitivity | Relative Printing Durability |
|---|---|---|---|---|---|---|---|---|
| Example 23 | (11) | B-63 | X-1 | Y-1 | R-5 | Presence | 1.7 | 270 |
| Example 24 | (12) | B-69 | X-1 | Y-1 | R-2 | Presence | 1.6 | 270 |
| Example 25 | (13) | B-83 | X-1 | Y-1 | R-1 | Presence | 2.0 | 300 |
| Example 26 | (14) | B-84 | X-1 | Y-1 | R-2 | Presence | 1.6 | 260 |
| Example 27 | (15) | B-95 | X-1 | Y-1 | R-1 | Presence | 1.7 | 270 |
| Example 28 | (16) | B-115 | X-1 | Y-1 | R-6 | Presence | 1.6 | 260 |
| Example 29 | (17) | B-118 | X-1 | Y-1 | R-6 | Presence | 1.6 | 260 |
| Example 30 | (18) | B-121 | X-1 | Y-1 | R-1 | Presence | 1.6 | 260 |
| Example 31 | (19) | B-130 | X-1 | Y-1 | R-6 | Presence | 1.9 | 290 |
| Comparative Example 7 | (20) | Z-1 | X-1 | Y-1 | R-1 | Presence | 1.0 | 200 |
| Comparative Example 8 | (21) | Z-2 | X-1 | Y-1 | R-2 | Presence | 0.9 | 180 |
| Comparative Example 9 | (22) | Z-3 | X-1 | Y-1 | R-6 | Presence | 0.7 | 220 |
| Comparative Example 10 | (23) | Z-4 | X-1 | Y-1 | R-4 | Presence | 1.2 | 250 |
| Comparative Example 11 | (24) | Z-5 | X-1 | Y-1 | R-5 | Presence | 0.9 | 180 |
| Comparative Example 12 | (25) | Z-6 | X-1 | Y-1 | R-3 | Presence | 1.0 | 200 |
| Comparative Example 13 | (26) | Z-7 | X-1 | Y-1 | R-1 | Presence | 0.9 | 190 |
| Comparative Example 14 | (27) | Z-8 | X-1 | Y-1 | R-6 | Presence | 0.8 | 220 |
| Comparative Example 15 | (28) | Z-17 | X-1 | Y-1 | R-1 | Presence | 1.2 | 250 |

TABLE D

| | Lithographic Printing Plate Precursor | Binder Polymer | Polymerization Initiator | Sensitizing Dye | Polymerizable Compound | Protective Layer | Relative Sensitivity | Relative Printing Durability |
|---|---|---|---|---|---|---|---|---|
| Example 32 | (29) | B-4 | X-3 | Y-5 | R-1 | Presence | 1.5 | 240 |
| Example 33 | (30) | B-8 | X-3 | Y-5 | R-2 | Presence | 1.6 | 260 |
| Example 34 | (31) | B-25 | X-3 | Y-6 | R-3 | Presence | 2.2 | 310 |
| Example 35 | (32) | B-30 | X-3 | Y-6 | R-4 | Presence | 1.6 | 280 |
| Example 36 | (33) | B-31 | X-4 | Y-5 | R-5 | Absence | 1.7 | 270 |
| Example 37 | (34) | B-32 | X-4 | Y-5 | R-6 | Absence | 1.8 | 290 |
| Example 38 | (35) | B-36 | X-4 | Y-6 | R-1 | Absence | 1.8 | 290 |
| Example 39 | (36) | B-42 | X-4 | Y-6 | R-2 | Absence | 1.6 | 250 |
| Example 40 | (37) | B-55 | X-4 | Y-6 | R-3 | Absence | 1.6 | 260 |
| Example 41 | (38) | B-56 | X-3 | Y-5 | R-4 | Presence | 1.4 | 250 |
| Example 42 | (39) | B-63 | X-3 | Y-5 | R-5 | Presence | 1.7 | 260 |
| Example 43 | (40) | B-69 | X-4 | Y-5 | R-2 | Absence | 1.6 | 270 |
| Example 44 | (41) | B-83 | X-4 | Y-6 | R-1 | Absence | 2.0 | 290 |
| Example 45 | (42) | B-84 | X-3 | Y-5 | R-2 | Presence | 1.6 | 260 |
| Example 46 | (43) | B-95 | X-3 | Y-5 | R-1 | Presence | 1.6 | 270 |
| Example 47 | (44) | B-115 | X-3 | Y-6 | R-6 | Presence | 1.6 | 260 |
| Example 48 | (45) | B-118 | X-3 | Y-5 | R-6 | Presence | 1.7 | 260 |
| Example 49 | (46) | B-121 | X-3 | Y-6 | R-1 | Presence | 1.6 | 270 |
| Example 50 | (47) | B-130 | X-3 | Y-5 | R-6 | Presence | 1.9 | 290 |
| Comparative Example 16 | (48) | Z-1 | X-3 | Y-5 | R-1 | Presence | 1.0 | 200 |
| Comparative Example 17 | (49) | Z-2 | X-3 | Y-5 | R-2 | Presence | 0.8 | 170 |
| Comparative Example 18 | (50) | Z-3 | X-3 | Y-6 | R-6 | Presence | 0.7 | 220 |
| Comparative Example 19 | (51) | Z-4 | X-3 | Y-6 | R-4 | Presence | 1.1 | 240 |
| Comparative Example 20 | (52) | Z-5 | X-4 | Y-5 | R-5 | Absence | 0.7 | 170 |
| Comparative Example 21 | (53) | Z-6 | X-4 | Y-5 | R-3 | Absence | 1.0 | 210 |
| Comparative Example 22 | (54) | Z-5 | X-4 | Y-6 | R-1 | Absence | 0.8 | 180 |
| Comparative Example 23 | (55) | Z-6 | X-4 | Y-6 | R-6 | Absence | 0.9 | 210 |
| Comparative Example 24 | (56) | Z-17 | X-4 | Y-6 | R-6 | Absence | 1.2 | 240 |

TABLE E

| | Lithographic Printing Plate Precursor | Binder Polymer | Polymerization Initiator | Sensitizing Dye | Polymerizable Compound | Protective Layer | Relative Sensitivity | Relative Printing Durability |
|---|---|---|---|---|---|---|---|---|
| Example 51 | (57) | B-137 | X-1 | Y-1 | R-7 | Presence | 1.6 | 270 |
| Example 52 | (58) | B-138 | X-1 | Y-1 | R-8 | Presence | 2.1 | 320 |
| Example 53 | (59) | B-139 | X-1 | Y-1 | R-9 | Presence | 1.8 | 290 |
| Example 54 | (60) | B-142 | X-1 | Y-1 | R-10 | Presence | 1.5 | 250 |
| Example 55 | (61) | B-143 | X-1 | Y-1 | R-11 | Presence | 1.6 | 260 |
| Example 56 | (62) | B-144 | X-1 | Y-1 | R-7 | Presence | 1.4 | 240 |
| Example 57 | (63) | B-146 | X-1 | Y-1 | R-8 | Presence | 1.8 | 280 |
| Example 58 | (64) | B-148 | X-1 | Y-1 | R-7 | Presence | 1.6 | 260 |
| Example 59 | (65) | B-149 | X-1 | Y-1 | R-9 | Presence | 1.4 | 240 |
| Example 60 | (66) | B-150 | X-1 | Y-1 | R-7 | Presence | 1.7 | 280 |
| Example 61 | (67) | B-151 | X-1 | Y-1 | R-9 | Presence | 1.9 | 300 |
| Example 62 | (68) | B-152 | X-1 | Y-1 | R-11 | Presence | 1.9 | 290 |
| Comparative Example 25 | (69) | Z-9 | X-1 | Y-1 | R-7 | Presence | 1.0 | 200 |
| Comparative Example 26 | (70) | Z-10 | X-1 | Y-1 | R-8 | Presence | 0.9 | 190 |
| Comparative Example 27 | (71) | Z-11 | X-1 | Y-1 | R-9 | Presence | 1.1 | 220 |
| Comparative Example 28 | (72) | Z-12 | X-1 | Y-1 | R-10 | Presence | 1.0 | 200 |
| Comparative Example 29 | (73) | Z-13 | X-1 | Y-1 | R-11 | Presence | 0.9 | 190 |
| Comparative Example 30 | (74) | Z-14 | X-1 | Y-1 | R-7 | Presence | 1.0 | 200 |
| Comparative Example 31 | (75) | Z-15 | X-1 | Y-1 | R-8 | Presence | 1.0 | 190 |
| Comparative Example 32 | (76) | Z-16 | X-1 | Y-1 | R-9 | Presence | 1.2 | 220 |

TABLE F

| | Lithographic Printing Plate Precursor | Binder Polymer | Polymerization Initiator | Sensitizing Dye | Polymerizable Compound | Protective Layer | Relative Sensitivity | Relative Printing Durability |
|---|---|---|---|---|---|---|---|---|
| Example 63 | (77) | B-137 | X-3 | Y-5 | R-7 | Presence | 1.7 | 270 |
| Example 64 | (78) | B-138 | X-3 | Y-6 | R-8 | Presence | 2.1 | 330 |
| Example 65 | (79) | B-139 | X-4 | Y-5 | R-9 | Absence | 1.8 | 280 |
| Example 66 | (80) | B-142 | X-4 | Y-6 | R-10 | Absence | 1.5 | 250 |
| Example 67 | (81) | B-143 | X-3 | Y-5 | R-11 | Presence | 1.5 | 260 |
| Example 68 | (82) | B-144 | X-4 | Y-5 | R-7 | Absence | 1.4 | 250 |
| Example 69 | (83) | B-146 | X-3 | Y-5 | R-8 | Presence | 1.7 | 280 |
| Example 70 | (84) | B-148 | X-4 | Y-5 | R-7 | Absence | 1.6 | 260 |
| Example 71 | (85) | B-149 | X-3 | Y-5 | R-9 | Presence | 1.4 | 240 |
| Example 72 | (86) | B-150 | X-4 | Y-5 | R-7 | Absence | 1.7 | 270 |
| Example 73 | (87) | B-151 | X-4 | Y-5 | R-9 | Absence | 2.0 | 290 |
| Example 74 | (88) | B-152 | X-3 | Y-5 | R-8 | Presence | 1.9 | 280 |
| Comparative Example 33 | (89) | Z-9 | X-3 | Y-5 | R-7 | Presence | 1.0 | 200 |
| Comparative Example 34 | (90) | Z-10 | X-3 | Y-6 | R-8 | Presence | 0.9 | 200 |
| Comparative Example 35 | (91) | Z-11 | X-4 | Y-5 | R-9 | Absence | 1.1 | 210 |
| Comparative Example 36 | (92) | Z-12 | X-4 | Y-6 | R-10 | Absence | 1.1 | 200 |
| Comparative Example 37 | (93) | Z-13 | X-3 | Y-5 | R-11 | Presence | 1.0 | 190 |
| Comparative Example 38 | (94) | Z-14 | X-4 | Y-5 | R-7 | Absence | 1.0 | 190 |
| Comparative Example 39 | (95) | Z-15 | X-3 | Y-5 | R-8 | Presence | 0.9 | 190 |
| Comparative Example 40 | (96) | Z-16 | X-4 | Y-5 | R-9 | Absence | 1.1 | 210 |

Structures of Polymerization initiators X-1, X-3 and X-4, Sensitizing dyes Y-1, Y-5 and Y-6 and Polymerizable compounds R-1 to R-11 and compositions of Comparative binder polymers Z-1 to Z-17 described in Tables C to F are shown below.
X-1: CGI-784 produced by Ciba-Geigy Corp.)
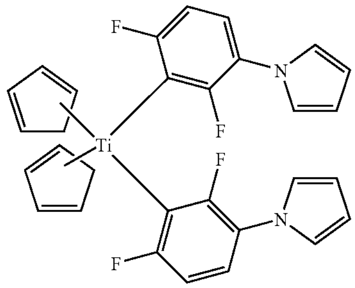
X-3:
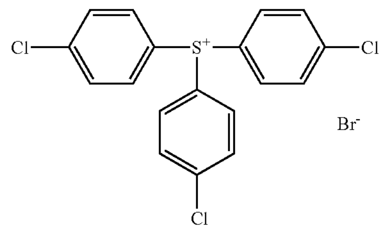
X-4:
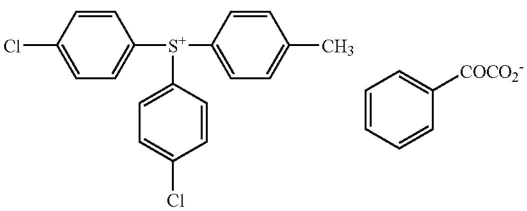
Y-1:
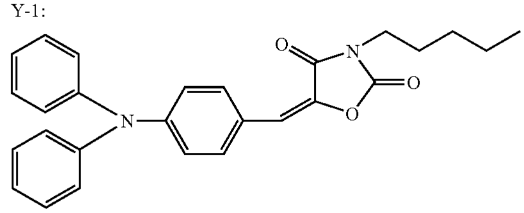
Y-5:
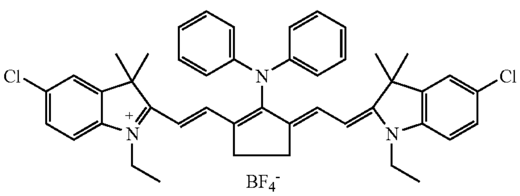
Y-6:
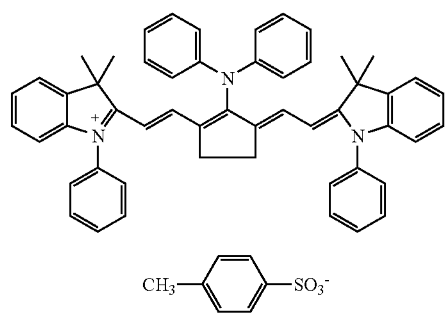
R-1
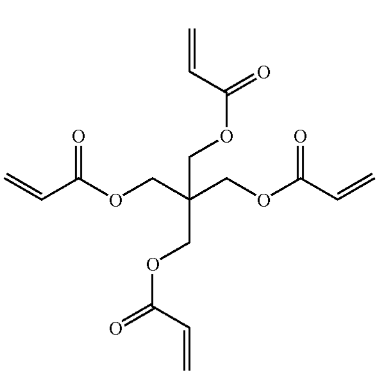
R-2
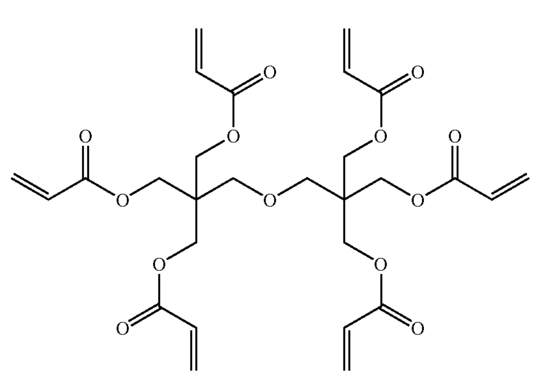

-continued
R-3
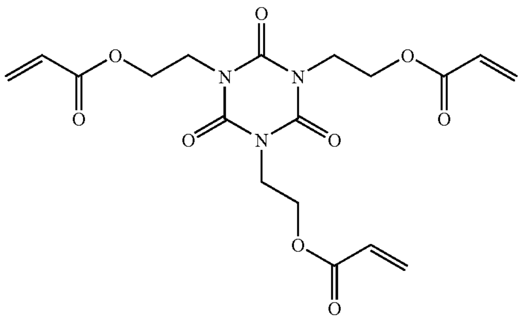
R-4
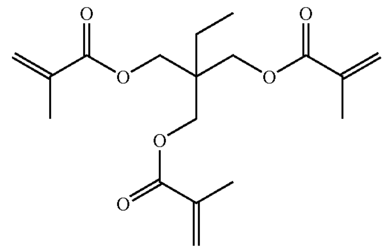
R-5
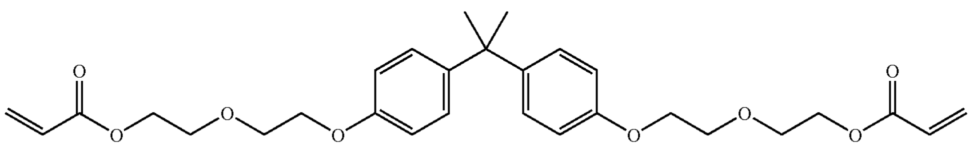
R-6
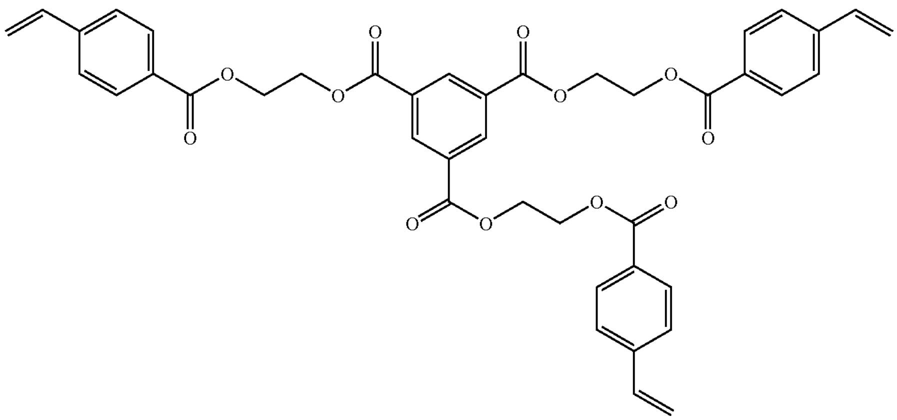
R-7
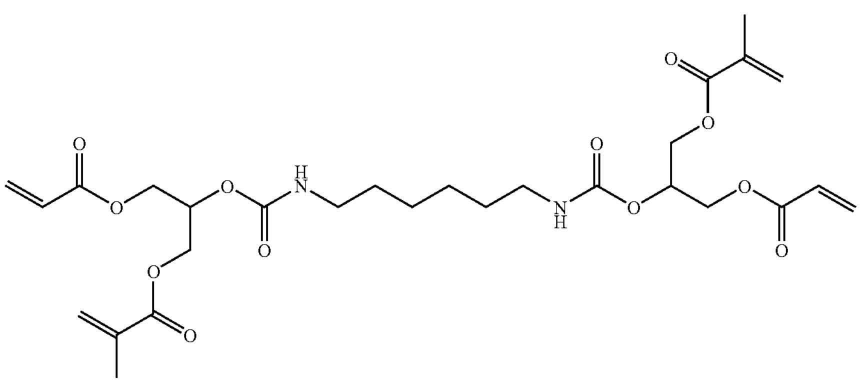
R-8
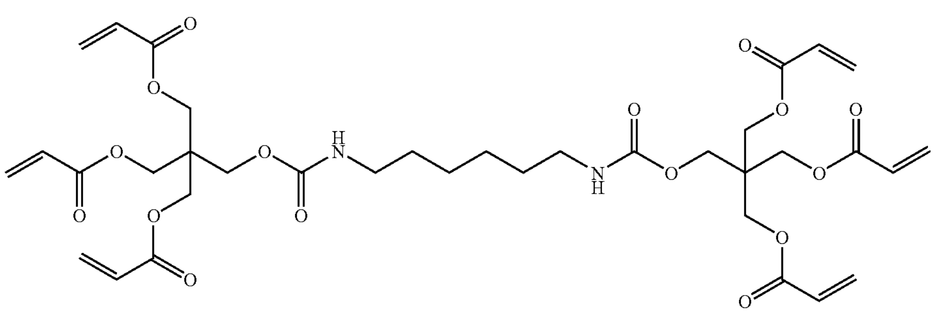

-continued
R-9
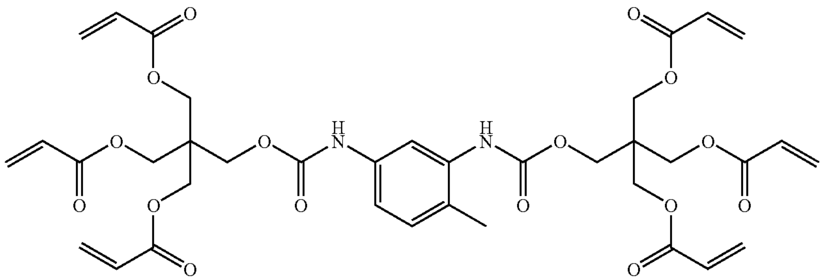
R-10
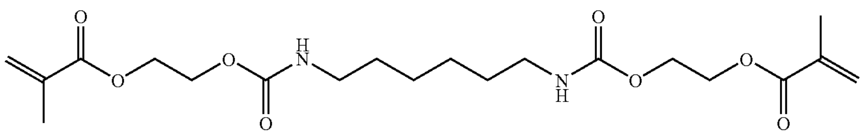
R-11
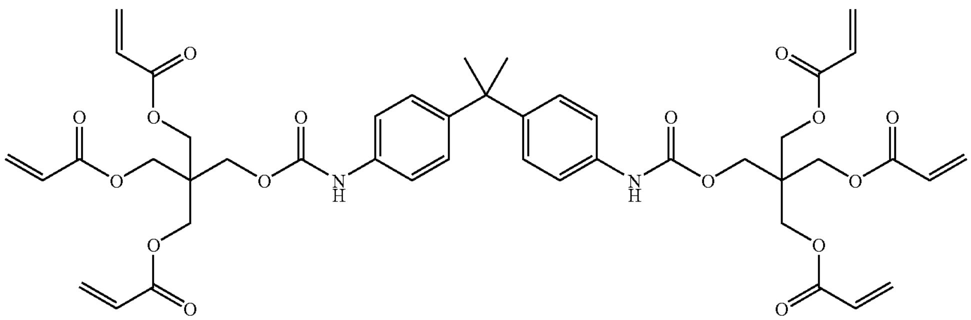
| Binder | Unit 1 | | Unit 2 | | Unit 3 | |
|---|---|---|---|---|---|---|
| Polymer | Species | Content (%) | Species | Content (%) | Species | Contents (%) |
| Z-1 | N-28 | 20 | N-14 | 20 | N-6 | 60 |
| Z-2 | N-36 | 50 | N-49 | 15 | N-18 | 35 |
| Z-3 | N-44 | 30 | N-58 | 20 | N-59 | 50 |
| Z-4 | N-44 | 65 | N-21 | 15 | N-7 | 20 |
| Z-5 | N-18 | 85 | N-49 | 15 | — | — |
| Z-6 | N-6 | 80 | N-14 | 20 | — | — |
| Z-7 | N-1 | 40 | N-34 | 20 | N-18 | 40 |
| Z-8 | N-51 | 80 | N-58 | 20 | — | — |
| Binder | Unit 1 | | Unit 2 | | Unit 3 | | Unit 4 | | Unit 5 | |
|---|---|---|---|---|---|---|---|---|---|---|
| Polymer | Species | Content (%) | Species | Content (%) | Species | Contents (%) | Species | Contents (%) | Species | Contents (%) |
| Z-9 | N-74 | 30 | N-81 | 20 | N-71 | 15 | N-65 | 25 | N-78 | 10 |
| Z-10 | N-80 | 25 | N-68 | 25 | N-64 | 10 | N-65 | 20 | N-71 | 20 |
| Z-11 | N-79 | 20 | N-66 | 30 | N-65 | 20 | N-71 | 20 | N-72 | 10 |
| Z-12 | N-74 | 50 | N-64 | 15 | N-65 | 15 | N-71 | 20 | — | — |
| Z-13 | N-79 | 25 | N-73 | 25 | N-71 | 35 | N-65 | 15 | — | — |
| Z-14 | N-74 | 30 | N-68 | 20 | N-71 | 25 | N-65 | 20 | N-72 | 5 |
| Z-15 | N-66 | 25 | N-73 | 25 | N-71 | 20 | N-65 | 20 | N-78 | 10 |
| Z-16 | N-66 | 20 | N-73 | 20 | N-80 | 10 | N-65 | 20 | N-71 | 30 |

-continued (Z-17)

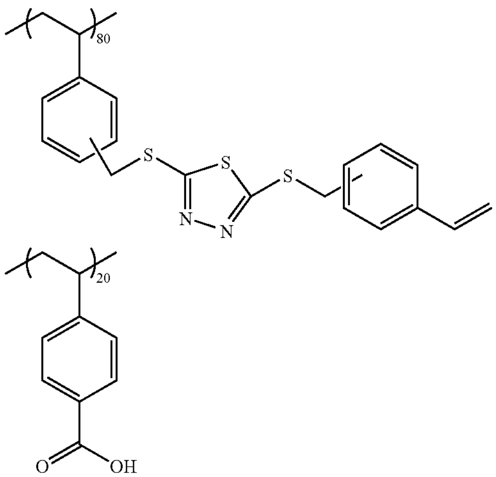

As is apparent form the results described above, the radical polymerizable composition according to the invention is highly sensitive and when it is used in the photosensitive layer of a lithographic printing plate precursor, the high sensitivity and high printing durability are obtained. It is believed that these results are derived from the effect of the specific binder polymer according to the invention.

Examples 101 to 104 and Comparative Example 101

<Preparation of Lithographic Printing Plate Precursors (101) to (105)>

On Aluminum support 1 described above was coated an undercoat solution shown below using a bar to have a dry coating amount of 10 mg/m$^2$ and dried in an oven at 80° C. for 10 seconds to prepare an undercoat layer.

| <Undercoat solution> | |
|---|---|
| Undercoat Compound (1) shown below | 0.017 g |
| Methanol | 9.00 g |
| Water | 1.00 g |

Undercoat Compound (1):

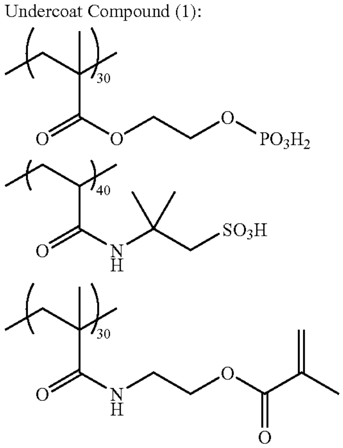

On the support having the undercoat layer prepared above, Coating Solution 1 for Photosensitive Layer having the composition shown below was coated using a bar and dried in an oven at 70° C. for 60 seconds to form a photosensitive layer having a dry coating amount of 1.1 g/m$^2$. On the photosensitive layer, Coating Solution 1 for Protective Layer having the composition shown below was coated using a bar to have a dry coating amount of 0.75 g/m$^2$ and dried at 125° C. for 70 seconds to prepare Lithographic Printing Plate Precursors (101) to (105), respectively,

| (Coating Solution 1 for Photosensitive Layer) | |
|---|---|
| Binder polymer shown in Table 1 below | 0.54 g |
| Polymerizable compound<br>Isocyanuric acid EO-modified triacrylate (Aronics M-315, produced by Toa Gosei Co., Ltd.) | 0.40 g |
| Polymerizable compound<br>Ethoxylated trimethylolpropane triacrylate (SR9035, produced by Nippon Kayaku Co., Ltd., EO addition molar number: 15, molecular weight: 1,000) | 0.08 g |
| Sensitizing Dye(101) shown below | 0.06 g |
| Polymerization Initiator(101) shown below | 0.18 g |
| Co-sensitizer(101) shown below | 0.07 g |
| Dispersion(101) of ϵ-phthalocyanine pigment [pigment: 15 parts by weight; dispersing agent (allyl methacrylate/methacrylic acid(80/20) copolymer): 10 parts by weight; solvent (cyclohexanone/methoxypropyl acetate/1-methoxy-2-propanol = 15 parts by weight/20 parts by weight/40 parts by weight)] | 0.40 g |
| Thermal polymerization inhibitor<br>N-nitrosophenylhydroxylamine aluminum salt | 0.01 g |
| Fluorine-Based Surfactant(101) shown below | 0.001 g |
| Polyoxyethylene-polyoxypropylene condensate (Pluronic L44, produced by ADEKA Corp.) | 0.04 g |
| Tetraethylamine hydrochloride | 0.01 g |
| 1-Methoxy-2-propanol | 3.5 g |
| Methyl ethyl ketone | 8.0 g |

Sensitizing Dye(101):

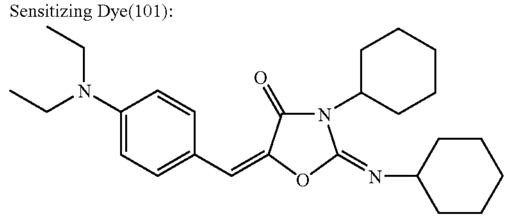

Polymerization Initiator(101):

-continued

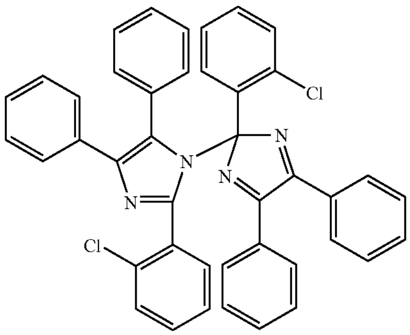 [SMILES: Clc1ccccc1-c1nc(-c2ccccc2)c(-c2ccccc2)n1C1(c2ccccc2Cl)N=C(c2ccccc2)C(c2ccccc2)=N1]

Co-sensitizer(101)

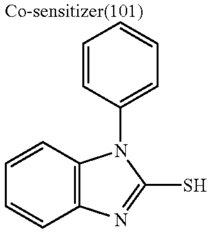

Fluorine-Based Surfactant(101):

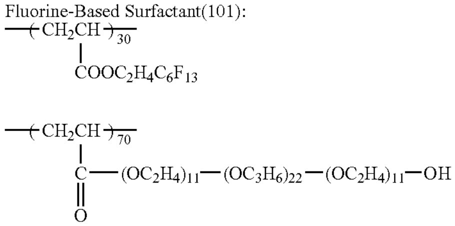

| (Coating Solution 1 for Protective Layer) | |
|---|---|
| Polyvinyl alcohol (saponification degree: 98% by mole; polymerization degree: 500) | 40 g |
| Polyvinyl pyrrolidone (molecular weight: 50,000) | 5 g |
| Vinyl pyrrolidone/vinyl acetate (1/1) copolymer (molecular weight: 70,000) | 0.5 g |
| Surfactant (Emalex 710, produced by Nihon-Emulsion Co., Ltd.) | 0.5 g |
| Water | 950 g |

(1) Exposure, Development and Printing

Each of Lithographic Printing Plate Precursors (101) to (105) was subjected to imagewise exposure using a semiconductor laser of 405 nm having an output of 100 mW while changing energy density.

Then, development processing was performed in an automatic development processor having a structure shown in FIG. 1 using Developer 1 having the composition shown below to prepare a lithographic printing plate (without heating). The pH of the developer was 46. The automatic development processor was an automatic processor having two rotating brush rollers. As for the rotating brush rollers used, the first brush roller was a brush roller having an outer diameter of 90 mm and being implanted with fiber of polybutylene terephthalate (bristle diameter: 200 μm, bristle length. 17 mm), and the brush roller was rotated at 200 rpm in the same direction as the transporting direction peripheral velocity at the tip of brush: 0.94 m/sec). The second brush roller was a brush roller having an outer diameter of 60 mm and being implanted with fiber of polybutylene terephthalate (bristle diameter: 200 μm, bristle length: 17 mm), and the brush roller was rotated at 200 rpm in the opposite direction to the transporting direction (peripheral velocity at the tip of brush: 0.63 m/sec). The transportation of the lithographic printing plate precursor was performed while changing variously transporting speed.

The developer was supplied on the surface of the lithographic printing plate precursor by showering from a spray pipe using a circulation pump. The tank volume for the developer was 10 liters.

| (Developer) | |
|---|---|
| Water | 100.00 g |
| Benzyl alcohol | 1.00 g |
| Polyoxyethylene naphthyl ether (average number of oxyethylene: n = 13) | 1.00 g |
| Sodium salt of dioctylsulfosuccinic acid ester | 0.50 g |
| Gum arabic | 1.00 g |
| Ethylene glycol | 0.50 g |
| Ammonium primary phosphate | 0.05 g |
| Citric acid | 0.05 g |
| Tetrasodium salt of ethylenediaminetetraacetate | 0.05 g |

On the other hand, within 30 seconds after the laser exposure, the exposed lithographic printing plate precursor was put in an oven and heated the whole surface of the lithographic printing plate precursor by blowing hot air to maintain at 110° C. for 15 seconds and then the development processing was performed within 30 seconds in the same manner as described above to prepare a lithographic printing plate (with heating).

Then, each of the lithographic printing plate (without heating) and lithographic printing plate (with heating) was mounted on a printing machine, SOR-M, produced by Heidelberg, and printing was performed at a printing speed of 6,000 sheets per hour using dampening water (EU-3 (etching solution, produced by Fuji Film Co., Ltd.))/water/isopropyl alcohol=1/89/10 (by volume ratio)) and TRANS-G(N) black ink (produced by Dai-Nippon Ink & Chemicals, Inc.).

(2) Evaluation

With respect to the lithographic printing plate precursors prepared above, the developing property, sensitivity and printing durability were evaluated in the following manner. The results are shown in Table 1.

<Developing Property>

With the lithographic printing plate obtained by performing the development while changing variously the transporting speed described above, cyan density of the non-image area was measured by a Macbeth densitometer. The transporting speed at which the cyan density of the non-image area became equivalent to cyan density of the aluminum support was determined and regarded as the developing property. The evaluation of developing property was indicated as a relative developing property defined as below using Comparative Example 101 as a criterion (1.0). As the value of relative developing property increases, the developing property becomes better and the performance is more preferable.

Relative developing property=Transporting speed of subject lithographic printing plate precursor)/(Transporting speed of criterion lithographic printing plate precursor)

<Sensitivity>

After performing printing of 100 sheets as described above and confining that a printed material free from ink stain in the non-image area was obtained, 500 sheets were continuously printed. The exposure amount for causing no unevenness in the ink density of the image area on the 600th printed material was determined as the sensitivity. The evaluation of sensitivity was indicated as a relative sensitivity defined as below using Comparative Example 101 as a criterion (1.0). As the value of relative sensitivity increases, the sensitivity becomes higher and the performance is more preferable.

Relative sensitivity=(Sensitivity of criterion lithographic printing plate precursor)/(Sensitivity of subject lithographic printing plate precursor)<

<Printing Durability>

As increase in the number of printing sheets, the photosensitive layer was gradually abraded to cause decrease in the ink receptivity, resulting in decrease of ink density on printing paper. With respect to the lithographic printing plate obtained by the exposure in the same exposure amount, a number of printed materials obtained until the ink density (reflection density) decreased by 0.1 from that at the initiation of printing was determined to evaluate the printing durability. The evaluation of printing durability was indicated as a relative printing durability defined as below using Comparative Example 101 as a criterion (1.0). As the value of relative printing durability increases, the printing durability becomes higher.

Relative printing durability=(Printing durability of subject lithographic printing plate precursor)/(Printing durability of criterion lithographic printing plate precursor)

TABLE 1

| | Lithographic Printing Plate Precursor | Binder Polymer | | | Relative Developing Property | | Relative Sensitivity | | Relative Printing Durability | |
|---|---|---|---|---|---|---|---|---|---|---|
| | | U-31 | N-1 | N-19 | Without Heating | With Heating | Without Heating | With Heating | Without Heating | With Heating |
| Example 101 | (101) | 80 | 0 | 20 | 1.5 | 1.5 | 2.2 | 3.0 | 2.0 | 3.2 |
| Example 102 | (102) | 60 | 20 | 20 | 1.5 | 1.5 | 2.0 | 2.6 | 1.8 | 2.8 |
| Example 103 | (103) | 40 | 40 | 20 | 1.4 | 1.4 | 1.7 | 2.4 | 1.6 | 2.5 |
| Example 104 | (104) | 20 | 60 | 20 | 1.2 | 1.2 | 1.5 | 2.2 | 1.4 | 2.2 |
| Comparative Example 101 | (105) | 0 | 80 | 20 | 1.0 | 1.0 | 1.0 | 1.0 | 1.0 | 1.0 |

Examples 105 to 120 and Comparative Examples 102 to 109

<Preparation of Lithographic Printing Plate Precursors (106) to (129)>

Lithographic printing plate precursors (106) to (129) were prepared in the same manner as in the preparation of Lithographic Printing Plate Precursor (101) except for changing the binder polymer in Coating Solution 1 for Photosensitive Layer to the binder polymer shown in Table 2 below, respectively.

Lithographic printing plate precursors (106) to (129) were evaluated in the same manner as in Example 101. The results are shown in Table 2.

TABLE 2

| | Lithographic Printing Plate Precursor | Binder Polymer X | Binder Polymer Dipole Moment | Relative Developing Property Without Heating | Relative Developing Property With Heating | Relative Sensitivity Without Heating | Relative Sensitivity With Heating | Relative Printing Durability Without Heating | Relative Printing Durability With Heating |
|---|---|---|---|---|---|---|---|---|---|
| Example 105 | (106) | U-4 | 4.7 | 1.6 | 1.6 | 1.8 | 2.7 | 1.8 | 2.4 |
| Example 106 | (107) | U-8 | 5.3 | 1.5 | 1.5 | 2.1 | 2.9 | 2.1 | 3.0 |
| Example 107 | (108) | U-21 | 4.6 | 1.4 | 1.4 | 1.8 | 2.8 | 1.9 | 2.5 |
| Example 108 | (109) | U-25 | 5.9 | 1.7 | 1.7 | 2.3 | 3.0 | 2.3 | 3.0 |
| Example 109 | (110) | U-32 | 5.1 | 1.6 | 1.6 | 2.0 | 2.9 | 2.0 | 2.7 |
| Example 110 | (111) | U-36 | 5.1 | 1.7 | 1.7 | 2.1 | 3.0 | 2.1 | 2.8 |
| Example 111 | (112) | U-40 | 5.2 | 1.6 | 1.6 | 2.1 | 3.0 | 2.1 | 2.7 |
| Example 112 | (113) | U-55 | 4.7 | 1.6 | 1.6 | 1.9 | 2.9 | 1.9 | 2.5 |
| Example 113 | (114) | U-59 | 4.3 | 1.7 | 1.7 | 1.6 | 2.4 | 1.7 | 2.2 |
| Example 114 | (115) | U-13 | 3.8 | 1.5 | 1.5 | 1.5 | 2.2 | 1.5 | 2.0 |
| Example 115 | (116) | U-63 | 4.1 | 1.5 | 1.5 | 1.6 | 2.3 | 1.6 | 2.2 |
| Example 116 | (117) | U-69 | 5.4 | 1.7 | 1.7 | 2.2 | 2.9 | 2.0 | 2.9 |
| Example 117 | (118) | U-84 | 5.3 | 1.5 | 1.5 | 2.0 | 2.9 | 2.1 | 2.9 |
| Example 118 | (119) | U-95 | 5.2 | 1.6 | 1.6 | 2.1 | 2.9 | 2.1 | 2.8 |
| Example 119 | (120) | U-114 | 4.7 | 1.6 | 1.6 | 1.9 | 2.8 | 2.0 | 2.6 |
| Example 120 | (121) | U-104 | 6.9 | 1.7 | 1.7 | 2.3 | 3.1 | 2.4 | 3.1 |
| Comparative Example 102 | (122) | N-10 | 0.0 | 1.0 | 1.0 | 1.0 | 1.0 | 1.0 | 1.0 |
| Comparative Example 103 | (123) | N-15 | 1.9 | 1.1 | 1.1 | 1.1 | 1.1 | 1.0 | 1.0 |
| Comparative Example 104 | (124) | N-35 | 1.2 | 1.5 | 1.5 | 0.8 | 0.8 | 0.5 | 0.5 |
| Comparative Example 105 | (125) | N-99 | 3.6 | 1.0 | 1.0 | 1.3 | 1.4 | 1.1 | 1.1 |
| Comparative Example 106 | (126) | N-100 | 2.5 | 1.1 | 1.1 | 1.1 | 1.2 | 1.0 | 1.0 |
| Comparative Example 107 | (127) | N-101 | 1.9 | 1.2 | 1.2 | 1.1 | 1.1 | 1.0 | 1.0 |
| Comparative Example 108 | (128) | N-102 | 3.4 | 1.3 | 1.3 | 1.2 | 1.3 | 1.1 | 1.1 |
| Comparative Example 109 | (129) | N-103 | 3.7 | 1.3 | 1.3 | 1.3 | 1.3 | 1.2 | 1.2 |

Binder Polymer:

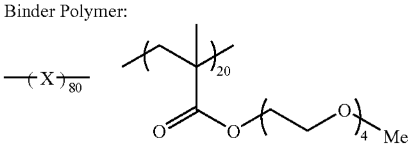

Examples 121 to 130 and Comparative Examples 110 to 113

<Preparation of Lithographic Printing Plate Precursors (130) to (143)>

Lithographic printing plate precursors (130) to (143) were prepared in the same manner as in the preparation of Lithographic Printing Plate Precursor (101) except for changing Coating Solution 1 for Photosensitive Layer to Coating Solution 2 for Photosensitive Layer having the composition shown below, respectively.

| (Coating Solution 2 for Photosensitive Layer) | |
|---|---|
| Binder polymer shown in Table 3 below | 0.54 g |
| Polymerizable Compound(101) shown below | 0.40 g |
| Polymerizable compound Dipentaerythritol pentaacrylate (SR399, produced by Nippon Kayaku Co., Ltd.) | 0.08 g |
| Sensitizing Dye(101) shown above | 0.06 g |
| Polymerization Initiator(101) shown above | 0.18 g |
| Co-sensitizer(101) shown above | 0.07 g |
| Dispersion(101) of ϵ-phthalocyanine pigment described above | 0.40 g |

-continued

| | |
|---|---|
| Thermal polymerization inhibitor N-nitrosophenylhydroxylamine aluminum salt | 0.01 g |
| Fluorine-Based Surfactant(101) shown above | 0.001 g |
| Polyoxyethylene-polyoxypropylene condensate (Pluronic L44, produced by ADEKA Corp.) | 0.04 g |
| Tetraethylamine hydrochloride | 0.01 g |
| 1-Methoxy-2-propanol | 3.5 g |
| Methyl ethyl ketone | 8.0 g |

Polymerizable Compound(101):

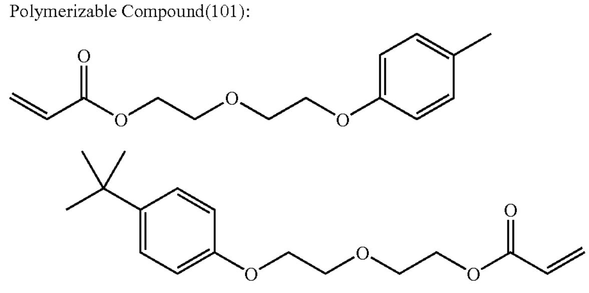

Lithographic printing plate precursors (130) to (143) were evaluated in the same manner as in Example 101. The results are shown in Table 3.

TABLE 3

| | Lithographic Printing Plate Precursor | Binder Polymer X | Binder Polymer Dipole Moment | Relative Developing Property Without Heating | Relative Developing Property With Heating | Relative Sensitivity Without Heating | Relative Sensitivity With Heating | Relative Printing Durability Without Heating | Relative Printing Durability With Heating |
|---|---|---|---|---|---|---|---|---|---|
| Example 121 | (130) | U-115 | 5.1 | 1.8 | 1.8 | 2.0 | 3.0 | 2.0 | 3.0 |
| Example 122 | (131) | U-111 | 4.9 | 1.7 | 1.7 | 2.0 | 2.9 | 2.0 | 2.9 |
| Example 123 | (132) | U-120 | 4.5 | 1.7 | 1.7 | 1.8 | 2.7 | 1.9 | 2.6 |
| Example 124 | (133) | U-121 | 5.1 | 1.8 | 1.8 | 2.0 | 3.0 | 2.0 | 2.9 |
| Example 125 | (134) | U-129 | 3.8 | 1.5 | 1.5 | 1.5 | 2.0 | 1.5 | 2.2 |
| Example 126 | (135) | U-136 | 5.1 | 1.6 | 1.6 | 2.0 | 3.0 | 2.0 | 2.9 |
| Example 127 | (136) | U-138 | 4.7 | 1.7 | 1.7 | 1.8 | 2.8 | 1.9 | 2.6 |
| Example 128 | (137) | U-141 | 4.7 | 1.7 | 1.7 | 1.8 | 2.8 | 2.0 | 2.7 |
| Example 129 | (138) | U-146 | 4.7 | 1.7 | 1.7 | 1.9 | 2.9 | 2.0 | 2.8 |
| Example 130 | (139) | U-149 | 5.2 | 1.8 | 1.8 | 2.1 | 3.0 | 2.2 | 3.1 |
| Comparative Example 110 | (140) | N-44 | 0.0 | 1.0 | 1.0 | 1.0 | 1.0 | 1.0 | 1.0 |
| Comparative Example 111 | (141) | N-45 | 2.0 | 1.1 | 1.1 | 1.1 | 1.1 | 1.0 | 1.0 |
| Comparative Example 112 | (142) | N-56 | 1.2 | 1.5 | 1.5 | 0.8 | 0.8 | 0.7 | 0.8 |
| Comparative Example 113 | (143) | N-62 | 3.6 | 1.3 | 1.3 | 1.3 | 1.3 | 1.2 | 1.2 |

Binder Polymer:

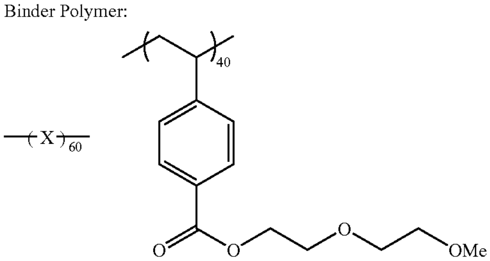

Examples 131 to 139 and Comparative Examples 114 to 118

<Preparation of Lithographic Printing Plate Precursors (144) to (157)>

Lithographic printing plate precursors (144) to (157) were prepared in the same manner as in the preparation of Lithographic Printing Plate Precursor (101) except for changing Coating Solution 1 for Photosensitive Layer to Coating Solution 3 for Photosensitive Layer having the composition shown below, respectively.

| (Coating Solution 3 for Photosensitive Layer) | |
|---|---|
| Binder polymer shown in Table 4 below | 0.54 g |
| Polymerizable Compound (102) shown below | 0.48 g |
| Sensitizing Dye(101) shown above | 0.06 g |
| Polymerization Initiator(101) shown above | 0.18 g |
| Co-sensitizer(101) shown above | 0.07 g |
| Dispersion(101) of ϵ-phthalocyanine pigment described above | 0.40 g |
| Thermal polymerization inhibitor N-nitrosophenylhydroxylamine aluminum salt | 0.01 g |
| Fluorine-Based Surfactant(101) shown above | 0.001 g |

-continued

| | |
|---|---|
| Polyoxyethylene-polyoxypropylene condensate (Pluronic L44, produced by ADEKA Corp.) | 0.04 g |
| Tetraethylamine hydrochloride | 0.01 g |
| 1-Methoxy-2-propanol | 3.5 g |
| Methyl ethyl ketone | 8.0 g |

Polymerizable Compound (102):

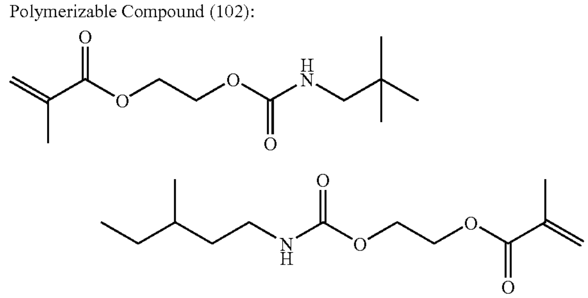

Lithographic printing plate precursors (144) to (157) were evaluated in the same manner as in Example 101. The results are shown in Table 4.

TABLE 4

| | Lithographic Printing Plate Precursor | Binder Polymer X | Dipole Moment | Relative Developing Property Without Heating | Relative Developing Property With Heating | Relative Sensitivity Without Heating | Relative Sensitivity With Heating | Relative Printing Durability Without Heating | Relative Printing Durability With Heating |
|---|---|---|---|---|---|---|---|---|---|
| Example 131 | (144) | V-2 | 5.1 | 1.6 | 1.6 | 1.7 | 2.3 | 1.7 | 2.3 |
| Example 132 | (145) | V-3 | 4.3 | 1.2 | 1.2 | 1.4 | 1.9 | 1.4 | 1.9 |
| Example 133 | (146) | V-6 | 4.8 | 1.5 | 1.5 | 1.6 | 2.0 | 1.6 | 2.1 |
| Example 134 | (147) | V-8 | 4.0 | 1.2 | 1.2 | 1.3 | 1.7 | 1.3 | 1.6 |
| Example 135 | (148) | V-12 | 5.8 | 1.7 | 1.7 | 2.0 | 2.5 | 2.0 | 2.6 |
| Example 136 | (149) | V-16 | 5.9 | 1.7 | 1.7 | 2.0 | 2.7 | 2.1 | 2.8 |
| Example 137 | (150) | V-18 | 4.5 | 1.4 | 1.4 | 1.5 | 2.0 | 1.5 | 2.0 |
| Example 138 | (151) | V-20 | 5.1 | 1.6 | 1.6 | 1.7 | 2.3 | 1.7 | 2.2 |
| Example 139 | (152) | V-24 | 5.2 | 1.6 | 1.6 | 1.7 | 2.3 | 1.8 | 2.4 |
| Comparative Example 114 | (153) | N-64 | 0.0 | 1.0 | 1.0 | 1.0 | 1.0 | 1.0 | 1.0 |
| Comparative Example 115 | (154) | N-78 | 0.0 | 0.9 | 0.9 | 1.1 | 1.2 | 1.1 | 1.1 |
| Comparative Example 116 | (155) | N-104 | 0.0 | 0.8 | 0.8 | 1.2 | 1.3 | 1.2 | 1.3 |
| Comparative Example 117 | (156) | N-105 | 0.0 | 1.1 | 1.1 | 1.0 | 1.0 | 1.1 | 1.0 |
| Comparative Example 118 | (157) | N-71 | 0.0 | 0.9 | 0.9 | 1.1 | 1.1 | 1.1 | 1.1 |

Binder Polymer:

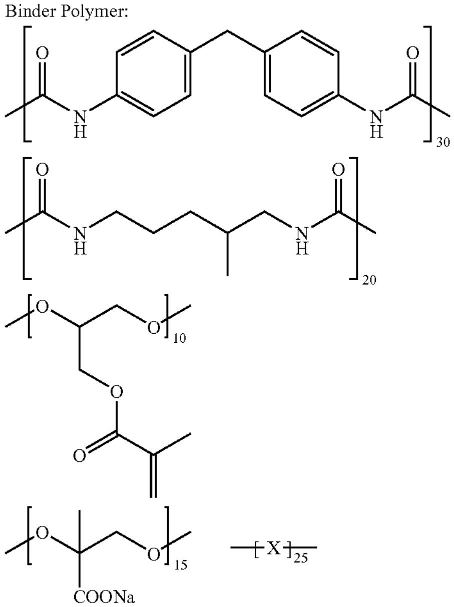

Examples 140 to 147 and Comparative Examples 119 to 121

<Preparation of Lithographic Printing Plate Precursors (158) to (168)>

Lithographic printing plate precursors (158) to (168) were prepared in the same manner as in the preparation of Lithographic Printing Plate Precursor (101) except for changing Coating Solution 1 for Photosensitive Layer to Coating Solution 4 for Photosensitive Layer having the composition shown below, respectively.

| (Coating Solution 4 for Photosensitive Layer) | |
|---|---|
| Polymerization Initiator (101) shown above | 0.20 g |
| Sensitizing Dye (101) shown above | 0.10 g |
| Binder polymer shown in Table 5 below | 3.00 g |
| Polymerizable compound Dipentaerythritol pentaacrylate (SR399, produced by Nippon Kayaku Co., Ltd.) | 6.20 g |
| Leuco Crystal Violet | 0.20 g |
| Fluorine-based Surfactant (101) shown above | 0.10 g |
| Dispersion of Microcapsule (101) shown below | 25.00 g |
| Methyl ethyl ketone | 35.00 g |
| 1-Methoxy-2-propanol | 35.00 g |

(Preparation of Dispersion of Microcapsule (101))

As an oil phase component, 10 g of adduct of trimethylolpropane and xylene diisocyanate (Takenate D-110N, produced by Mitsui Takeda Chemicals, Inc.), 4.15 g of isocyanuric acid EO-modified diacrylate (Aronics M-215, produced by To a Gosei Co., Ltd.) and 0.1 g of Pionin A-41C (produced by Takemoto Oil & Fat Co., Ltd.) were dissolved in 17 g of ethyl acetate. As an aqueous phase component, 40 g of an aqueous 4% by weight PVA-205 solution was prepared. The oil phase component and the aqueous phase component were mixed and emulsified using a homogenizer at 12,000 rpm for 10 minutes. The resulting emulsion was added to 25 g of distilled water and the mixture was stirred at room temperature for 30 minutes and then stirred at 40° C. for 3 hours. The thus-obtained microcapsule solution was diluted with distilled water to have a solid content concentration of 20% by weight to prepare Dispersion of Microcapsule (101). The average particle diameter of the microcapsule was 0.25 μn.

Lithographic printing plate precursors (158) to (168) were evaluated in the same manner as in Example 101. The results are shown in Table 5.

TABLE 5

| | Lithographic Printing Plate Precursor | Binder Polymer | Relative Developing Property | | Relative Sensitivity | | Relative Printing Durability | |
|---|---|---|---|---|---|---|---|---|
| | | | Without Heating | With Heating | Without Heating | With Heating | Without Heating | With Heating |
| Example 140 | (158) | B-30 | 1.8 | 1.8 | 2.2 | 2.8 | 2.1 | 2.8 |
| Example 141 | (159) | B-35 | 1.8 | 1.8 | 2.3 | 2.9 | 2.2 | 3.0 |
| Example 142 | (160) | B-36 | 1.5 | 1.5 | 2.2 | 2.8 | 1.9 | 2.5 |
| Example 143 | (161) | B-42 | 1.7 | 1.7 | 2.0 | 2.6 | 2.1 | 2.7 |
| Example 144 | (162) | B-55 | 1.6 | 1.6 | 1.9 | 2.5 | 2.0 | 2.6 |
| Example 145 | (163) | B-59 | 1.6 | 1.6 | 1.8 | 2.4 | 1.9 | 2.5 |
| Example 146 | (164) | B-69 | 1.8 | 1.8 | 2.3 | 3.0 | 2.3 | 2.9 |
| Example 147 | (165) | B-95 | 1.8 | 1.8 | 2.3 | 3.0 | 2.3 | 3.0 |
| Comparative Example 119 | (166) | C-1 | 1.0 | 1.0 | 1.0 | 1.0 | 1.0 | 1.0 |
| Comparative Example 120 | (167) | C-2 | 1.1 | 1.1 | 1.1 | 1.2 | 1.0 | 1.0 |
| Comparative Example 121 | (168) | C-3 | 1.1 | 1.1 | 1.5 | 1.7 | 1.5 | 2.0 |

Binder Polymer:

(C-1)

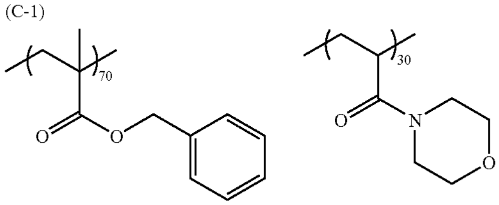

(C-2)

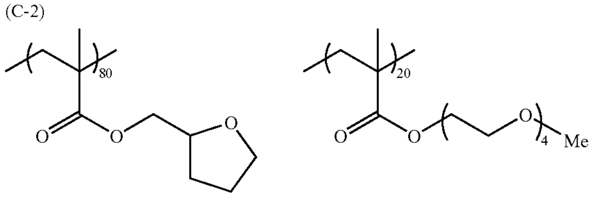

(C-3)

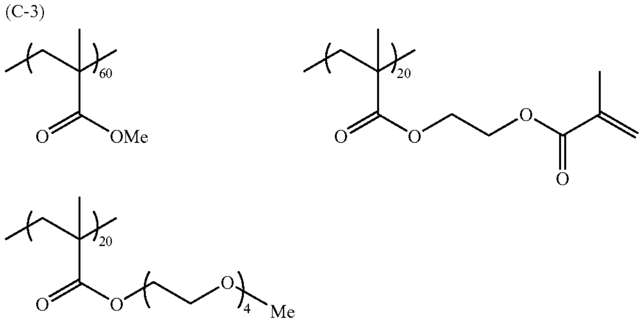

Examples 148 to 152 and Comparative Examples 122 to 123

<Preparation of Lithographic Printing Plate Precursors (169) to (175)>

Lithographic printing plate precursors (169) to (175) were prepared in the same manner as in the preparation of Lithographic Printing Plate Precursor (101) except for changing Coating Solution 1 for Photosensitive Layer to Coating Solution 5 for Photosensitive Layer having the composition shown below, changing Coating Solution 1 for Protective Layer to Coating Solution 2 for Protective Layer and changing the dry coating amount of the protective layer to 0.2 g/m$^2$, respectively.

| (Coating Solution 5 for Photosensitive Layer) | |
|---|---|
| Binder polymer shown in Table 6 below | 0.54 g |
| Polymerizable Compound (102) shown above | 0.45 g |
| Sensitizing Dye (101) shown above | 0.06 g |
| Polymerization Initiator (101) shown above | 0.18 g |
| Co-sensitizer (101) shown above | 0.07 g |
| Dispersion (101) of ϵ-phthalocyanine pigment described above | 0.40 g |
| Thermal polymerization inhibitor N-nitrosophenylhydroxylamine aluminum salt | 0.01 g |
| Fluorine-Based Surfactant (101) shown above | 0.001 g |
| 1-Methoxy-2-propanol | 3.5 g |
| Methyl ethyl ketone | 8.0 g |

| (Coating Solution 2 for Protective Layer) | |
|---|---|
| Dispersion of Mica (101) shown below | 13.00 g |
| Polyvinyl alcohol (saponification degree: 98% by mole; polymerization degree: 500) | 1.30 g |
| Sodium 2-ethylhexylsulfosuccinate | 0.20 g |
| Vinyl pyrrolidone/vinyl acetate (1/1) copolymer (molecular weight: 70,000) | 0.05 g |
| Surfactant (Emalex 710, produced by Nihon-Emulsion Co., Ltd.) | 0.05 g |
| Water | 133.00 g |

(Preparation of Dispersion of Mica (101))

In 368 g of water was added 32 g of synthetic mica (SOMASIF ME-100, produced by CO-OP Chemical Co., Ltd; aspect ratio: 1,000 or more) and dispersed using a homogenizer until the average particle diameter (measured by a laser scattering method) became 0.5 μM to obtain Dispersion of Mica (101).

Lithographic printing plate precursors (169) to (175) were evaluated in the same manner as in Example 101. The results are shown in Table 6.

TABLE 6

| | Lithographic Printing Plate Precursor | Binder Polymer | Relative Developing Property Without Heating | Relative Developing Property With Heating | Relative Sensitivity Without Heating | Relative Sensitivity With Heating | Relative Printing Durability Without Heating | Relative Printing Durability With Heating |
|---|---|---|---|---|---|---|---|---|
| Example 148 | (169) | B-178 | 1.5 | 1.5 | 1.5 | 2.0 | 1.5 | 2.0 |
| Example 149 | (170) | B-179 | 1.5 | 1.5 | 1.7 | 2.1 | 1.6 | 2.2 |
| Example 150 | (171) | B-180 | 1.6 | 1.7 | 2.0 | 2.5 | 1.9 | 2.5 |
| Example 151 | (172) | B-181 | 1.7 | 1.7 | 2.0 | 2.6 | 2.1 | 2.7 |
| Example 152 | (173) | B-182 | 1.8 | 1.7 | 2.2 | 2.8 | 2.2 | 2.9 |
| Comparative Example 122 | (174) | C-4 | 1.0 | 1.0 | 1.0 | 1.0 | 1.0 | 1.0 |
| Comparative Example 123 | (175) | C-5 | 0.9 | 0.9 | 1.0 | 0.9 | 1.0 | 0.9 |

Binder Polymer:

(C-4)

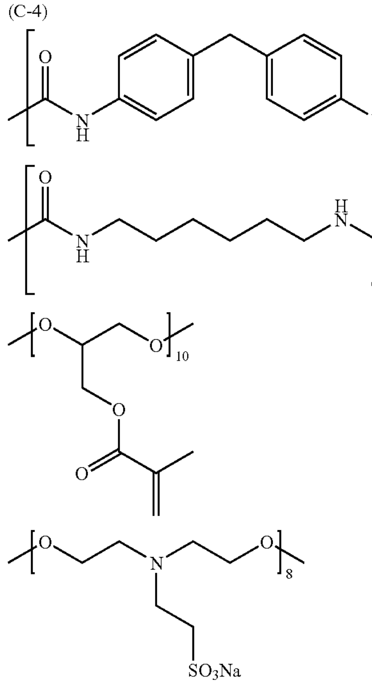

TABLE 6-continued

| Lithographic Printing Plate Precursor | Binder Polymer | Relative Developing Property Without Heating | Relative Developing Property With Heating | Relative Sensitivity Without Heating | Relative Sensitivity With Heating | Relative Printing Durability Without Heating | Relative Printing Durability With Heating |
|---|---|---|---|---|---|---|---|

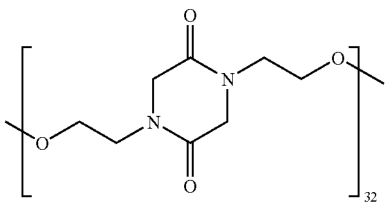

(C-5)

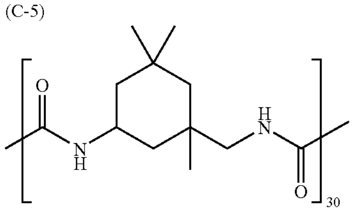

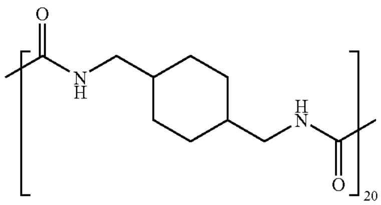

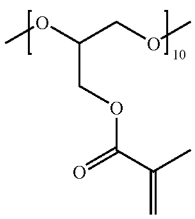

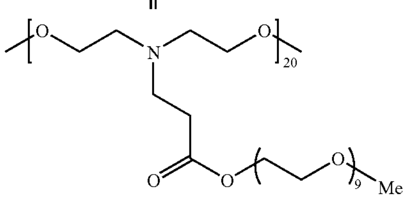

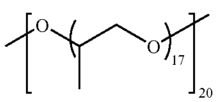

Examples 153 to 160 and Comparative Examples 124 to 126

<Preparation of Lithographic Printing Plate Precursors (176) to (186)>

(Preparation of Aluminum Support 3)

An aluminum plate of JIS A 1050 having a thickness of 0.3 mm was subjected to surface treatment by performing steps (a) to (k) shown below in this order.

(a) Mechanical Surface Roughening Treatment

Mechanical surface roughening of the aluminum plate was conducted by means of rotating roller-form nylon brushes while supplying a suspension of an abrasive (silica sand) in water having specific gravity of 1.12 as an abrasion slurry solution to the surface of the aluminium plate. The average particle size of the abrasive was 8 μm and the maximum particle size was 50 μm. The material of the nylon brush was 6-10 nylon, and the brush has a bristle length of 50 mm and a bristle diameter of 0.3 mm. The nylon brush was made by making holes in a stainless steel cylinder having a diameter of 300 mm and densely filling the brush bristles. Three of the rotating nylon brushes were used. Two supporting rollers (each having a diameter of 200 mm) provided under the brush rollers were spaced 300 mm. The brush rollers were pressed against the aluminum plate till the load applied to a driving motor for rotating the brush became 7 kw greater than the load before pressing the brush rollers against the aluminum plate. The rotating direction of the brushes was the same as the moving direction of the aluminum plate. The rotation number of the brushes was 200 rpm.

(b) Alkali Etching Treatment

Etching treatment of the aluminum plate was conducted by spraying an aqueous sodium hydroxide solution (sodium hydroxide concentration: 26% by weight, aluminum ion concentration: 6.5% by weight) having temperature of 70° C. to dissolve the aluminum plate in an amount of 6 g/$m^2$, followed by washing by spraying well water.

(c) Desmut Treatment

Desmut treatment of the aluminum plate was conducted by spraying an aqueous 1% by weight nitric acid solution (containing 0.5% by weight of aluminum ion) having temperature of 30° C., followed by washing with water by spraying. The aqueous nitric acid solution used for the desmut treatment was a waste solution from the step of (d) electrochemical surface roughening treatment described below.

(d) Electrochemical Surface Roughening Treatment

Electrochemical surface roughening treatment of the aluminum plate was continuously conducted by applying 60 Hz alternating current voltage. The electrolytic solution used was an aqueous solution containing 10.5 g/liter of nitric acid (containing 5 g/liter of aluminum ion) and the solution temperature was 50° C. The electrochemical surface roughening treatment was conducted using an alternating current source, which provided a trapezoidal rectangular wave alternating current where time (TP) for reaching the current to its peak from zero was 0.8 msec and a duty ratio was 1:1, and using a carbon electrode as a counter electrode. A ferrite was used as an auxiliary anode. The electrolytic cell used was a radial cell type. The current density was 30 A/$dm^2$ at the peak current, and the electric amount was 220 C/$dm^2$ in terms of the total electric quantity during the aluminum plate functioning as an anode. To the auxiliary anode, 5% of the current from the electric source was divided. Subsequently, the plate was washed by spraying well water.

(e) Alkali Etching Treatment

Etching treatment of the aluminum plate was conducted at 32° C. by spraying an aqueous solution having a sodium hydroxide concentration of 26% by weight and an aluminum ion concentration of 6.5% by weight to remove the smut component mainly comprising aluminum hydroxide formed in the precedent step of (d) electrochemical surface roughening treatment and to dissolve an edge portion of the pit formed thereby smoothening the edge portion. Subsequently, the plate was washed by spraying well water. The amount of etching was 3.5 g/$m^2$.

(f) Desmut Treatment

Desmut treatment of the aluminum plate was conducted by spraying an aqueous 15% by weight nitric acid solution (containing 4.5% by weight of aluminum ion) having temperature of 30° C., followed by washing by spraying well water. The aqueous nitric acid solution used for the desmut treatment was a waste solution from the step of (d) electrochemical surface roughening treatment described above.

(g) Electrochemical Surface Roughening Treatment

Electrochemical surface roughening treatment of the aluminum plate was continuously conducted by applying 60 Hz alternating current voltage. The electrolytic solution used was an aqueous solution containing 7.5 g/liter of hydrochloric acid (containing 5 g/liter of aluminum ion) and the solution temperature was 35° C. The electrochemical source roughening treatment was conducted using an alternating current source which provided a rectangular wave alternating current and using a carbon electrode as a counter electrode. A ferrite was used as an auxiliary anode. The electrolytic cell used was a Vial cell type. The current density was 25 A/$dm^2$ at the peak current, and the electric amount was 50 C/$dm^2$ in terms of the total electric quantity during the aluminum plate functioning as an anode. Subsequently, the plate was washed by spraying well water.

(h) Alkali Etching Treatment

Etching treatment of the aluminum plate was conducted at 32° C. by spraying an aqueous solution having a sodium hydroxide concentration of 26% by weight and an aluminum ion concentration of 6.5% by weight to dissolve the aluminum plate in an amount of 0.10 g/$m^2$. Thus, the smut component mainly comprising aluminum hydroxide formed in the precedent step of (g) electrochemical surface roughening treatment was removed and an edge portion of the pit formed was dissolved to smoothen the edge portion. Subsequently, the plate was washed by spraying well water.

(i) Desmut Treatment

Desmut treatment of the aluminum plate was conducted by spraying an aqueous 25% by weight sulfuric acid solution (containing 0.5% by weight of aluminum ion) having temperate of 60° C., followed by washing by spraying well water.

(h) Anodizing Treatment

Anodizing treatment of the aluminum plate was conducted using sic acid as an electrolytic solution. The electrolytic solution has sulfuric acid concentration of 170 g/liter (containing 0.5% by weight of aluminum ion) and temperature of 43° C. Subsequently, the plate was washed by spraying well water. The c t density was about 30 A/$dm^2$. The amount of the final anodic oxide film was 2.7 g/$m^2$.

(k) Alkali Metal Silicate Treatment

Alkali metal silicate treatment (silicate treatment) of the aluminum plate was conducted by immersing the plate in a treatment bath containing an aqueous 1% by weight sodium silicate No. 3 solution having temperature of 30° C. for 10 seconds. Subsequently, the plate was washed by spraying well water, whereby Aluminum support 3 was prepared. The adhesion amount of the silicate was 3.6 mg/$m^2$.

(Formation of Undercoat Layer)

On Aluminum support 3 described above was coated a methanol solution of a copolymer (weight average molecular weight 35,000) shown as Polymer Compound (101) below using a wire bar and dried at 80° C. for 60 seconds to prepare an undercoat layer. The coating amount of the undercoat layer was 0.01 g/$m^2$.

Polymer Compound (101):

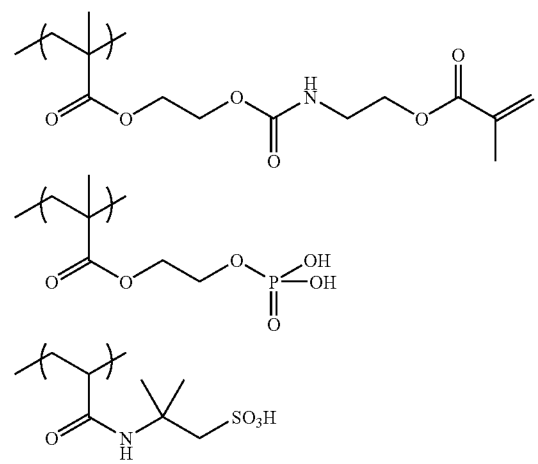

(Formation of Photosensitive Layer)

On the aluminum support having the undercoat layer prepared above, Coating Solution 6 for Photosensitive Layer having the composition shown below was coated using a bar and dried in an oven at 70° C. for 60 seconds to form a photosensitive layer having a dry coating amount of 1.0 g/m$^2$, thereby preparing Lithographic Printing Plate Precursors (176) to (186), respectively.

| (Coating Solution 6 for Photosensitive Layer) | |
|---|---|
| Binder polymer shown in Table 7 below | 0.50 g |
| Polymerizable compound | 1.18 g |
| Isocyanuric acid EO-modified triacrylate (NK Ester M-315, produced by Shin-Nakamura Chemical Co., Ltd.) | |
| Polymerization Initiator (102) shown below | 0.20 g |
| Infrared Absorbing Agent(101) shown below | 0.05 g |
| Fluorine-Based Surfactant (102) shown below | 0.05 g |
| 1-Methoxy-2-propanol | 18.00 g |

Polymerization Initiator (102)

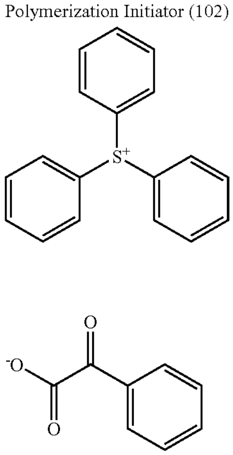

Infrared Absorbing Agent (101)

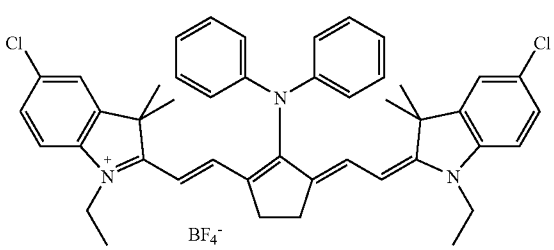

Fluorine-Based Surfactant (102)

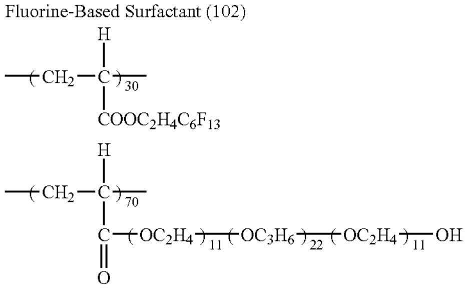

(1) Exposure and Printing

Each of the lithographic printing plate precursors was exposed by Trendsetter 3244VX, produced by Creo Co., equipped with a water-cooled 40 W infrared semiconductor laser under the conditions of output of 9 W, a rotational number of an outer surface drum of 210 rpm and resolution of 2,400 dpi. The exposed lithographic printing plate precursor was mounted without conducting development processing on a cylinder of a printing machine (SOR-M, produced by Heidelberg Co.). After supplying dampening water (EU-3 (etching solution, produced by Fuji Film Co., Ltd.))/water/isopropyl alcohol=1/89/10 (by volume ratio)) and TRANS-G(N) black ink (produced by Dai-Nippon Ink & Chemicals, Inc,), printing was performed at a printing speed of 6,000 sheets per hour.

(2) Evaluation

<Developing Property>

A number of printing papers required until the on-machine development of the unexposed area of the photosensitive layer on the printing machine was completed to reach a state where the ink was not transferred to the printing paper in the non-image area was measured to evaluate the on-machine development property. The developing property was relatively evaluated according to the formula shown below using Comparative Example 124 as a criterion (1.0). As the value of relative developing property increase the developing property becomes better and the performance is more preferable.

Relative developing property=(Number of sheets of on-machine development of criterion lithographic printing plate precursor)/(Number of sheets of on-machine development of subject lithographic printing plate precursor)

<Sensitivity>

After performing printing of 100 sheets as described above and confirming that a printed material free from ink stain in the non-image area was obtained, 500 sheets were continuously printed. The exposure amount for causing no unevenness in the ink density of the image area on the 600th printed material was determined as the sensitivity. The evaluation of sensitivity was indicated as a relative sensitivity defined as below using Comparative Example 124 as a criterion (1.0). As the value of relative sensitivity increases, the sensitivity becomes higher and the performance is more preferable.

Relative sensitivity=(Sensitivity of criterion lithographic printing plate precursor)/(Sensitivity of subject lithographic printing plate precursor)

<Printing Durability>

As increase in the number of printing sheets, the photosensitive layer was gradually abraded to cause decrease in the ink receptivity, resulting in decrease of ink density on printing paper. With reset to the lithographic printing plate obtained by the exposure in the same exposure amount a number of printed materials obtained until the ink density (reflection density) decreased by 0.1 from that at the initiation of printing was determined to evaluate the printing durability. The evaluation of printing durability was indicated as a relative printing durability defined as below using Comparative Example 124 as a criterion (1.0). As the value of relative printing durability increases, the printing durability becomes higher.

Relative printing durability=(Printing durability of subject lithographic printing plate precursor)/(Printing durability of criterion lithographic printing plate precursor)

TABLE 7
| | Lithographic Printing Plate Precursor | Binder Polymer | Relative Developing Property | Relative Sensitivity | Relative Printing Durability |
|---|---|---|---|---|---|
| Example 153 | (176) | B-4 | 1.3 | 1.6 | 1.7 |
| Example 154 | (177) | B-21 | 1.5 | 1.8 | 1.9 |
| Example 155 | (178) | B-25 | 1.3 | 2.2 | 2.0 |
| Example 156 | (179) | B-31 | 1.7 | 2.0 | 2.1 |
| Example 157 | (180) | B-32 | 1.6 | 2.1 | 2.2 |
| Example 158 | (181) | B-40 | 1.6 | 2.0 | 2.0 |
| Example 159 | (182) | B-84 | 1.8 | 2.1 | 2.2 |
| Example 160 | (183) | B-104 | 1.8 | 2.2 | 2.2 |
| Comparative Example 124 | (184) | C-6 | 1.0 | 1.0 | 1.0 |
| Comparative Example 125 | (185) | C-7 | 0.9 | 1.1 | 1.1 |
| Comparative Example 126 | (186) | C-8 | 0.7 | 1.2 | 1.3 |
Binder Polymer:
(C-6)
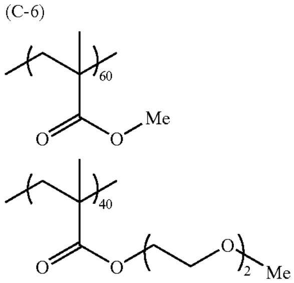
(C-7)
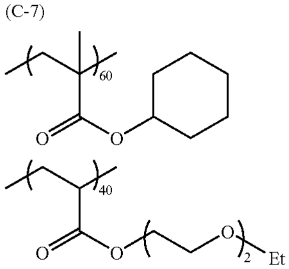
(C-8)
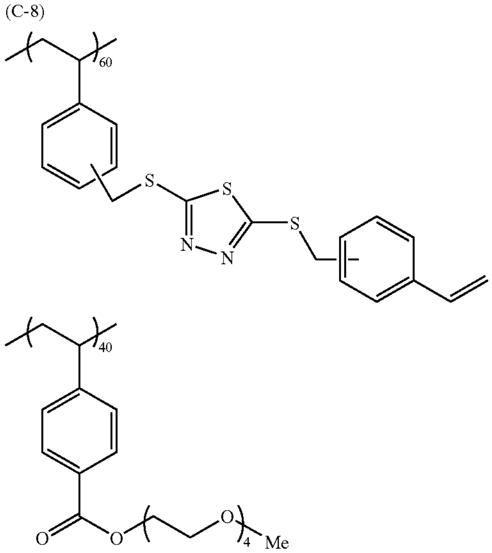

Examples 161 to 168 and Comparative Examples 127 to 129

<Preparation of Lithographic Printing Plate Precursors (187) to (197)>

On the same aluminum support having the undercoat layer as used in Lithographic printing plate precursor (176), a coating solution prepared by mixing Coating solution 7 for Photosensitive layer having the composition shown below with Solution of Microcapsule 102 shown below just before coating using a bar and dried in an oven at 100° C. for 60 seconds to prepare a photosensitive layer having a dry coating amount of 1.1 g/m$^2$.

| (Coating Solution 7 for Photosensitive Layer) | |
|---|---|
| Binder polymer shown in Table 8 below | 0.162 g |
| Polymerization Initiator (102) shown above | 0.160 g |
| Polymerization Initiator (103) shown below | 0.180 g |
| Infrared Absorbing Agent (102) shown below | 0.020 g |
| Polymerizable compound (Aronics M-215, produced by Toa Gosei Co., Ltd.) | 0.385 g |
| Fluorine-Based Surfactant (102) shown above | 0.044 g |
| Methyl ethyl ketone | 1.091 g |
| 1-Methoxy-2-propanol | 8.210 g |

Polymerization Initiator (103):

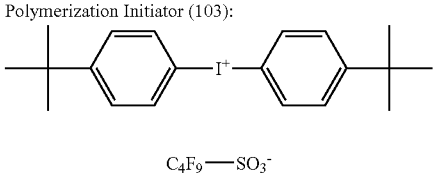

Infrared Absorbing Agent (102)

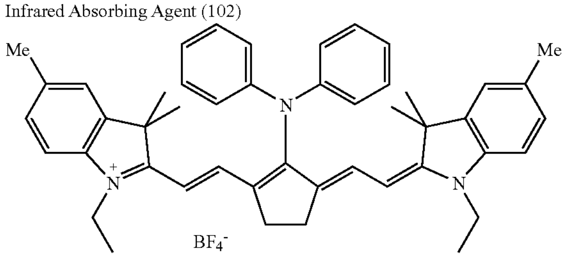

(Preparation of Solution of Microcapsule (102))

As an oil phase component, 10 g of adduct of trimethylolpropane and xylene diisocyanate Takenate D-110N, produced by Mitsui Takeda Chemicals, Inc., 75% by weight ethyl acetate solution), 6.00 g of Aronics SR-399 (produced by Toa Gosei Co., Ltd.) and 0.12 g of Pionin A-41C (produced by Takemoto Oil & Fat Co., Ltd.) were dissolved in 16.67 g of ethyl acetate. As an aqueous phase component, 37.5 g of an aqueous 4% by weight PVA-205 solution was prepared. The oil phase component and the aqueous phase component were mixed and emulsified using a homogenizer at 12,000 rpm for 10 minutes. The resulting emulsion was added to 25 g of distilled water and the mixture was sired at room temperature for 30 minutes and then stirred at 40° C. for 2 hours. The thus-obtained microcapsule solution was diluted with distilled water to have a solid content concentration of 15% by weight to prepare Solution of Microcapsule (102). The average particle diameter of the microcapsule was 0.2 μm Coating Solution 3 for Protective Layer having the composition shown below vas coated on the photosensitive layer and dried in an oven at 125° C. for 75 seconds to form a protective layer having a dry coating amount of 0.15 g/m$^2$, hereby preparing Lithographic printing plate precursors (187) to (197), respectively.

| (Coating Solution 3 for Protective Layer) | |
|---|---|
| Polyvinyl alcohol (aqueous 6% by weight solution) (PVA 105, produced by Kuraray Co., Ltd., saponification degree: 98.5% by mole; polymerization degree: 500) | 2.24 g |
| Polyvinyl pyrrolidone (K 30) | 0.0053 g |
| Surfactant (aqueous 1% by weight solution) (Emalex 710, produced by Kao Corp.) | 2.15 g |
| Scale-like synthetic mica (aqueous 3.4% by weight dispersion) (MEB 3L, produced by UNICOO Co., Ltd., average particle size: 1 to 5 μm) | 3.75 g |
| Distilled water | 10.60 g |

Lithographic printing plate precursors (187) to (197) were evaluated in the same manner as in Example 153. The results are shown in Table 8.

TABLE 8

| | Lithographic Printing Plate Precursor | Binder Polymer | Relative Developing Property | Relative Sensitivity | Relative Printing Durability |
|---|---|---|---|---|---|
| Example 161 | (187) | B-4 | 1.4 | 1.5 | 1.7 |
| Example 162 | (188) | B-21 | 1.6 | 1.9 | 1.9 |
| Example 163 | (189) | B-25 | 1.4 | 2.1 | 2.1 |
| Example 164 | (190) | B-31 | 1.7 | 2.1 | 2.1 |
| Example 165 | (191) | B-32 | 1.6 | 2.0 | 2.1 |
| Example 166 | (192) | B-40 | 1.6 | 1.9 | 2.0 |
| Example 167 | (193) | B-84 | 1.8 | 2.2 | 2.1 |
| Example 168 | (194) | B-104 | 1.8 | 2.2 | 2.4 |
| Comparative Example 127 | (195) | C-6 | 1.0 | 1.0 | 1.0 |
| Comparative Example 128 | (196) | C-7 | 0.9 | 1.1 | 1.1 |
| Comparative Example 129 | (197) | C-8 | 0.6 | 1.3 | 1.4 |

As is apparent form the results described above, the lithographic printing plate precursor according to the invention exhibits high developing property, high image-forming property and high printing durability. It is believed that these results are derived from the effect of the specific binder polymer according to the invention. The specific binder polymers used in the examples each has an acid value of 0.3 meq/g or less.

This application is based on Japanese Patent application JP 2006-350047, filed Dec. 26, 2006, and Japanese Patent application JP 2006-350048, filed Dec. 26, 2006, the entire contents of which are hereby incorporated by reference, the same as if fully set forth herein.

Although the invention has been described above in relation to preferred embodiments and modifications thereof, it will be understood by those skilled in the art that other variations and modifications can be effected in these preferred embodiments without departing from the scope and spirit of the invention.

What is claimed is:

1. A polymerizable composition comprising a binder polymer containing a functional group having a dipole moment of 4.5 debye or more, a radical polymerizable compound which is an addition polymerizable compound having at least one ethylenically unsaturated double bond, an infrared absorbing agent or a sensitizing dye having absorption in a wavelength of from 360 to 450 nm and a radical polymerization initiator, wherein the functional group having a dipole moment of 4.5 debye or more is selected from the following groups:

-continued
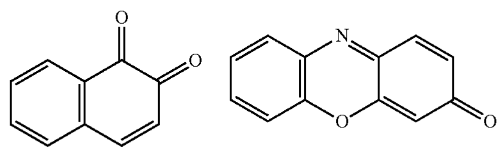
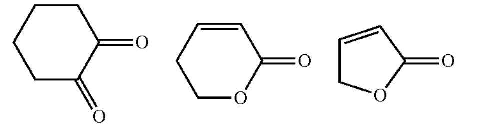
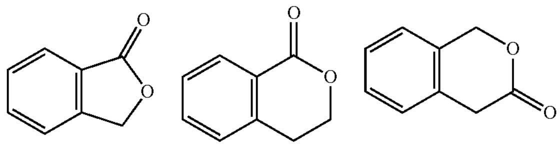
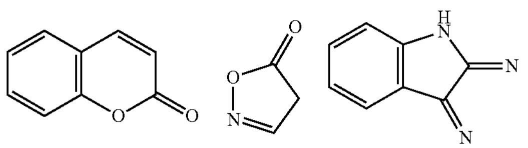
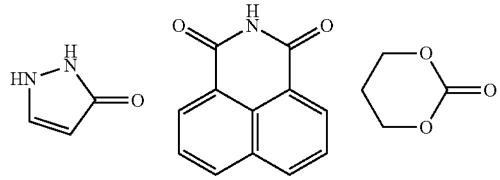
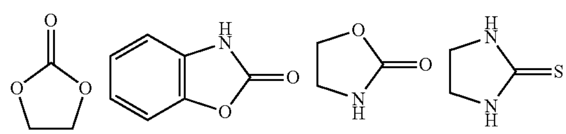
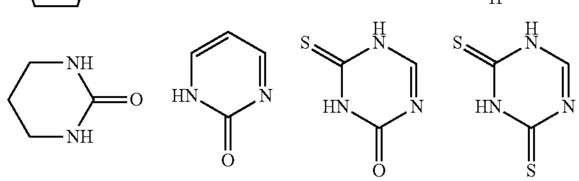
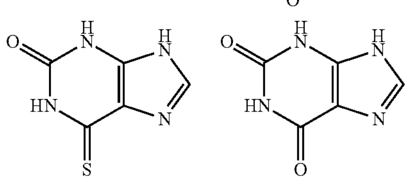
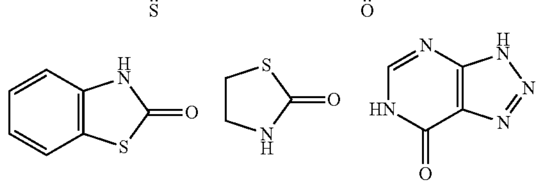
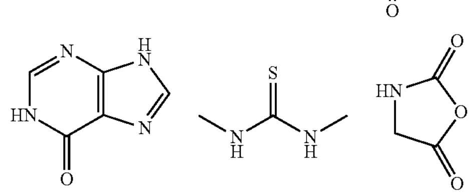
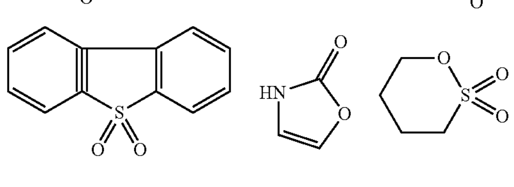
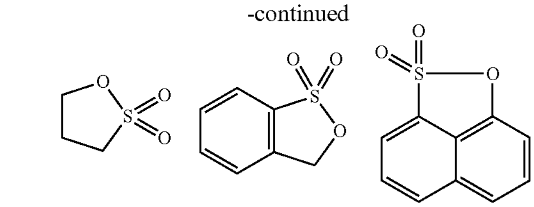
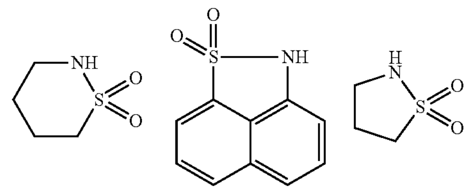
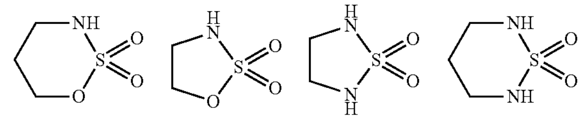
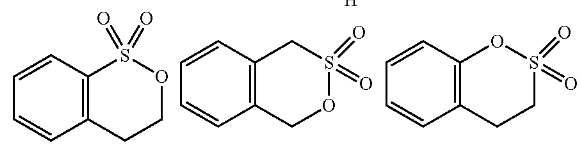
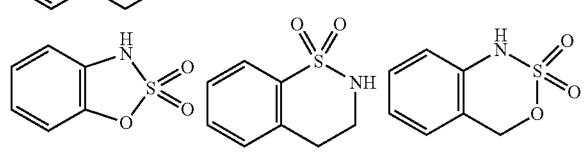
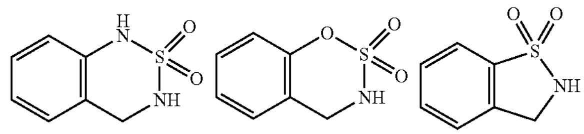
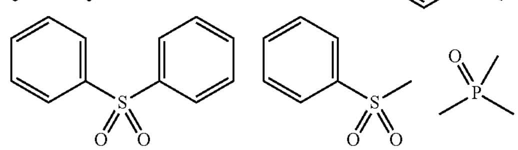
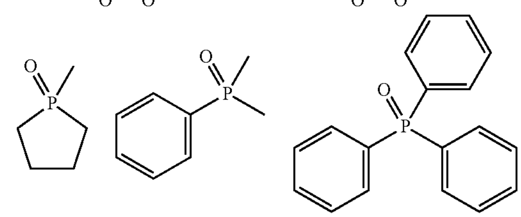
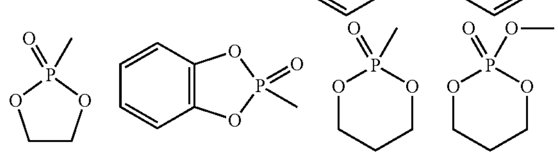
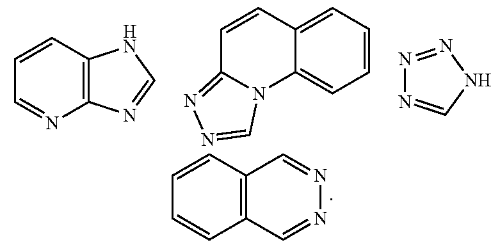
2. A polymerizable composition comprising a binder polymer containing a functional group having a dipole moment of 3.8 debye or more and being represented by the following formula (1), (2), (3) (4) or (5), a radical polymerizable compound which is an addition polymerizable compound having at least one ethylenically unsaturated double bond and a radical polymerization initiator:

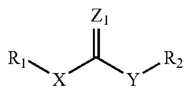

(1)

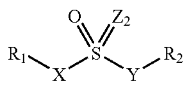

(2)

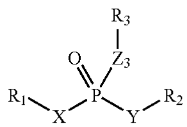

(3)

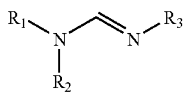

(4)

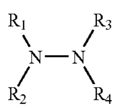

(5)

wherein X and Y each independently represents —C($R_5$)($R_6$)—, —C($R_5$)═, —O—, —S—, —N(R)$_5$— or —N═, $Z_1$ represents O or S, $Z_2$ represents 0 or a lone pair, $Z_3$ represents —C($R_5$)($R_6$)—, C($R_5$)═, —O—, —S—, —N($R_5$)— or —N═, $R_1$ to $R_6$ each independently represents a substituent comprising at least one atom selected from hydrogen, carbon, oxygen, nitrogen, sulfur, phosphorus, halogen and silicon or appropriate two of $R_1$ to $R_6$ may be combined with each other to form a ring, provided that at least one of $R_1$ to $R_6$ represents a divalent connecting group comprising at least one atom selected from hydrogen, carbon, oxygen, nitrogen, sulfur, phosphorus, halogen and silicon and connecting to a skeleton of the binder polymer, wherein the functional group having a dipole moment of 3.8 debye or more and being represented by the formula (1), (2), (3), (4) or (5) is selected from the following groups:

Groups of Formula (1):

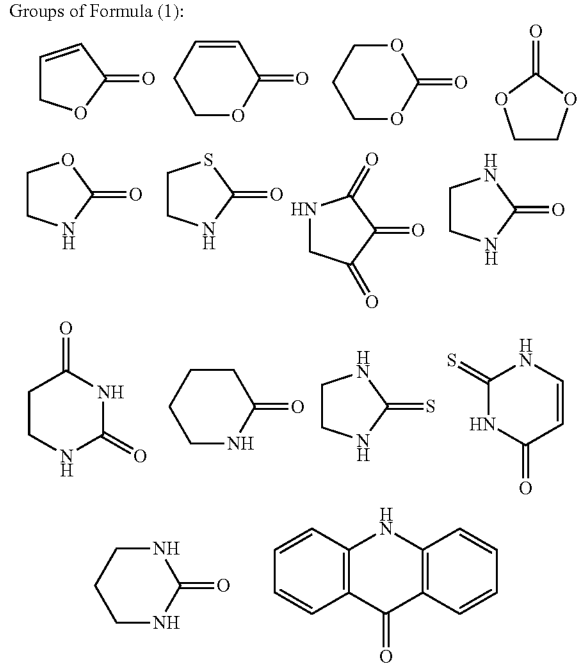

| Groups of Formula (2): | | | | | |
|---|---|---|---|---|---|
| 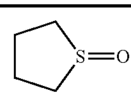 | 3.9 | 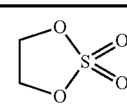 | 4.0 | 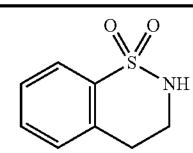 | 5.4 |
| 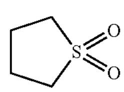 | 4.3 | 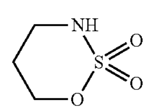 | 5.5 | 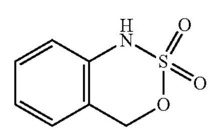 [SMILES: O=S1(=O)Nc2ccccc2CO1] | 5.6 |
| 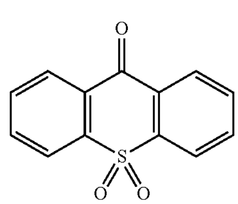 [SMILES: O=C1c2ccccc2S(=O)(=O)c2ccccc21] | 4.1 | 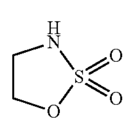 | 5.4 | 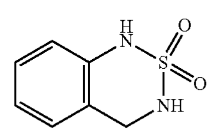 [SMILES: O=S1(=O)NCc2ccccc2N1] | 4.8 |
| 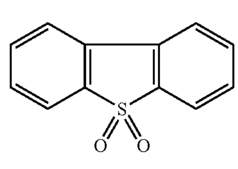 [SMILES: O=S1(=O)c2ccccc2-c2ccccc21] | 5.4 | 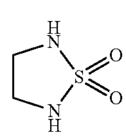 | 5.1 | 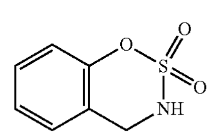 | 5.1 |

-continued
| Groups of Formula (2): | | | | | |
|---|---|---|---|---|---|
| 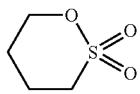 | 4.7 | 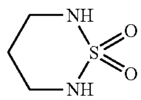 | 5.5 | 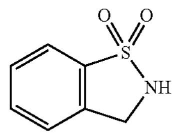 | 5.3 |
| 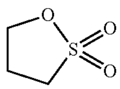 | 4.9 | 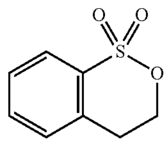 [SMILES: O=S1(=O)OCCc2ccccc21] | 6.3 | 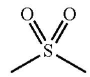 | 4.1 |
| 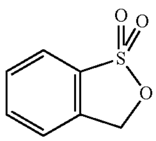 | 6.2 | 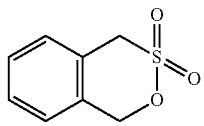 [SMILES: O=S1(=O)Cc2ccccc2CO1] | 5.3 | 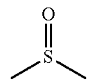 | 3.9 |
| 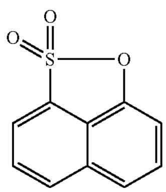 [SMILES: O=S1(=O)Oc2cccc3cccc1c23] | 5.8 | 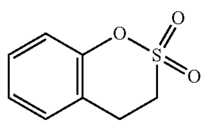 [SMILES: O=S1(=O)CCc2ccccc2O1] | 4.6 | 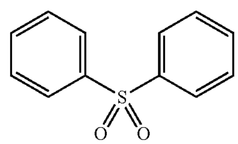 [SMILES: O=S(=O)(c1ccccc1)c1ccccc1] | 4.7 |
| 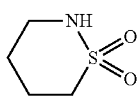 | 4.9 | 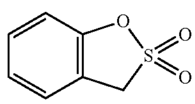 [SMILES: O=S1(=O)Cc2ccccc2O1] | 4.4 | 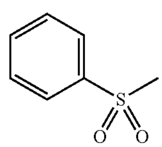 | 4.9 |
| 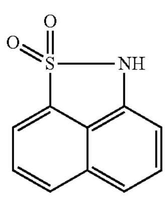 [SMILES: O=S1(=O)Nc2cccc3cccc1c23] | 4.7 | 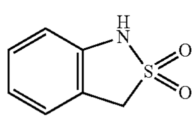 | 4.1 | 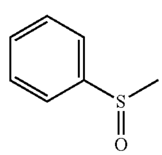 | 3.9 |
| 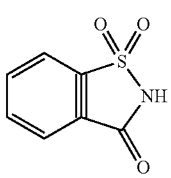 | 4.1 | 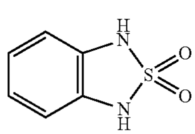 [SMILES: O=S1(=O)Nc2ccccc2N1] | 3.9 | | |
| 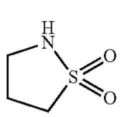 | 4.7 | 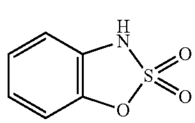 [SMILES: O=S1(=O)Nc2ccccc2O1] | 4.7 | | |

| Grops of Formulae (3) to (5): | | | | | |
|---|---|---|---|---|---|
| 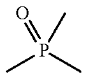 | 5.0 | 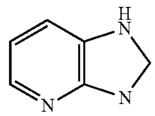 | 5.3 | 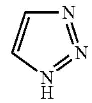 | 4.1 |
| 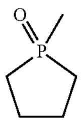 | 4.9 | 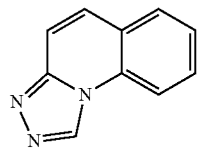 [SMILES: c1ccc2c(c1)ccc1nncn12] | 5.9 | 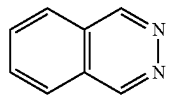 | 4.6 |
| 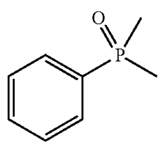 | 5.2 | 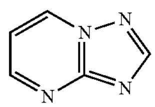 | 4.1 | | |
| 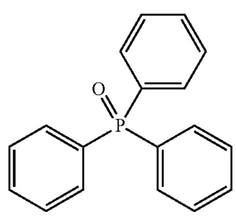 [SMILES: O=P(c1ccccc1)(c1ccccc1)c1ccccc1] | 5.3 | 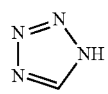 | 5.1 | | |
| 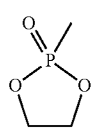 | 4.7 | | | | |
| 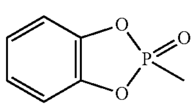 | 4.7 | | | | |
| 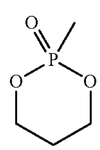 | 6.9 | | | | |
| 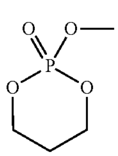 | 5.2 | | | | |
wherein the binder polymer has a repeating unit selected from the following formulae:
Units U-4, U-8, U-25, U-30, U-32, U-36, U-42, U-55, U-56, U-59 to U-104, U-106 to U-109, U-115, U-118, U-121, U-123, U-127 to U-130, U-132 to U-134, V-2 to V-11, V-13 to V-17, V-20 to V-22, V-24 to V-26, V-30, V-33 to V-36, V-38, V-40 and V-43 to V-45:

-continued
U-4
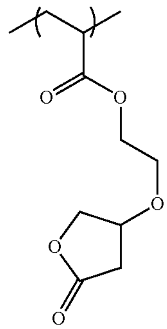
U-8
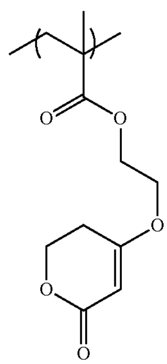
U-25
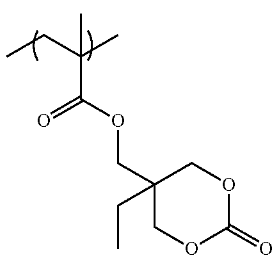
U-30
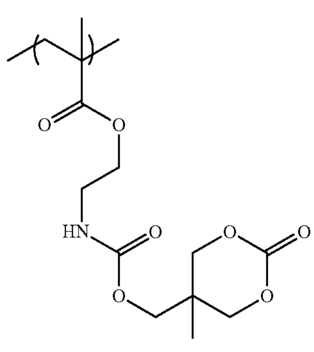
U-32
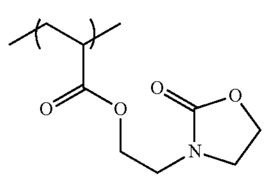
U-36
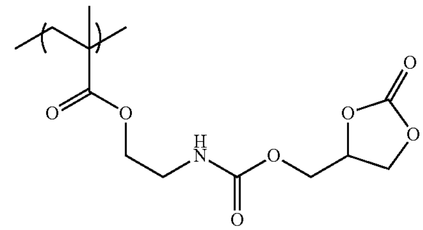
U-42
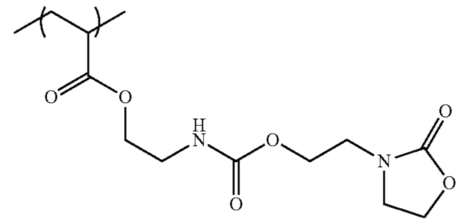
U-55
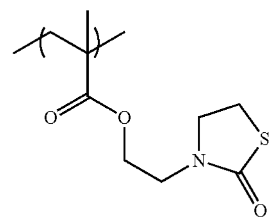
U-56
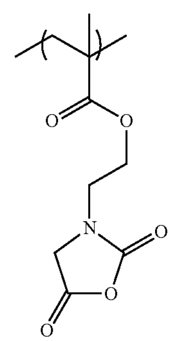
U-59
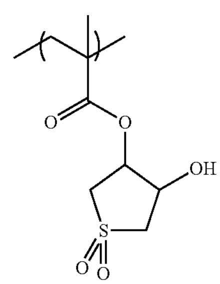
U-60
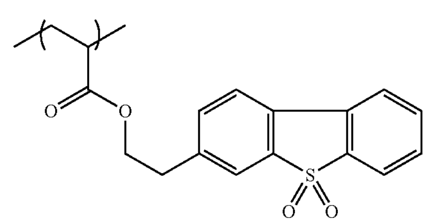

-continued
U-61
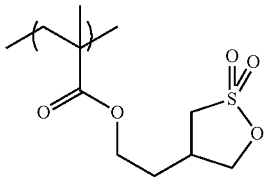
U-62
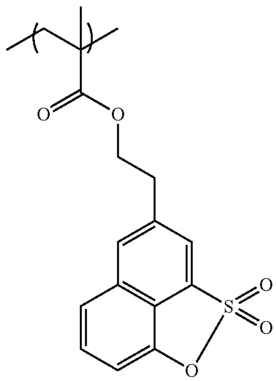
U-63
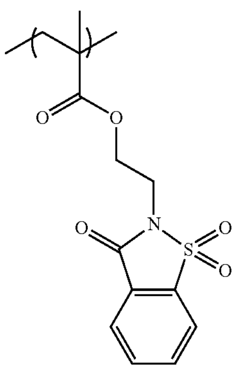
U-64
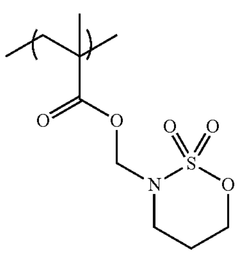
U-65
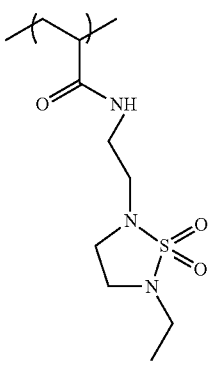
-continued
U-66
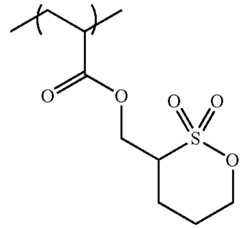
U-67
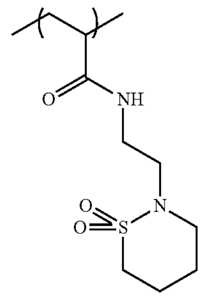
U-68
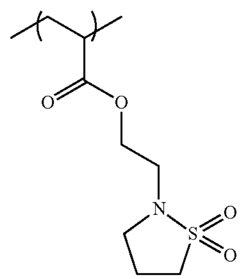
U-69
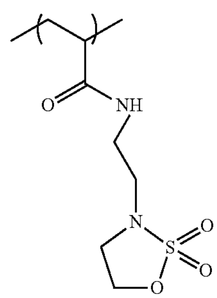
U-70
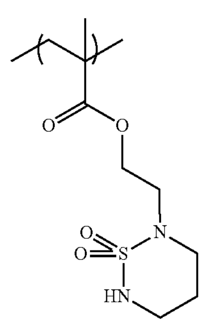

-continued
U-71
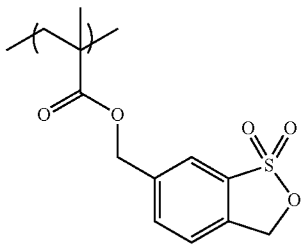
U-72
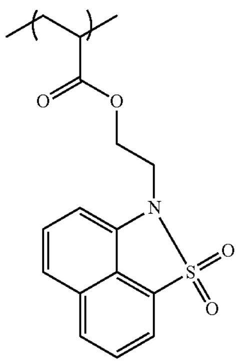
U-73
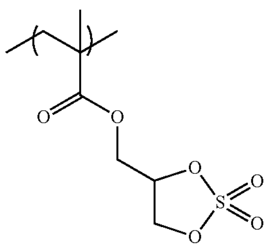
U-74
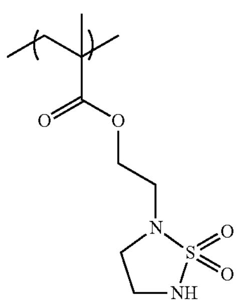
U-75
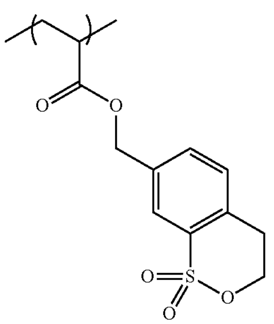
-continued
U-76
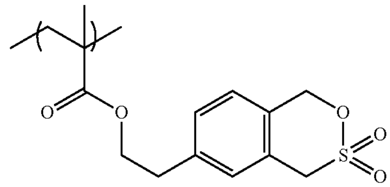
U-77
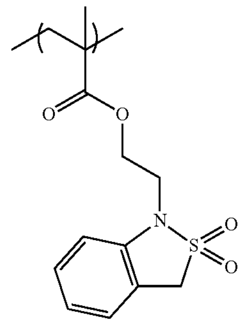
U-78
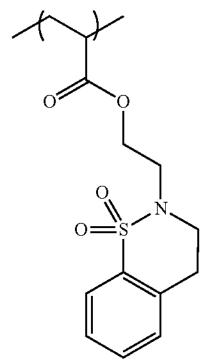
U-79
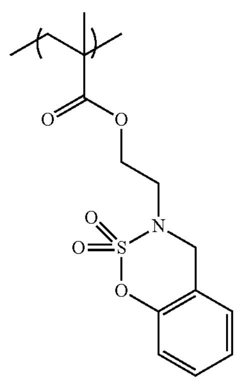
U-80
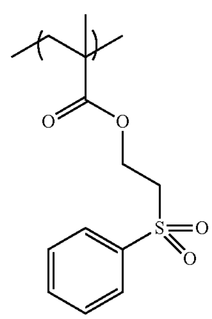

U-81
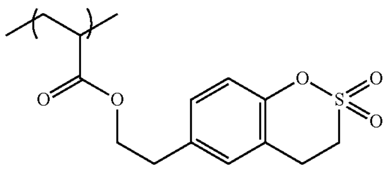
U-82
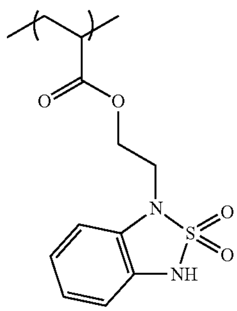
U-83
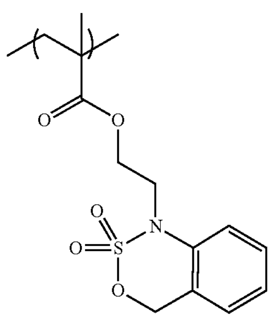
U-84
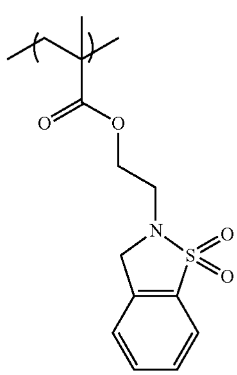
U-85
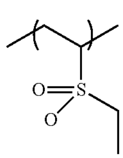
U-86
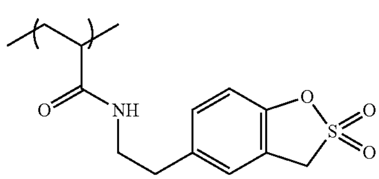
U-87
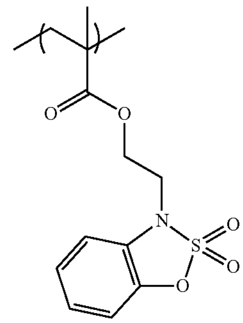
U-88
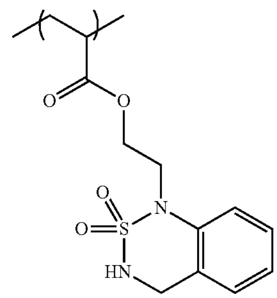
U-89
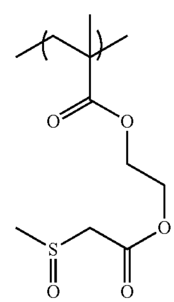
U-90
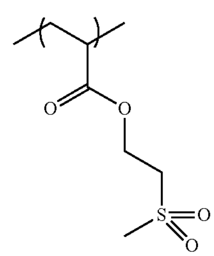
U-91
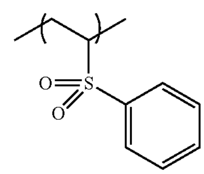

-continued
U-92
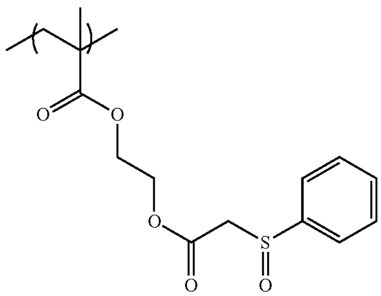
U-93
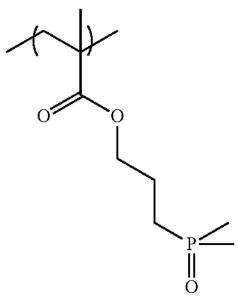
U-94
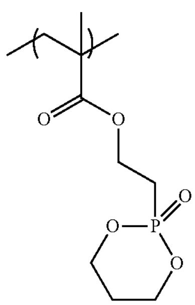
U-95
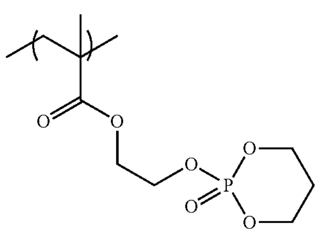
U-96
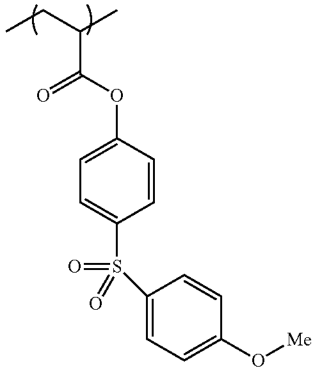
-continued
U-97
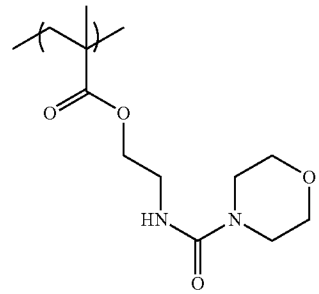
U-98
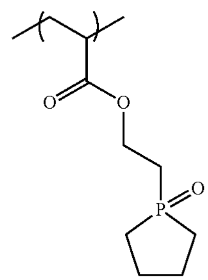
U-99
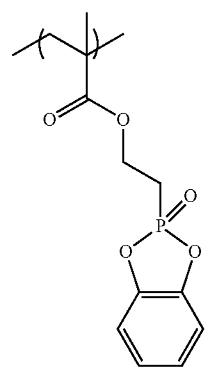
U-100
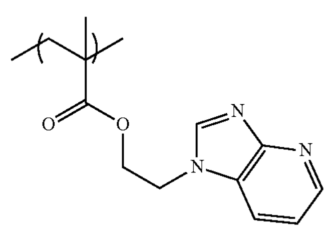
U-101
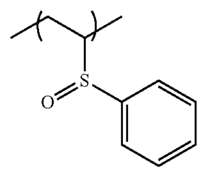

-continued
U-102
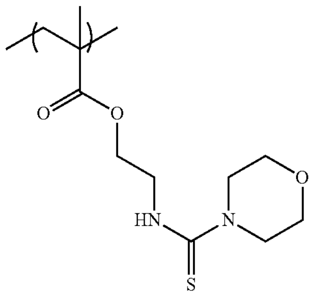
U-103
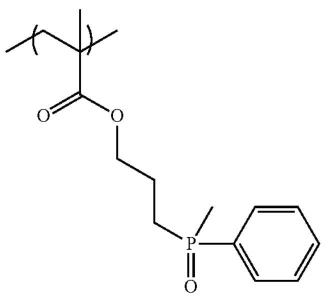
U-104
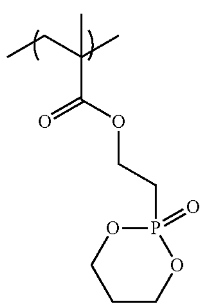
U-106
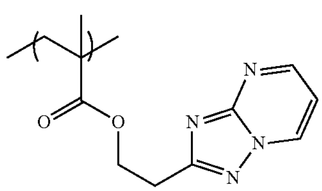
U-107
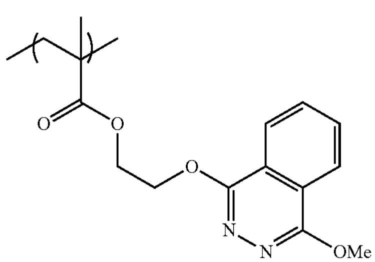
U-108
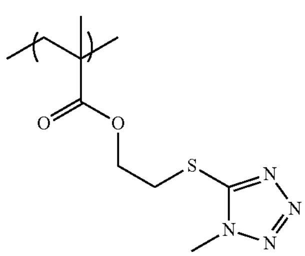
-continued
U-109
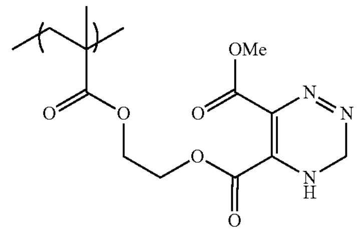
U-115
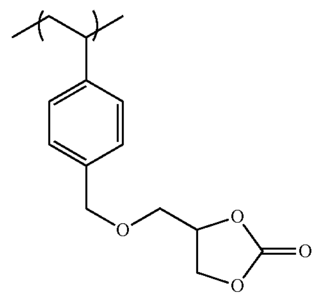
U-118
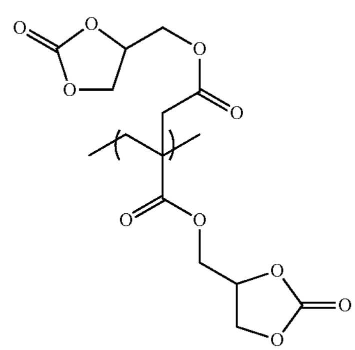
U-121
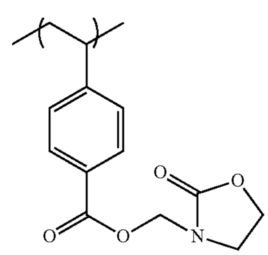
U-123
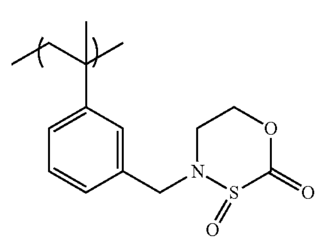

-continued
U-127
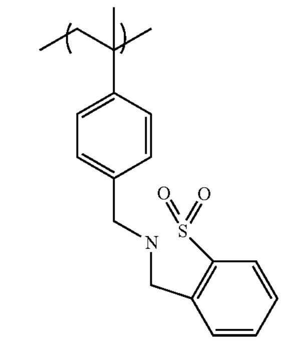
U-128
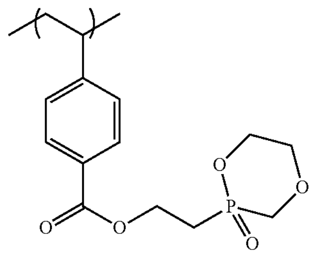
U-129
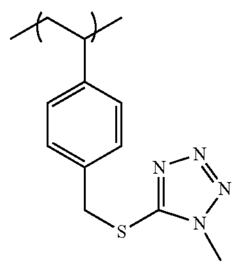
U-130
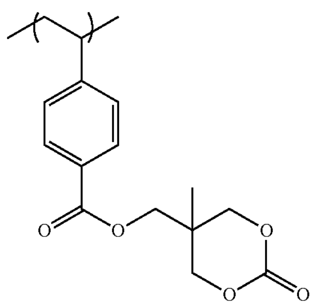
U-132
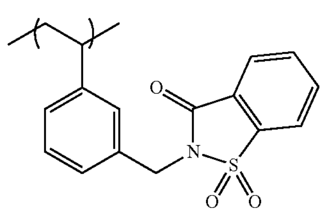
U-133
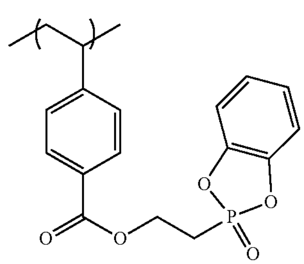
-continued
U-134
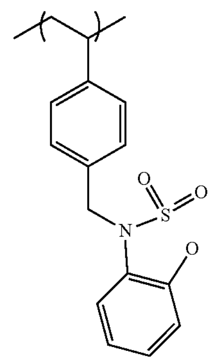
V-2
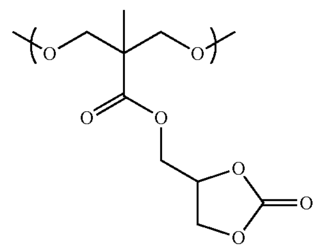
V-3
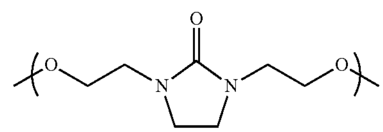
V-4
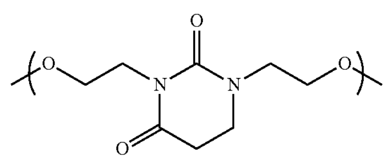
V-5
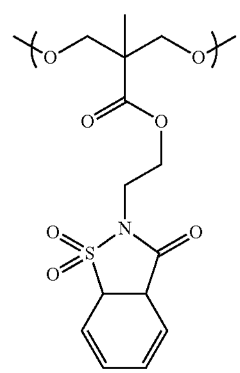
V-6
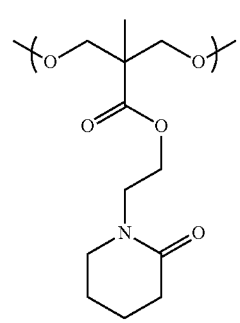

-continued
V-7
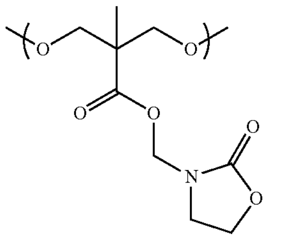
V-8
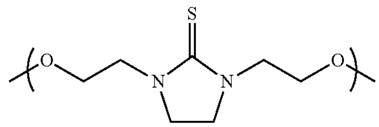
V-9
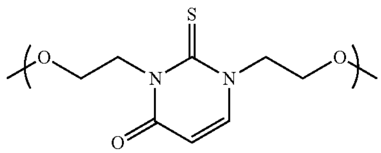
V-10
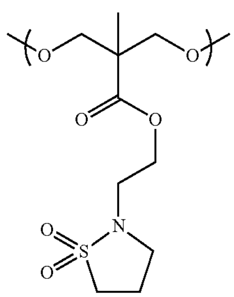
V-11
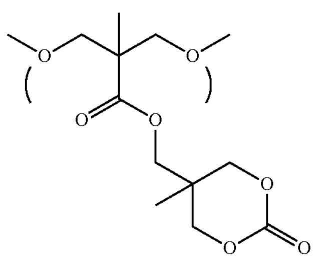
V-13
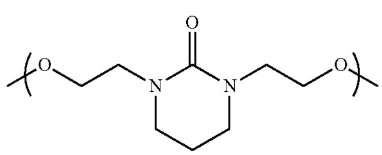
V-14
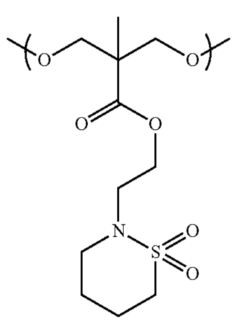
-continued
V-15
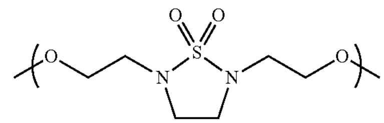
V-16
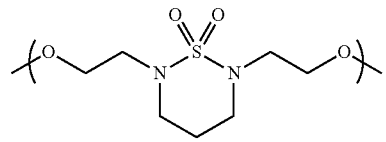
V-17
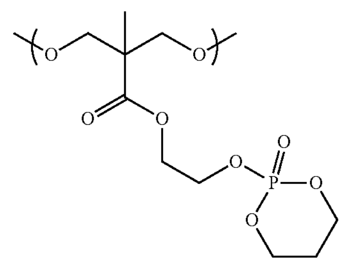
V-20
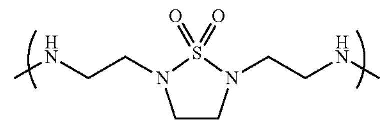
V-21
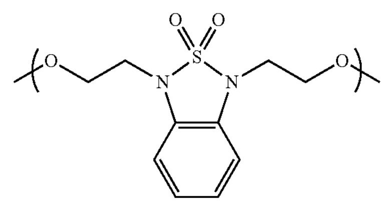
V-22
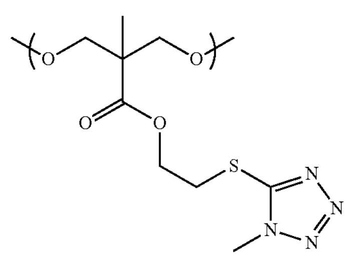
V-24
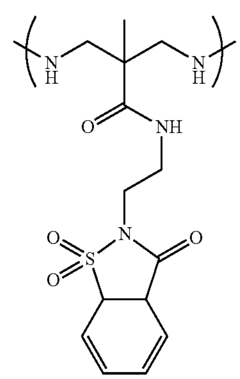

-continued
V-25
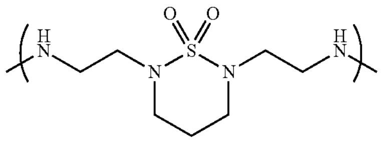
V-26
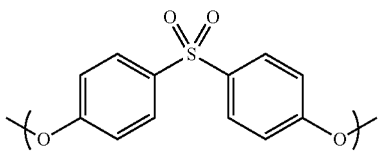
V-30
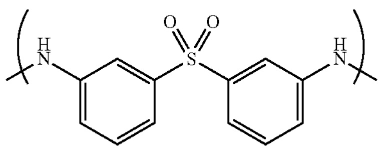
V-33
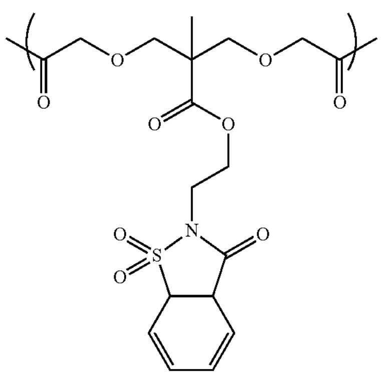
V-34
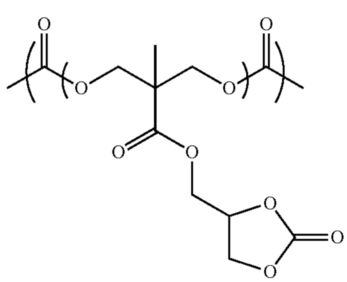
V-35
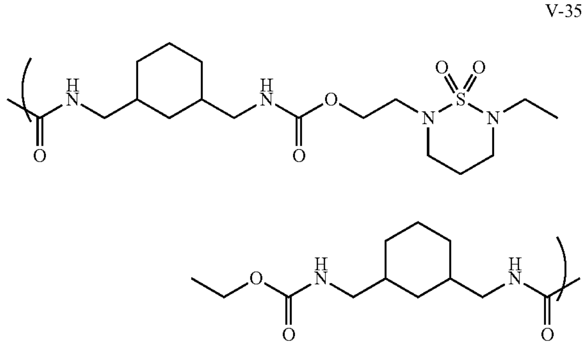
-continued
V-36
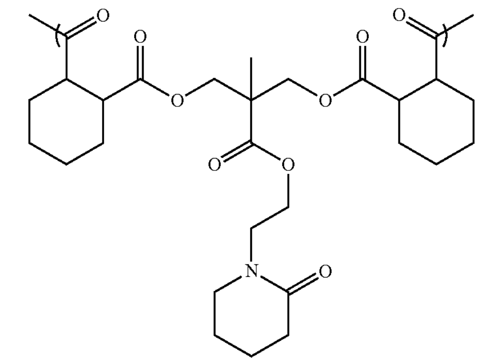
V-38
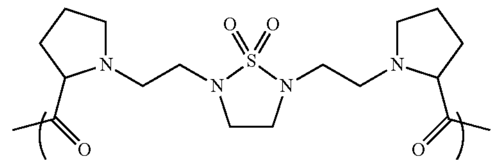
V-40
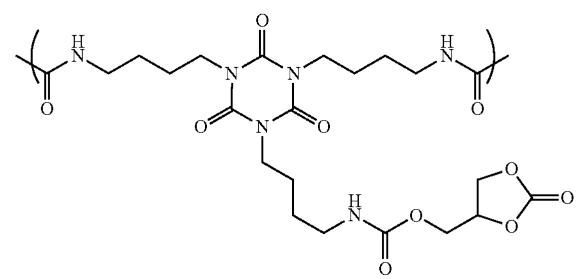
V-43
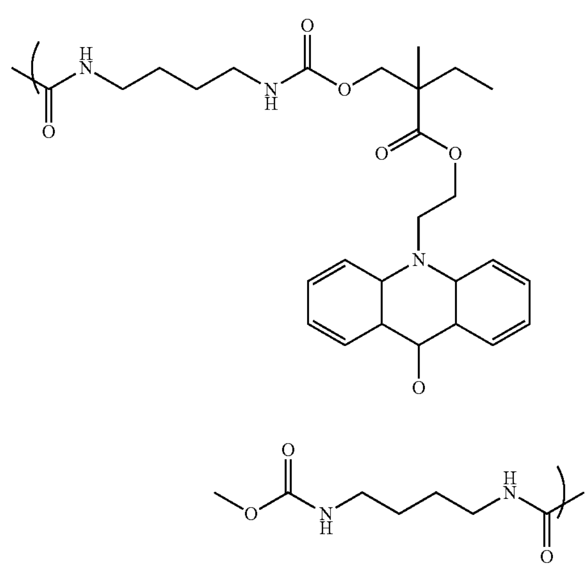

-continued

V-44

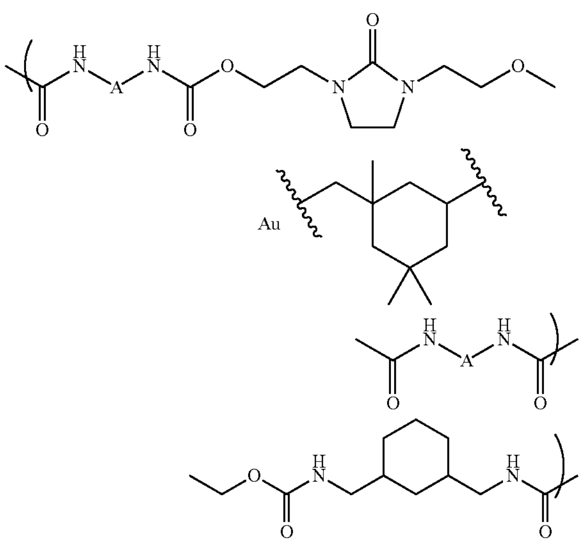

V-45

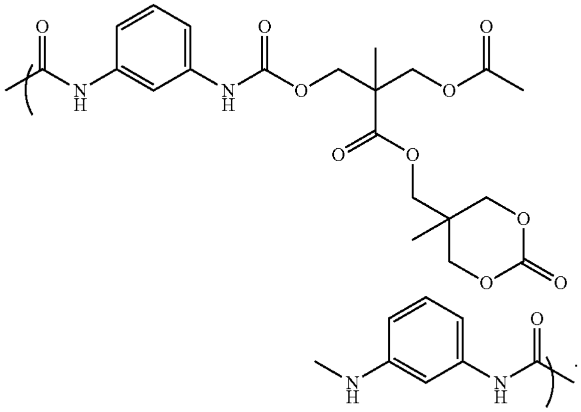

3. The polymerizable composition as claimed in claim 2, wherein the binder polymer has a repeating unit selected from the following formulae:

Units U-4, U-8, U-25, U-30, U-32, U-36, U-42, U-55, U-56, U-63, U-69, U-83, U-84, U-95, U-115, U-118, U-121, U-130, V-2, V-3, V-4, V-6, V-7, V-8, V-9, V-11, V-13 to V-17, V-28, V-33 to V-36, V-40 and V-43 to V-45.

4. The polymerizable composition as claimed in claim 2, wherein the binder polymer includes more than 20% by mole of the repeating unit.

5. A polymerizable composition comprising a binder polymer containing a functional group having a dipole moment of 3.8 debye or more and being represented by the following formula (1), (2), (3) (4) or (5), a radical polymerizable compound which is an addition polymerizable compound having at least one ethylenically unsaturated double bond and a radical polymerization initiator:

(1)

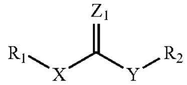

-continued (2)

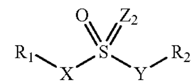

(3)

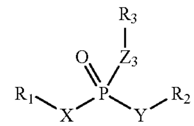

(4)

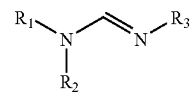

(5)

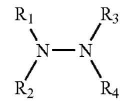

wherein X and Y each independently represents —C($R_5$)($R_6$)—, —C($R_5$)=, —O—, —S—, —N(R)$_5$— or —N=, $Z_1$ represents O or S, $Z_2$ represents O or a lone pair, $Z_3$ represents —C($R_5$)($R_6$)—, C($R_5$)=, —O—, —S—, —N($R_5$)— or —N=, $R_1$ to $R_6$ each independently represents a substituent comprising at least one atom selected from hydrogen, carbon, oxygen, nitrogen, sulfur, phosphorus, halogen and silicon or appropriate two of $R_1$ to $R_6$ may be combined with each other to form a ring, provided that at least one of $R_1$ to $R_6$ represents a divalent connecting group comprising at least one atom selected from hydrogen, carbon, oxygen, nitrogen, sulfur, phosphorus, halogen and silicon and connecting to a skeleton of the binder polymer, wherein the functional group having a dipole moment of 3.8 debye or more and being represented by the following formula (1), (2), (3), (4) or (5) is selected from the following groups:

Groups of Formula (1):

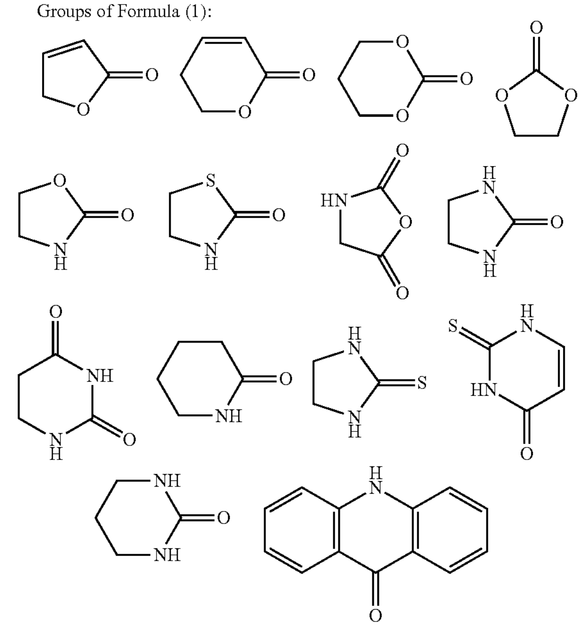

| Groups of Formula (2): | | | | | |
|---|---|---|---|---|---|
| 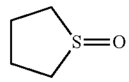 | 3.9 | 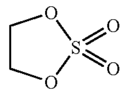 | 4.0 | 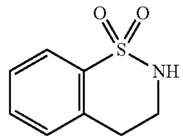 [SMILES: O=S1(=O)NCCc2ccccc21] | 5.4 |
| 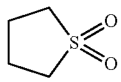 | 4.3 | 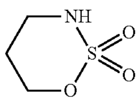 | 5.5 | 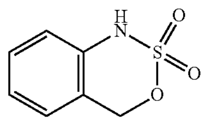 [SMILES: O=S1(=O)Nc2ccccc2CO1] | 5.6 |
| 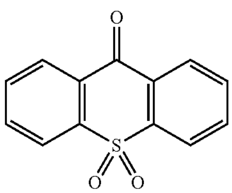 [SMILES: O=C1c2ccccc2S(=O)(=O)c2ccccc21] | 4.1 | 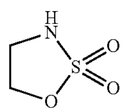 | 5.4 | 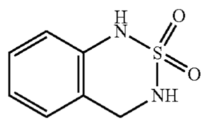 [SMILES: O=S1(=O)NCc2ccccc2N1] | 4.8 |
| 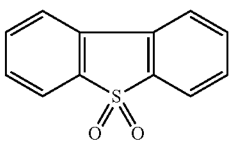 [SMILES: O=S1(=O)c2ccccc2-c2ccccc21] | 5.4 | 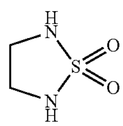 | 5.1 | 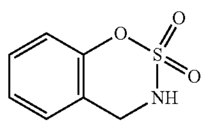 [SMILES: O=S1(=O)NCc2ccccc2O1] | 5.1 |
| 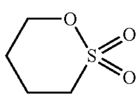 | 4.7 | 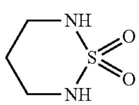 | 5.5 | 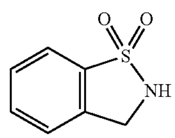 [SMILES: O=S1(=O)NCc2ccccc21] | 5.3 |
| 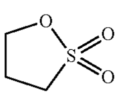 | 4.9 | 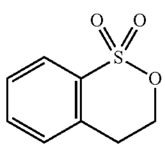 [SMILES: O=S1(=O)OCCc2ccccc21] | 6.3 | 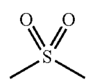 | 4.1 |
| 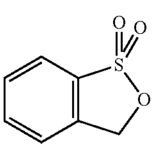 | 6.2 | 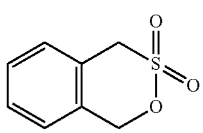 [SMILES: O=S1(=O)Cc2ccccc2CO1] | 5.3 | 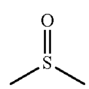 | 3.9 |
| 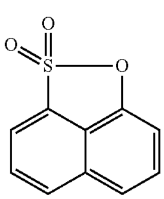 [SMILES: O=S1(=O)Oc2cccc3cccc1c23] | 5.8 | 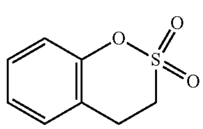 [SMILES: O=S1(=O)CCc2ccccc2O1] | 4.6 | 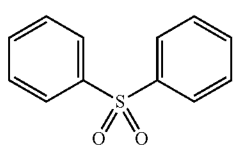 [SMILES: O=S(=O)(c1ccccc1)c1ccccc1] | 4.7 |
| 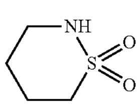 | 4.9 | 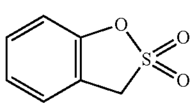 | 4.4 | 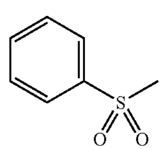 | 4.9 |
| 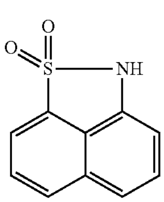 [SMILES: O=S1(=O)Nc2cccc3cccc1c23] | 4.7 | 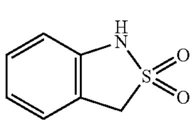 | 4.1 | 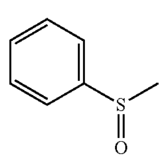 | 3.9 |

-continued
| Groups of Formula (2): | | | |
| --- | --- | --- | --- |
| 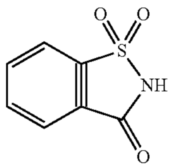 | 4.1 | 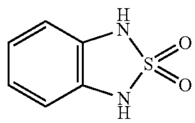 | 3.9 |
| 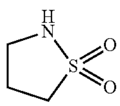 | 4.7 | 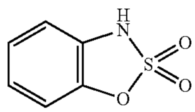 [SMILES: O=S1(=O)Nc2ccccc2O1] | 4.7 |
| Grops of Formulae (3) to (5): | | | | | |
| --- | --- | --- | --- | --- | --- |
| 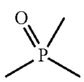 | 5.0 | 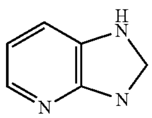 | 5.3 | 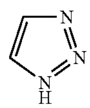 | 4.1 |
| 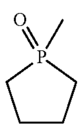 | 4.9 | 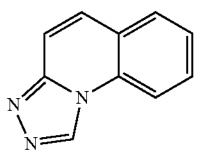 [SMILES: c1ccc2c(c1)ccc1nncn12] | 5.9 | 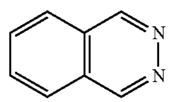 | 4.6 |
| 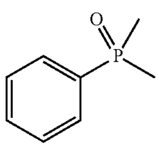 | 5.2 | 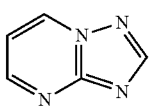 | 4.1 | | |
| 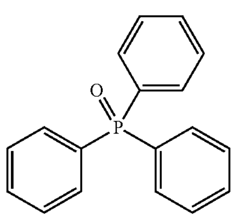 [SMILES: O=P(c1ccccc1)(c1ccccc1)c1ccccc1] | 5.3 | 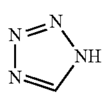 | 5.1 | | |
| 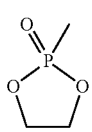 | 4.7 | | | | |
| 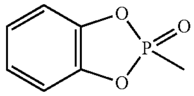 | 4.7 | | | | |
| 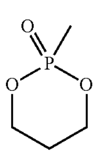 | 6.9 | | | | |

-continued

| Grops of Formulae (3) to (5): | |
|---|---|
| 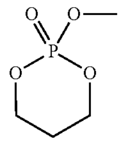 | 5.2 |

wherein the binder polymer is represented by one of the following structural formulae:

Binder polymers B-4, B-8, B-16, B-17, B-25, B-30 to B-32, B-36, B-42, B-55, B-56, B-59 to B-104, B-106, B-109, B-115, B-118, B-121 and B-123, B-127 to B-130, B-132 to B-134, B-136 to B-187 and B-190 to B-199, where the percentages of the constituent units are mole percentages:

| | Unit 1 | | Unit 2 | | Unit 3 | |
|---|---|---|---|---|---|---|
| Binder Polymer | No. | Content (%) | No. | Content (%) | No. | Content (%) |
| B-1 | U-1 | 20 | N-12 | 20 | N-1 | 60 |
| B-2 | U-2 | 30 | N-19 | 10 | N-15 | 60 |
| B-3 | U-3 | 40 | N-14 | 20 | N-16 | 40 |
| B-4 | U-4 | 50 | N-1 | 12 | N-12 | 38 |
| B-5 | U-5 | 20 | N-21 | 10 | N-10 | 70 |
| B-6 | U-6 | 20 | N-11 | 20 | N-18 | 60 |
| B-7 | U-7 | 30 | N-33 | 20 | N-6 | 50 |
| B-8 | U-8 | 60 | N-7 | 25 | N-19 | 15 |
| B-9 | U-9 | 30 | N-34 | 20 | N-7 | 50 |
| B-10 | U-10 | 20 | N-28 | 10 | N-22 | 70 |
| B-11 | U-11 | 30 | N-35 | 20 | N-27 | 50 |
| B-12 | U-12 | 30 | N-42 | 12 | N-44 | 58 |
| B-13 | U-13 | 90 | N-43 | 10 | — | — |
| B-14 | U-14 | 80 | N-50 | 20 | — | — |
| B-15 | U-15 | 80 | N-57 | 20 | — | — |
| B-16 | U-16 | 40 | N-48 | 10 | N-52 | 50 |
| B-17 | U-17 | 30 | N-49 | 20 | N-1 | 50 |
| B-18 | U-18 | 50 | N-63 | 12 | N-15 | 38 |
| B-19 | U-19 | 90 | N-51 | 10 | — | — |
| B-20 | U-20 | 80 | N-58 | 20 | — | — |
| B-21 | U-21 | 80 | N-33 | 20 | — | — |
| B-22 | U-22 | 40 | N-56 | 10 | N-16 | 50 |
| B-23 | U-23 | 20 | N-12 | 20 | N-10 | 60 |
| B-24 | U-24 | 30 | N-19 | 12 | N-18 | 58 |
| B-25 | U-25 | 85 | N-12 | 15 | — | — |
| B-26 | U-26 | 80 | N-14 | 20 | — | — |
| B-27 | U-27 | 60 | N-21 | 10 | N-6 | 30 |
| B-28 | U-28 | 60 | N-11 | 20 | N-7 | 20 |
| B-29 | U-29 | 30 | N-33 | 12 | N-22 | 58 |
| B-30 | U-30 | 70 | N-12 | 10 | N-7 | 20 |
| B-31 | U-31 | 80 | N-12 | 20 | — | — |
| B-32 | U-32 | 90 | N-33 | 10 | — | — |
| B-33 | U-33 | 50 | N-34 | 20 | N-27 | 30 |
| B-34 | U-34 | 40 | N-28 | 10 | N-44 | 50 |
| B-35 | U-35 | 70 | N-35 | 20 | N-6 | 10 |
| B-36 | U-36 | 90 | N-12 | 10 | — | — |
| B-37 | U-37 | 80 | N-42 | 20 | — | — |
| B-38 | U-38 | 50 | N-43 | 10 | N-1 | 40 |
| B-39 | U-39 | 30 | N-50 | 20 | N-15 | 50 |
| B-40 | U-40 | 60 | N-12 | 30 | N-10 | 10 |
| B-41 | U-41 | 90 | N-57 | 10 | — | — |
| B-42 | U-42 | 60 | N-33 | 10 | N-6 | 30 |
| B-43 | U-43 | 80 | N-48 | 20 | — | — |
| B-44 | U-44 | 40 | N-49 | 10 | N-16 | 50 |
| B-45 | U-45 | 30 | N-63 | 20 | N-10 | 50 |

| | Unit 1 | | Unit 2 | | Unit 3 | |
|---|---|---|---|---|---|---|
| Binder Polymer | No. | Content (%) | No. | Content (%) | No. | Content (%) |
| B-46 | U-46 | 30 | N-51 | 12 | N-18 | 58 |
| B-47 | U-47 | 90 | N-58 | 10 | — | — |
| B-48 | U-48 | 80 | N-56 | 20 | — | — |
| B-49 | U-49 | 80 | N-12 | 20 | — | — |
| B-50 | U-50 | 90 | N-19 | 10 | — | — |
| B-51 | U-51 | 30 | N-14 | 20 | N-6 | 50 |
| B-52 | U-52 | 40 | N-21 | 12 | N-7 | 48 |
| B-53 | U-53 | 40 | N-11 | 10 | N-22 | 50 |
| B-54 | U-54 | 80 | N-33 | 20 | — | — |
| B-55 | U-55 | 70 | N-35 | 10 | N-6 | 20 |
| B-56 | U-56 | 30 | N-34 | 12 | N-27 | 58 |
| B-57 | U-57 | 60 | N-28 | 10 | N-44 | 30 |
| B-58 | U-58 | 50 | N-35 | 20 | N-52 | 30 |
| B-59 | U-59 | 60 | N-42 | 10 | N-6 | 30 |
| B-60 | U-60 | 80 | N-42 | 20 | — | — |
| B-61 | U-61 | 90 | N-43 | 10 | — | — |
| B-62 | U-62 | 80 | N-50 | 20 | — | — |
| B-63 | U-63 | 88 | N-14 | 12 | — | — |
| B-64 | U-64 | 88 | N-57 | 12 | — | — |
| B-65 | U-65 | 50 | N-48 | 10 | N-1 | 40 |
| B-66 | U-66 | 30 | N-49 | 20 | N-15 | 50 |
| B-67 | U-67 | 50 | N-63 | 10 | N-16 | 40 |
| B-68 | U-68 | 80 | N-51 | 20 | — | — |
| B-69 | U-69 | 70 | N-43 | 10 | N-28 | 20 |
| B-70 | U-70 | 80 | N-58 | 20 | — | — |
| B-71 | U-71 | 30 | N-56 | 10 | N-10 | 60 |
| B-72 | U-72 | 60 | N-12 | 20 | N-18 | 20 |
| B-73 | U-73 | 50 | N-19 | 12 | N-6 | 38 |
| B-74 | U-74 | 30 | N-14 | 10 | N-7 | 60 |
| B-75 | U-75 | 30 | N-21 | 20 | N-22 | 50 |
| B-76 | U-76 | 30 | N-11 | 20 | N-27 | 50 |
| B-77 | U-77 | 90 | N-33 | 10 | — | — |
| B-78 | U-78 | 60 | N-34 | 20 | N-44 | 20 |
| B-79 | U-79 | 50 | N-28 | 12 | N-52 | 38 |
| B-80 | U-80 | 60 | N-35 | 10 | N-1 | 30 |
| B-81 | U-81 | 80 | N-42 | 20 | — | — |
| B-82 | U-82 | 80 | N-43 | 20 | — | — |
| B-83 | U-83 | 90 | N-50 | 10 | — | — |
| B-84 | U-84 | 70 | N-33 | 30 | — | — |
| B-85 | U-85 | 30 | N-57 | 12 | N-15 | 58 |
| B-86 | U-86 | 30 | N-48 | 10 | N-16 | 60 |
| B-87 | U-87 | 80 | N-49 | 20 | — | — |
| B-88 | U-88 | 80 | N-63 | 20 | — | — |

| | Unit 1 | | Unit 2 | | Unit 3 | |
|---|---|---|---|---|---|---|
| Binder Polymer | No. | Content (%) | No. | Content (%) | No. | Content (%) |
| B-89 | U-89 | 90 | N-51 | 10 | — | — |
| B-90 | U-90 | 80 | N-58 | 20 | — | — |
| B-91 | U-91 | 50 | N-56 | 12 | N-10 | 38 |
| B-92 | U-92 | 40 | N-12 | 10 | N-18 | 50 |
| B-93 | U-93 | 50 | N-19 | 20 | N-6 | 30 |
| B-94 | U-94 | 80 | N-14 | 20 | — | — |
| B-95 | U-95 | 80 | N-12 | 20 | — | — |
| B-96 | U-96 | 30 | N-21 | 20 | N-7 | 50 |

-continued

| Binder Polymer | Unit 1 No. | Unit 1 Content (%) | Unit 2 No. | Unit 2 Content (%) | Unit 3 No. | Unit 3 Content (%) |
|---|---|---|---|---|---|---|
| B-97 | U-97 | 30 | N-11 | 10 | N-22 | 60 |
| B-98 | U-98 | 40 | N-33 | 20 | N-27 | 40 |
| B-99 | U-99 | 88 | N-34 | 12 | — | — |
| B-100 | U-100 | 90 | N-28 | 10 | — | — |
| B-101 | U-101 | 80 | N-35 | 20 | — | — |
| B-102 | U-102 | 60 | N-42 | 20 | N-44 | 20 |
| B-103 | U-103 | 50 | N-49 | 10 | N-18 | 40 |
| B-104 | U-104 | 60 | N-12 | 30 | N-1 | 10 |
| B-105 | U-105 | 88 | N-50 | 12 | — | — |
| B-106 | U-106 | 90 | N-57 | 10 | — | — |
| B-107 | U-107 | 30 | N-48 | 20 | N-1 | 50 |
| B-108 | U-108 | 30 | N-49 | 20 | N-15 | 50 |
| B-109 | U-109 | 40 | N-63 | 10 | N-16 | 50 |
| B-110 | U-110 | 80 | N-51 | 20 | — | — |
| B-111 | U-111 | 88 | N-58 | 12 | — | — |
| B-112 | U-112 | 90 | N-56 | 10 | — | — |
| B-113 | U-113 | 50 | N-12 | 20 | N-10 | 30 |
| B-114 | U-114 | 50 | N-19 | 20 | N-18 | 30 |
| B-115 | U-115 | 50 | N-14 | 10 | N-6 | 40 |
| B-116 | U-116 | 50 | N-21 | 20 | N-7 | 30 |
| B-117 | U-117 | 40 | N-11 | 12 | N-22 | 48 |
| B-118 | U-118 | 50 | N-33 | 10 | N-27 | 40 |
| B-119 | U-119 | 80 | N-34 | 20 | — | — |
| B-120 | U-120 | 80 | N-28 | 20 | — | — |
| B-121 | U-121 | 60 | N-56 | 30 | N-44 | 10 |
| B-122 | U-122 | 80 | N-35 | 20 | — | — |
| B-123 | U-123 | 90 | N-42 | 10 | — | — |
| B-124 | U-124 | 80 | N-43 | 20 | — | — |
| B-125 | U-125 | 70 | N-51 | 30 | — | — |
| B-126 | U-126 | 60 | N-50 | 10 | N-44 | 30 |
| B-127 | U-127 | 60 | N-57 | 20 | N-52 | 20 |
| B-128 | U-128 | 40 | N-48 | 12 | N-1 | 48 |

-continued

| Binder Polymer | Unit 1 No. | Unit 1 Content (%) | Unit 2 No. | Unit 2 Content (%) | Unit 3 No. | Unit 3 Content (%) |
|---|---|---|---|---|---|---|
| B-129 | U-129 | 80 | N-49 | 20 | — | — |
| B-130 | U-130 | 80 | N-51 | 20 | — | — |
| B-131 | U-131 | 50 | N-63 | 20 | N-15 | 30 |

| Binder Polymer | Unit 1 No. | Unit 1 Content (%) | Unit 2 No. | | Unit 3 No. | Unit 3 Content (%) |
|---|---|---|---|---|---|---|
| B-132 | U-132 | 50 | N-51 | 10 | N-16 | 40 |
| B-133 | U-133 | 30 | N-58 | 20 | N-10 | 50 |
| B-134 | U-134 | 80 | N-56 | 20 | — | — |
| B-135 | U-135 | 70 | N-51 | 20 | N-52 | 10 |
| B-136 | U-136 | 50 | N-12 | 20 | N-18 | 30 |
| B-137 | U-137 | 50 | N-19 | 20 | N-6 | 30 |
| B-138. | U-138 | 50 | N-14 | 20 | N-7 | 30 |
| B-139 | U-139 | 50 | N-21 | 20 | N-22 | 30 |
| B-140 | U-140 | 50 | N-11 | 20 | N-27 | 30 |
| B-141 | U-141 | 50 | N-33 | 20 | N-44 | 30 |
| B-142 | U-142 | 50 | N-34 | 20 | N-52 | 30 |
| B-143 | U-143 | 50 | N-28 | 20 | N-1 | 30 |
| B-144 | U-144 | 50 | N-58 | 20 | N-44 | 30 |
| B-145 | U-145 | 50 | N-35 | 20 | N-15 | 30 |
| B-146 | U-146 | 50 | N-42 | 20 | N-16 | 30 |
| B-147 | U-147 | 50 | N-43 | 20 | N-10 | 30 |
| B-148 | U-148 | 50 | N-50 | 20 | N-18 | 30 |
| B-149 | U-149 | 60 | N-51 | 20 | N-52 | 20 |
| B-150 | U-150 | 70 | N-51 | 20 | N-44 | 10 |

| Binder Polymer | Unit 1 No. | Unit 1 Content (%) | Unit 2 No. | Unit 2 Content (%) | Unit 3 No. | Unit 3 Content (%) | Unit 4 No. | Unit 4 Content (%) | Unit 5 No. | Unit 5 Content (%) |
|---|---|---|---|---|---|---|---|---|---|---|
| B-151 | V-47 | 30 | N-74 | 20 | V-1 | 20 | N-64 | 20 | N-71 | 10 |
| B-152 | V-47 | 50 | V-2 | 30 | N-65 | 10 | N-64 | 10 | — | — |
| B-153 | V-48 | 40 | N-79 | 10 | V-3 | 30 | N-85 | 10 | N-72 | 10 |
| B-154 | N-66 | 30 | N-68 | 20 | V-4 | 25 | N-71 | 20 | N-88 | 5 |
| B-155 | V-49 | 30 | N-68 | 20 | V-5 | 42 | N-86 | 8 | — | — |
| B-156 | V-51 | 40 | N-96 | 10 | V-6 | 25 | N-87 | 15 | N-64 | 10 |
| B-157 | N-67 | 20 | N-97 | 30 | V-7 | 40 | N-88 | 10 | — | — |
| B-158 | N-68 | 20 | N-74 | 30 | V-8 | 30 | N-90 | 10 | N-72 | 10 |
| B-159 | N-95 | 30 | V-50 | 20 | V-9 | 20 | N-64 | 20 | N-78 | 10 |
| B-160 | V-47 | 40 | N-81 | 10 | V-10 | 30 | N-65 | 10 | N-78 | 10 |
| B-161 | N-73 | 20 | N-98 | 30 | V-11 | 35 | N-71 | 10 | N-86 | 5 |
| B-162 | N-74 | 30 | N-81 | 20 | V-12 | 35 | N-85 | 15 | — | — |
| B-163 | N-79 | 30 | N-96 | 20 | V-13 | 42 | N-86 | 8 | — | — |
| B-164 | N-80 | 25 | N-68 | 25 | V-14 | 35 | N-87 | 15 | — | — |
| B-165 | N-81 | 20 | N-79 | 30 | V-15 | 40 | N-88 | 10 | — | — |
| B-166 | V-49 | 50 | V-16 | 25 | N-85 | 15 | N-72 | 10 | — | — |
| B-167 | N-96 | 30 | N-80 | 20 | V-17 | 25 | N-90 | 20 | N-78 | 5 |
| B-168 | N-98 | 25 | N-79 | 25 | V-18 | 30 | N-64 | 10 | N-87 | 10 |
| B-169 | N-97 | 50 | V-19 | 40 | N-65 | 10 | — | — | — | — |
| B-170 | V-48 | 50 | V-20 | 35 | N-86 | 5 | N-71 | 10 | — | — |
| B-171 | N-66 | 10 | N-68 | 40 | V-21 | 30 | N-87 | 10 | N-64 | 10 |
| B-172 | N-67 | 30 | N-96 | 20 | V-22 | 30 | N-71 | 10 | N-65 | 10 |
| B-173 | N-68 | 50 | V-23 | 30 | N-85 | 10 | N-78 | 10 | — | — |
| B-174 | V-51 | 50 | V-24 | 40 | N-88 | 10 | — | — | — | — |
| B-175 | N-95 | 30 | N-81 | 20 | V-25 | 32 | N-86 | 8 | N-78 | 10 |
| B-176 | N-73 | 30 | N-97 | 20 | V-26 | 35 | N-87 | 15 | — | — |
| B-177 | N-74 | 30 | N-96 | 20 | V-27 | 40 | N-88 | 10 | — | — |
| B-178 | N-79 | 25 | N-98 | 25 | V-24 | 20 | N-90 | 20 | N-72 | 10 |
| B-179 | N-74 | 30 | N-81 | 20 | V-16 | 20 | N-90 | 10 | N-72 | 20 |
| B-180 | V-47 | 50 | N-86 | 10 | N-72 | 20 | N-78 | 20 | — | — |
| B-181 | V-49 | 20 | V-47 | 30 | N-88 | 10 | N-72 | 20 | N-78 | 20 |

| | Unit 1 | | Unit 2 | | Unit 3 | | Unit 4 | | Unit 5 | |
|---|---|---|---|---|---|---|---|---|---|---|
| Binder Polymer | No. | Content (%) | No. | Content (%) | No. | Content (%) | No. | Content (%) | No. | Content (%) |
| B-182 | V-51 | 25 | V-48 | 25 | V-2 | 30 | N-90 | 10 | N-72 | 10 |
| B-183 | V-47 | 50 | N-75 | 15 | V-29 | 30 | N-69 | 5 | — | — |
| B-184 | V-48 | 40 | N-96 | 10 | N-82 | 20 | V-30 | 30 | — | — |
| B-185 | N-74 | 20 | N-97 | 30 | N-75 | 15 | V-31 | 35 | — | — |
| B-186 | N-95 | 20 | N-68 | 30 | N-82 | 20 | V-32 | 20 | N-69 | 10 |
| B-187 | N-73 | 10 | N-79 | 40 | N-75 | 15 | V-33 | 25 | N-69 | 10 |
| B-188 | V-49 | 50 | N-82 | 20 | V-34 | 30 | — | — | — | — |
| B-189 | N-67 | 20 | N-81 | 30 | N-75 | 10 | V-35 | 20 | N-69 | 20 |
| B-190 | V-51 | 50 | N-82 | 30 | V-36 | 20 | — | — | — | — |
| B-191 | N-98 | 50 | N-75 | 15 | V-37 | 20 | N-69 | 15 | — | — |
| B-192 | N-79 | 30 | N-98 | 20 | N-82 | 20 | V-38 | 20 | N-69 | 10 |
| B-193 | N-74 | 30 | N-81 | 20 | N-82 | 20 | V-34 | 15 | V-36 | 15 |
| B-194 | V-51 | 25 | V-48 | 25 | N-75 | 20 | N-69 | 30 | — | — |
| B-195 | V-39 | 30 | N-76 | 20 | N-85 | 10 | N-72 | 20 | N-78 | 20 |
| B-196 | V-40 | 50 | V-2 | 20 | N-90 | 10 | V-16 | 20 | — | — |
| B-197 | V-41 | 30 | V-44 | 20 | V-16 | 25 | N-85 | 15 | N-72 | 10 |
| B-198 | V-42 | 30 | N-83 | 20 | V-24 | 40 | N-88 | 10 | — | — |
| B-199 | V-43 | 30 | N-76 | 20 | N-75 | 20 | N-69 | 30 | — | — |
| B-200 | V-44 | 30 | V-39 | 20 | N-82 | 20 | V-34 | 15 | V-36 | 15 |
| B-201 | V-45 | 20 | N-83 | 30 | N-82 | 20 | V-30 | 30 | — | — |
| B-202 | V-46 | 20 | N-83 | 30 | N-75 | 20 | N-69 | 30 | — | — |
| B-203 | N-83 | 20 | N-76 | 30 | V-2 | 20 | N-90 | 10 | V-16 | 20 |
| B-204 | N-83 | 30 | N-76 | 20 | N-82 | 20 | V-34 | 15 | V-36 | 15 |
| B-205 | V-52 | 20 | N-70 | 30 | N-88 | 10 | N-72 | 20 | N-78 | 20 |
| B-206 | V-53 | 40 | N-77 | 10 | N-85 | 10 | V-2 | 40 | — | — |
| B-207 | N-70 | 20 | N-77 | 30 | N-85 | 10 | V-2 | 40 | — | — |
| B-208 | V-52 | 25 | V-53 | 25 | V-2 | 25 | V-16 | 25 | — | — |

wherein the structures of the U, V and N units of the binder polymer are as follows:

U-1

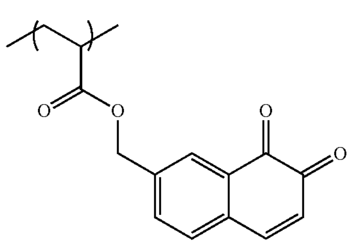

U-2

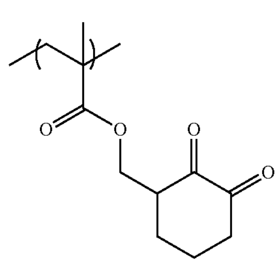

-continued

U-3

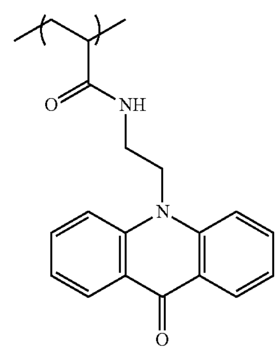

U-4

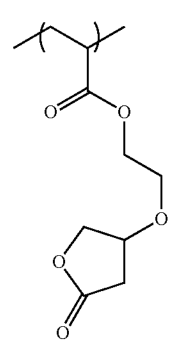

U-5
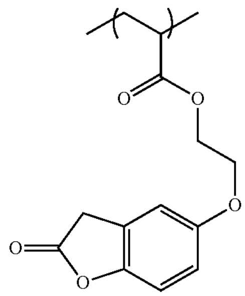
U-6
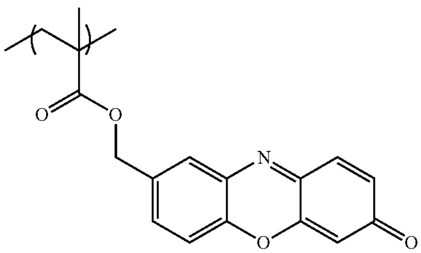
U-7
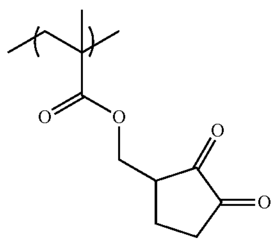
U-8
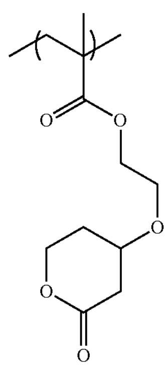
U-9
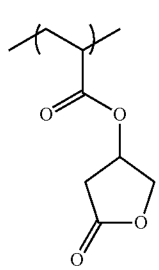
U-10
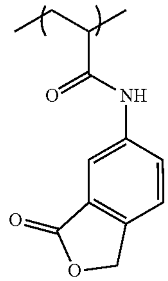
U-11
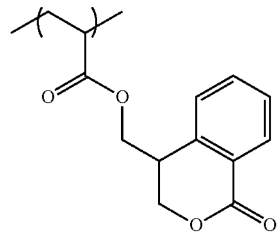
U-12
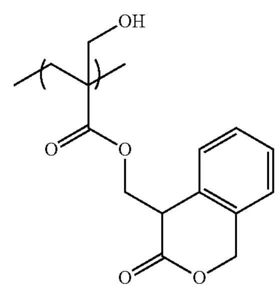
U-13
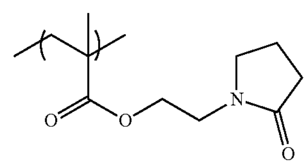
U-14
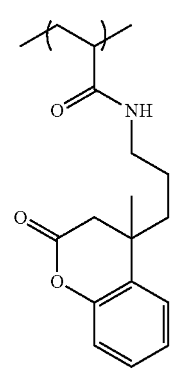

-continued
U-15
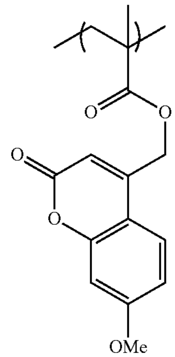
U-16
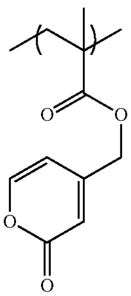
U-17
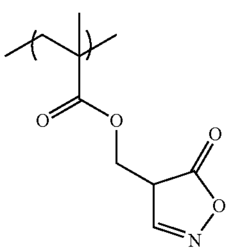
U-18
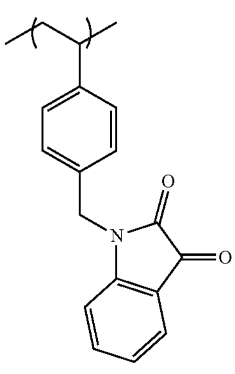
U-19
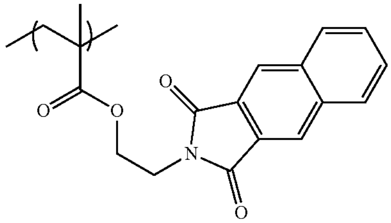
-continued
U-20
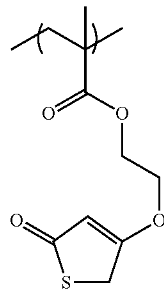
U-21
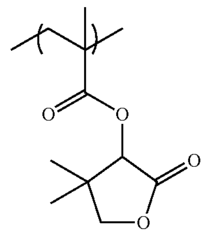
U-22
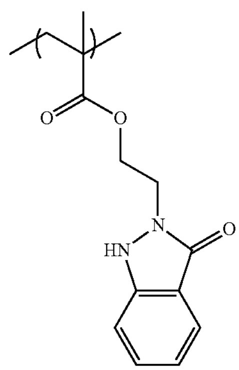
U-23
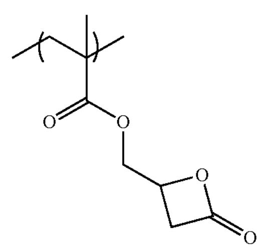
U-24
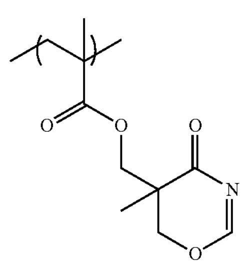

U-25
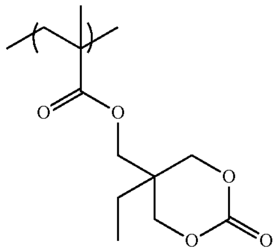
U-26
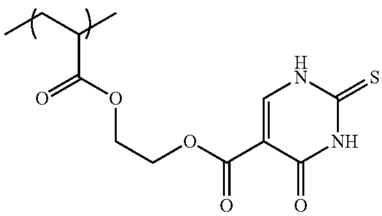
U-27
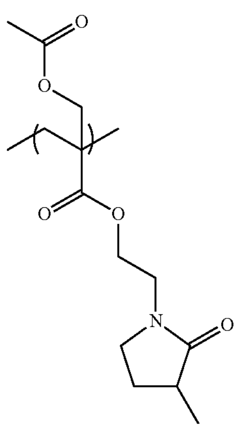
U-28
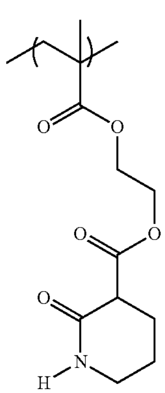
U-29
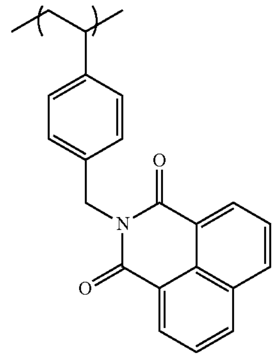
U-30
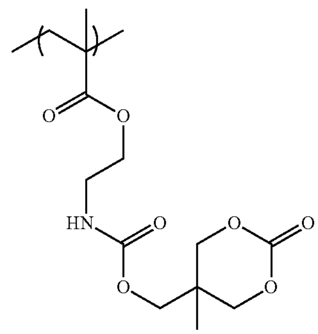
U-31
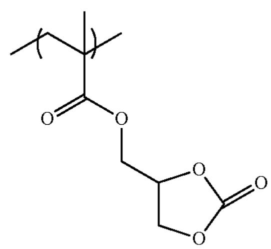
U-32
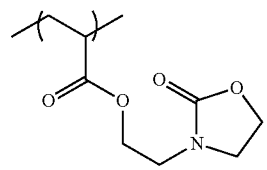
U-33
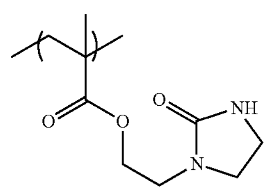
U-34
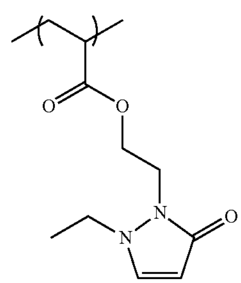

-continued
U-35
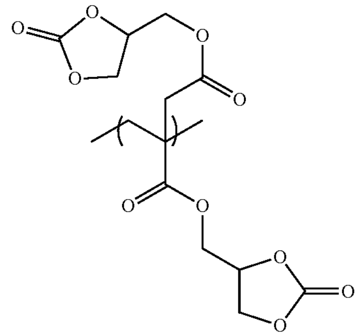
U-36
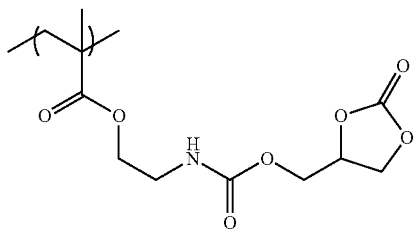
U-37
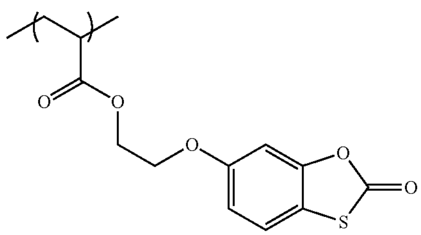
U-38
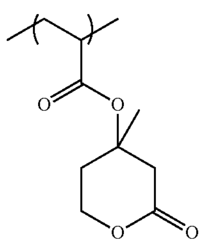
U-39
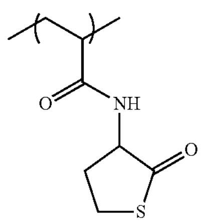
U-40
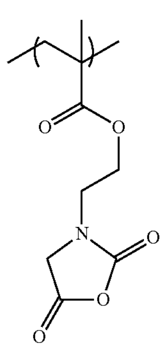
-continued
U-41
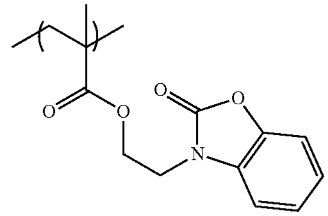
U-42
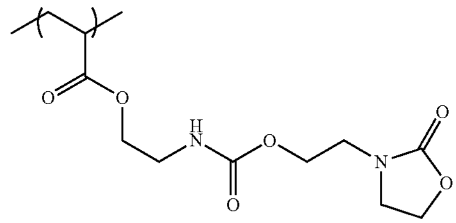
U-43
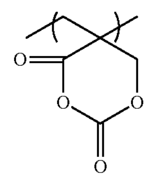
U-44
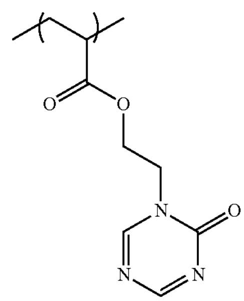
U-45
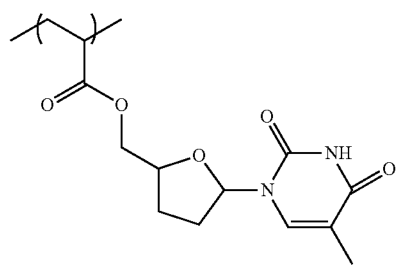
U-46
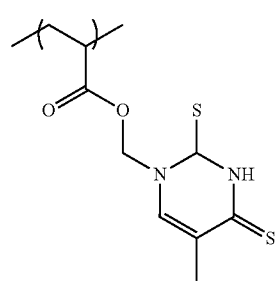

-continued
U-47
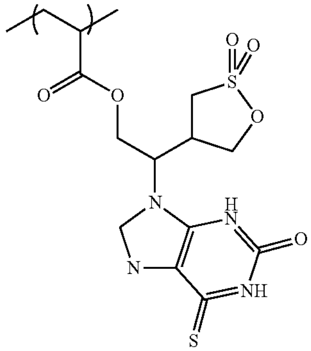
U-48
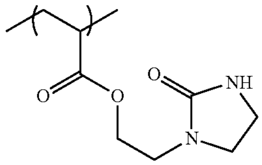
U-49
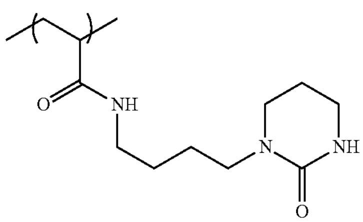
U-50
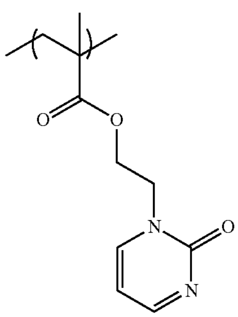
U-51
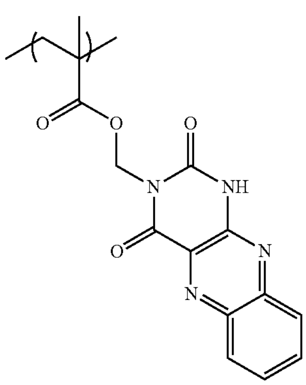
-continued
U-52
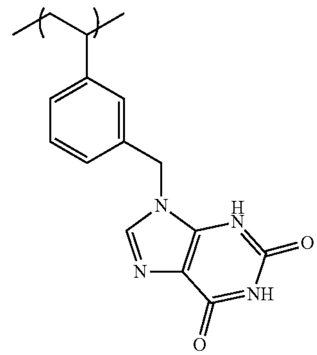
U-53
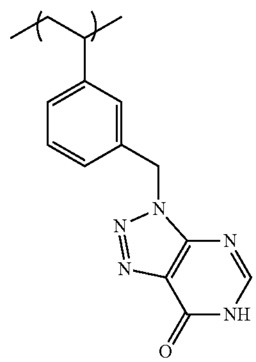
U-54
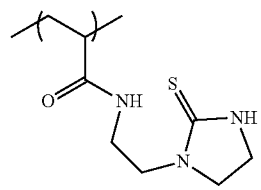
U-55
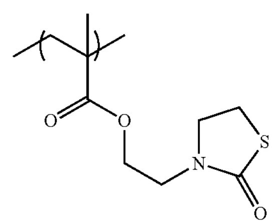
U-56
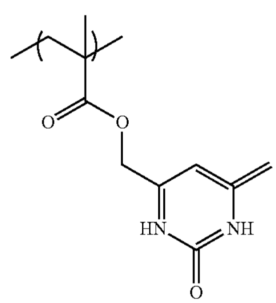

-continued
U-57
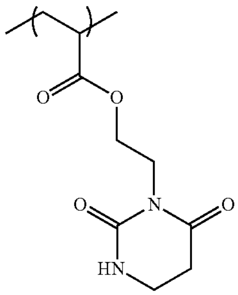
U-58
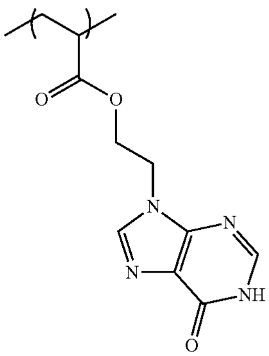
U-59
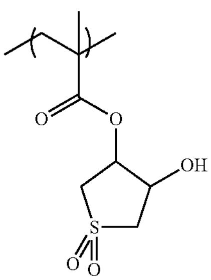
U-60
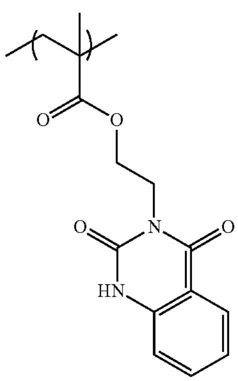
U-61
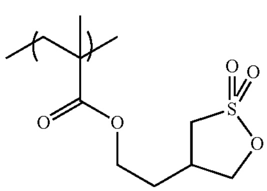
-continued
U-62
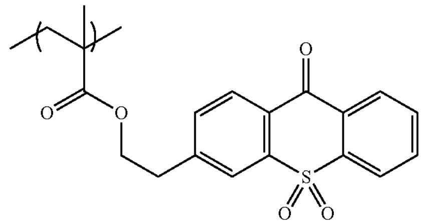
U-63
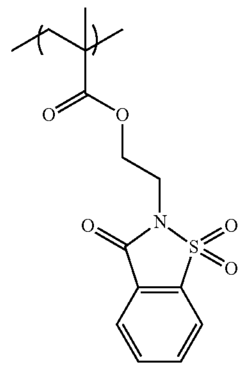
U-64
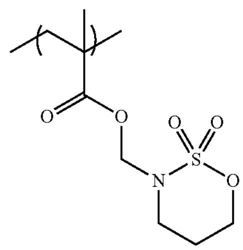
U-65
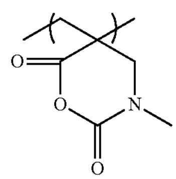
U-66
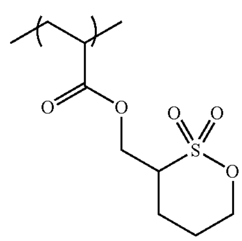
U-67
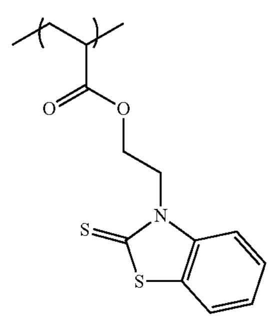

-continued
U-68
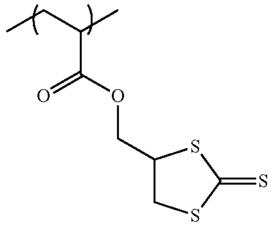
U-69
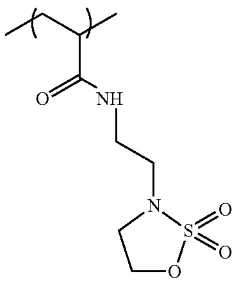
U-70
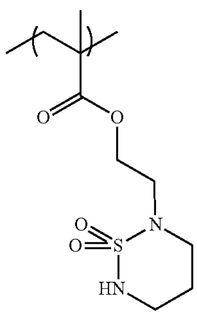
U-71
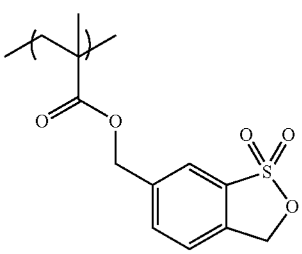
U-72
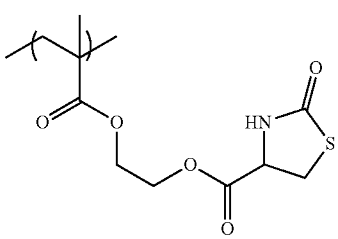
U-73
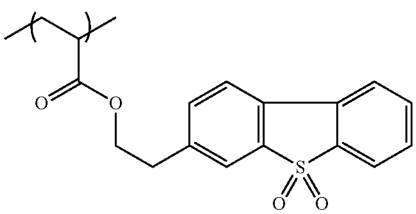
-continued
U-74
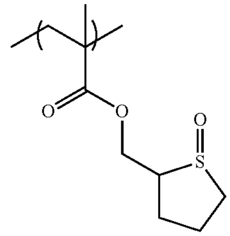
U-75
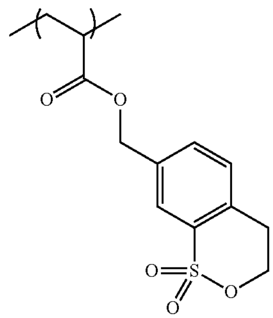
U-76
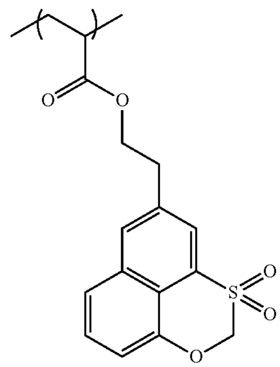
U-77
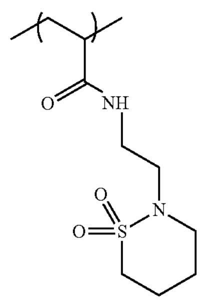
U-78
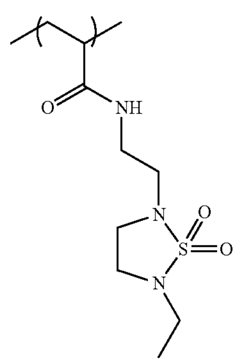

-continued
U-79
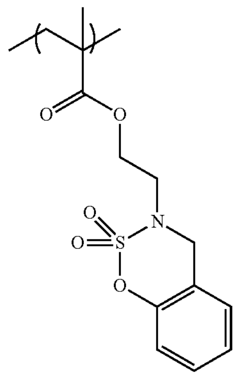
U-80
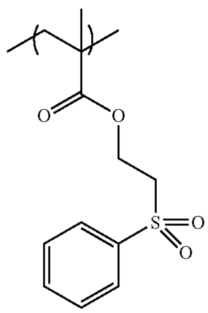
U-81
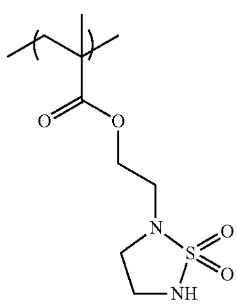
U-82
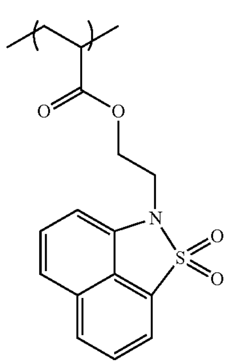
-continued
U-83
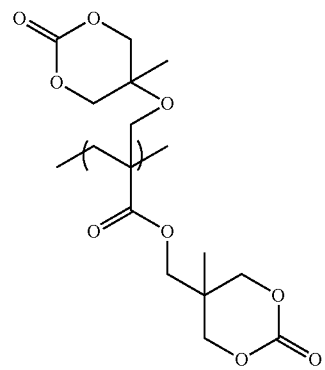
U-84
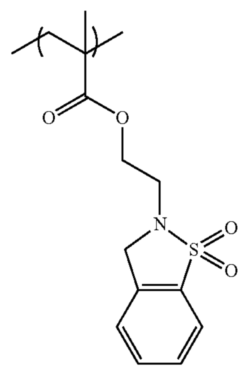
U-85
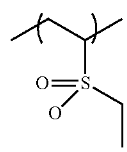
U-86
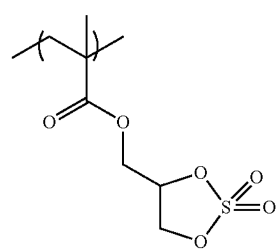
U-87
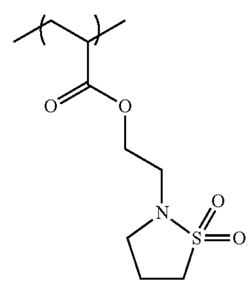

-continued
U-88
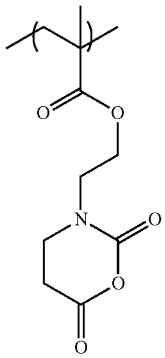
U-89
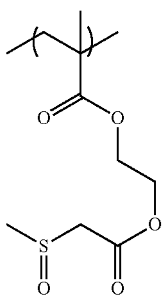
U-90
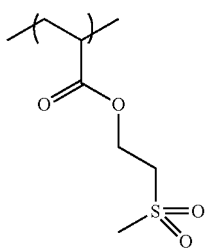
U-91
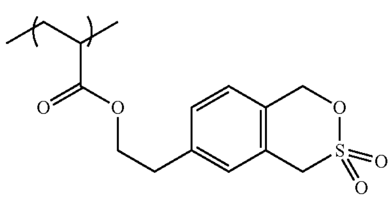
U-92
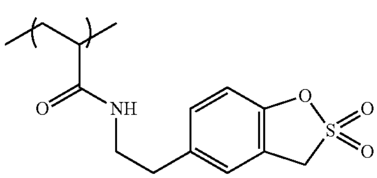
U-93
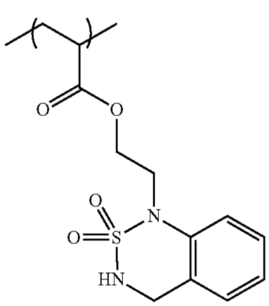
-continued
U-94
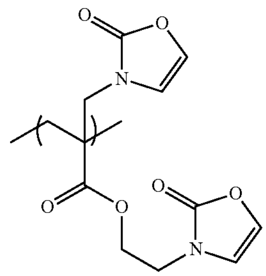
U-95
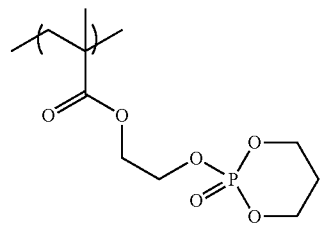
U-96
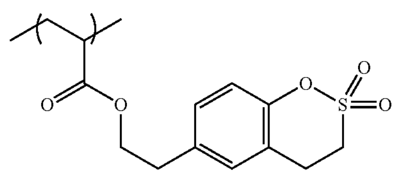
U-97
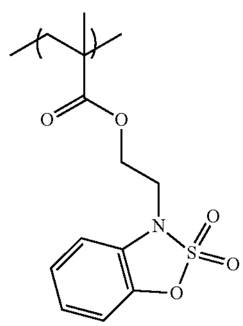
U-98
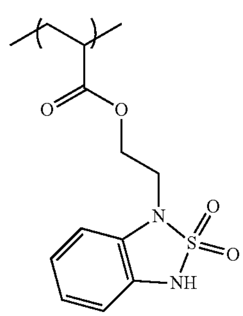

U-99
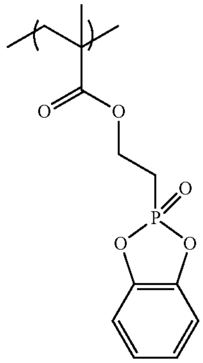
U-100
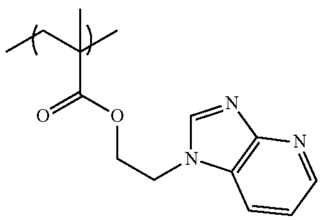
U-101
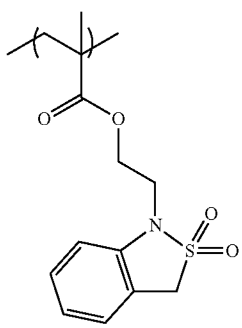
U-102
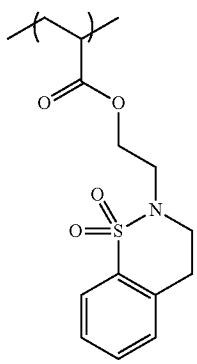
U-103
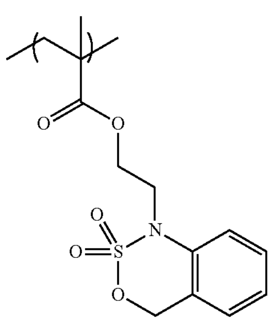
U-104
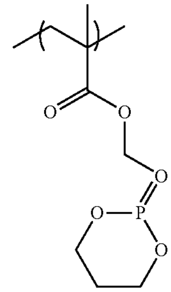
U-105
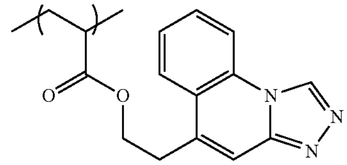
U-106
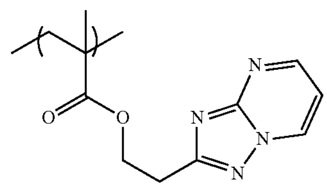
U-107
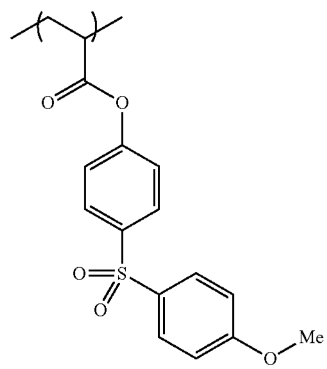
U-108
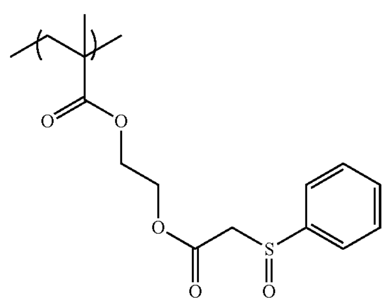
U-109
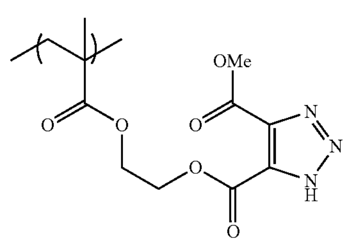

-continued
U-110
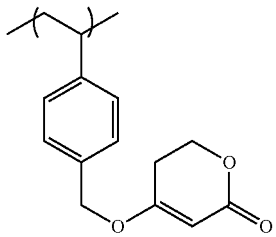
U-111
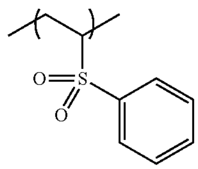
U-112
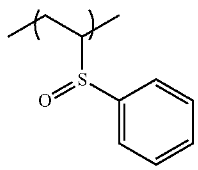
U-113
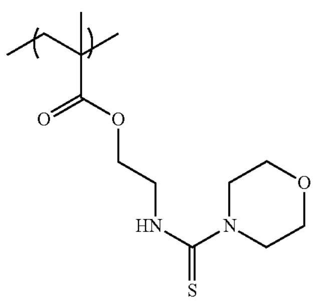
U-114
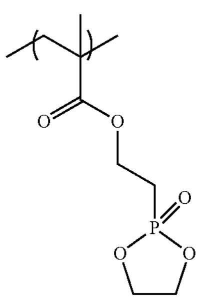
U-115
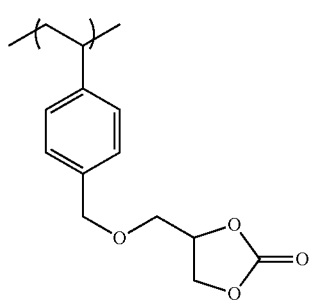
-continued
U-116
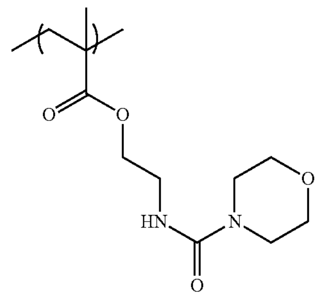
U-117
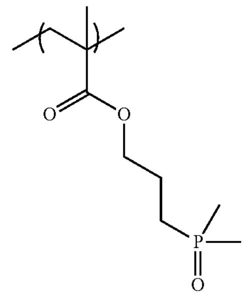
U-118
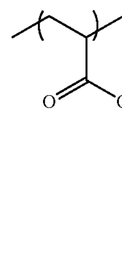
U-119
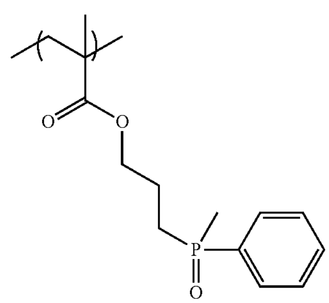
U-120
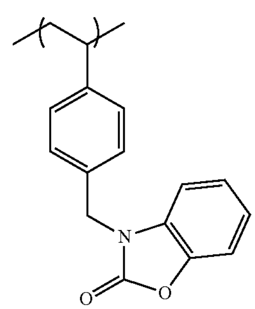

-continued
U-121
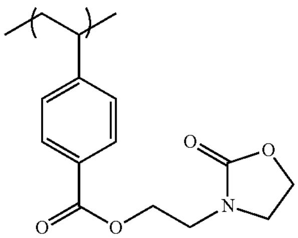
U-122
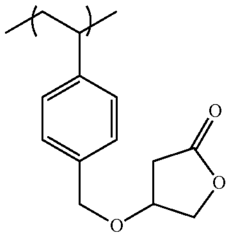
U-123
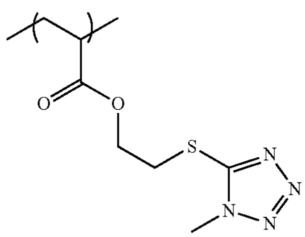
U-124
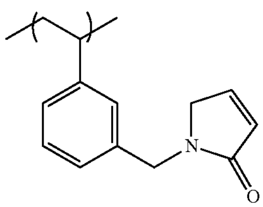
U-125
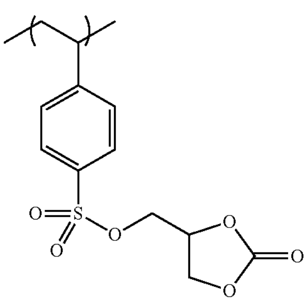
U-126
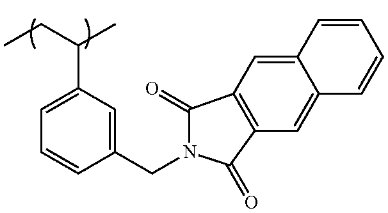
-continued
U-127
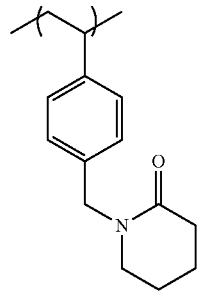
U-128
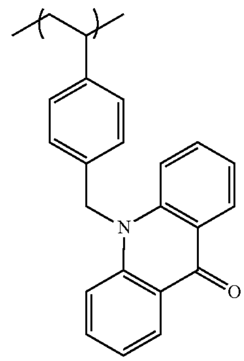
U-129
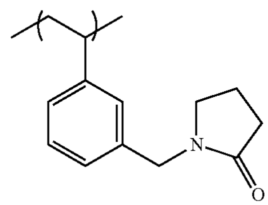
U-130
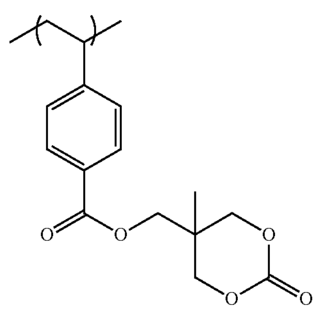
U-131
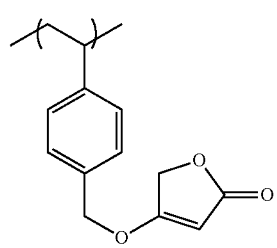

-continued
U-132
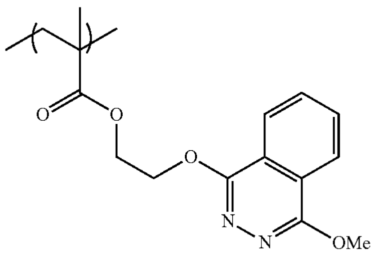
U-133
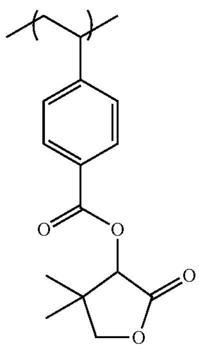
U-134
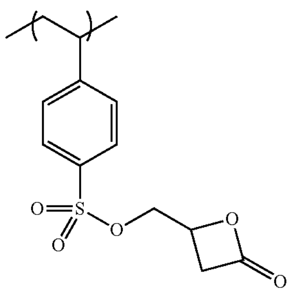
U-135
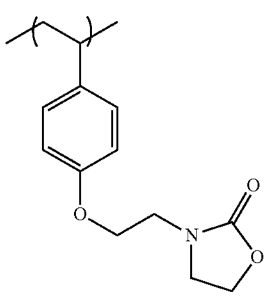
V-1
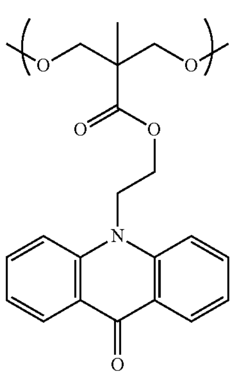
-continued
V-2
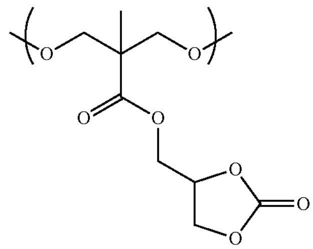
V-3
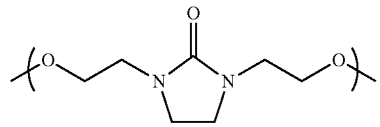
V-4
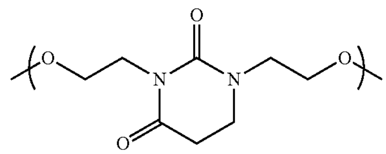
V-5
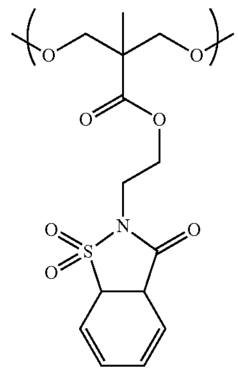
V-6
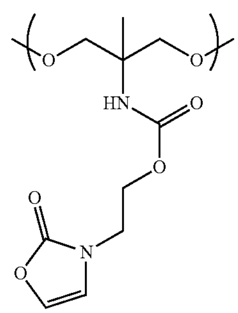
V-7
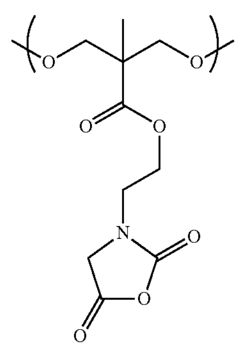

-continued
V-8
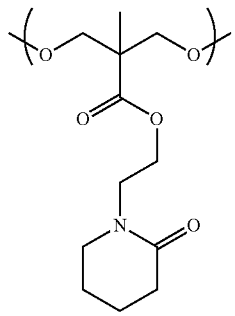
V-9
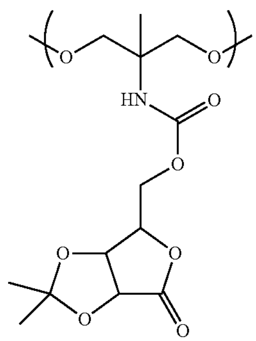
V-10
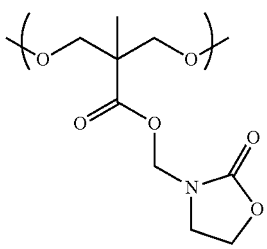
V-11
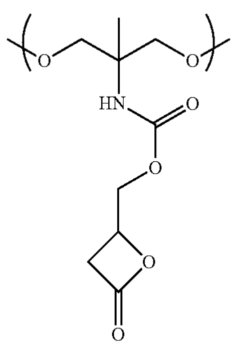
V-12
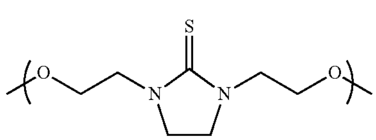
V-13
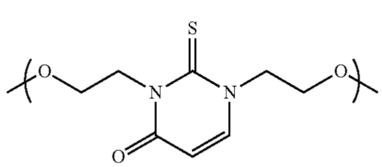
-continued
V-14
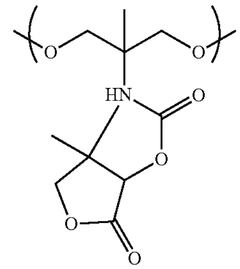
V-15
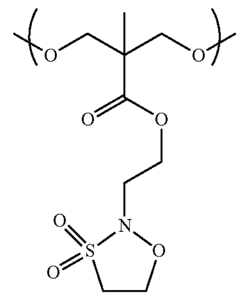
V-16
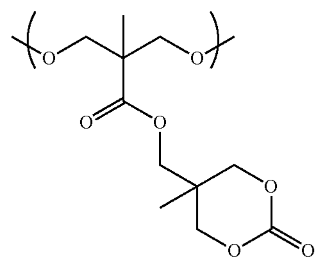
V-17
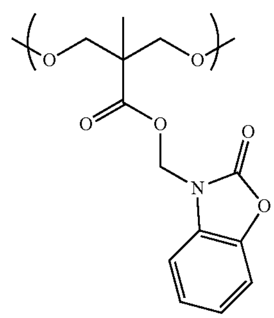
V-18
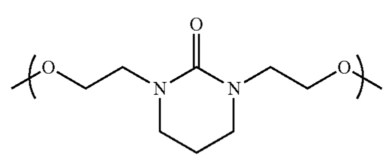
V-19
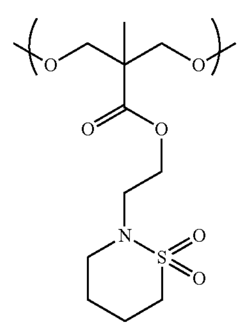

-continued
V-20
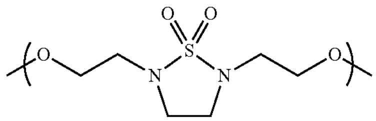
V-21
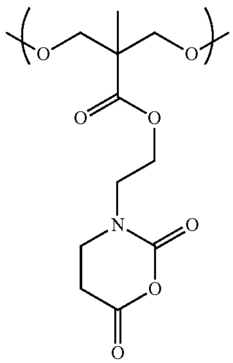
V-22
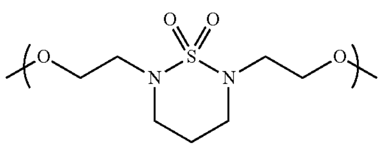
V-23
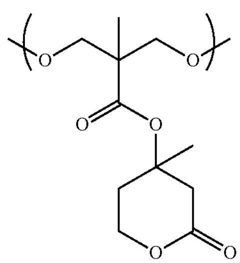
V-24
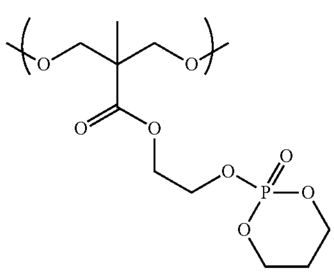
V-25
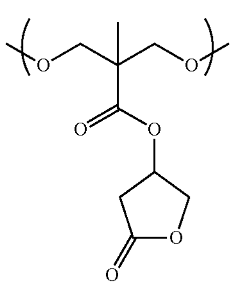
-continued
V-26
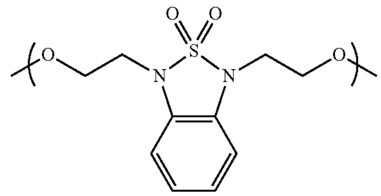
V-27
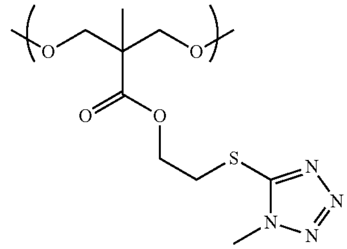
V-28
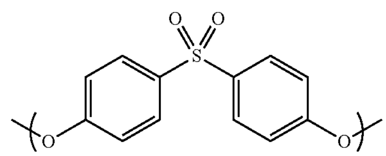
V-29
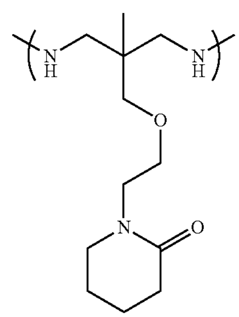
V-30
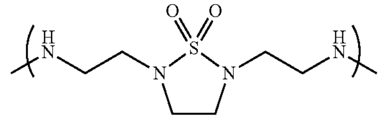
N-43
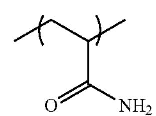
N-44
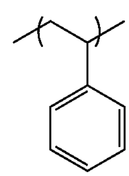
N-45
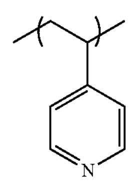

-continued
N-46
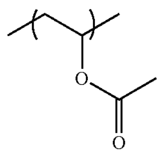
N-47
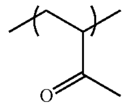
N-48
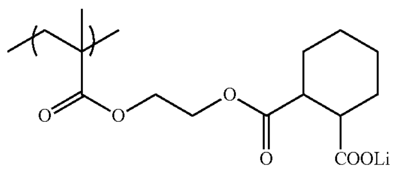
N-49
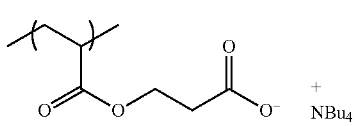
N-50
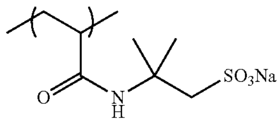
N-51
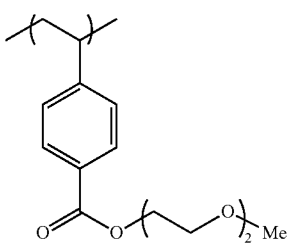
N-52
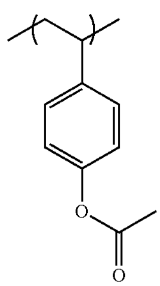
N-53
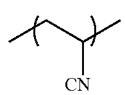
N-54
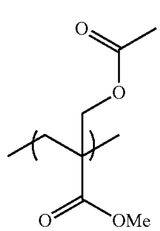
-continued
N-55
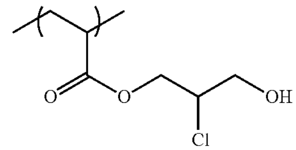
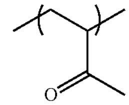
N-56
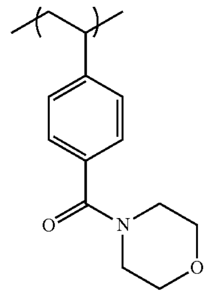
N-57
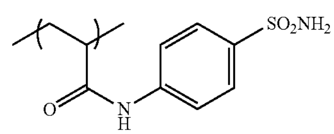
N-58
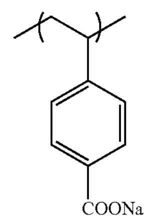
N-59
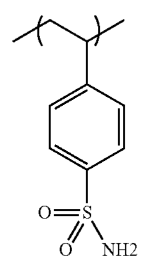
N-60
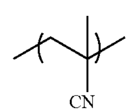
N-61
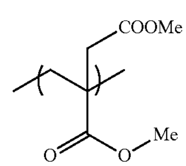
N-62
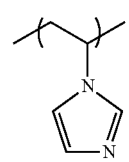

-continued
N-63
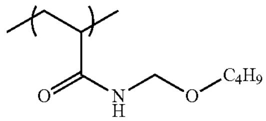
N-64
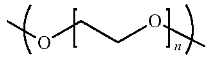
N-65
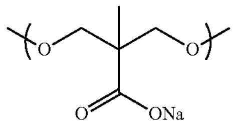
N-66
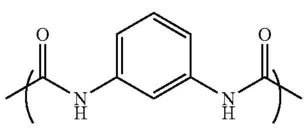
N-67
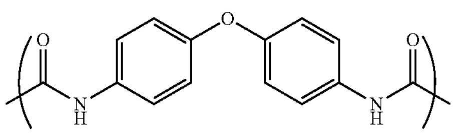
N-68
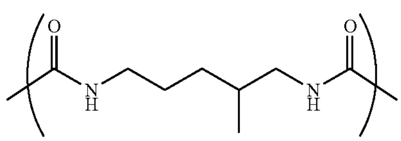
N-69
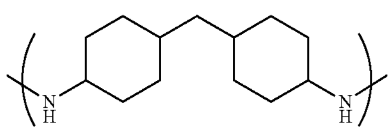
N-70
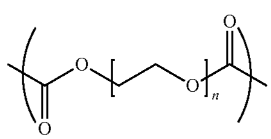
N-71
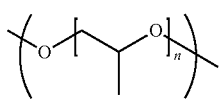
N-72
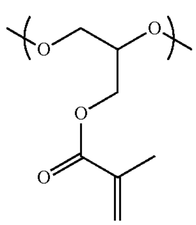
N-73
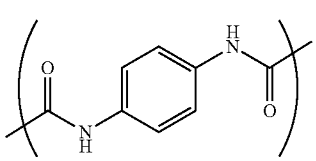
-continued
N-74
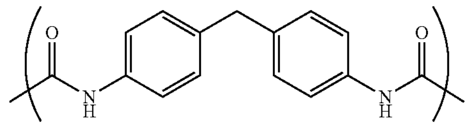
N-75
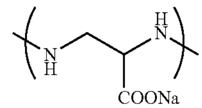
N-76
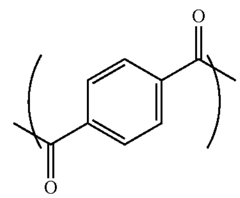
N-77
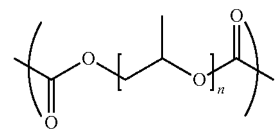
N-78
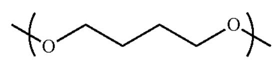
N-79
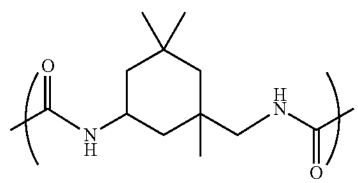
N-80
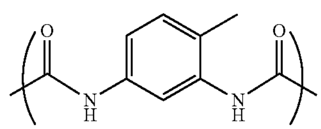
N-81
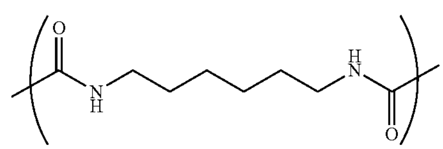
N-82
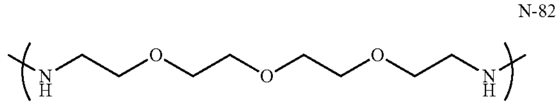
N-83
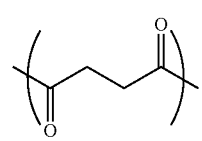
N-84
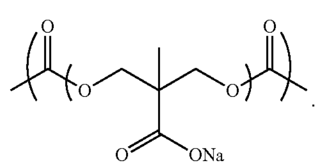
6. The polymerizable composition as claimed in claim 5, wherein the binder polymer is represented by one of the following structural formulae:

Binder polymers B-4, B-8, B-25, B-30 to B-32, B-36, B-42, B-55, B-56, B-63, B-69, B-83, B-84, B-95, B-115, B-118, B-121, B-130, B-137 to B-139, B-142 to B-144, B-146 and B-148 to B-152.

7. The polymerizable composition as claimed in claim 1, wherein the binder polymer has an acid value of 0.3 meq/g or less.

8. An image-forming material comprising a support and a layer comprising the polymerizable composition as claimed in claim 1.

9. A lithographic printing plate precursor comprising a support of a hydrophilic surface and a photosensitive layer comprising the polymerizable composition as claimed in claim 1.

10. The lithographic printing plate precursor as claimed in claim 9, which comprises a protective layer, so that the support, the photosensitive layer and the protective layer are provided in this order.

11. The lithographic printing plate precursor as claimed in claim 1, which is capable of performing printing by mounting on a printing machine after image exposure without carrying out a development processing step.

12. A lithographic printing method comprising:

(i) mounting the lithographic printing plate precursor as claimed in claim 11 on a printing machine and exposing the mounted lithographic printing plate precursor imagewise with a laser or (ii) exposing the lithographic printing plate precursor as claim 11 imagewise with a laser and mounting the exposed lithographic printing plate precursor on a printing machine; and supplying printing ink and dampening water on the exposed lithographic printing plate precursor to remove an unexposed area of the photosensitive layer and printing.

13. The polymerizable composition as claimed in claim 1, wherein the functional group has a dipole moment of 5.0 debye or more and the functional group having a dipole moment of 5.0 debye or more is selected from the following groups:

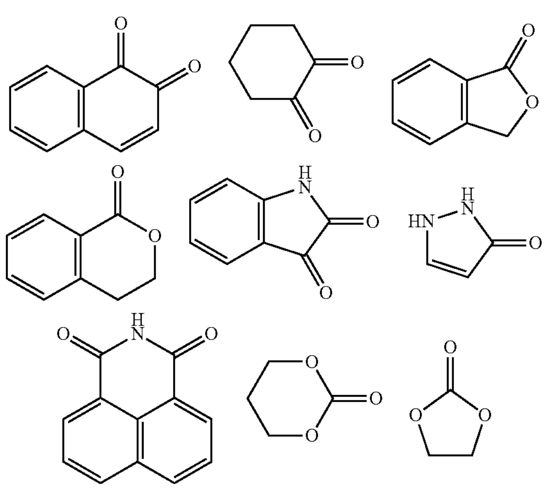

-continued

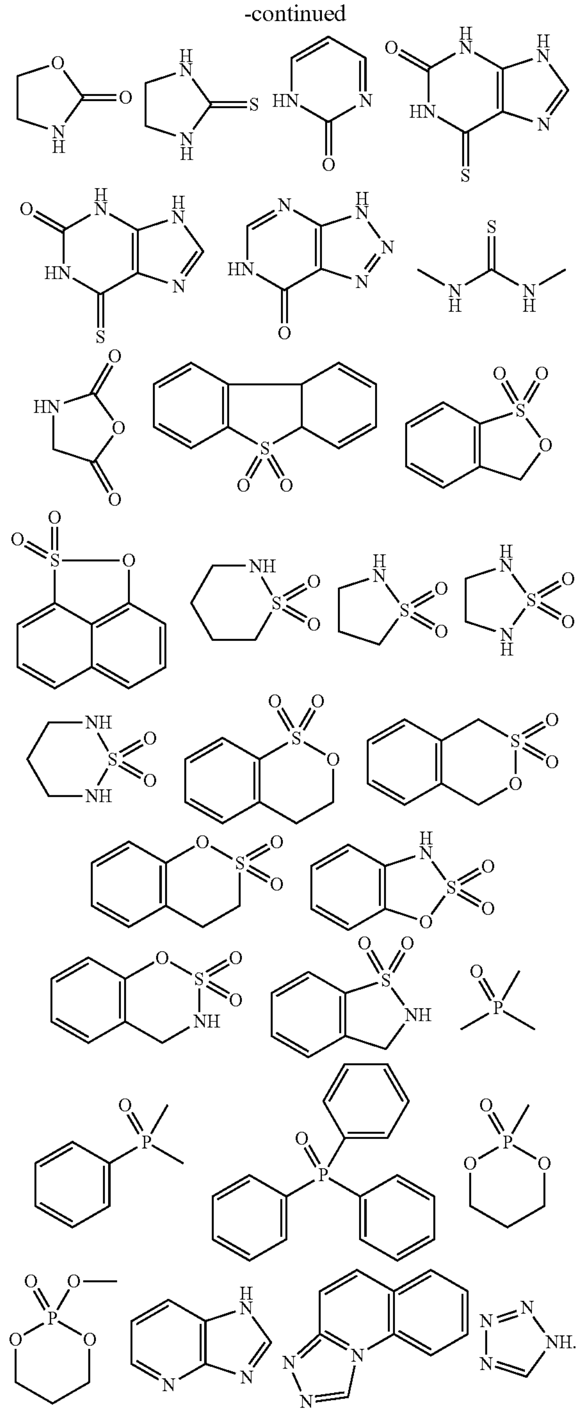

14. The polymerizable composition as claimed in claim 1, wherein the binder polymer is a resin selected from the group consisting of an acrylic resin, a methacrylic resin, a styrene resin, a urethane resin, a urea resin, an amide resin, an ester resin and a carbonate resin.

15. The polymerizable composition as claimed in claim 1, wherein the binder polymer is a resin selected from the group consisting of an acrylic resin, a methacrylic resin and a urethane resin.

* * * * *